(12) United States Patent
Box et al.

(10) Patent No.: US 8,390,325 B2
(45) Date of Patent: Mar. 5, 2013

(54) RECONFIGURABLE INTEGRATED CIRCUIT ARCHITECTURE WITH ON-CHIP CONFIGURATION AND RECONFIGURATION

(75) Inventors: Brian A. Box, Seabrook, NH (US); John M. Rudosky, Hampton, NH (US); Stephen L. Wasson, Marina, CA (US); Steven Hennick Kelem, Los Altos Hills, CA (US)

(73) Assignee: Element CXI, LLC, San Jose, CA (US)

( * ) Notice: Subject to any disclaimer, the term of this patent is extended or adjusted under 35 U.S.C. 154(b) by 0 days.

(21) Appl. No.: 13/216,212

(22) Filed: Aug. 23, 2011

(65) Prior Publication Data

US 2012/0131288 A1 May 24, 2012

Related U.S. Application Data

(63) Continuation-in-part of application No. 12/977,319, filed on Dec. 23, 2010, and a continuation-in-part of application No. 12/785,433, filed on May 22, 2010, now Pat. No. 8,072,239, said application No. 12/977,319 is a continuation of application No. 12/463,040, filed on May 8, 2009, now Pat. No. 7,880,497, which is a continuation of application No. 11/766,310, filed on Jun. 21, 2007, now Pat. No. 7,548,084, which is a continuation-in-part of application No. 11/471,832, filed on Jun. 21, 2006, now Pat. No. 7,427,871, said application No. 12/785,433 is a continuation of application No. 12/131,896, filed on Jun. 2, 2008, now Pat. No. 7,750,672, which is a continuation of application No. 11/765,986, filed on Jun. 20, 2007, now Pat. No. 7,397,275, which is a continuation-in-part of application No. 11/471,832, filed on Jun. 21, 2006, now Pat. No. 7,427,871, and a continuation-in-part of application No. 11/471,875, filed on Jun. 21, 2006, now Pat. No. 7,429,870, said application No. 11/766,310 is a continuation-in-part of application No. 11/471,875, filed on Jun. 21, 2006, now Pat. No. 7,429,870.

(60) Provisional application No. 61/376,615, filed on Aug. 24, 2010, provisional application No. 61/376,659, filed on Aug. 24, 2010, provisional application No. 61/376,662, filed on Aug. 24, 2010, provisional application No. 61/376,666, filed on Aug. 24, 2010, provisional application No. 61/376,672, filed on Aug. 24, 2010.

(51) Int. Cl.
*H03K 19/173* (2006.01)
*G06F 12/00* (2006.01)

(52) U.S. Cl. ............... 326/40; 326/46; 326/38; 326/39; 711/154; 711/170

(58) Field of Classification Search ............ 326/37–41, 326/46; 711/5, 154, 170
See application file for complete search history.

(56) References Cited

U.S. PATENT DOCUMENTS 8,072,239 B2 * 12/2011 Kelem et al. ............... 326/40
2012/0126850 A1 * 5/2012 Wasson et al. ............. 326/38

* cited by examiner

*Primary Examiner* — Vibol Tan
(74) *Attorney, Agent, or Firm* — Nancy R. Gamburd; Gamburd Law Group LLC

(57) ABSTRACT

The exemplary embodiments provide a reconfigurable integrated circuit capable of on-chip configuration and reconfiguration, comprising: a plurality of configurable composite circuit elements; a configuration and control bus; a memory; and a sequential processor. Each composite circuit element comprises: a configurable circuit; and an element interface and control circuit, the element interface and control circuit comprising an element controller and at least one configuration and control register to store one or more configuration and control words. The configuration and control bus is coupled to the plurality of configurable composite circuit elements, and comprises a plurality of address and control lines and a plurality of data lines. The sequential processor can write configurations to the configuration and control registers of an addressed configurable composite circuit element to configure or reconfigure the configurable circuit.

50 Claims, 41 Drawing Sheets

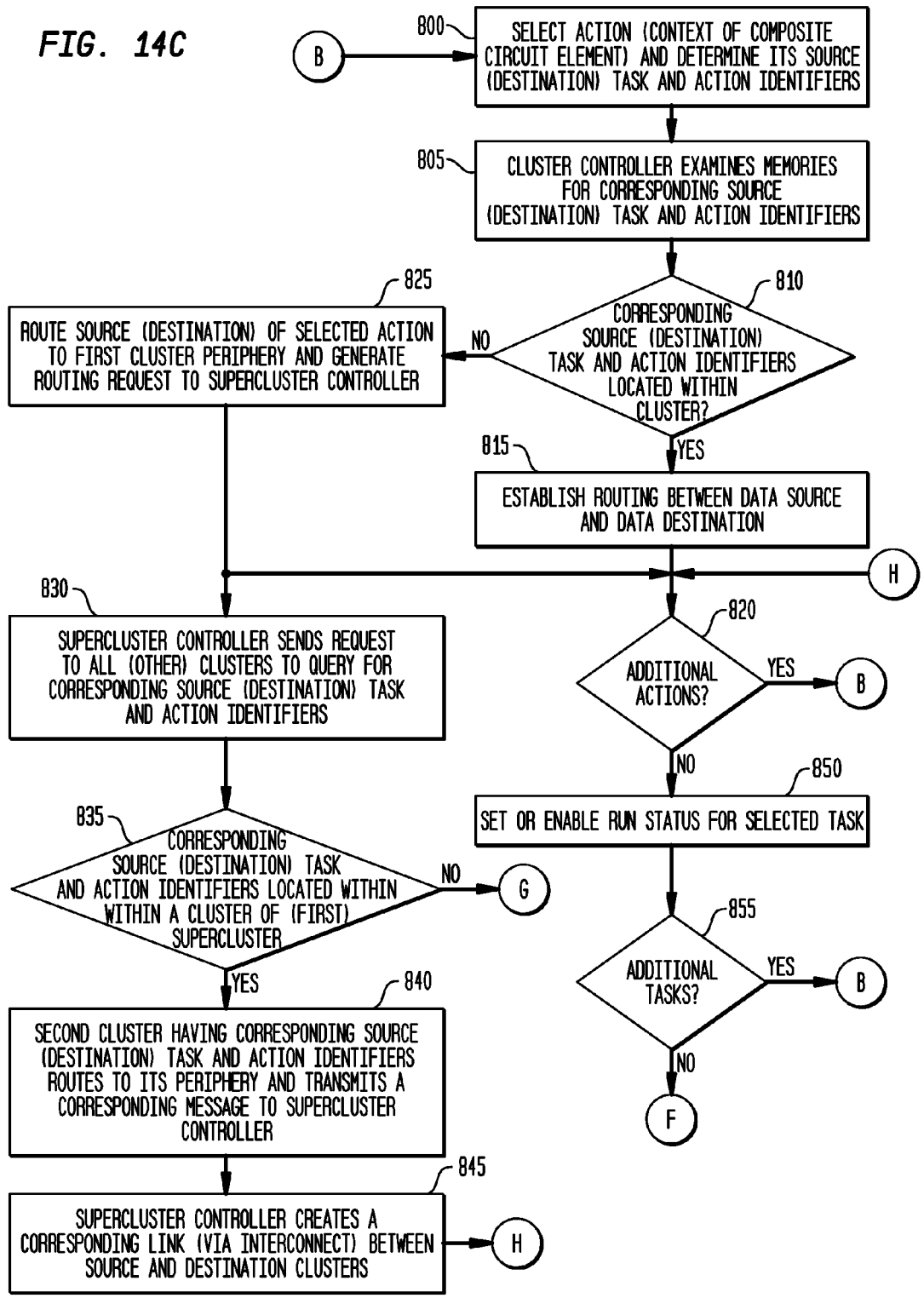

FIG. 16B

| SOURCE | SI | CONSTANT | STATUS | MAXIMUM LENGTH | LENGTH | RESET |
|---|---|---|---|---|---|---|
| 1139 | 1141 | 1143 | 1145 | 1147 | 1149 | 1151 |

| SOURCE | SO | 00 MAPPING | 00 LEAD | 00 NEXT | 00 LAST | RESET |
|---|---|---|---|---|---|---|
| 1162 | 1164 | 1166 | 1168 | 1172 | 1174 | 1176 |

1160

RECONFIGURABLE INTEGRATED CIRCUIT ARCHITECTURE WITH ON-CHIP CONFIGURATION AND RECONFIGURATION

CROSS-REFERENCE TO RELATED APPLICATIONS

This application is a conversion of and claims priority to: (1) Kelem, Steven Hennick et al., U.S. Provisional Patent Application Ser. No. 61/376,615, filed Aug. 24, 2010, entitled "Hierarchically Scalable Reconfigurable DDM Architecture With Unit-Delay Modules"; (2) Kelem, Steven Hennick et al., U.S. Provisional Patent Application Ser. No. 61/376,659, filed Aug. 24, 2010, entitled "Hierarchically Extensible Reconfigurable Zones in a Resilient Device Architecture"; (3) Kelem, Steven Hennick et al., U.S. Provisional Patent Application Ser. No. 61/376,662, filed Aug. 24, 2010, entitled "Multi-Context Memory Management Unit"; (4) Kelem, Steven Hennick et al., U.S. Provisional Patent Application Ser. No. 61/376,666, filed Aug. 24, 2010, entitled "On-Chip Configuration"; and (5) Kelem, Steven Hennick et al., U.S. Provisional Patent Application Ser. No. 61/376,672, filed Aug. 24, 2010, entitled "Data-Driven Integrated Circuit Architecture"; which are commonly assigned herewith, the contents of which are incorporated herein by reference with the same full force and effect as if set forth in their entireties herein, and with priority claimed for all commonly disclosed subject matter.

This application is a continuation-in-part of and claims priority to Kelem, Steven Hennick et al., U.S. patent application Ser. No. 12/977,319, filed Dec. 23, 2010, entitled "Fault Tolerant Integrated Circuit Architecture", which is a continuation of and claims priority to Kelem, Steven Hennick et al., U.S. patent application Ser. No. 12/463,040, filed May 8, 2009 and now U.S. Pat. No. 7,880,497 issued Feb. 1, 2011, entitled "Fault Tolerant Integrated Circuit Architecture", which is a continuation of and claims priority to Kelem, Steven Hennick et al., U.S. patent application Ser. No. 11/766,310, filed Jun. 21, 2007 and now U.S. Pat. No. 7,548,084 issued Jun. 16, 2009, entitled "Fault Tolerant Integrated Circuit Architecture", which is a continuation-in-part of and claims priority to Kelem, Steven Hennick et al., U.S. patent application Ser. No. 11/471,832, filed Jun. 21, 2006 and now U.S. Pat. No. 7,427,871 issued Sep. 23, 2008, entitled "Fault Tolerant Integrated Circuit Architecture", which are commonly assigned herewith, the contents of all of which are incorporated herein by reference with the same full force and effect as if set forth in their entireties herein, and with priority claimed for all commonly disclosed subject matter.

This application is also a continuation-in-part of Steven Hennick Kelem et al., U.S. patent application Ser. No. 12/785,433, filed May 22, 2010, and now U.S. Pat. No. 8,072,239 issued Dec. 6, 2011, entitled "Element Controller for a Resilient Integrated Circuit Architecture", which is continuation of Steven Hennick Kelem et al., U.S. patent application Ser. No. 12/131,896, filed Jun. 2, 2008 and issued Jul. 6, 2010 as U.S. Pat. No. 7,750,672, entitled "Element Controller for a Resilient Integrated Circuit Architecture", which is a continuation of Steven Hennick Kelem et al., U.S. patent application Ser. No. 11/765,986, filed Jun. 20, 2007 and issued Jul. 8, 2008 as U.S. Pat. No. 7,397,275, entitled "Element Controller for a Resilient Integrated Circuit Architecture", which is a continuation-in-part of and claims priority to Steven Hennick Kelem et al., U.S. patent application Ser. No. 11/471,832, filed Jun. 21, 2006 and issued Sep. 23, 2008 as U.S. Pat. No. 7,427,871, entitled "Fault Tolerant Integrated Circuit Architecture" and which is a continuation-in-part of and claims priority to Kelem, Steven Hennick et al., U.S. patent application Ser. No. 11/471,875, filed Jun. 21, 2006 and now U.S. Pat. No. 7,429,870 issued Sep. 30, 2008, entitled "Resilient Integrated Circuit Architecture", which are commonly assigned herewith, the contents of all of which are incorporated herein by reference with the same full force and effect as if set forth in their entireties herein, and with priority claimed for all commonly disclosed subject matter.

The U.S. patent application Ser. No. 11/766,310, filed Jun. 21, 2007 and now U.S. Pat. No. 7,548,084 issued Jun. 16, 2009 is also a continuation-in-part of and claims priority to Kelem, Steven Hennick et al., U.S. patent application Ser. No. 11/471,875, filed Jun. 21, 2006 and now U.S. Pat. No. 7,429,870 issued Sep. 30, 2008, entitled "Resilient Integrated Circuit Architecture", which is commonly assigned herewith, the contents of all of which are incorporated herein by reference with the same full force and effect as if set forth in its entirety herein, and with priority claimed for all commonly disclosed subject matter.

FIELD OF THE INVENTION

The present invention relates, in general, to integrated circuits and, more particularly, to integrated circuitry having distributed and configurable circuit elements, distributed communication circuit elements, and distributed control circuit elements.

BACKGROUND OF THE INVENTION

Historically, integrated circuits ("ICs") which are configurable post-fabrication have been dominated by field programmable gate arrays ("FPGAs"), which provide an array of identical logic gates or other elements. In some integrated circuit embodiments, the gate array is also coupled to one or more microprocessor cores, for the FPGA components to provide configurable, application-specific acceleration of selected computations. The logic elements in an FPGA are typically very "fine-grained", as gate arrays which can be connected through data inputs and outputs ("I/O") to provide a more advanced function such as addition, subtraction or comparison, without separate hard-wired, application-specific components directly providing such advanced functions. The process for creating the configurations for the gate arrays of FPGAs is comparatively slow, especially so for determining whether any given configuration meets timing requirements, so that FPGAs generally have not been capable of real-time reconfiguration for immediate changes in functionality, as such timing cannot be guaranteed.

In other circumstances, configurable ICs have involved large-scale (or "coarse-grained" configurable logic elements which are capable of significant functionality, such as multimedia processing, arithmetic processing, and communication functionality. While these large-scale configurable logic elements provide extremely capable acceleration, each group of configurable logic elements is typically different and requires separate programming to carry out its functions. In addition, such large-scale configurable logic elements are not translatable to other functions, exhibiting similar constraints of application-specific ICs ("ASICs").

Configurable capabilities have also been added to microprocessor, ASIC and memory ICs. For example, in memory ICs, extra or redundant rows and columns are fabricated; when subsequent testing may reveal that selected rows and columns have defects, those affected IC regions are disabled, with the balance of the memory IC being useable potentially and, with the redundancy, may still meet the memory capacity specification. In other circumstances, some amount of configurability may be added to correct for design errors and other defects after the IC has been fabricated, or to allow modification of inputs and outputs, such as for configurable I/O and configurable data path widths.

These other configurable architectures also do not scale well, for a variety of reasons. In some instances, interior regions of the IC become starved for resources, as the exterior regions consume all of the input/output (I/O) capability. In other instances, communication within the IC becomes problematic.

These configurable architectures may also exhibit timing unpredictability and a corresponding inability to provide a timing closure. For example, recompiling the same netlist may result in different timing delays. Accordingly, a system designer may not be able to know in advance if a particular mapping, placement and routing will meet system requirements until the mapping, placement and routing has been performed, which is a very time-consuming process with high configuration variability.

Accordingly, a need remains for a configurable IC architecture which can be readily configured and reconfigured, with predictable timing closure. In addition, such an architecture should be readily scalable to create larger architectures for selected applications.

In addition, after configuration and during operation, such FPGAs, ASICs, processors, and other configurable logic do not exhibit resiliency. For example, if a portion of the IC becomes defective during operation, the entire IC fails instantly, losing all functionality. While the IC may be taken off line or removed, diagnosed, and depending upon the damage, possibly reconfigured, such ICs are not capable of real-time reconfiguration and transferring of functionality to unaffected portions of the IC.

These known technologies, however, do not address the increasing number of defects which are now arising in sub-100 nm IC fabrication. More particularly, as IC feature size continues to decrease below 90 nm, there are increasing levels of defects and decreased IC yields. In addition, while an IC initially may be sufficiently free of defects to operate for its intended use, the smaller feature size also increases the probability of IC failure during operation, such as due to tunneling and electromigration effects.

In addition, while each of these prior art technologies have their own advantages, such as an ability to correct design flaws and to work-around minor fabrication defects, none of these prior art technologies provide sustainable resiliency over time, during IC operation. Whether defects were created during fabrication or much later, during IC usage, these known technologies simply cannot accommodate both certain kinds of defects and certain levels of defects, and the entire IC fails completely. Such failure is often catastrophic, such that the entire IC fails instantly and without warning. For example, if a region of a microprocessor fails, the entire microprocessor becomes instantly useless.

To attempt to provide some level of resiliency, these various technologies have simply added some redundancy. For example, multiple processors will be placed on the same IC, such that if a defect causes one processor to fail, a redundant processor is available to take over. In these circumstances, however, either the redundant processor was previously completely idle and unused, or its prior functioning has been superseded and completely lost. In either event, this resiliency is at the expense of approximately twice the IC area and significantly increased manufacturing costs. In addition, such basic redundancy efforts do not account for defects which may occur within all redundant components, as even small defects may cause such components to fail.

As a consequence, a need remains for an integrated circuit architecture which is significantly resilient and robust despite fabrication or usage defects which can affect any components, without the expense of otherwise unused redundancy. Such an IC should provide for ongoing adaptation, such that when a defect arises, functionality may be transferred to an unaffected region in real-time or near-real time. Such technology should provide for configuration (programming or other software) for the IC which allows such transferable functionality, without requiring the entire program to be transferred to a completely redundant processor. In addition, such an IC should provide for a graceful degradation with increasing defects or problems, rather than a catastrophic failure.

SUMMARY OF THE INVENTION

The exemplary embodiments of the present invention provide an integrated circuit architecture which is scalable and repeatable. Exemplary embodiments provide for "unit delay" timing within isochronous zones and for unit delay timing between zones. As a consequence, timing closure is known and repeatable once configurations are mapped and bound in the exemplary apparatus. Exemplary architectures are also scalable and repeatable, up to the practical or physical limits of an IC fabrication technology.

Exemplary embodiments are also "data driven", in which incoming data is utilized to control execution of operations. Highly novel in a data flow architecture, the exemplary embodiments provide for a high degree of control of data flow operations, including partial execution, conditional execution, execution ordering, and data output ordering. In addition, exemplary embodiments also utilize "back pressure" to optimize use of resources and provide data integrity.

Other illustrated embodiments provide circuitry, communication and control which allows and provides for on-chip configuration capabilities, including reconfiguration and partial reconfiguration during run-time.

Exemplary embodiments are also illustrated for configurable memory control which allows multi-threaded and multi-context execution, allowing multiple concurrent read and write operations directly from a configurable full interconnect communication channel.

Exemplary embodiments also provide an integrated circuit architecture which is capable of significant resiliency, without otherwise unused redundancy. The exemplary IC embodiment may be adapted on an ongoing basis, as may be necessary in the event of a defect, or as may be desirable for incorporation of a new program or function. For example, in the event a defect arises, functionality may be transferred to an unaffected region in real-time or near-real time. The exemplary architecture and software for the IC also allows such transferable functionality, without requiring the entire program to be transferred to a completely redundant processor or otherwise unused computational block. In addition, the exemplary IC embodiments provide for a graceful degradation and notification with increasing defects or problems, which may occur during use (in addition to fabrication), rather than a catastrophic failure.

An exemplary embodiment provides a reconfigurable integrated circuit capable of on-chip configuration and reconfiguration, with the integrated circuit comprising: a plurality of configurable composite circuit elements, a configuration and control bus coupled to the plurality of configurable composite circuit elements, a memory; and a sequential processor coupled to the configuration and control bus and to the memory. Each composite circuit element comprises: a configurable circuit; and an element interface and control circuit, with the element interface and control circuit comprising an element controller and at least one configuration and control register, the at least one configuration and control register to store one or more configuration and control words. The configuration and control bus comprises a plurality of address and control lines and a plurality of data lines. The sequential processor, in turn, may write a first configuration to the at least one configuration and control register of an addressed first configurable composite circuit element to configure or reconfigure the configurable circuit.

In an exemplary embodiment, the sequential processor may write a data source address to the at least one configuration and control register for the addressed first configurable composite circuit element to provide input data routing; and further may write a data source address of the addressed first configurable composite circuit element to one or more configuration and control registers of other configurable composite circuit elements to provide output data routing for the addressed first configurable composite circuit element.

In various exemplary embodiments, the sequential processor may read the first configuration and the data source address from the memory and transfer the first configuration and the data source address to the addressed first configurable composite circuit element over the configuration and control bus. The sequential processor may generate the first configuration, and/or may generate the data source address.

In exemplary embodiments, the integrated circuit may further comprise: a message-based interconnect bus to transfer a plurality of messages, each message comprising control information and a data payload; and a message manager circuit coupled to the message-based interconnect bus, to the configuration and control bus, and to the memory, the message manager circuit to receive and interpret the plurality of messages. When the data payload is a second configuration, the message manager circuit may write the second configuration to at least one configuration and control register of an addressed second configurable composite circuit element to configure or reconfigure the configurable circuit element of the addressed second configurable composite circuit element. The message manager circuit further may write a second data source address to the at least one configuration and control register of the addressed second configurable composite circuit element to provide input data routing for the addressed second configurable composite circuit element. When the data payload is a configuration, the message manager circuit further may write the configuration to the memory, and when the data payload is application data, the message manager circuit further may write the application data to the memory or transfer the application data to a configurable composite circuit element or to the sequential processor. The message manager circuit may transmit a message to or receive a message from an absolute address, an application-specified address, or a data path-specified address, for example. In addition, the message manager circuit may transmit a message to or receive a message independently of the sequential processor or a host processor, and may generate and transmit an acknowledgment message automatically upon reception of a message. The sequential processor and/or the message manager circuit also may read a configuration from one or more configuration and control registers of an addressed third composite circuit element. Also in addition, the message-based interconnect bus may be coupled to an integrated circuit input and output to receive and transmit a plurality of messages from and to the integrated circuit.

In various exemplary embodiments, the sequential processor and/or the message manager circuit also may further may broadcast configuration data over the configuration and control bus to the plurality of composite circuit elements. Also in various exemplary embodiments, each configurable composite circuit element has a plurality of contexts, and the sequential processor and/or the message manager circuit also may write a configuration and control data to the at least one configuration and control register for a first context of the addressed first configurable composite circuit element, the control data comprising a task identifier of a plurality of tasks. The sequential processor and/or the message manager circuit also may further may concurrently enable a plurality of contexts of a plurality of configurable composite circuit elements by broadcasting second control information over the configuration and control bus, the second control information having the task identifier and an enable run status. The sequential processor and/or the message manager circuit also may suspend a task by broadcasting second control information over the configuration and control bus, the second control information having the task identifier and a halt run status.

In an exemplary embodiment, the sequential processor may move a task by broadcasting second control information over the configuration and control bus, the second control information having the task identifier and a halt run status; the sequential processor may write a second configuration, a data source address, a data source context and the task identifier to a one or more configuration and control registers for a second context of an addressed second configurable composite circuit element to configure or reconfigure the configurable circuit and provide input data routing for the second context of the addressed configurable composite circuit element; and the sequential processor further may write a data source address and a data source context of the second context of the addressed second configurable composite circuit element to one or more configuration and control registers of other configurable composite circuit elements to provide output data routing for the second context of the addressed second configurable composite circuit element.

In various exemplary embodiments, an initial configuration and data routing is transferred from an external source into the integrated circuit and is stored in the memory, and the sequential processor subsequently may write a second configuration to at least one configuration and control register for the addressed first configurable composite circuit element to reconfigure the configurable circuit without involvement of the external source. In another exemplary embodiment, an initial configuration and data routing is transferred from an external source into the integrated circuit and is stored in the memory, and the sequential processor subsequently may write a second configuration to at least one configuration and control register for the addressed first configurable composite circuit element to reconfigure the configurable circuit without involvement of a non-volatile memory storing configurations. For example and without limitation, an external or internal read-only memory storing configurations and locations for the configurations is not required for on-chip configuration and reconfiguration. In addition, once an initial configuration and data routing is provided to the integrated circuit, the integrated circuit is fully capable of reconfiguring, without involvement of any device or input external to the chip.

Another exemplary embodiment provides an integrated circuit capable of on-chip configuration and reconfiguration, with the integrated circuit comprising: a plurality of configurable composite circuit elements, a configuration and control bus coupled to the plurality of configurable composite circuit elements, a memory; and a message manager circuit.

Each composite circuit element has a plurality of contexts and comprises a configurable circuit and an element interface and control circuit, the element interface and control circuit comprising an element controller and one or more configuration and control registers, with the one or more configuration and control registers storing a configuration and control word for each context of the plurality of contexts. The configuration and control bus comprises a plurality of address and control lines and a plurality of data lines. The message manager circuit is coupled to the configuration and control bus and to the memory, and the message manager circuit may write a first configuration, a data source address and a data source context to the one or more configuration and control registers for a first context of an addressed first configurable composite circuit element to configure or reconfigure the configurable circuit for the first context of the addressed first configurable composite circuit element and to provide input data routing for the first context of the addressed first configurable composite circuit element.

In an exemplary embodiment, the message manager circuit further may write a data source address and a data source context of the first context of the addressed first configurable composite circuit element to one or more configuration and control registers of other configurable composite circuit elements to provide output data routing for the first context of the addressed first configurable composite circuit element.

In another exemplary embodiment, the sequential processor may write a first configuration to the one or more configuration and control registers for a first context of an addressed first configurable composite circuit element to configure or reconfigure the configurable circuit for the first context of the addressed first configurable composite circuit element; and the message manager circuit may write a second configuration to the one or more configuration and control registers for a second context of an addressed second configurable composite circuit element to configure or reconfigure the configurable circuit for the second context of the addressed second configurable composite circuit element.

In another exemplary embodiment, a reconfigurable integrated circuit comprises a plurality of zones, with each zone of the plurality of zones comprising: a plurality of composite circuit elements, each composite circuit element comprising: a configurable circuit element circuit and an element interface and control circuit, the element interface and control circuit comprising an input queue and an output queue; a plurality of cluster queues, each cluster queue comprising an element interface and control having an input queue and an output queue; and a first full interconnect bus coupling every output queue within the zone to every input queue within the zone; wherein any data operation performed by a composite circuit element, any data word transfer through a cluster queue, and any data word transfer over the first full interconnect bus, is completed within a predetermined unit time delay which is independent of application placement and application data routing. In an exemplary embodiment, the predetermined unit time delay is further independent of application implementation and application compilation to the plurality of composite circuit elements.

In an exemplary embodiment, a first cluster queue has an input queue coupled to the first full interconnect bus and an output queue coupled to a second full interconnect bus of an adjacent or diagonally adjacent zone of the plurality of zones, and wherein a second cluster queue has an input queue coupled to the second full interconnect bus and an output queue coupled to the first full interconnect bus, and wherein any data word transfer from the output queue of the first cluster queue to any input queue coupled to the second full interconnect bus is completed within the predetermined unit time delay.

In an exemplary embodiment, the first full interconnect bus comprises: a plurality of source data lines for transmission of a source identification and a source context identification; a plurality of application data lines; and a plurality of control lines for transmission of a data valid signal on a first control line, a data deny signal on a second control line, and a data retry signal on a third control line. The first full interconnect bus may further comprise a plurality of tag data lines coupled to the plurality of input queues and plurality of output queues. In an exemplary embodiment, each element interface and control further comprises: an input controller coupled to the input queue and further coupled to the plurality of source data lines and plurality of control lines; and an output controller coupled to the output queue and further coupled to the plurality of source data lines and plurality of control lines.

In an exemplary embodiment, within the predetermined unit time delay, an output queue is to broadcast output data over the first full interconnect bus to all input queues coupled to the first full interconnect bus and an output controller is to concurrently broadcast a data valid signal. In addition, each input controller is to assert a data deny signal within the same predetermined unit time delay on the second control line when an input queue for the context identified on the source data lines is unable to accept input data. When a data deny signal is received, an output controller at a later time is to transmit a data retry signal on the third control line and to provide for the output queue to rebroadcast the output data within the predetermined unit time delay.

In an exemplary embodiment, the integrated circuit may further comprise: a first message manager circuit; and a configuration and control bus coupled to the first message manager circuit. Each element interface and control may further comprise one or more configuration and control registers coupled to the configuration and control bus; and an element controller or a queue controller. In an exemplary embodiment, any data word transfer over the configuration and control bus to or from the first message manager circuit is completed within the predetermined unit time delay. In addition, any data word transfer to or from the sequential processor over any of the configuration and control bus, the first full interconnect bus, or to the first message manager circuit, is completed within the predetermined unit time delay.

In an exemplary embodiment, the integrated circuit may further comprise: a random access memory; and a memory composite circuit element coupled to the random access memory, the sequential processor, the first message manager circuit, and the first full interconnect bus, the memory composite circuit element to perform a plurality of concurrent read and write operations and complete a transfer of a data word over the first full interconnect bus within the predetermined unit time delay.

In an exemplary embodiment, the integrated circuit may further comprise: a first message-based interconnect bus coupled to the first message manager circuit; a first message repeater circuit coupled to the first message-based interconnect; a second message manager circuit; and a second message-based interconnect bus coupled to the second message manager circuit and to the first message repeater circuit. In an exemplary embodiment, any data word transfer over the first or second message-based interconnect bus between the first message repeater circuit and the first and second message manager circuits is completed within the predetermined unit time delay. In an exemplary embodiment, the integrated circuit may further comprise: a second message repeater circuit;

and a second message-based interconnect bus coupled to the second message repeater circuit and to the first message repeater circuit. In an exemplary embodiment, any data word transfer between the second message repeater circuit and the first message repeater circuit over the second message-based interconnect bus is completed within the predetermined unit time delay.

Also in an exemplary embodiment, any timing of an application of the reconfigurable integrated circuit is independent of any task placement within any selected zone and independent of task data routing within the selected zone of the plurality of zones. In an exemplary embodiment, any task data routing between adjacent zones of the plurality of zones, for each data word transfer, adds the predetermined unit time delay to the application timing. In an exemplary embodiment, any data word transfer through a cluster queue between adjacent zones or between diagonally adjacent zones of the plurality of zones is completed within the predetermined unit time delay.

In various exemplary embodiments: each input queue of a cluster queue within the zone is write-enabled and clocked using a first clock and each output queue of the cluster queue coupled to an adjacent zone is read-enabled and clocked using a second clock; or each input queue of a cluster queue within the zone is write-enabled and clocked using a first clock and each output queue of the cluster queue coupled to an adjacent zone is clocked using the first clock and is read-enabled using a second clock; or the plurality of composite circuit elements are clocked using a first clock, the input queues of the plurality of cluster queues are clocked using the first clock, and the output queues of the plurality of cluster queues are clocked using a second clock; or the plurality of composite circuit elements and plurality of cluster queues are clocked using a first clock, the input queues of the plurality of cluster queues write-enabled using the first clock, and the output queues of the plurality of cluster queues read-enabled using a second clock.

In various exemplary embodiments, a first zone of the plurality of zones is tiled next to an adjacent second zone and next to a diagonally adjacent third zone of the plurality of zones, and a first cluster queue of the plurality of cluster queues completes any data word transfer between the first full interconnect bus of the first zone and a second full interconnect bus of the second zone within the predetermined unit time delay, and a second cluster queue of the plurality of cluster queues completes a data word transfer between the first full interconnect bus of the first zone and a third full interconnect bus of the third zone within the predetermined unit time delay.

Also in various exemplary embodiments, a scaled and extended integrated circuit further comprises: the plurality of zones coupled adjacent and diagonally adjacent to each other through the plurality of cluster queues; a random access memory; a memory composite circuit element coupled to the random access memory; a configuration and control bus coupled to the plurality of composite circuit elements; a message manager circuit coupled to the configuration and control bus and to the memory composite circuit element; a sequential processor coupled to the configuration and control bus, the message manager circuit, and the memory composite circuit element; a first message repeater circuit; and a message-based interconnect bus coupled to the first message manager circuit and the message repeater circuit and couplable to a second message manager circuit.

In another exemplary embodiment, a reconfigurable integrated circuit comprises: a message manager circuit; a sequential processor; a configuration and control bus coupled to the message manager circuit and to the sequential processor; a plurality of circuit zones, each circuit zone of the plurality of circuit zones comprising: a plurality of composite circuit elements coupled to the configuration and control bus, each composite circuit element comprising: a configurable circuit element circuit and an element interface and control circuit, the element interface and control circuit comprising an input queue and an output queue; a first full interconnect bus coupling every output queue within the circuit zone to every input queue within the circuit zone; and a plurality of cluster queues coupled to the configuration and control bus, each cluster queue configurable and comprising an element interface and control having an input queue and an output queue, each cluster queue further coupled to the first full interconnect bus and further coupled to a second full interconnect bus of an adjacent zone or a diagonally adjacent zone of the plurality of zones; wherein any data operation performed by a composite circuit element, any data word transfer through a cluster queue, any data word transfer over the first full interconnect bus, and any data word transfer over the configuration and control bus, is completed within a predetermined unit time delay which is independent of both application placement and application data routing within the reconfigurable integrated circuit.

In an exemplary embodiment, the reconfigurable integrated circuit may further comprise: a message-based interconnect; a plurality of message repeater circuits coupled to the message-based interconnect; a plurality of circuit clusters, each circuit cluster comprising: a first communication circuit coupled to the message-based interconnect; a sequential processor; a configuration and control bus coupled to the first communication circuit and to the sequential processor; a plurality of composite circuit elements, each composite circuit element having a plurality of contexts configurable for data operations, each composite circuit element comprising an input queue and an output queue; a plurality of cluster queues, each cluster queue comprising an input queue and an output queue; a plurality of full interconnect busses, each full interconnect bus of the plurality of full interconnect busses coupling every output queue to every input queue within a corresponding region of the circuit cluster; wherein any data operation performed by a composite circuit element, any data word transfer through a cluster queue, any data word transfer over the first full interconnect bus, any data word transfer over the configuration and control bus, and any data word transfer between a first communication circuit and a first message-repeater circuit over the message-based interconnect bus, is completed within a predetermined unit time interval which is independent of application placement, application data routing, and application implementation on the reconfigurable integrated circuit.

In another exemplary embodiment, an integrated circuit comprises: a configurable circuit element configurable for a plurality of data operations, each data operation corresponding to a context of a plurality of contexts; a plurality of input queues; a plurality of output queues; one or more configuration and control registers to store, for each context of the plurality of contexts, a plurality of configuration bits, a run status bit, and a plurality of bits designating at least one data input queue and at least one data output queue; an element controller coupled to the configurable circuit element and to the one or more configuration and control registers, the element controller to allow loading of a context configuration and execution of a data operation upon the arrival of input data in the context-designated data input queue when the context run status is enabled and the context-designated data output queue has a status to accept output data.

In various exemplary embodiments, the one or more configuration and control registers further store, for each context of the plurality of contexts, a plurality of execution context chaining bits designating a lead context and a next context, and wherein the element controller further to sequence execution of a plurality of data operations in an order determined by the plurality of execution context chaining bits. Also in various exemplary embodiments, the integrated circuit may further comprise: an input controller coupled to the context-designated input queue; wherein when the context-designated data input queue does not have a status to accept data for the selected context, the input controller is to issue a data deny signal to a source of the input data. Also in various exemplary embodiments, the integrated circuit may further comprise: an output controller coupled to the context-designated output queue; wherein when the output controller receives a data deny signal following a first data broadcast, the output controller at a later time to direct a second data broadcast and issue a data retry signal.

In an exemplary embodiment, a second circuit may be coupled to the configuration and control register, the second circuit to enable the run status for each context of the plurality of contexts. In various exemplary embodiments, the second circuit is a message manager circuit and/or a sequential processor.

In various exemplary embodiments, the element controller further may not allow the data operation to execute unless a condition has been met or unless a state ready status has been enabled.

In an exemplary embodiment, the element controller further may configure the configurable circuit element for the plurality of data operations using the plurality of configuration bits stored in the one or more configuration and control registers, and the one or more configuration and control registers further store, for each context of the plurality of contexts, a designated data source address and a data source context.

In an exemplary embodiment, the integrated circuit may further comprise: an input controller; wherein the input controller is to compare a received data source address and source context with the context-designated data source address and data source context and, when the received data source address and data source context match the context-designated data source address and data source context, to allow input of data into the context-designated input queue. Also in various exemplary embodiments, the integrated circuit may further comprise: an input controller; and a full interconnect bus comprising a plurality of data lines and a plurality of control lines, the plurality of control lines coupled to the input controller and the plurality of data lines coupled to the plurality of input queues; wherein the input controller is to compare a data source address and source context broadcast on the plurality of control lines of the full interconnect bus with the context-designated data source address and data source context and, when the broadcast data source address and data source context match the context-designated data source address and data source context, to allow input of data into the context-designated input queue.

In various exemplary embodiments, the element controller further may select a context-designated output of a plurality of outputs of a plurality of configurable circuit elements; may provide for the configurable circuit element to execute the data operation using input data as a constant; may provide for the configurable circuit element to execute the data operation only once until a control signal is received; and may generate an interrupt signal. In an exemplary embodiment, the one or more configuration and control registers may further store, for each context of the plurality of contexts, a plurality of output context chaining bits designating a lead output context and a next output context, and further comprising: an output controller, the output controller to sequence broadcast of output data in an order determined by the plurality of output context chaining bits. The one or more configuration and control registers may further store: for a first context of the plurality of contexts, a plurality of output mapping bits designating that a data output broadcast is to be identified as a second, different context; for each context of the plurality of contexts, a plurality of bits designating a merger of input queue contexts; for each context of the plurality of contexts, a plurality of bits designating a depth of the context-designated input queue.

In various exemplary embodiments, the element controller further may arbitrate among a plurality of data operations, or among a corresponding plurality of contexts, which are ready for execution, wherein the arbitration is at least one of the following arbitration methods: a round-robin, a priority, a most recently executed, a least recently executed, a scheduled execution, or a concurrent execution. The element controller further may provide for conditional data output based upon a result of the data operation; and may provide for non-consumption of input data for the data operation. The element controller may be comprised of combinatorial logic gates, or combinatorial logic gates and a finite state machine, for example and without limitation.

When the configurable circuit element is a memory circuit element, the element controller further may provide for a plurality of substantially concurrent memory read and memory write data operations; may provide for a plurality of substantially concurrent read operations from the plurality of data inputs or a plurality of substantially concurrent write operations to the plurality of data outputs; and may allow execution of a memory read or write operation without a context-designated data input queue and without a context-designated data output queue.

In various exemplary embodiments, element controller further may: determine whether a selected data input is a context-designated data input and determine whether a selected data output is a context-designated data output based upon an occurrence of a condition or based upon a result of a selected data operation; switch from a first context and allow loading of a second context configuration and execution of a second context data operation upon the arrival of input data in the data input queue designated for the second context; allow loading of the context configuration and execution of a data operation only upon the arrival of input data in all of the context-designated data input queues when the context run status is enabled and all of the context-designated data output queues have a status to accept output data; allow loading of the context configuration and an initial execution of a data operation and, when input data has not arrived in the context-designated data input queue, further is to halt a completion of the data operation; may allow a partial execution of a data operation and storage of interim results in a memory; and not allow loading of the context configuration and execution of a data operation when the context run status is set to suspend, or set to halt, or set to free.

In another exemplary embodiment, an integrated circuit, comprises: a configurable circuit element configurable for a plurality of data operations, each data operation corresponding to a context of a plurality of contexts; a plurality of input queues; a plurality of output queues; at least one configuration and control register to store, for each context of the plurality of contexts, a plurality of configuration bits, a run status bit, a plurality of bits designating a data source address and a data source context, and a plurality of bits designating at least one data input queue and at least one data output queue; an input controller to allow input of data into the context-designated input queue when a received data source address and data source context match the context-designated data source address and data source context; and an element controller coupled to the configurable circuit element and to the at least one configuration and control register, the element controller to allow loading of a context configuration and execution of a data operation upon the arrival of input data in the context-designated data input queue when the context run status is enabled and the context-designated data output has a status to accept output data.

In another exemplary embodiment, an integrated circuit comprises: a configurable circuit element configurable for a plurality of data operations, each data operation corresponding to a context of a plurality of contexts; a plurality of input queues; a plurality of output queues; at least one configuration and control register to store, for each context of the plurality of contexts, a plurality of configuration bits, a run status bit, and a plurality of bits designating at least one data input queue and at least one data output queue; an input controller coupled to the plurality of input queues, the input controller is to issue a data deny signal to a source of the input data when the context-designated data input queue does not have a status to accept data for the selected context; an output controller coupled to the plurality of output queues, and when the output controller receives a data deny signal following a first data broadcast, the output controller to direct a second data broadcast and issue a data retry signal at a later time; and an element controller coupled to the configurable circuit element and to the at least one configuration and control register, the element controller to allow loading of a context configuration and execution of a data operation upon the arrival of input data in the context-designated data input queue when the context run status is enabled and the context-designated data output has a status to accept output data.

In various exemplary embodiments, an integrated circuit comprises: a configurable circuit element configurable for a plurality of data operations, each data operation corresponding to a context of a plurality of contexts; a plurality of input queues; a plurality of output queues; at least one configuration and control register to store, for each context of the plurality of contexts, a plurality of configuration bits, a run status bit, and a plurality of bits designating at least one data input queue and at least one data output queue; an element controller coupled to the configurable circuit element and to the at least one configuration and control register, the element controller to allow loading of a context configuration and partial or conditional execution of a data operation upon the arrival of input data in the context-designated data input queue when the context run status is enabled and the context-designated data output queue has a status to accept output data.

Another exemplary embodiment provides a multi-context configurable memory controller, the multi-context configurable memory controller couplable to a random access memory, the multi-context configurable memory controller comprising: an input-output data port array comprising a plurality of input queues and a plurality of output queues; at least one configuration and control register to store, for each context of a plurality of contexts, a plurality of configuration bits; a configurable circuit element configurable for a plurality of data operations, each data operation corresponding to a context of a plurality of contexts, the plurality of data operations comprising memory address generation, memory write operations, and memory read operations, the configurable circuit element comprising a plurality of configurable address generators; and an element controller coupled to the configurable circuit element, the element controller comprising a port arbitration circuit to arbitrate among a plurality of contexts having a ready-to-run status, and the element controller to allow concurrent execution of multiple data operations for multiple contexts having the ready-to-run status.

In an exemplary embodiment, the at least one configuration and control register further stores, for each context of the plurality of contexts, a plurality of execution context chaining bits designating a lead context and a next context, and wherein the element controller further to sequence execution of the plurality of data operations in an order determined by the plurality of execution context chaining bits. The at least one configuration and control register may further store, for each context of the plurality of contexts, a plurality of bits designating at least one data input queue and at least one data output queue, and the ready-to-run status for a selected context of the plurality of contexts may be determined by a presence of input data in the at least one context-designated data input queue, room for output data in the at least one context-designated data output queue, and a designation of a lead context or a next context in the plurality of execution chain bits of the selected context.

In various exemplary embodiments, when a plurality of contexts having a ready-to-run status designate the same output queue of the plurality of output queues or designate a same memory address, the port arbitration circuit may provide a round-robin arbitration to select for execution of a data operation at least one context of the plurality of contexts having a ready-to-run status.

In various exemplary embodiments, the plurality of configuration bits stored in the at least one configuration and control register may designate, for each context of the plurality of contexts, a read or a write access, a data structure, and at least one address generator of the plurality of address generators. The plurality of configuration bits stored in the at least one configuration and control register may further designate, for each context-designated address register, a minimum memory address, a maximum memory address, a current memory address, a stride to determine a next memory address, an access count, and a maximum number of accesses to perform for the context, and may further designate for an address generator, for a first-in first out (FIFO) mode of at least two contexts of the plurality of contexts, a base address, a maximum number of words in the FIFO, a read pointer, a read offset, a write pointer, a write offset, a number of valid words currently in the FIFO, and a watermark; and may further designate, for a two-dimensional address mode, at least two contexts of the plurality of contexts and at least two address generators of the plurality of address generators.

In various exemplary embodiments, the plurality of configurable address generators are configurable to provide a plurality of addressing modes. In an exemplary embodiment, the plurality of addressing modes comprises at least two addressing modes selected from the group consisting of: single word addressing, one-dimensional block addressing, two-dimensional block addressing, memory striping, row skipping, column skipping, wrap-around, logical partitioning, random access, first-in first out (FIFO), externally generated addressing input through an input queue of the plurality of input queues, look up table (LUT) mode, and combinations thereof. In an exemplary embodiment, the element controller further is to generate a done status or tag following a read or write of a last word of a one-dimensional or two-dimensional data block.

In another exemplary embodiment, the multi-context configurable memory controller may further comprise a memory bank interface couplable to the random access memory, the memory bank interface comprising a plurality of memory interface circuits, each memory interface circuit couplable to a separate block of the memory and comprising an address input, a data input, a write enable input, and a data output. The memory bank interface may further comprise address pattern generation logic circuitry for memory striping to provide a plurality of concurrent accesses to the memory.

In another exemplary embodiment, the multi-context configurable memory controller may further comprise a plurality of types of data ports; and a memory bank mapping and arbitration circuit to arbitrate among the plurality of types of data ports for access to the memory using a fixed priority and further using a round-robin priority. The memory bank mapping and arbitration circuit further may generate a wait signal to any data port which was not selected in a memory access arbitration, and may detect a collision or a contention for a memory access to a selected memory bank of a plurality of banks of the random access memory.

In an exemplary embodiment, the memory bank mapping and arbitration circuit is coupled through a first data port of the plurality of data port types to a sequential processor for an instruction read operation from the memory, a memory write operation, and a memory read operation by the sequential processor; further coupled through a second data port of the plurality of data port types to a message manager circuit for a memory write operation, a memory read operation, and remote address generation by the message manager circuit; further coupled through a third data port of the plurality of data port types to the message manager circuit for memory read operations for message generation directly by the message manager circuit without use of the sequential processor. The memory bank mapping and arbitration circuit further may arbitrate among memory access using a fixed priority among the message manager circuit, the input-output port array, and the sequential processor, and further to use a round-robin priority for the plurality of output queues of the input-output port array. The concurrent execution of multiple data operations generally are mapped by a memory bank interface to a plurality of separate and non-overlapping physical blocks of memory.

In another exemplary embodiment, a multi-context configurable memory controller is coupled to a random access memory, with the multi-context configurable memory controller comprising: an input-output data port array comprising a plurality of input queues and a plurality of output queues; a configurable circuit element configurable for a plurality of data operations, each data operation corresponding to a context of a plurality of contexts, the plurality of data operations comprising memory address generation, memory write operations, and memory read operations; the configurable circuit element comprising a plurality of configurable address generators configurable for a plurality of addressing modes; at least one configuration and control register to store, for each context of a plurality of contexts, a plurality of configuration bits designating a read or a write access, a data structure, at least one address generator of the plurality of configurable address generators and an address of a logical block of memory; an element controller coupled to the configurable circuit element, the element controller to allow concurrent execution of multiple data operations for multiple contexts having a ready-to-run status; and a memory bank interface coupled to the random access memory, the memory bank interface to map the concurrent execution of multiple data operations to a plurality of separate and non-overlapping physical blocks of the memory.

In another exemplary embodiment, a multi-context configurable memory controller is couplable to a random access memory, with the multi-context configurable memory controller comprising: an input-output data port array comprising a plurality of input queues and a plurality of output queues; a plurality of data ports, the plurality of data ports having different data port types; at least one configuration and control register to store, for each context of a plurality of contexts, a plurality of configuration bits designating a read or a write access, a data structure, and at least one address generator of a plurality of address generators; a configurable circuit element configurable for a plurality of data operations, each data operation corresponding to a context of a plurality of contexts, the plurality of data operations comprising memory address generation, memory write operations, and memory read operations; the configurable circuit element comprising the plurality of address generators configurable to provide a plurality of addressing modes, the plurality of addressing modes comprising at least two addressing modes selected from the group consisting of: single word addressing, one-dimensional block addressing, two-dimensional block addressing, memory striping, row skipping, column skipping, wrap-around, logical partitioning, random access, first-in first out (FIFO), externally generated addressing input through an input queue of the plurality of input queues, look up table (LUT) mode, and combinations thereof; a memory bank mapping and arbitration circuit to arbitrate among the plurality of data ports for access to the memory using a fixed priority; and an element controller coupled to the configurable circuit element, the element controller comprising a port arbitration circuit and to arbitrate among a plurality of contexts having a ready-to-run status using a round-robin priority, and the element controller to allow concurrent execution of multiple data operations for multiple contexts having the ready-to-run status.

In various exemplary embodiments, the multi-context configurable memory controller comprises: an input-output data port array comprising a plurality of input queues and a plurality of output queues; a plurality of data ports, the plurality of data ports having different data port types; at least one configuration and control register to store, for each context of a plurality of contexts, a plurality of configuration bits designating a read or a write access, a data structure, and at least one address generator of a plurality of address generators; a configurable circuit element configurable for a plurality of data operations, each data operation corresponding to a context of a plurality of contexts, the plurality of data operations comprising memory address generation, memory write operations, and memory read operations; the configurable circuit element comprising the plurality of address generators configurable to provide a plurality of addressing modes, the plurality of addressing modes comprising at least two addressing modes selected from the group consisting of: single word addressing, one-dimensional block addressing, two-dimensional block addressing, memory striping, row skipping, column skipping, wrap-around, logical partitioning, random access, first-in first out (FIFO), externally generated addressing input through an input queue of the plurality of input queues, look up table (LUT) mode, and combinations thereof; a memory bank mapping and arbitration circuit to arbitrate among the plurality of data ports for access to the memory using a fixed priority; an element controller coupled to the configurable circuit element, the element controller comprising a port arbitration circuit and to arbitrate among a plurality of contexts having a ready-to-run status using a round-robin priority, and the element controller to allow concurrent execution of multiple data operations for multiple contexts having the ready-to-run status; and a memory bank interface to map the concurrent execution of multiple data operations to a plurality of separate and non-overlapping physical blocks of memory.

These and additional embodiments are discussed in greater detail below. Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings and examples which form a portion of the specification, wherein like reference numerals are used to identify identical components in the various views, and wherein reference numerals with alphabetic characters are utilized to identify additional types, instantiations or variations of a selected component embodiment in the various views, in which:

FIG. 4, divided into

FIG. 14, divided into FIG. 14A, FIG. 14B, FIG. 14C and FIG. 14D, is a flow diagram illustrating an exemplary algorithm or symbolic netlist run-time binding process in accordance with the teachings of the present invention.

FIG. 16, divided into FIGS. 16A, 16B and 16C, is a diagram illustrating an exemplary configuration and control word in accordance with the teachings of the present invention.

FIG. 33, divided into

FIG. 34, divided into

FIG. 35, divided into

FIG. 36, divided into

DETAILED DESCRIPTION OF EXEMPLARY EMBODIMENTS

Figure 1:
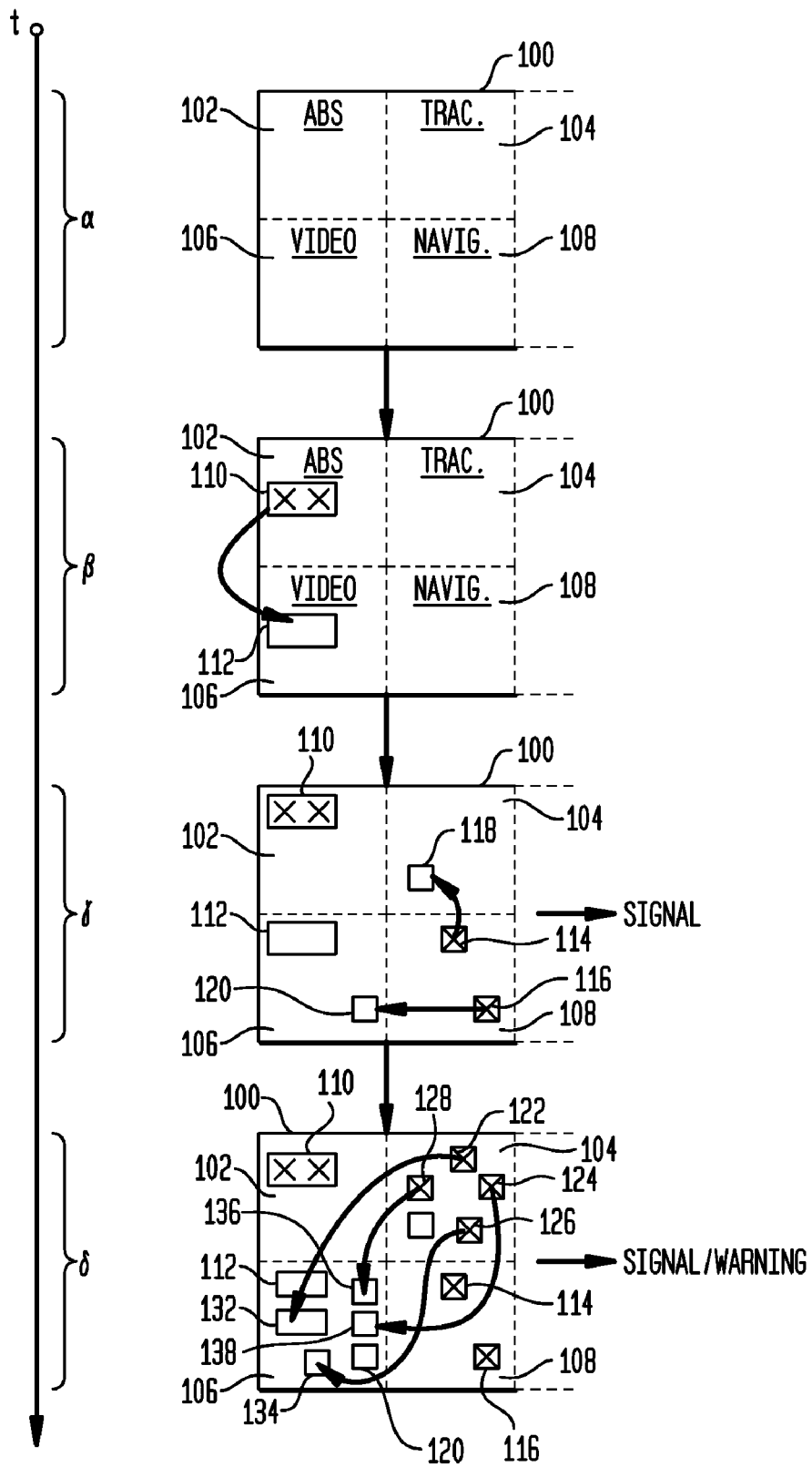
FIG. 1 is a diagram illustrating, at a high or conceptual level, resiliency of an exemplary apparatus embodiment in accordance with the teachings of the present invention.

While the present invention is susceptible of embodiment in many different forms, there are shown in the drawings and will be described herein in detail specific examples and embodiments thereof, with the understanding that the present disclosure is to be considered as an exemplification of the principles of the invention and is not intended to limit the invention to the specific examples and embodiments illustrated, and that numerous variations or modifications from the described embodiments may be possible and are considered equivalent. In this respect, before explaining at least one embodiment consistent with the present invention in detail, it is to be understood that the invention is not limited in its application to the details of construction and to the arrangements of components set forth above and below, illustrated in the drawings, or as described in the examples. Methods, systems and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

As indicated above, the exemplary embodiments provide an integrated circuit architecture which is scalable and repeatable. Exemplary embodiments provide for "unit delay" timing within isochronous zones and for unit delay timing between zones and from point-to-point throughout the entire architecture. As a consequence, timing closure is known and repeatable once configurations are mapped and bound in the exemplary apparatus. Exemplary architectures are also scalable and repeatable, up to the practical or physical limits of an IC fabrication technology.

Exemplary embodiments are also "data driven", in which incoming data is utilized to control execution of operations. Highly novel in data flow architectures, the exemplary embodiments provide for a high degree of control of data flow operations, including partial execution, conditional execution, execution ordering, and data output ordering. In addition, exemplary embodiments also utilize a "back pressure" to optimize use of resources and provide data integrity.

Other illustrated embodiments provide circuitry, communication and control which allows and provides for on-chip configuration capabilities, including reconfiguration and partial reconfiguration during run-time.

Exemplary embodiments are also illustrated for configurable memory control which allows multi-threaded and multi-context execution, allowing multiple concurrent read and write operations directly from a configurable full interconnect communication channel.

The exemplary embodiments provide an integrated circuit architecture capable of virtually guaranteeing timing isolation between user applications. The architecture comprises zones 201 isolated from one another by timing isolation components. In some embodiments, these timing isolation components are implemented as queues with separate clocks on their input and output sides. When delivering data sourced from within the zone, the zone drives the capture clock; when receiving data sourced from outside the zone, an outside zone drives the capture clock. This function is similar to a First-In-First-Out (FIFO) queue, but has additional capability related to signal routing and power isolation.

In other embodiments, a single clock is used for both input and output capture, and enable signals are used to provide timing isolation. When delivering data sourced from within the zone, the zone drives the write enables; when receiving data sourced from outside the zone, an outside zone drives the read enables.

Zones 201 are replicable "tiles" that maintain their timing characteristics regardless of array size. Every zone 201 within the apparatus 100, 140 has a single unit-delay for all signals within the zone. Successive hierarchical aggregation of zones 201 adds one unit delay for each hierarchical level. Timing is always predicated upon the unit delay distance between zones, not on archaic x/y distance or re-powered route calculations.

Function timing isolation within an apparatus 100, 140 is provided by wrapping every function inside a common, unit-delay wrapper, referred to as an element interface and control 280. Each element interface and control 280 (or wrapper) embeds a function of known unit delay within sequential input/output components that interconnect with each other through a common, bus-width, unit-delay interface.

Context timing isolation within an apparatus 100, 140 is provided three ways: first, by providing each function with multiple contexts; second, by providing a context selection that is a programmable function of data readiness and third, by providing context selection that is a programmable function of function status (e.g. "run," "suspend," and "halt").

Task timing isolation within an apparatus 100, 140 is provided by implementing a "Task ID" register associated with every context of every function. As used herein, a task is a set of one or more functions, and an apparatus 100, 140 may be concurrently configured with one or more tasks. Once configured, a task may be reconfigured without disturbing other tasks. Such task isolated reconfiguration is accomplished by sending data with the unique ID of the task to be reconfigured. Only tasks with that ID will respond to the reconfiguration command.

Unit delay timing is enabled within an apparatus 100, 140 by several uniform, hierarchical interconnect structures: first, message channels; second, configuration channels; and third, dataflow channels. These channels pass through successive hierarchy layers in deterministic and scalable fashion regardless of the number of levels: every level represents a single, unit-delay. Message channels transport both configuration and user messages, and are conveyed by upper hierarchical nodes (message repeaters 210A or waypoints). Configuration channels transport both configuration write and read back data and other control. Dataflow channels transport both user data and internal state data. For example, in exemplary embodiments, partial reconfiguration is made feasible and fast by matching the physical and logical addressing for the interconnect bus 275, 295 and the hierarchical addressing of the clusters 200.

Uniformly sized unit delay function blocks within a device of the invention permit symmetric arraying without irregular obstruction of the interconnect channels. This is accomplished by aggregating functions of similar size within a common wrapper and then by arraying these nodes around a common hierarchical interconnect point. Such an arrangement then allows for regular tiling with repeatable unit delay characteristics.

All these innovative unit delay mechanisms greatly diminish timing closure complexity and finally make partial reconfiguration in-field a practical reality.

Exemplary embodiments also implement what is referred to herein as "data domain" multiplexing ("DDM") in a context-based, configurable architecture, to distinguish time-division multiplexing ("TDM") and frequency division multiplexing ("FDM") implementations. In a TDM system, within a regularly repeating period, each configuration is allocated a selected, sequential time slot for operation in that period, regardless of other constraints. In an FDM system, each configuration is allocated one or more sequential time slots in that period. In both of these cases, however, the data dependencies may not accommodate the corresponding allotted intervals, with incoming data arriving later or out of phase with the allocated interval for operation of the selected configuration. The selected configuration is then not able to run during its allocated interval, resulting in considerable idle time and wasted resources.

In contrast, the DDM of the exemplary embodiments is highly efficient and has a pipelining effect. As data arrives, it may be processed by the execution of any context of a composite circuit element 260, 260A and/or a cluster queue 245 (as long as other conditions precedent have been met, such as the context being enabled for execution and having room for output data). If there is contention between contexts because more than one context has input data and room for output data, one context will run, and the next context will run after that in the next clock cycle, and so on, resulting in a pipeline of data being able to be processed by the corresponding contexts, regardless of whether its arrival time was within in a particular time interval and regardless of any allocation of time for execution of a configuration. This results in a highly efficient use of resources, with data driving the execution of contexts and any corresponding configurations needed for the context, rather than having configurations idling in their allotted times while waiting for data. (There is an additional advantage to DDM. When computations are mapped to different contexts, the contexts can be initially allocated on percentage bandwidth basis, while unallocated bandwidth can be assigned to unused contexts.)

As indicated above, another novel feature of the IC architecture of the present invention is its resiliency, providing adaptation for manufacturing defects, flaws which may arise during usage of the IC, and adaptability for new features, services, algorithms, and other events. The resiliency and robustness of the inventive IC architecture allows for increasing yields from IC fabrication, as the inventive ICs fabricated with various defects will nonetheless be quite useable and fully functional.

In addition, during operation, this resiliency may be described as "neural" or biological self-healing, because in the event a portion of the IC is damaged or otherwise becomes unusable, another portion of the IC is effectively "recruited" or reassigned to take over and perform the functions of the damaged portion. In addition, as discussed in greater detail below, as the functions are reassigned, new control and data pathways are also created, so that the transferred operations continue to perform seamlessly with other IC operations. Such adaptive resilience and self-healing may occur in real-time or near real-time, depending upon the selected embodiment. This allows the IC to continue to operate without disruption provided that sufficient computing resources remain operational. Such resiliency provides for a graceful degradation of performance in the event of damage to the IC, rather than a catastrophic failure, and is especially significant in health and safety applications.

As discussed in greater detail below, several features of the exemplary embodiments of the present invention enable such resiliency, continued operation and eventual graceful degradation. First, the IC or other device is comprised of a plurality of "composite" circuit elements (which comprise various types of computational elements, a uniform I/O interface, and a uniform control structure); these composite circuit elements are effectively interchangeable or fungible, such that in the event of a loss of functionality of an element, its functions can be taken over by another composite circuit element (either identical or similar), when available. Second, the plurality of computational elements is selected to enable the performance of virtually any functionality, that is, they are computationally complete. Third, control functionality is distributed among a plurality of control components, such as a sequential processing element (SPE) 292 and a message manager 265 (or, in other embodiments, circuit "cluster" controllers, referred to herein as "state machine elements" 290 or "finite state machine elements"), such that control functionality may be transferred between and among these distributed control elements, as may be needed. Fourth, the composite circuit elements and/or their interconnections may be configurable, to aid in the transfer of functionality and any corresponding routing of data and control paths. Fifth, all selected operations are assigned and bound within the device at the initial run-time, and may be re-assigned and re-bound subsequently as may be needed to transfer corresponding functionality to other composite circuit elements and continue operations.

Figure 2:
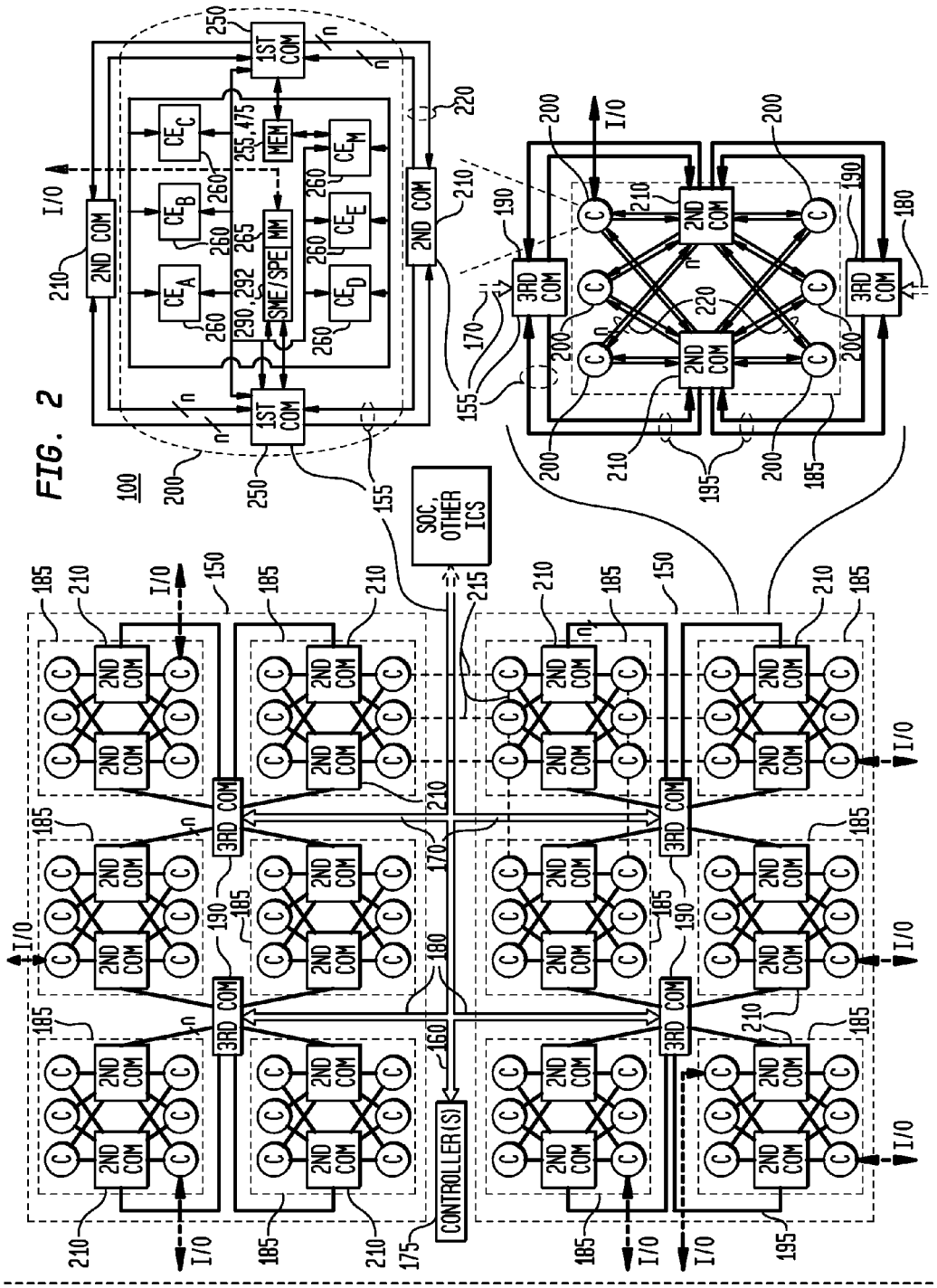
FIG. 2 is a block diagram illustrating an exemplary first apparatus embodiment in accordance with the teachings of the present invention.
Figure 3:
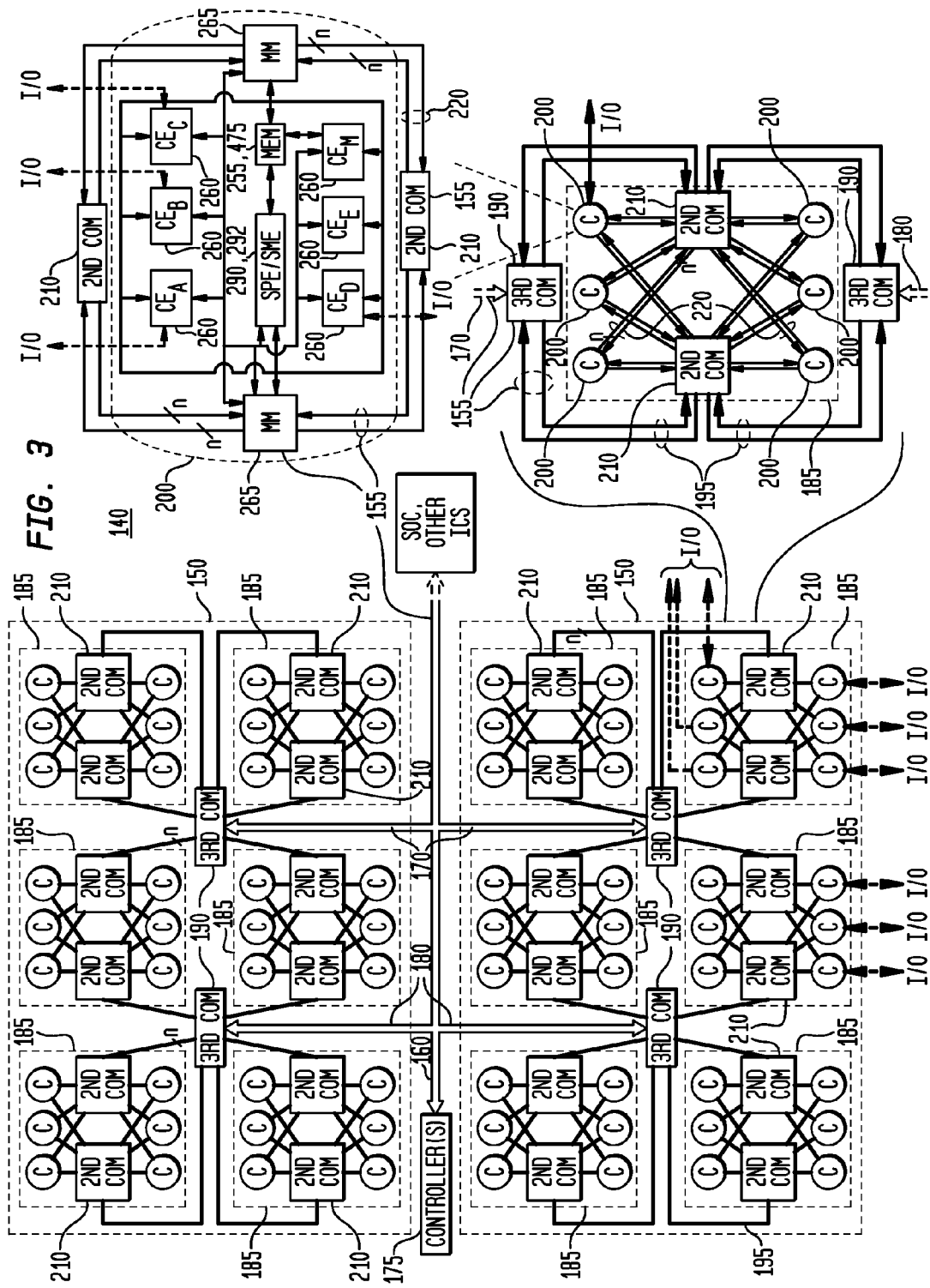
FIG. 3 is a block diagram illustrating an exemplary second apparatus embodiment in accordance with the teachings of the present invention.

FIG. 1 is a diagram illustrating, at a high or conceptual level, such resiliency of an exemplary apparatus 100, 140 embodiment in accordance with the teachings of the present invention. As illustrated in FIG. 1, various parts of the apparatus 100, embodied as an IC, such as various matrices 150 illustrated and discussed with reference to FIGS. 2-3, are utilized to perform concurrently a plurality of functions, such as those which may be associated with a typical automobile, other vehicle, or computerized or complex system. During time period "a", an IC portion 102 is providing anti-lock braking (ABS) functionality, an IC portion 104 is providing traction control functionality, an IC portion 106 is providing video or other multimedia functionality, and an IC portion 108 is providing navigation functionality, such as through a satellite or radio link.

During time period "β", a region 110 (marked with "X's") of IC portion 102 has become unusable, such as due to physical wear or other damage to the IC. Such damage may be determined through self-testing or through other means discussed in greater detail below. As ABS is a high priority function, the functionality performed within region 110 is then reassigned (or bound) to region 112, which previously had been performing video functionality, which has a lower priority for operation in a vehicle environment. As discussed in greater detail below, as part of this reassignment process, new data and control pathways will also be created, so that the newly assigned regions continue to communicate properly with other regions of the IC, transparently, as if the reassignment never occurred. Depending upon the nature and scope of the new functionality assigned to this region, IC portion 106 may or may not continue to perform its video functionality, or may perform this functionality with lower bandwidth or speed. In either case, in spite of damage to the IC 100, the higher priority ABS functions continue to be operational, and no catastrophic failure has occurred.

Subsequently, during time period "γ", regions 114 and 116 (marked with "X's") of IC portion 108 have become unusable, and their functions are reassigned to regions 118 and 120, respectively. In this case, as traction control (of region 104) generally could have a higher priority than the operation of the navigational system, it is likely that region 118 was available and not being completely used by the traction control functions (e.g., one or more composite circuit elements and/or contexts were available, as discussed below). As more of the IC has degraded, however, a signal or other indication may be provided to the user, such as to have the vehicle serviced in the near future for IC replacement, for example. In addition, as mentioned above and as discussed in greater detail below, depending upon the availability of target destinations for the functionality to be reassigned and depending upon how the functionality is reassigned, the reassigned functions may no longer perform optimally (e.g., they may be slower or have less bandwidth), but still perform. Again, such decline in performance is gradual and not catastrophic, with the capability for ample warnings to be provided.

Subsequently, during time period "δ", regions 122, 124, 126 and 128 (marked with "X's") of IC portion 104 have become unusable, and their functions are reassigned to regions 132, 138, 134 and 136, respectively. In this case, as traction control (of region 104) generally would have a higher priority than the operation of the video system of IC portion 106, those higher priority functions are reassigned to the unaffected areas of the IC. In this instance, it is plausible that the video functionality could cease entirely, as the remaining usable portions of the IC are performing these higher priority functions, such as braking and traction control. As more of the IC has degraded, however, a warning, signal or other indication also may be provided to the user, such as to have the vehicle serviced immediately for IC replacement, for example. Again, such decline in performance is gradual and not catastrophic, with the capability for high priority functions to continue to operate, despite significant failures within many portions of the IC that would cause a prior art IC to fail completely, suddenly, and potentially catastrophically.

The biological parallels in the operation of the apparatus 100 are striking. As in a biological system which can heal itself, such as a neurological system, in the event of a damage such as a stroke with loss of neurons and corresponding neurological function, other existing neurons are recruited, with new connections (synapses) created, to take over and restore the functionality previously performed by the damaged neurons. In the case of the apparatus 100, in the event of damage to one or more parts of the IC, other existing portions of the IC (circuit clusters and composite circuit elements (discussed below)) are recruited, with new connections created, to take over and restore the functionality previously performed by the damaged regions of the IC. As a consequence, as in a biological system, the apparatus 100 is self-healing, enabling ongoing functionality despite IC damage.

A. Apparatus Architecture

FIGS. 2-3 are block diagrams illustrating, in increasing levels of detail, exemplary first and second apparatuses 100, 140 in accordance with the teachings of the present invention, typically embodied as an IC or portion of an IC. As illustrated, the apparatus 100, 140 is highly distributed and computationally "flat", with all computation performed by the plurality of composite circuit elements 260, 260A. An "action" is the type of function or activity to be performed by a composite circuit element 260 (through its incorporated computational or other type of circuit element 270), such as multiplication or bit manipulation. As illustrated, there are various types of composite circuit elements 260, illustrated as different types of composite circuit elements (equivalently referred to and abbreviated as "composite elements" ("CE")) $CE_A$, $CE_B$, $CE_C$, $CE_D$, $CE_E$, and $CE_M$, which perform different actions and which may be configurable or non-configurable (illustrated and discussed with reference to FIGS. 5-8). The plurality of composite circuit elements 260, with other circuit structures discussed below, as a first grouping, are grouped into a corresponding plurality of circuit "clusters" 200. The various groupings may also be considered arrays of a plurality of composite circuit elements 260, at corresponding levels. Various types of composite circuit elements 260, 260A are illustrated, and differ primarily with regard to the number of circuit elements 270 within the composite circuit elements 260, 260A, and with more detailed control illustrated for composite circuit elements 260A; accordingly, unless specifically indicated to the contrary or the context so requires, any reference to a composite circuit element 260 should be understood to mean and include a composite circuit element 260A, and vice-versa.

As discussed in greater detail below, in exemplary embodiments, circuit clusters ("clusters") are further comprised of a plurality of zones 201 having the composite circuit elements 260, 260A and cluster queues 245 coupled to a full interconnect bus 275, 295, a sequential processor ("SPE") 292, a message manager 265 coupled to hierarchical interconnect 220, and a memory control element (MCE) 485 (which comprises a memory composite circuit element 260M and a cluster memory (RAM) 475 (or other cluster memory 255).

The apparatus 100, 140 may then be logically divided into or comprised of a plurality of levels, with this lower level referred to as a "cluster" level (or a first array), with the plurality of circuit clusters 200 then grouped through various (second) communication elements 210 and a second channel (or bus structure) 220 into an intermediate level (or a second array), as a second grouping, referred to as a cluster-grouping or "supercluster" level (a plurality of superclusters 185), which in turn are further grouped through various (third) communication elements 190 and third channel (or bus structure) 195 into a higher level, as a third grouping, referred to as a "matrix" level (a plurality of matrices 150) or unit level (or a third array), which are further grouped through a fourth channel (or bus structure) 160 into the apparatus 100, 140 or device level, as a fourth grouping or array.

The various communication channels (e.g., busses or bus structures) 160, 195, 220 and communication elements 190, 210, 250 collectively may be referred to and defined as interconnect 155 of the present invention, allowing communication of data and control information between and among any of the various clusters 200 and other IC components.

Each of the apparatuses 100, 140 typically is embodied as an integrated circuit, and may be a separate IC or part of a larger system-on-a-chip ("SOC") or part of a network of ICs, such as coupled to other ICs on a circuit board, wiring network, network mesh, and so on. The two apparatus embodiments 100, 140 are illustrated as examples and typically differ in the location (and/or type) of the components and number of components within the various clusters 200, including the components utilized to provide input and output ("I/O") to other, external or non-integrated ICs or other devices, such as external memory (e.g., DDR-2) or external communication channels or busses (e.g., PCI or PCI-express (PCI-e)). For apparatus 140, such external I/O has been concentrated within a selected matrix 150, while for apparatus 100, such external I/O has been distributed among a plurality of matrices 150. In FIG. 3, a message manager 265 has been utilized to implement a first communication element 250. The clusters 200 may generally also differ with regard to the number and type of composite circuit elements 260; as illustrated in FIGS. 2 and 3, six composite circuit elements 260 are shown, while in other exemplary embodiments, sixteen composite circuit elements 260 are illustrated within a cluster 200, four composite circuit elements 260 in each zone 201, and with each composite circuit elements 260 comprised of a plurality of configurable elements 270. All such variations are within the scope of the disclosure, and additional apparatus embodiments are illustrated in FIGS. 18-22, with tilings of zones 201, clusters 200C, 200D, superclusters 185C, 185D, and so on. As a consequence, any reference to apparatus 100 will be understood to mean and include the second embodiment illustrated as apparatus 140, and apparatus 140 otherwise will not be further discussed as a separate embodiment. Also, while FIGS. 2 and 3 illustrate two matrices 150, it should be understood that the apparatus 100, 140 may include one or more matrices 150, and that exemplary embodiments may include any number of matrices 150, depending upon selected applications and various design parameters, such as IC area and power requirements.

As discussed in greater detail below, the fundamental computing block of the exemplary embodiments is a composite circuit element 260, 260A. Each composite circuit element comprises an element interface 280 and one or more selected circuit elements 270, which may vary by element type and which may be configurable. Many of the composite circuit elements 260, 260A consist of configurable element circuitry (270) and have configurable inputs (320) and configurable outputs (315). As described in greater detail below, composite circuit elements 260, 260A may be grouped into isochronous regions such as zones 201 (and/or clusters 200, depending upon the embodiment), in which all of the composite circuit elements 260, 260A in that region can communicate with each other within a time period less than or equal to a unit time delay ("unit delay"), which may be as fast as a single clock cycle. These adjacent regions may also be grouped into larger regions (clusters 200, superclusters 185) in which communication between regions also occurs within a unit time delay. Such adjacent (and diagonally adjacent) regions can also be grouped so that communication with each other occurs within a unit time delay, such as in a single clock cycle. This hierarchical grouping can be done to an arbitrary degree until the physical limits of the integrated circuit, circuit board (or blade), chassis, etc. are reached.

This grouping is accomplished through connections to various communication channels, discussed in detail below. First, at the lowest level of grouping within zones 201 and clusters 200, communication channels between composite circuit elements 260, 260A are "flat" and non-hierarchical, using the full interconnect 275, 295 data path, the configuration and control bus (CC bus) 285, and cluster queues 245 which provide data path coupling between the full interconnect 275, 295 data paths of adjacent and diagonally adjacent zones 201. Additionally, more specialized communication channels between selected components within a cluster 200 are also described in greater detail below.

Second, beginning at the cluster 200 level, in exemplary embodiments, a message manager 265 (or first communication element 250) within each cluster 200 is utilized for the communication to and from clusters 200, coupling to hierarchical interconnect 220, which in turn (through other communication elements, 190, 210, such as message repeaters 210A), couples to higher levels of interconnect (195, 170, 180), up to the overall fabric input and output (I/O) 204 or IC I/O for off chip communication.

Referring to FIGS. 2-3, as indicated above, the apparatus 100 is logically divided into or comprised of a plurality of matrices 150. Each matrix 150 is coupled through a corresponding plurality of third communication elements 190 and a fourth communication channel (or bus structure) 160, and each has at least two input and two output data and control paths, separately illustrated as input and output ("I/O") 170 and I/O 180 (of fourth channel (or bus structure) 160). Depending upon the selected embodiment, the fourth channel (or bus structure) 160 (with I/O 170 and 180) may have combined control and data I/O paths (as illustrated), with data, configuration and control information utilizing the same bus structures, or such data, configuration and control may be separated onto different bus or interconnect structures (not separately illustrated). In an exemplary embodiment, at this matrix 150 level, such a plurality of third communication elements 190 are implemented through exemplary communication circuitry such as message or packet routing or message repeater circuitry. In the event of a failure of a third communication element 190 and/or one of the I/O 170, 180, or any portions thereof, another third communication element 190 and the remaining I/O 170, 180 are available to provide identical functionality, albeit potentially with a reduction in available communication bandwidth. In an exemplary embodiment, the third communication elements 190 are implemented as a single, combined circuit element having four independent up link channels and four independent down link channels (with corresponding bus structures); alternatively, the various channels may also be implemented to provide full duplex communication.

In an exemplary embodiment discussed in greater detail below, the communication elements (190, 210) utilized through or until the cluster 200 level provide message-based routing (i.e., routing and message repeating to the addressed destination or another node along the path to the specified destination), described in greater detail below with reference to FIG. 4, and may be referred to equivalently as message repeaters 210A or waypoints. Instead of utilizing a separate first communication element 250, that functionality is included within the functions of the message manager 265, described in detail below with reference to FIG. 38.

This use of a plurality of (at least two) communication elements and corresponding I/O portions of the bus structures (having combined control and data I/O paths), in exemplary embodiments, is repeated at each of the various logical, hierarchical levels, providing corresponding resiliency in the event of a failure of any of the various communication elements or I/O paths. For selected embodiments requiring less resiliency or subject to other constraints, however, such one or more additional sets of communication elements and corresponding I/O are optional and may be omitted.

Each matrix 150, in turn, is logically divided into various hierarchical levels or subgroups, also with circuitry for communication between and among the various levels, such as the plurality of third communication elements 190 adapted to perform message or packet-based routing, self-routing, tunneling, or other types of data, configuration and control communication. More specifically, a matrix 150 is logically divided into a plurality of superclusters 185, which are coupled to each other through the plurality of third communication elements 190 and third channel (or bus structure) 195, and which further are coupled to superclusters 185 of other matrices 150 via fourth channel (or bus structure) 160 and other corresponding third communication elements 190.

The superclusters 185, in turn, are logically divided into a corresponding plurality of circuit clusters 200 (abbreviated and referred to herein simply as "clusters" or a "cluster"), which in turn are comprised of a plurality of circuitry elements referred to as composite circuit elements 260 (or, equivalently referred to and abbreviated as "composite elements" ("CE") 260) and other components (including first communication elements 250 and SPEs 292 (or SMEs 290)) discussed below. The communication between and among these various clusters 200 is provided through a plurality of second communication elements 210 (which also may provide message or packet-based routing, self-routing, tunneling, or other types of data, configuration and control communication) and a second channel (or bus structure) 220, such as message repeaters 210A and also message managers 265. In exemplary embodiments described in greater detail below, clusters 200 are further divided into zones 201. The various clusters 200 within a supercluster 185 are then further coupled to other clusters 200 of other superclusters 185 of the same or other matrices 150 via second channel (or bus structure) 220, second communication elements 210, third channel (or bus structure) 195, and third communication elements 190, and then to other matrices via fourth channel (or bus structure) 160. In addition, as an optional variation, "fast path" connections may be provided between adjacent clusters, illustrated as connections 215 in FIG. 2, and discussed in greater detail below.

In various exemplary embodiments, one or more state machine elements 290 are utilized to perform various functions, such as instruction processing and reconfiguration or linking of data paths, for example. In other exemplary embodiments, such as clusters 200C, 200D, a more powerful, instruction-based sequential processing element (SPE) 292 is utilized which, for example and without limitation, may be a RISC processor or other type of processor or controller. As a consequence, any reference to a state machine element (SME) 290, in the Figures or in this specification, should be understood to mean and include a sequential processing element (SPE) 292, and vice-versa. For example, there may be cluster 200C, 200D implementations that do not require a more powerful processor, and a more limited processing element such as a SME 290 may be substituted within the scope of this disclosure.

Similarly, various communication and management functions have been co-located within a message manager 265 (discussed in greater detail with reference to FIG. 38). It should be understood that the functionality performed by a message manager 265 may be split up among various components, such as a first communication element 250 and a sequential processing element (SPE) 292 or a state machine element 290, for example and without limitation, and all such implementations are considered equivalent and within the scope of the disclosure.

The various second and third communication elements 210, 190 and levels of communication channels (bus structures) 160, 195, 220 collectively form an interconnect structure 155 of the present invention. As indicated above, the second and third communication elements 210, 190 may be implemented as known or as becomes known in the art for transfer, routing or switching of data, configuration and control to and from addressable clusters 200. The second and third communication elements 210, 190 may be implemented as routing elements, self-routing elements, message repeaters, circuit-switched, hybrid routing and circuit-switched elements, other switch-based communication elements, or other types of communication elements, and are considered equivalent. The various communication channels (bus structures) 160, 195, 220 may be implemented utilizing any conductive paths which may be available in IC fabrication and processing.

In exemplary embodiments, this interconnect 155 (communication channels (bus structures) 160, 195, 220) will generally be "n" bits wide, with the number "n" selected depending upon the objectives of the selected embodiment. A protocol and bus structure for an exemplary communication channel 170, 180, 195, 220 is illustrated in FIG. 4 and discussed in greater detail below. For example, in an exemplary embodiment, "n" is 17 or more bits, providing for a 16 bit data word and one or more control or signaling bits. In addition to the interconnect 155 comprising one or more busses, wires, conductors, transmission media or connection structures as illustrated in FIGS. 2-3, the interconnect 155 also includes a plurality of communication elements (190, 210) which accommodate the n-bit width and which provide routing or other transmission for data words (or messages or packets), configuration words (or messages or packets), and/or control words (or messages or packets), between and among matrices 150, superclusters 185, and clusters 200. In exemplary embodiments, these communication elements (190, 210) may also provide arbitration or other routing conflict resolution, depending upon the degree of interconnectivity to be provided.

Within the cluster 200 level, in some exemplary embodiments, the first communication elements 250 provide cluster I/O, providing intra-cluster circuit-based (or circuit-switched) connection capability in addition to inter-cluster data, configuration and control routing, creating direct communication links or connections to and from components within a cluster 200 and data, configuration and control routing from and to components of other clusters 200. In exemplary embodiments, a message manager 265 within a cluster 200 or supercluster 185 is also utilized to provide inter-cluster communication of configuration and control and external input and output communication of any type of data, configuration and control, with dedicated full interconnection between composite circuit elements 260 and cluster queues 245 provided by full interconnect bus 275, 295.

It should be noted that the selection of the number of levels within the apparatus 100 may be varied in any given embodiment, as a balancing of the amount of physical interconnect to be utilized in comparison with routing complexity, for a given number of computational elements. In the exemplary embodiment, for the same number of composite circuit elements 260, the use of four levels (matrix, supercluster, cluster, and composite circuit element levels) in comparison to three levels (with more components per level), for example, enables a substantial reduction in the amount of busses and wires of interconnect, resulting in a savings of area and capacitance, at the expense of additional routing complexity.

Continuing to refer to FIGS. 2 and 3, as an option or alternative, depending upon the selected embodiment, one or more additional controllers (or processors, equivalently) 175 may be utilized, at any of the various matrix 150, supercluster 185 or cluster 200 levels. For example, exemplary embodiments of run-time binding (discussed below with reference to FIG. 14) may utilize such additional controllers 175, may instead utilize one or more SPEs 292 (or SMEs 290) (discussed below) as one or more controllers, or both. In an exemplary embodiment, the controller or processor 175 is implemented utilizing a commercially available processor or microprocessor, e.g., ARM or Micro-Blaze. The processor 175 also may be in a separate system, or may be integrated as part of the die of the apparatus 100, 140, etc., and may be any type of processor or controller, or also may be implemented using one or more SPEs 292 or SMEs 290. In addition, the apparatus 100 (or 140) may also include other components, such as any other circuits or other devices which may be integrated or coupled with the apparatus, such as radio-frequency or cellular communication circuitry, memory circuitry, processors, microprocessors, etc., with all such variations considered within the scope of the present invention.

As an introduction to the operation of the apparatus 100, data computations and manipulations are performed within the plurality of clusters 200, through composite circuit elements 260. These circuit elements 260 are referred to as "composite" circuit elements 260 because in the exemplary embodiments, they are comprised of a first, constant or fixed portion, and a second, variable portion, which may be configurable or non-configurable (depending upon the type of composite circuit element 260). More particularly, each composite circuit element 260 is comprised of: (1) a uniform or constant element interface and control 280, which is the same for every composite circuit element 260; and (2) a selected type of "computational" or other circuit element 270 from a plurality of types of computational elements 270 (configurable or non-configurable), which are illustrated and discussed in greater detail with reference to FIGS. 5-8. An additional variation of a composite circuit element 260, as a composite circuit element 260A, is discussed in greater detail below with reference to FIG. 25.

The computational circuit element 270 (also referred to more simply as an element 270 or circuit element 270) within composite circuit elements 260 vary by type and configurability; the computational elements 270 are referred to as "computational" for ease of reference only, as the various types of circuit elements 270 may have functionality which is not computational in any strict sense, such as memory functions, finite state machine functions, communication functions, etc. For example, some circuit elements 270 may be static or configurable computational elements of a plurality of types, static or configurable memory elements of a plurality of types, static or configurable communication elements or interfaces of a plurality of types, static or configurable state machine elements, and so on, resulting in a plurality of types of composite circuit elements 260, such as configurable composite circuit elements 260, configurable or nonconfigurable memory composite circuit elements 260$_M$, or configurable or nonconfigurable composite I/O or other communication circuit elements 260 (which may provide I/O interfaces for external communication, for example). Accordingly, any reference herein to a composite circuit element 260 will be understood to mean and include any of the various types, special cases or specific instances or instantiations of composite circuit elements 260, such as configurable composite circuit elements 260, composite circuit elements 260A, first communication elements 250, and composite memory elements 260$_M$, unless the context requires or indicates otherwise.

Also for example, the first communication elements 250 (cluster I/O) may be implemented as a type of composite circuit element 260, having an element interface and control 280 presented to other composite circuit elements 260, and having a computational element 270 designed for communication functionality, and which may or may not be configurable. In addition, as discussed below, additional circuitry typically embodied as a "message manager" circuit 265 is provided within various or selected clusters 200 to perform communication functions, such as messaging over interconnect 220; in other exemplary embodiments, a message manager 265 may be utilized to provide communication interfaces to external memory, busses and communication systems, e.g., providing interfaces which comply with various communication and other data transfer standards, and may also include interfaces for communication with other portions of an IC when the apparatus 100 is embodied as part of an SOC. For example, depending upon the selected embodiment, a message manager 265 (as dedicated hardware) or a composite circuit element 260 (having a computational element 270 adapted for a communication function) may be utilized for such external communication, such as providing an Ethernet interface, a PCI interface, a PCI Express interface, a USB or USB2 interface, a DDR SDRAM interface or other type of memory interface, a wireless interface, an interface to another IC, and so on. In exemplary embodiments, the message manager may also be utilized for communication within the apparatus 100, such as communication between clusters 200 and communication between SPEs 292 (or SMEs 290), as discussed in greater detail below, such as for configuration and control messaging.

In other exemplary embodiments, external communication (such as for DDR-2, PCI, PCI-e) is provided by other components coupled to the interconnect 155, and the message manager circuit 265 provides for interfacing between stream-based communication within a supercluster 185 and/or cluster 200 and message or packet-based communication on the interconnection networks 220, 195, 160, 170, 180, essentially replacing the first and/or second communication elements 250, 210, such as in supercluster 185C and cluster 200C embodiments. In this embodiment, the message manager circuit 265 may also be implemented as combinational logic gates or as a finite state machine or as a state machine in conjunction with various combinational logic gates, and the message manager circuit 265 processes three kinds of messages: incoming messages, outgoing acknowledgements, and outgoing messages, all via interconnect 220 (155). Two types of messages are utilized, Data Write messages, and Data Copy messages. Data Write messages cause the payload data in the message to be written to an address specified in the message. Data Write messages, for example, may be user task writes, writes to second memory element 255, or writes over the configuration/control bus 285, such as for writing to the SPE 292 (or SME 290) and modifying SPE 292 (or SME 290) executable code, or writes to configure any composite circuit element 260 within a cluster 200. In this embodiment, also for example, the message manager circuit 265 may write to the SPE 292 (or SME 290), to provide SPE 292 (or SME 290) control. Data Copy messages cause a Data Write message to be sent from a specified source address to a specified destination address. Outgoing acknowledgements are generated by the message manager circuit 265 in response to an incoming Data Write message requesting a reply, and are themselves Data Write messages. Outgoing messages are assembled in the second memory element 255 (e.g., cluster 200 RAM 255, 475) by the SPE 292 (or SME 290) and are then transmitted by the message manager circuit 265, such as by setting a pointer to the start of the message and specifying the message size. The message assembly may be applicable to outgoing messages which do not require acknowledgment or extended to those which do require acknowledgment. Such messaging is discussed in greater detail below.

In an exemplary embodiment, the second memory element 255 (or memory 475) forming cluster 200 RAM is implemented as eight 1K times 16 blocks, with address generators provided within the memory-type composite circuit element $260_M$, rather than use of the SPE 292 (or SME 290) for address generation. An additional register is also utilized, which if set, reserves the memory-type composite circuit element $260_M$ for use by the SPE 292 (or SME 290), such as for storing instruction sets, and which if not set, enables use by other composite circuit elements 260. Address generation may include, for example, FIFO, block read/write (including counting and striding), and 2-D or 3-D address generation. The second memory element 255 also could be a hierarchical memory with or without paged or cached memory structures. Priority for data input into the second memory element 255 is typically the message manager circuit 265, to avoid data back ups on the interconnect 155, the memory-type composite circuit element $260_M$, followed by the SPE 292 (or SME 290). The memory-type composite circuit element $260_M$ has additional features, such as being synchronous, and further allowing multiple processes/contexts to execute simultaneously (as long as there is no data collision).

In another exemplary embodiment, the message manager circuit 265 is also configured or adapted to manage the memory-type composite circuit elements $260_M$ distributed throughout the apparatus 100. For example, the message manager circuit 265 is adapted to provide a uniform address space for the distributed plurality of memory composite circuit elements. Through this use of the message manager circuit 265, the distributed plurality of memory-type composite circuit elements 260 appears to the other composite circuit elements 260 and may be managed as one large memory array.

Each of the configurable computational elements 270 are comprised of combinational logic (i.e., a group of logic gates forming a functional unit, such as an adder, a multiplier, arithmetic logic unit ("ALU") etc.) having input, output, and other internal connections which are adapted to be changeable or are otherwise capable of being modified. More specifically, each configurable computational element 270 is designed such that its logic gates or other functional units may be coupled or connected (or decoupled or disconnected), through switching circuits, elements or other switching structures such as switches, multiplexers, demultiplexers, pass transistors, crossbar switches, routing elements, or other transistor configurations, in any of a plurality of ways, to perform a corresponding plurality of functions. Each different way of connecting the various gates (or functional units) is a "configuration", and a selected configuration may be represented as a plurality of bits which control the corresponding switches, multiplexers, demultiplexers, pass transistors, or other transistors or switching arrangements, creating the specific connections of the selected configuration. For example, adders, multipliers and registers may be coupled in any number of various ways to perform a wide variety of functions, from simple arithmetic to discrete cosine transformation. In other circumstances, a configuration may also indicate how input data is to be interpreted or used, such as signed or unsigned, a constant or a variable, consumable or non-consumable, etc. Other types of configurations and ways of configuring are known in the electronic arts, are considered equivalent and within the scope of the present invention.

Each of the available or selected configurations for a configurable computational element 270 is stored locally within a memory of the element interface and control 280 of the composite circuit element 260. As discussed in greater detail below, each of these configurations, in conjunction with other information such as selected inputs, output destinations and control information is defined as or comprises a corresponding "context". For example, the same configuration of elements may have multiple contexts, with each context using different inputs and providing outputs to different locations, or utilizing different constants. Also for example, different configurations will also provide different contexts, even if the different configurations will utilize the same inputs and provide outputs to the same destinations. The operations and control of composite circuit elements 260 is discussed in greater detail below with reference to FIGS. 5-8 and 16, following the discussion of the internal and external communication and addressing utilized in exemplary embodiments of the invention.

In exemplary embodiments, the various connections between composite circuit elements 260 within a cluster 200, and routing or tunneling from one cluster to another (via communication elements 250, 210, or 190), are established at run-time by the operating system of the apparatus 100, for implementation of a selected program, algorithm or function. In addition, such connections may change over time, and depending upon the selected embodiment, generally will change over time as may be needed, as briefly discussed above with reference to FIG. 1 and as discussed in greater detail below, for creation of new functionality, changing contexts and configurations, changing functionality, or resilient self-healing. In alternative embodiments within the scope of the invention, such as for applications which may not be subject to requirements for resiliency, the various connections also may be established prior to run-time and maintained in a memory within the apparatus 100, with the potential for subsequent modification as may be necessary or desirable.

Referring to FIGS. 2 and 3, a matrix 150 is logically divided into or comprises a plurality of superclusters 185 and one or more third communication elements 190. The third communication elements 190 are communication circuitry (e.g., routers, message repeaters, gateways, switches, or tunneling devices) which provide message or packet routing, switching, hybrid routing and switching, or tunneling of data and control into and out of a matrix 150, for communication of data, configuration and control information, and may be considered to form part of interconnect 155. The third communication elements 190 may also be considered message repeaters or gateways, and are one of several communication structures utilized in accordance with the present invention. In a first selected embodiment utilizing at least two or more third communication elements 190, each third communication element 190 is coupled to each supercluster 185 of a selected matrix 150 and to other third communication elements 190 (via bus structure 160), such that communication to and from each supercluster 185 may occur through either third communication element 190. As a result, in the event of a failure of any one of the third communication elements 190, another third communication element 190 is available to each supercluster 185 of a selected matrix 150 to provide identical communication functionality. While illustrated as separate third communication elements 190, it will be understood that these independent circuits may be combined into one or more larger circuit structures providing the same independent communication function. For example, in a selected embodiment, a single third communication element 190 is utilized, similarly connected to each supercluster 185 and to other third communication elements 190, with each third communication element 190 providing multiple and independent communication pathways (e.g., 4 down links and 4 up links), such that additional links are available in the event of failure of one or more links. Again, in the event of such a failure, significant functionality is preserved, with graceful degradation and not catastrophic failure.

Each supercluster 185 is further logically divided into or comprises a plurality of clusters 200 and one or more second communication elements 210. The second communication elements 210 are also communication circuitry which provide message or packet routing, tunneling, switching or other transfer of data and control into and out of a supercluster 185, for communication of data, configuration and control information, and also may be considered to form part of interconnect 155. The second communication elements 210 also may also be considered message repeaters or gateways, and are one of several communication structures utilized in accordance with the present invention. In a first selected embodiment utilizing at least two second communication elements 210, each second communication element 210 is coupled to each cluster 200 of a selected supercluster 185, such that communication to and from each cluster 200 may occur through either second communication element 210. Also as a result, in the event of a failure of a second communication element 210, another second communication element 210 is available to each cluster 200 of a selected supercluster 185 to provide identical communication functionality. In a selected embodiment, these independent circuits may be combined into one or more larger circuit structures providing the same independent communication function. Also for example, a single, combined second communication element 210 is utilized, similarly connected to each cluster 200 and to one or more third communication elements 190. In this embodiment, each second communication element 210 provides multiple and independent communication pathways (e.g., 4 down links and 4 up links), such that additional links are available in the event of failure of one or more links. Again, in the event of such a failure, significant functionality is preserved, with graceful degradation and not catastrophic failure.

As a consequence, moving from a matrix 150 level to a supercluster 185 level and to a cluster 200 level, the interconnect 155 provides message or packet routing, self-routing, tunneling, switching or other transfer of data, configuration and control information through a plurality of communication elements 190 and 210 and communication channels (bus structures) 160, 195, 220. In addition, as discussed below, within a cluster 200, the interconnect 155 also provides circuit-switched (or circuit-based) communication, through first communication elements 250. Indeed, one of the novel features of the architecture of the present invention is the use of an interconnect structure 155 providing both message or packet-based and circuit-switched communication.

Continuing to refer to FIGS. 2 and 3, the exemplary interconnect 155 comprises: (1) a plurality of routing (tunneling, message repeater or gateway) elements, namely, a plurality of third communication elements 190, a plurality of second communication elements 210, and a plurality of first communication elements 250; (2) a plurality of circuit switching elements, namely, the plurality of first communication elements 250; and (3) their corresponding busses, wires or other forms of physical connections or date transmission media (e.g., illustrated, for example, as busses or wires 160, 195 and 220 which, as discussed above, are "n" bits wide). Within a matrix 150, one or more third communication elements 190 provide message or packet routing, self-routing, tunneling, switching or other transfer of data, configuration and control information, to and from other matrices 150 (via first bus 160 and I/O 170, 180), and to and from a plurality of superclusters 185, via one or more second communication elements 210 within each such supercluster 185. In turn, one or more second communication elements 210 within such a supercluster 185 provides message or packet routing, self-routing, tunneling, switching or other transfer of data, configuration and control information, to and from the third communication elements 190, and to and from a plurality of clusters 200 within the supercluster 185, via one or more first communication elements 250 within each such cluster 200.

In turn, the one or more first communication elements 250 within a cluster 200 provides message or packet routing, self-routing, tunneling, switching or other transfer of data, configuration and control information to and from the cluster 200, via the second communication elements 210, such as to and from other clusters 200, and provides circuit-switched communication for data and control within the cluster 200, enabling communication between other clusters 200 and the composite circuit elements 260, SPE 292 (or SME 290), message manager 265, memory elements 255 and/or other components within the cluster 200. For example, data produced from a composite circuit element 260 within a cluster 200 may be output through a direct or a circuit-switched connection to one of the plurality of first communication elements 250, which then converts the data to message or packet form and routes the data message or packet to the second communication element 210, for transmission to another cluster 200, another supercluster 185, or another matrix 150. Similarly, when a data message or packet arrives via a second communication element 210, which may be from another cluster 200, another supercluster 185, or another matrix 150, the first communication element 250 extracts the data and transfers the one or more data words to the corresponding composite circuit element 260, SPE 292 (or SME 290), memory elements 255 or other components within the cluster 200.

These various communication elements (third communication elements 190, second communication elements 210, first communication elements 250, the full interconnect 275 and the distributed full interconnect 295 discussed below) may be designed to have any selected capacity, such as full interconnectivity to more limited interconnectivity. For example, instead of the full interconnect 275 or the distributed full interconnect 295 providing for any output of a composite circuit element 260 to be coupled concurrently to any input of a composite circuit element 260 in the exemplary embodiments (with the exception of conflicts or contentions for the same inputs or outputs), more limited or partial interconnections within the cluster 200 may be provided, such as by using a partial interconnect element or a distributed partial interconnect element (not separately illustrated). Also for example, in exemplary embodiments, the first communication elements 250 may provide 2 or more concurrent connections or routing, such as two up links to and two down links from second communication elements 210, in addition to one or more concurrent connections to and from the composite circuit elements 260 and other components of a cluster 200. More connectivity may also be provided in any given embodiment, as a trade-off of potential collisions with IC area. In addition, where less than full interconnectivity is provided, the various communication elements (third communication elements 190, second communication elements 210, and first communication elements 250) may also provide an arbitration functionality, which may be based on priority, round robin, sequential, etc., selecting a connection or routing for data transfer at any given time.

While illustrated having cluster 200, supercluster 185, matrix 150 and apparatus 100 levels, it will be understood by those of skill in the art that the number of levels may be extended or decreased in any selected embodiment. For example, a plurality of fourth communication elements (not illustrated), with the other interconnect 155, may be utilized to create another level of hierarchy within the apparatus 100, and so on, creating any selected number of levels within the hierarchy of the apparatus 100.

Figure 4A:
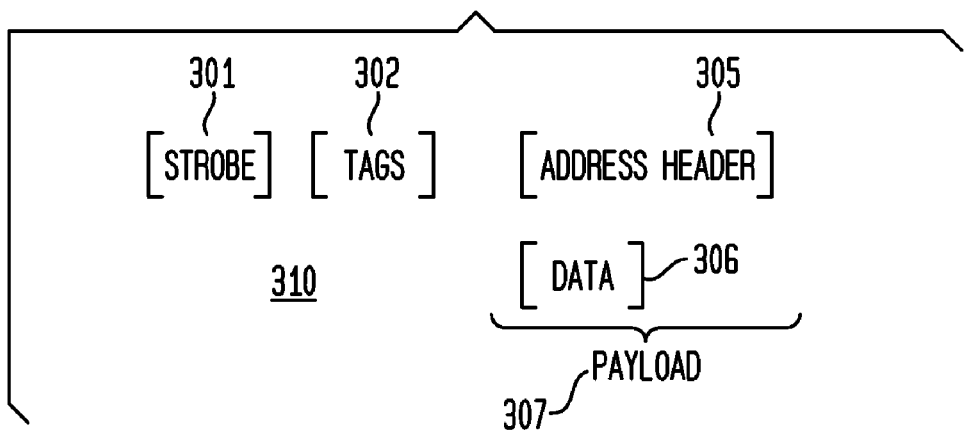
FIGS. 4A and 4B, is a diagram illustrating an exemplary data message and message bus protocol in accordance with the teachings of the present invention.
Figure 4B:
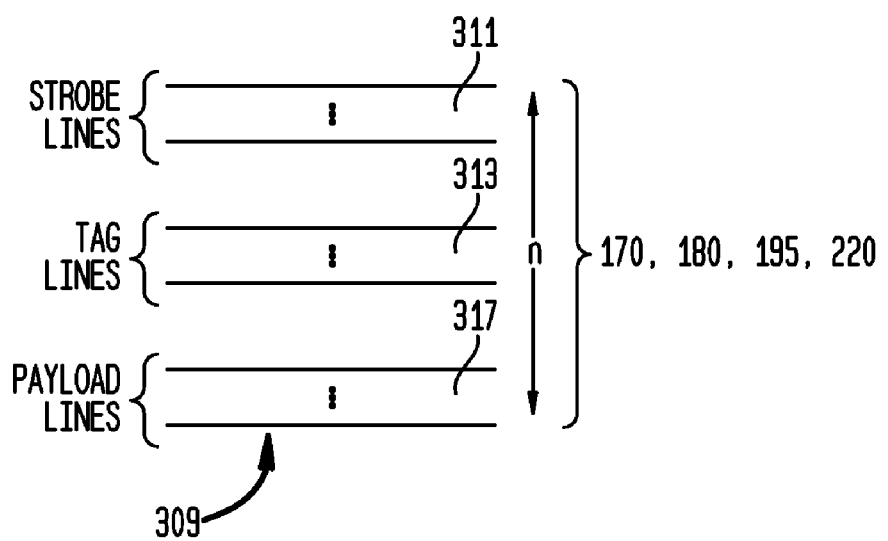

FIG. 4, divided into FIGS. 4A and 4B, is a diagram illustrating an exemplary data transmission message structure 310 and message bus structure 309 in accordance with the teachings of the present invention. The interconnect 170, 180, 195 and 220 (collectively interconnect 155), in exemplary embodiments, are message channels using the protocol (data transmission message structure 310) illustrated in FIG. 4A and having the message bus structure 309 illustrated in FIG. 4B, and transport data, configuration, and control messages (in payload 307). In the exemplary embodiments, data, configuration and/or control messages (or packets) are routed over the interconnect 155 by the various routing elements such as message managers 265 and message repeater (or waypoint) circuits 210A (third communication elements 190, second communication elements 210, and first communication elements 250) as a "message" consisting of one or more data words 310 transmitted (or repeated in a specified order sequentially), also referred to as "train" or tunneling of data words, thereby reducing addressing overhead which would otherwise be associated with routing of individually addressed data words (which are typically referred to as "packets", and which may be transmitted and received in any order and through different routes).

More specifically, referring to FIG. 4A, a data transmission sequence (or message) is of variable length and is comprised of one or more words (fields or data structures) 310, divided into "strobes" 301, "tags" 302, and a payload 307 consisting of a destination address header 305 and/or data 306, and is "n" bits wide, corresponding to the bit width of the message channel utilized, such as interconnect 155 (170, 180, 195 and 220). In an exemplary embodiment, for example, the interconnect 155 comprises a message bus 309, with each line or wire corresponding to a bit of the message (i.e., strobe lines 311, tag lines 313, and payload/data lines 317), and in an exemplary embodiment, has a width of twenty bits. Each such word 310 is transmitted sequentially, in order, one after the other, on the interconnect 155. The first field, typically the first two bits in an exemplary embodiment, is the strobes field 301, and is a notification of a request (data is available) or an acceptance (an acknowledgement or ACK), and is used to notify the recipient of incoming data on detecting an edge and to notify a sender of the receipt of data, respectively (providing a handshake mechanism). The next field, typically the next two bits in an exemplary embodiment, is the tags field 302, which indicates the location of the address header 305 and the first, middle, and last words of data. The next field, typically the next sixteen bits in an exemplary embodiment, is the payload 307, which may consist of an address header or data (which will be differentiated from each other using the tags field 302). An address header may be a destination address (which may require more than one word), or may comprise both a destination address and a source address (which also may require more than one word), and also indicates that all subsequent data words are to be routed to the same addressed destination, automatically, without any need for separate or additional addressing for each data word (in contrast to packet switching). When the payload 307 consists of data words 306, the first data word, the middle data words, and then the last data word, will be designated as such by the tags field 302, so that the recipient knows when the last data word has arrived.

Such an address header 305, in the exemplary embodiments, has the form of [IC number, matrix number, supercluster number, cluster number, zone number], with the number of bits utilized to designate the address dependent upon the number of ICs, matrices 150, superclusters 185, clusters 200 and zones 201 implemented in the selected embodiment. Sixteen bits are allotted for addressing in an exemplary embodiment, although fewer may actually be needed. It should also be noted that as such a message comes in to any of the communication elements (e.g., 190, 210, 250, 265) as successive words, the communication elements may commence processing the message and further transmission of the incoming data before the entire message has been received, allowing for more continuous data movement, such as transferring the data payload to the full interconnect 275, 295 or to cluster memory (RAM) 475.

Such an interconnect 155 which provides message-based transport of any kind of data, including both application data and configuration data, along with point-to-point communications within the apparatus 100, 140, is highly new and novel.

This message-based data transmission may be implemented in any of various ways, such as in an exemplary embodiment as a combination or hybrid of both message or packet routing and circuit switching. More particularly, the various routing elements (third communication elements 190 and second communication elements 210) provide for establishing one or more connections between and among clusters 200 using the address header of the first word or field 305, and reserving and setting up a dedicated path from a source cluster 200 to a destination cluster 200. The dedicated path may be formed by circuit-switching or other connections within, for example, a message repeater 210A or gateway. The remaining data words arriving at the communication element (third communication elements 190, second communication elements 210), may be buffered and then transferred automatically as a message on the switched or other dedicated path established within the communication element using the address header. The dedicated path is maintained until the complete message has been transmitted, after which the various path elements are released for other communications. A plurality of paths may be used concurrently to support a broadcast mode. Also in the exemplary embodiment, a plurality of such data transmissions may occur concurrently between and among the same communication elements, such as by using the four uplinks and four downlinks previously mentioned for an exemplary embodiment, allowing transmission of multiple data streams concurrently. As a consequence, in the exemplary embodiments, the plurality of communication elements (including the first communication elements 250) support any selected mode of communication, such as one-to-one input and output data links, one-to many (broadcast) data links, and many-to-one data links.

In contrast, a first communication element 250 (typically implemented in a message manager 265) receives data words from the various components of the cluster 200, typically sequentially (generally one data word per clock cycle or other unit time delay) via the full interconnect 275, 295, provides an address header, and transmits the sequence to a second communication element 210 (typically a message repeater 210A) for transmission to another cluster 200, supercluster 185 or matrix 150, generally transmitting the entire sequence as a message (packet burst). For data from other clusters 200, the first communication element 250 receives and buffers the plurality of data words or stores them in memory (e.g., a memory composite circuit element (MEMU) 260M), and sequentially provides them to the designated component of the cluster 200, typically via the switching or dedicated lines of the full interconnect 275. In exemplary embodiments, the source and/or destination addresses may be stored in any of a plurality of components, such as within any of the various routing elements (third communication elements 190, second communication elements 210, and first communication elements 250), and established during the binding process (discussed below) for each context utilizing message-based intercluster communication (rather than using a cluster queue 245).

More particularly, the one or more sequential processing elements (SPEs) 292 or state machine elements ("SMEs") 290 (or other controller(s) 175 or off-chip controller(s) or processor(s)) performing the binding process (the "binder") assigns actions (i.e., functions or contexts) to the various composite circuit elements 260, and establishes a "virtual" data linkage or routing between or among the composite circuit elements 260, namely, assigning a data linkage between one or more composite circuit elements 260, without necessarily specifying how that data linkage is to physically occur. The various communication elements (first communication element 250, second communication elements 210, third communication elements 190, full interconnect 275 and/or distributed full interconnect 295), either clock cycle-by-cycle or at any given time, then are adapted to determine the physical route for the corresponding data transfer, creating the physical data linkage. For example, via switching and/or routing, a first physical data path or link between or within communication elements may be established for one instance of a transfer of a data packet (e.g., a train of data words) between two clusters 200 (and subsequently released), with a different physical data path or link established for a subsequent instance of a transfer of a data packet between the two clusters 200. Such physical data links may be stored and maintained, for example, within the various memories within the communication elements, such as stored as a routing table within the memories of the corresponding element interface and control 280 (discussed below), with any selected physical data link determined by the corresponding element controller 325 of the communication composite circuit element 260. Similarly, at any instant in time or clock cycle, different physical data links may be established (and released) for data communication within the cluster 200. In other exemplary embodiments, rather than establishing a virtual data link, the physical data linkages may also be established by the binder as part of the binding process.

Figure 5:
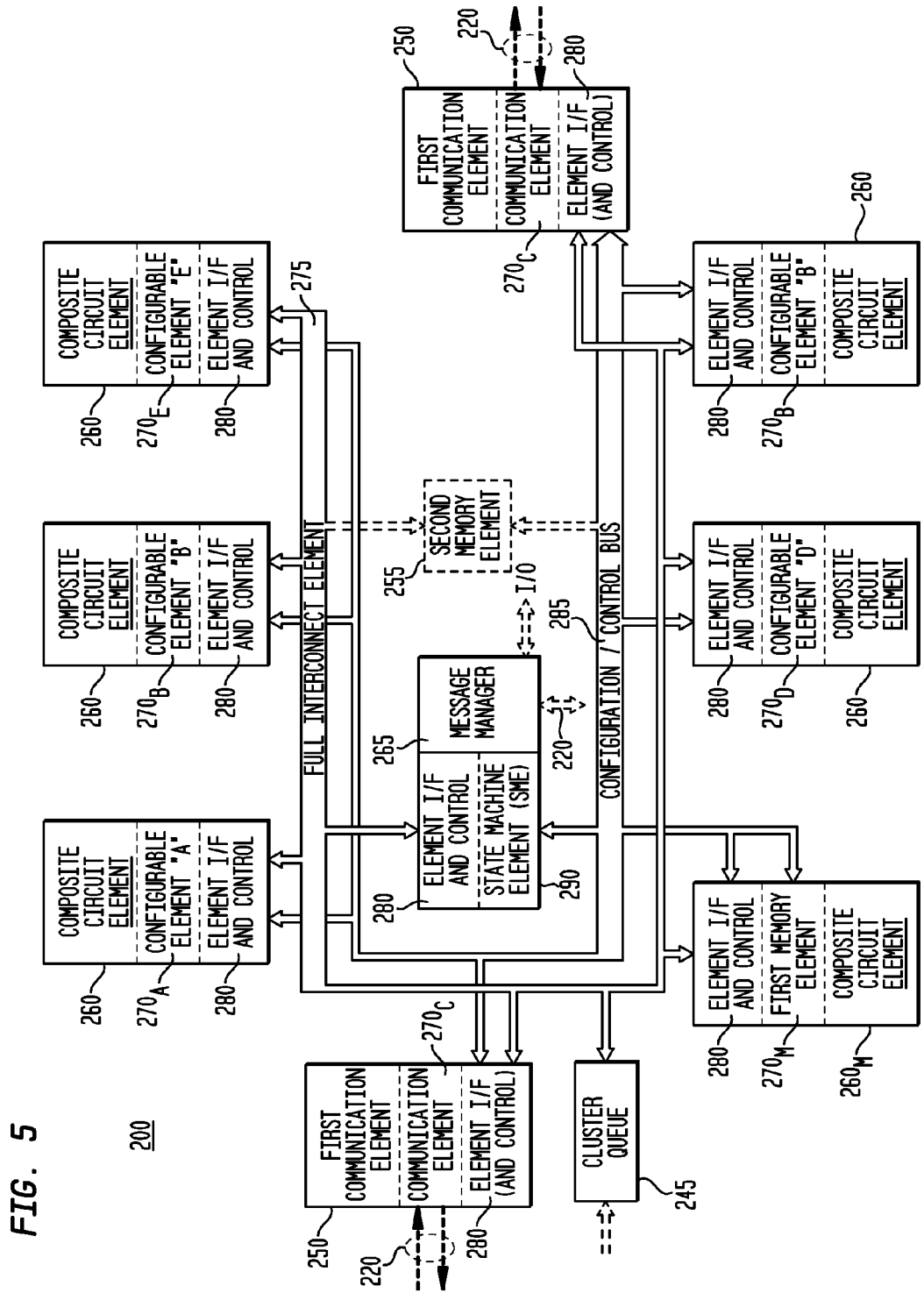
FIG. 5 is a block diagram illustrating a first exemplary circuit cluster in accordance with the teachings of the present invention.
Figure 6:
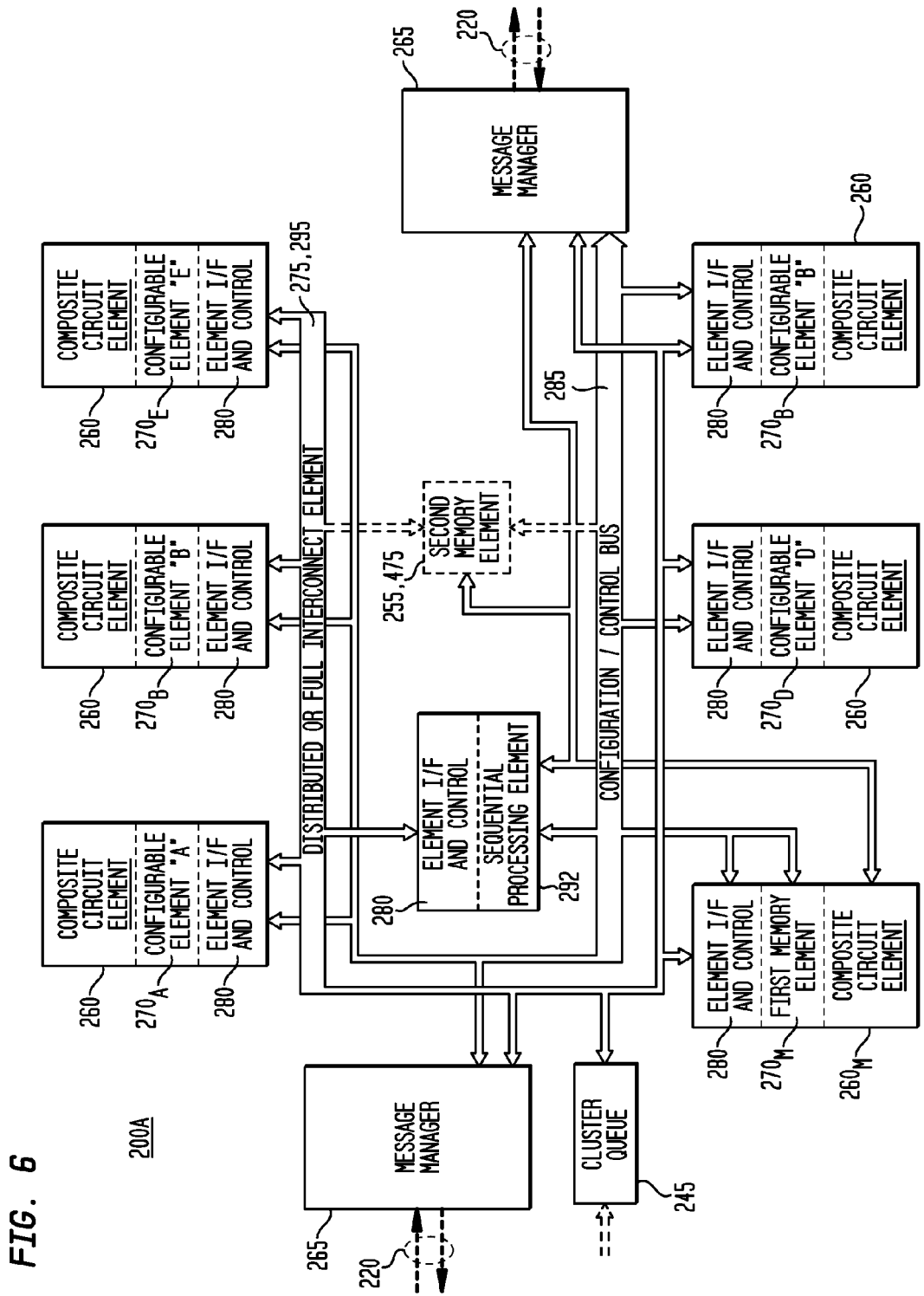
FIG. 6 is a block diagram illustrating a second exemplary circuit cluster in accordance with the teachings of the present invention.
Figure 7:
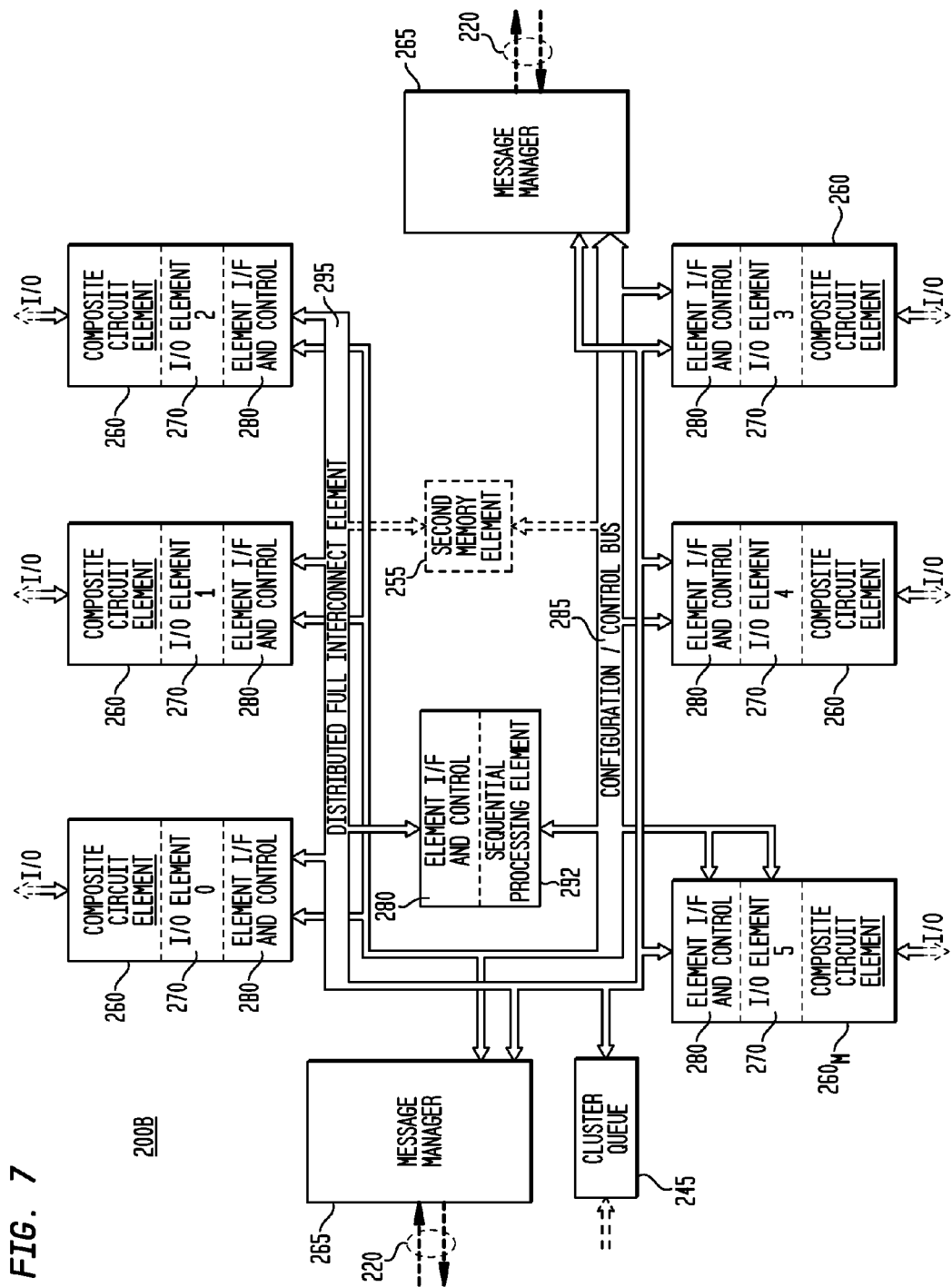
FIG. 7 is a block diagram illustrating a third exemplary circuit cluster in accordance with the teachings of the present invention.
Figure 18:
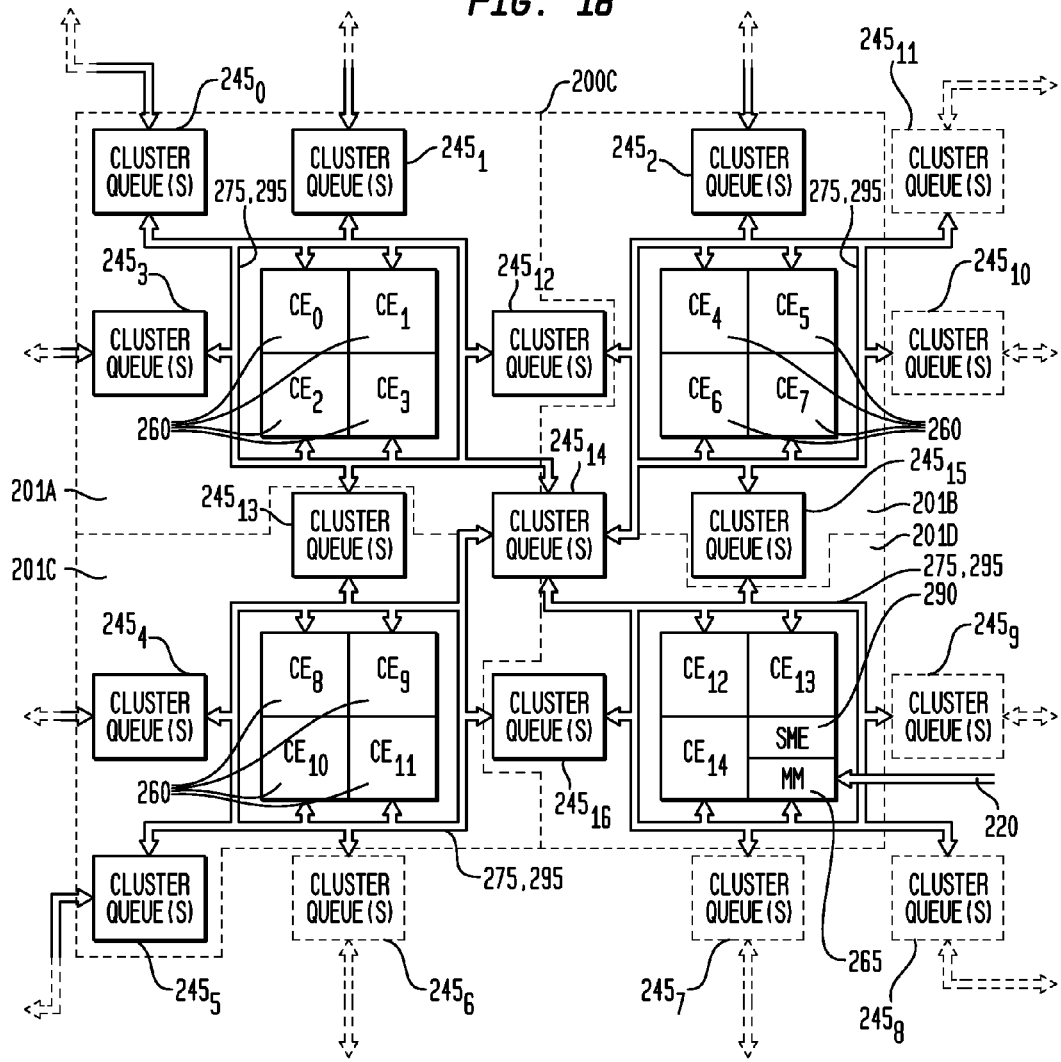
FIG. 18 is a block diagram illustrating a fourth exemplary circuit cluster in accordance with the teachings of the present invention.
Figure 20:
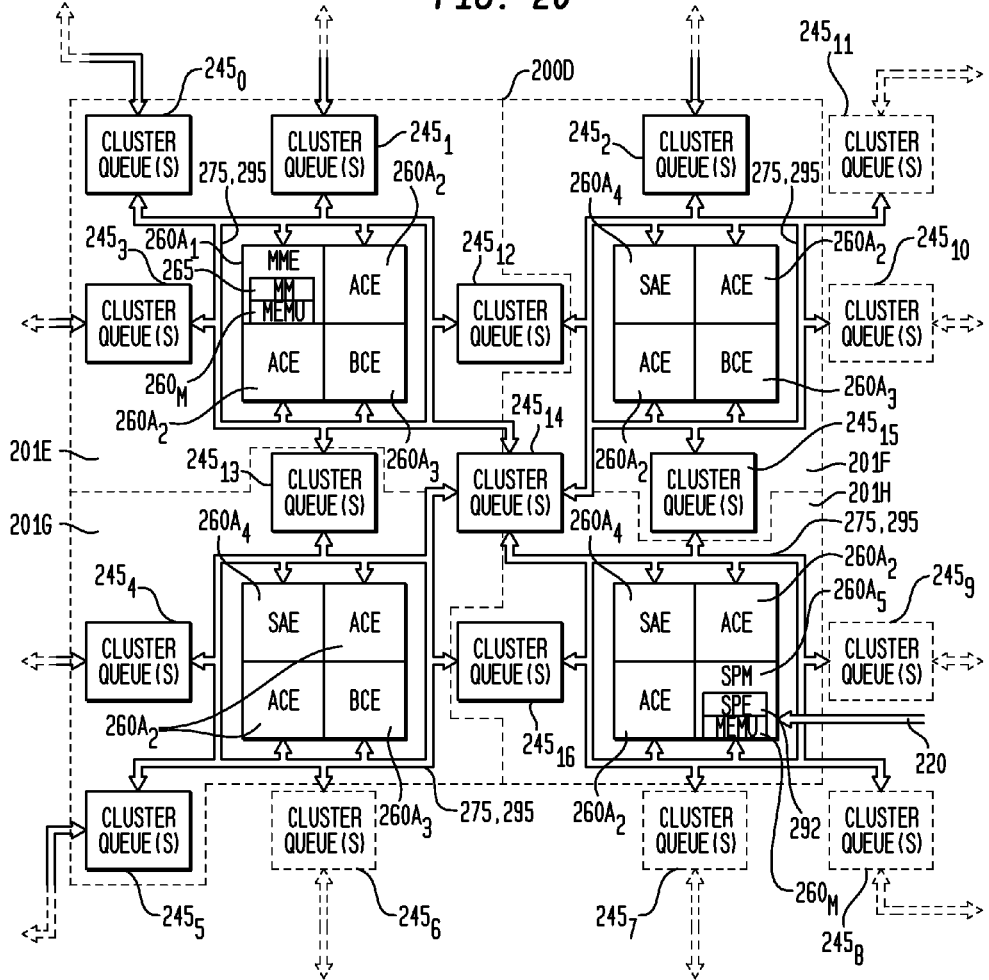
FIG. 20 is a block diagram illustrating a fifth exemplary circuit cluster in accordance with the teachings of the present invention.

FIG. 5 is a block diagram illustrating a first exemplary cluster 200 in accordance with the teachings of the present invention. FIG. 6 is a block diagram illustrating a second exemplary cluster 200A in accordance with the teachings of the present invention. FIG. 7 is a block diagram illustrating a third exemplary cluster 200B in accordance with the teachings of the present invention. Additional cluster 200 embodiments are illustrated in FIGS. 18 and 20 as clusters 200C, 200D. In cluster 200, a full interconnect 275 (as a single or unitary circuit component) is utilized to provide complete interconnections between inputs and outputs of each of the composite circuit elements 260 and other cluster components as illustrated. For example, the full interconnect 275 may be implemented as a crossbar switch or as dedicated wires. In cluster 200A, a distributed full interconnect 295 (as a distributed plurality of circuit components) is utilized to provide complete interconnections between inputs and outputs of each of the composite circuit elements 260, cluster queues 245, and other cluster components as illustrated. For example, the distributed full interconnect 295 may be implemented as a plurality of multiplexers and/or demultiplexers, such as the multiplexer 335 illustrated in FIG. 8 for a selected composite circuit element 260, along with various wires or bus structures.

Other variations are also illustrated, such as memory 255, 475 connections, use of a message manager 265 as a first communication element 250, use of a SPE 292 or SME 290, and so on. All such variations are within the scope of the disclosure. As a consequence, any reference to any cluster 200-200D embodiment will be understood to mean and include any other cluster 200-200D embodiments and vice-versa.

As illustrated in FIGS. 5 and 6, the exemplary cluster 200 (200A) comprises a plurality of composite circuit elements 260 (or composite elements 260); a plurality of communication elements, namely, one or more first communication elements 250 and a full interconnect 275 or a distributed full interconnect 295 (also referred to as a full communication element or full interconnect bus ("FIBus")); a state machine element (SME) 290 or SPE 292; a message manager 265; and various communication structures, such as busses or other types of communication media. It should be noted that a SPE 292 (or SME 290) and message manager 265 may not required in every cluster 200 or zone 201 for some exemplary embodiments; in various embodiments, depending upon the application to be run, selected clusters 200 may comprise predominantly composite circuit elements 260 (e.g., having digital signal processing ("DSP") functions), with processing and/or message management functionality provided by SPEs 292 (or SMEs 290) and message managers 265 of other clusters 200 (with corresponding communication via the first communication elements 250). In other exemplary embodiments, rather than or in addition to including one or more SPEs 292 (or SMEs 290) within the clusters 200, the corresponding functions may instead be implemented through the use of one or more external controllers 175 or other, off-chip controllers, state machines, or processors. In selected embodiments, the full interconnect 275 may be implemented as a crossbar switch or pass-transistors (with or without arbitration capability), while the distributed full interconnect 295 may be implemented as a plurality of switches, pass transistors, multiplexers and/or demultiplexers, for example.

In other exemplary embodiments, the full interconnect 275, 295 is implemented as a plurality of dedicated wires or busses connecting every output of composite circuit elements 260, 260A and cluster queues 245 to every input of composite circuit elements 260, 260A and cluster queues 245 within a zone 201, and depending upon the zone 201 or embodiment, also providing full connection capability to a SPE 292 and a message manager 265. Additional, context-based switching is provided by input and output multiplexers 335, 335A, 380, 380A. In another exemplary embodiment, two (or more) full interconnects 275, 295 are implemented within a zone 201, each providing full coupling among a subset of the components within a zone 201, such as a first full interconnect 275, 295 coupling composite circuit elements 260, 260A and even numbered cluster queues 245 for performing computations on "real" numbers (in mathematical terms") and an independent, second full interconnect 275, 295 coupling composite circuit elements 260, 260A and odd numbered cluster queues 245 for performing computations on "imaginary" numbers (in mathematical terms"). For the latter case, a zone 201 may simply be viewed containing fewer components, with the "real number" grouping being a first zone 201 and the "imaginary number" grouping being a second zone 201, as in both cases, each has a plurality of composite circuit elements 260, 260A and at least one cluster queue 245 coupled to a full interconnect 275, 295, which couples all outputs to all inputs within that smaller zone.

Also in selected embodiments, as various options or variations, an exemplary cluster 200 may also include additional memory, such as second memory element 255, which may be a type of queue, such as a long queue, for example; may also include an cluster queue 245, such as a FIFO, buffer or other memory structure, for transfer of data, control and/or configuration information between adjacent clusters 200 without utilizing the various first communication elements 250 and second communication elements 210 (creating the "fast path" connections 215 illustrated in FIG. 2); and may also include a separate or additional communication structure for communication between the SPE 292 (or SME 290) and other components within the cluster 200, illustrated as configuration/control bus 285. In other exemplary embodiments, memory is implemented as cluster RAM 475.

Not separately illustrated in FIGS. 5 and 6, each element interface and control 280 also includes a memory, input queues, and an element controller (comprised of a plurality of conditional logic structures (gates)), discussed in greater detail with reference to FIGS. 8 and 25. In addition, first communication elements 250 may also include a memory structure, to transfer incoming data to a selected composite circuit element 260, and to address and route outgoing data from a selected composite circuit element 260. While FIGS. 5 and 6 illustrate a cluster 200 (200A) comprising six composite circuit elements 260, two first communication elements 250, one state machine element ("SME") 290, one message manager 265, and one full interconnect 275 or distributed full interconnect 295, with possible additional memory such as second memory element 255 and one or more various communication structures such as cluster queue 245, it will be understood by those of skill in the electronic arts that any amounts and combinations of these components may be utilized, and that any and all such amounts and combinations are considered equivalent and within the scope of the invention.

Each composite circuit element 260 is comprised of a computational circuit element 270 and a uniform (constant or fixed) element interface and control 280. While generally referred to as a "computational" circuit element 270, it is to be understood that a circuit element 270 may perform functions other than computations, such as bit reordering, memory functions, control functions, state machine functions, communication functions, instruction processing, and all such non-computational or other functionality is considered within the scope of a circuit element 270 of the invention regardless of nomenclature.

Figure 9:
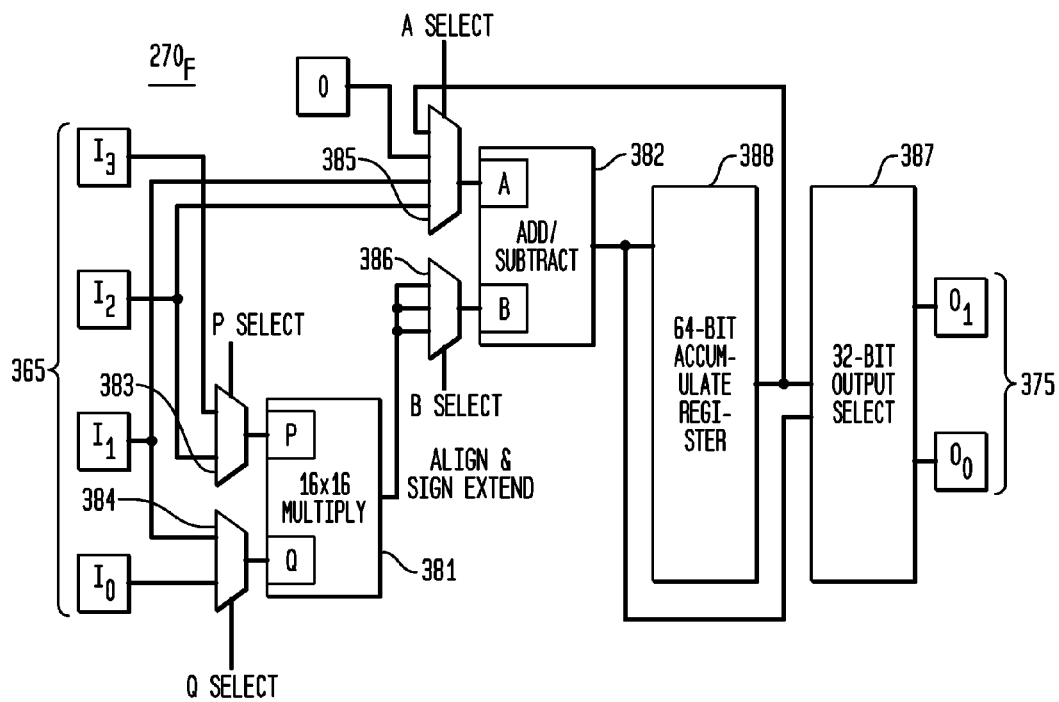
FIG. 9 is a block diagram of an exemplary multiplier configurable element in accordance with the teachings of the present invention.
Figure 10:
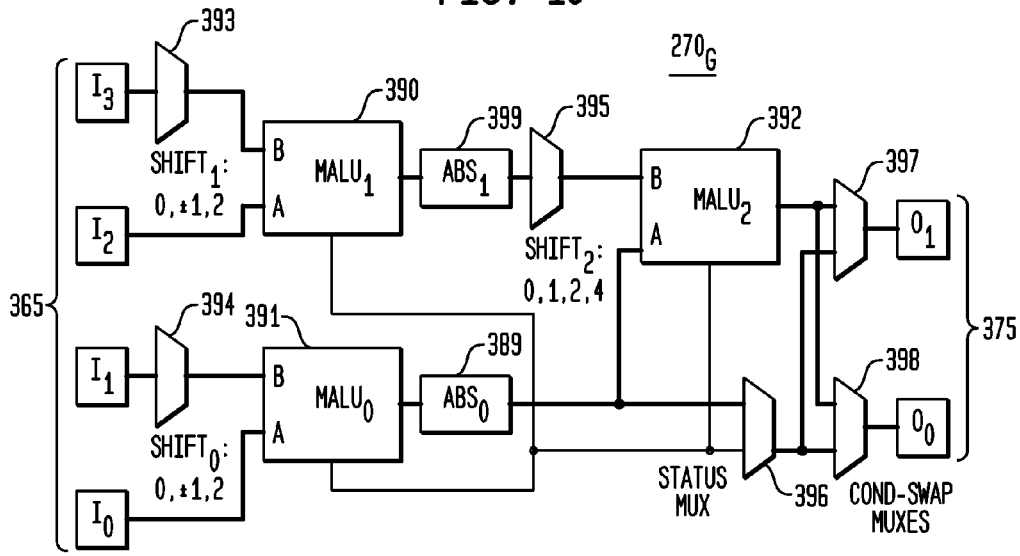
FIG. 10 is a block diagram of an exemplary triple-ALU configurable element in accordance with the teachings of the present invention.

Within a cluster 200, the composite circuit elements 260 have (computational) elements 270, which may be of the same or different type, and may be included within the cluster 200 in any selected combination or mix, and may be static (nonconfigurable) or configurable. As illustrated in FIG. 5, the elements 270 are a configurable element (type "A") $270_A$, two configurable elements (type "B") $270_B$, a configurable element (type "D") 270, a configurable element (type "E") $270_E$, and a configurable or non-configurable first memory circuit element $270_M$. A communication circuit element $270_C$ is utilized in the first communication elements 250, which is typically non-configurable but which could be implemented to be configurable. In addition, any selected elements 270 may also be implemented to be nonconfigurable, and all such variations are within the scope of the invention. The configurable computational elements 270 generally perform computation and/or bit manipulation and may be, for example, configurable arithmetic logic units (ALUs), configurable triple ALUs, configurable multiply and accumulate (MAC) units, configurable bit reordering elements (BREOs), configurable multipliers, configurable Galois multipliers, configurable barrel shifters, configurable look-up tables, configurable and programmable controllers, super or large ALUs (capable of a wide variety of arithmetic calculations, functions, comparisons and manipulations), and so on. The configurable computational elements 270 generally are comprised of combinatorial logic gates, but may also include conditional logic structures, as necessary or desirable, such as to evaluate the existence of a condition or event. Exemplary configurable elements 270 are illustrated in FIGS. 9 and 10.

As mentioned above, in some exemplary embodiments, elements 270 may also be implemented to provide communication functions, may be configurable or non-configurable, and may provide interfaces for internal communication, external communication, and memory access. In an exemplary embodiment, such external communication functions are provided through the message manager 265, which provides a selected communication function of a plurality of communication functions, which typically differ between and among the various clusters. The plurality of communication functions may include, for example, providing an Ethernet interface, a PCI interface, a PCI Express interface, a USB or USB2 interface, a DDR SDRAM interface or other type of memory interface, a wireless interface, an interface to another IC, etc. Typically, the message manager 265 of a given cluster 200 provides one type of communication function, with the message managers 265 of other clusters 200 correspondingly providing other types of communication functions. For example, the message manager 265 of a first cluster 200 may provide a PCI Express interface, while the message manager 265 of a second cluster 200 may provide a DDR-2 interface, while the message manager 265 of a third cluster 200 may provide an Ethernet interface.

In addition, the message manager 265 may also have a direct connection to the interconnect 155, or more particularly, the second communication channel or bus 220, for intercluster communication independently of the various first communication elements 250, such as for communication of configuration and/or control information between or among the SPEs 292 (or SMEs 290) and other components. For example, during run-time binding, the various configurations and data routings may be transmitted to the SPEs 292 (or SMEs 290) as messages via the message manager 265. As a consequence, the message manager 265 is illustrated as directly coupled to or part of the SPE 292 (or SME 290) (e.g., without intervening or separate bus or communication structures). Such exemplary embodiments are discussed in greater detail below with reference to FIGS. 18-38.

The first memory circuit element $270_M$, second memory element 255 and/or memory within the element interface and control 280 may be any form of memory, machine-readable storage or memory media, whether volatile or non-volatile, including without limitation, RAM, FLASH, DRAM, SDRAM, SRAM, MRAM, FeRAM, ROM, EPROM or $E^2$PROM, or any other type of memory, storage medium, or data storage apparatus or circuit, which is known or which becomes known, or combinations thereof. In a first exemplary embodiment, the first memory element $270_M$ and the memory within the element interface and control 280 are implemented as content addressable memories ("CAMs"). In a second exemplary embodiment, the first memory element $270_M$ and the memory within the element interface and control 280 are implemented as SDRAM.

The first communication elements 250 are similar to the composite circuit elements 260, including an element interface and control 280, and a circuit element 270 which, in this case, is a communication element $270_C$, which may be configurable or non-configurable, depending upon the selected embodiment. For example, configuration may occur to determine switching or routing paths within the communication element 270$_C$. The communication element 270$_C$ provides for message or packet switched data transmission and reception to and from the interconnect 155, and circuit-switched communication within the cluster 200.

Similarly, the SPE 292 (or SME 290) in various exemplary embodiments also comprises an element interface and control 280, with its "computational" element (270) being the more specific case of a processor or state machine element, which also may be configurable or non-configurable, depending upon the selected embodiment. The various memories 330 and input and output queues 320, 315, for SPE 292 (or SME 290) embodiment, alternatively may be provided as internal registers. Using the element interface and control 280, as discussed below, also provides for the SPE 292 (or SME 290) to have a plurality of contexts, such as for multithreading. In addition, the SPE 292 (or SME 290) is illustrated as having direct access to the element interface and control 280 of the composite circuit elements 260 (via configuration/control bus 285) for ease of directly populating configurations, control, and receiving interrupts, and a direct connection to the first memory element 270$_M$ (and/or second memory element 255) (e.g., through one port of a dual port RAM), to facilitate corresponding memory accesses for instruction/code processing and other data access. As mentioned above, the SPE 292 (or SME 290), in conjunction with any of the available memories (e.g., a composite memory element 260$_M$ or second memory element 255), constitutes a "controller" within the scope of the present invention, such as a cluster controller, a supercluster controller, a matrix controller, etc. Such a controller may also include the message manager 265 or similar functionality.

By utilizing the same (or similar) element interface and control 280, the first communication elements 250 and SPE 292 (or SME 290) appear to the composite circuit elements 260 within the cluster 200 as simply another composite circuit element 260, with corresponding advantages discussed below. For example, the other composite circuit elements 260 then do not need to have any knowledge that their output is provided to or input is being received from a first communication element 250 or a SPE 292 (or SME 290), and do not need to accommodate any different type of data reception or transmission. Other configurations of a message manager 265 are illustrated and discussed with reference to FIG. 38.

In exemplary embodiments, the composite circuit elements 260 may include some form of identification by type or kind of composite circuit element 260 (i.e., type of circuit element 270 within the composite circuit element 260), to facilitate identification by a state machine element ("SME") 290 (or a controller 175). Such identification may be retained in an available memory within the cluster 200 in a wide variety of forms, such as hard-wired as a ROM within a composite circuit element 260 during fabrication, loaded into a memory during a boot process, and so on. Such type identification, for example, may be maintained in a memory composite element 260, memory 255, 475, or within the memory 330 of the element interface and control 280 discussed below.

The element interface and control 280 provides both (1) a uniform interface for input to and output from each configurable circuit element 270, memory element, communication element, or SPE 292 (or SME 290); and (2) a uniform control structure, and is discussed in greater detail below with reference to FIGS. 8, 16, 25 and 26. Because each element interface and control 280 has the same structure for every composite circuit element 260, first communication element 250, and SPE 292 (or SME 290) within every cluster 200, every such element 260, 250, 290, 292 may be controlled in a uniform, repeatable manner, without regard to the type of element, such as whether the element (270) is a configurable ALU, a configurable barrel shifter, a communication element, or a state machine element. In addition, every such composite circuit element 260, first communication element 250, and SPE 292 (or SME 290) may communicate with any other composite circuit element 260, first communication element 250, and SPE 292 (or SME 290) in a uniform, repeatable manner, without regard to the type of element (e.g., a configurable circuit element 270). More particularly, every composite circuit element 260, first communication element 250, and SPE 292 (or SME 290) may be addressed in a uniform manner, through the addressing scheme discussed above.

As a first result of such uniformity, no composite circuit element 260, first communication element 250, and SPE 292 (or SME 290) is required to know anything about any other composite circuit element 260, first communication element 250, and SPE 292 (or SME 290) from which it receives input or to which it provides output, i.e., each composite circuit element 260, 260A and first communication element 250 may be generally ignorant about its surroundings and functions. (Depending upon the implementation, the SPE 292 (or SME 290) may have additional functionality for monitoring, testing and controlling other elements, so that it is knowledgeable about its surroundings and functions). As a second result of such uniformity, each composite circuit element 260, first communication element 250, and SPE 292 (or SME 290) may be configured, addressed and queried in a uniform manner, also without regard to the type of element (e.g., type of circuit element 270).

As a third and very significant result, each composite circuit element 260, 260A having a selected type of circuit element)s) 270 is virtually completely interchangeable with any other composite circuit element 260, 260A having the same selected type(s) of circuit element(s) 270, except to the extent of any locality (distance) constraints for the performance of a particular computation or algorithm. As a consequence, subject to such constraints, for execution of a given algorithm, the operations performed by any selected composite circuit element 260, 260A having a selected type of circuit element(s) 270 may be freely assigned or transferred to another composite circuit element 260, 260A having the same selected type of circuit element(s) 270, without any detrimental effect. In the event of a failure or defect in a particular composite circuit element 260, 260A having a selected type of circuit element(s) 270, its operations may be transferred to: (1) another available composite circuit element 260 having the same selected type of circuit element(s) 270; (2) a group of available composite circuit elements 260, 260A which together are capable of performing the same operations; or (3) an otherwise unavailable composite circuit element 260, 260A having the same selected type of circuit element 270 (or group of composite circuit elements 260) which had been performing another or a lower priority operation. For example, in the event of a failure of a composite circuit element 260, 260A having a triple ALU configurable element 270, its operations may be transferred to three composite circuit elements 260, 260A which each have a single ALU configurable element 270, which may then be configured to perform the operations of the triple ALU. Similarly, the functions performed by a first communication element 250 or a SPE 292 (or SME 290) may also be transferred to other available first communication elements 250 and SPEs 292 (or SMEs 290), as needed.

Within a zone 201, the full interconnect 275 and/or distributed full interconnect 295, which may be implemented as a plurality of dedicated bus connections, a full crossbar switch or as another arrangement of switches, multiplexers, demultiplexers, or other transistor arrangements, provides for any output of any composite circuit element 260, 260A, cluster queue 245 (and first communication element 250 and SPE 292 (or SME 290) in some embodiments) to be coupled to any input of any (other) composite circuit element 260, 260A, cluster queue 245 (and first communication element 250 and SPE 292 (or SME 290) in some embodiments), and/or to be coupled to any other component within its cluster 200 or, via cluster queue 245, to the full interconnect 275 and/or distributed full interconnect 295 of an adjacent or diagonally adjacent cluster 200 (for input to any composite circuit element 260, 260A, cluster queue 245, first communication element 250, and SPE 292 (or SME 290) or other component of the adjacent cluster 200). (Feedback of output to input within the same composite circuit element may, in selected embodiments, be accomplished internally within the composite circuit element 260, 260A, such as through a multiplexer or other switching arrangement, not separately illustrated in FIG. 8.) In an exemplary embodiment, any output of a composite circuit element 260, 260A, cluster queue 245, first communication element 250, and SPE 292 (or SME 290) may be provided as an input to any other composite circuit element 260, 260A, cluster queue 245, first communication element 250, and 260, 260A, in parallel and concurrently, through full interconnect 275 and/or distributed full interconnect 295, allowing complete and concurrent communication between and among all composite circuit elements 260, 260A, cluster queues 245, first communication elements 250, and SPEs 292 (or SMEs 290) within a zone 201 (with the exception of potential conflicts requiring arbitration or other resolution).

Depending upon the selected embodiment, the outputs from a composite circuit element 260, 260A may be directed or switched in a plurality of ways, all of which are within the scope of the present invention. For example, an optional output switching element 380 (illustrated in FIG. 8) may be provided for every composite circuit element 260, which may switch the outputs for internal feedback within the composite circuit element 260, switch the outputs to the full interconnect 275 or distributed full interconnect 295, switch the outputs directly to a first communication element 250, or switch the outputs directly to the SPE 292 (or SME 290). In the selected embodiment discussed below with reference to FIG. 8, internal feedback may be provided from any stage within a computational element 270, and the computational element 270 outputs are provided to an output memory (or output queue or register) 315 and then directly to the full interconnect 275, for switching to other composite circuit elements 260, to the SPE 292 (or SME 290), or to the first communication elements 250. Similarly, inputs to a composite circuit element 260 may be provided in a plurality of ways, such as from the full interconnect 275 or distributed full interconnect 295, or directly from the full interconnect 275 and other sources, such as from second memory element 255, the SPE 292 (or SME 290), and/or first communication elements 250. Other connectivity is described in greater detail with reference to FIGS. 18-38.

This communication functionality may be implemented based upon either or both data sources and/or data destinations. For destination-based communication, destination addresses for each context are typically stored in a routing table of an output queue 315 (FIG. 8). Output is then provided for the corresponding address, with the full interconnect 275 or distributed full interconnect 295 configured for the corresponding destination address. For this embodiment, when one output from a composite circuit element 260, 260A is to be applied as input to more than one composite circuit element 260, 260A, these additional inputs may be provided sequentially. In other exemplary embodiments, additional output fan-out may be provided, such that an output of one composite circuit element 260, 260A may be input concurrently into a plurality of other composite circuit elements 260, 260A, also via full interconnect 275, distributed full interconnect 295 or other communication structures. Handshaking protocols may also be utilized, with the destination sending or not sending an acknowledgement upon receipt of data.

For source-based communication, implemented in an exemplary embodiment, source addresses for each context are typically stored in configuration and control registers 330, 330A utilized by input controllers 336 and/or input queues 320. Every source provides its output on a selected bus or communication lines of the full interconnect 275 or distributed full interconnect 295. For incoming data, the corresponding input queue 320 determines whether the data is from a source designated for one or more of its contexts and, if so, when memory space is available, receives the corresponding data. This source-based communication provides ease of multicasting or broadcasting, as any and all destinations are enabled to concurrently receive any data of interest transmitted on the selected data lines. Handshaking protocols may also be utilized, with the destination sending or not sending a denial or other unavailability message when it is unable to receive the data transmitted (thereby providing for the source to resend the data at another time). This source-based protocol is discussed in greater detail below.

In another exemplary embodiment, no handshaking or other type of communication acknowledgement is utilized. Physical data links may be established at run time, as part of the binding process, with all corresponding computational processes allowed to execute, without a need to determine input data availability or space availability for output data. Such an implementation is useful for pipelining, such as for inner kernels of various algorithms. In addition, such an implementation is useful to avoid data stalls or data back pressure, when one data process may be waiting for incoming data and thereby affecting data throughput of other processes. In addition, combinations of these implementations may also be utilized, such as various components utilizing data flow-based operations, and other components not utilizing data flow-based operations. For example, data flow-based operations may be utilized for operations within a cluster 200, with other operations, such as communication operations, allowed to simply execute (e.g., route and switch).

Continuing to refer to FIGS. 5 and 6, the full interconnect 275 and distributed full interconnect 295 are illustrated generally, for ease and clarity of illustration, to represent generally the types of communication within a cluster 200, such as, for example: to provide for the input and output of any composite circuit element 260 to be coupled to other composite circuit elements 260, 260A, to the SPE 292 (or SME 290), to the message manager 265, or to either (or both) first communication elements 250 or cluster queue 245, for data transfer to or from other clusters 200; communication between the SPE 292 (or SME 290) and any composite circuit element 260, 260A (including memory elements and communication elements); communication between the SPE 292 (or SME 290) and either or both first communication elements 250, for transfer of control information, queries, query responses, and so on; communication between the message manager 265 and interconnect 155; and communication between the first communication elements 250 and the various memories within the cluster 200 (e.g., second memory element 255 and the other memories within the various components of the cluster 200); and any other communication between or among combinations of components within a cluster 200. It will be understood by those of skill in the art that a wide variety of communication structures and communication media are available, and all such variations are considered equivalent and within the scope of the present invention.

The SPE 292 (or SME 290) functions as a (comparatively small) microprocessor (or microcontroller), such as a RISC processor, for execution of instructions, determination of conditions and events, operating system management, and control of the composite circuit elements 260, 260A. The SPE 292 (or SME 290) can be utilized to implement legacy C programs and implement state for otherwise stateless dataflow operations of the composite circuit elements 260, 260A. The SPE 292 (or SME 290) is adapted to function as a sequential processor, and its operations are augmented by the composite circuit elements 260, 260A within the same cluster 200. The SPE 292 (or SME 290) also may have internal memory, may utilize the second memory element 255, cluster RAM 475, a memory composite circuit element $260_M$, or a memory 330 within a composite circuit element 260, for storage of data and instructions (or actions). For example, the second memory element 255 may be implemented as a plurality of "long" queues, having sufficient depth to store instructions which may be utilized by the SPE 292 (or SME 290). The SPE 292 (or SME 290) may utilize any of the composite circuit elements 260, 260A to perform calculations or other functions which will be needed in its execution of its program, such as to add or to compare two numbers, for example. The SPE 292 (or SME 290) performs control functions of computations, such as determinations of conditionals, represented in programming languages using statements such as IF, CASE, WHILE, FOR, etc. The SPE 292 (or SME 290) may also have control registers or other types of internal memory, such as to define and keep track of its control functions. As previously mentioned, not every cluster 200 is required to have a SPE 292 (or SME 290).

In addition, the SPE 292 (or SME 290) is illustrated as having, in addition to direct access to the element interface and control 280 of the composite circuit elements 260 (via configuration/control bus 285), a direct connection to the first memory element $270_M$ (and/or second memory element 255), to facilitate corresponding memory accesses for instruction/code processing and other data access, and generally to the message manager 265 as well. Alternatively to the use of the configuration/control bus 285, such communication may be provided via the full interconnect 275 or distributed full interconnect 295, for example.

The SPE 292 (or SME 290) may be utilized to implement a hardware operating system, and in a supervisory mode, has access to all of the resources within its cluster 200, thereby able to program, control, and monitor all of the composite circuit elements 260, 260A within the cluster 200. For implementations in which one or more clusters 200 do not have a SPE 292 (or SME 290) included within the cluster 200, one or more other SPEs 292 (or SMEs 290) of other clusters 200 will perform these functions and operations. In addition to task control, the SPE 292 (or SME 290) is utilized in self-testing of cluster resources, loading or assigning tasks (actions (or instructions)), binding actions (or instructions) (e.g., runtime binding) to the composite circuit elements 260, 260A, and in creating the connections between and among the various composite circuit elements 260, 260A and clusters 200. The assigning and binding process is discussed in greater detail with reference to FIG. 14. Collectively, the SPEs 292 (or SMEs 290) within the clusters 200 function as a highly distributed controller, running the operating system of the apparatus 100 (in conjunction with any needed composite circuit elements 260, 260A), either with or without other controllers 175. In exemplary embodiments, various SPEs 292 (or SMEs 290) may take on additional functions, such performing a system boot process, operating as a master controller, and determining and mapping functional and non-functional composite circuit elements 260 and other components, for example. The operation of the SPE 292 (or SME 290) is also explained in greater detail below with reference to FIGS. 8-14.

For example, the SPE 292 (or SME 290) may start a bound task of the composite circuit elements 260, 260A within the cluster 200, suspend a task, suspend an action or function of a composite circuit element 260, 260A (as part of an overall task), halt a task and free its resources (such as to load and run a higher priority task), set a task to perform in a single-step mode, and move a task to another location (such as to perform self-testing of the composite circuit elements 260, 260A currently performing the task).

The message manager 265, in the first cluster 200 and second cluster 200A embodiments, is utilized for communication external to the apparatus 100, such as for an Ethernet interface, a memory interface (e.g., DDR-2 SDRAM), a PCI-Express interface, etc. The message manager 265 is coupled directly to the SPE 292 (or SME 290), and more generally, also may be coupled to the full interconnect 275 or distributed full interconnect 295, the first communication elements 250, and/or the composite circuit elements 260 (not separately illustrated). For example, data words provided by the full interconnect 275 may be output by the message manager 265 for storage in an external memory. Similarly, also for example, incoming data, configuration or control may be transferred to the SPE 292 (or SME 290) (or stored in second memory element 255), such as to provide instructions for the SPE 292 (or SME 290), or transferred to a composite circuit element 260, for use and consumption in computations. In addition, in an exemplary embodiment, the message manager 265 is also coupled to the second communication channel or bus 220 (of the interconnect 155).

In an exemplary embodiment, as an additional alternative, the message manager 265 is also utilized for communication within the apparatus 100. In this embodiment, the message manager 265 is also utilized for cluster 200 to cluster 200 communication, and for SPE 292 (or SME 290) to SPE 292 (or SME 290) communication. For example, the message manager 265 is utilized for one composite circuit element 260 of a first cluster 200 to transfer information to another composite circuit element 260 of a second cluster 200. Additional functions of a message manager 265 are discussed in greater detail below for various exemplary embodiments.

Also, in an exemplary embodiment, not all message managers 265 in a matrix 150 are implemented to provide external communication. For example, in one alternative embodiment utilizing four matrices 150, each matrix 150 is provided with a total of six PCI-express interfaces implemented through the message managers 265 of six corresponding clusters 200 (one per supercluster 185, in an embodiment in which superclusters 185 are implemented identically). Similarly, in this four matrix example, each matrix 150 is provided with a total of one or two DDR-2 interfaces implemented through the message managers 265 of one or two corresponding clusters 200. As a result, there are remaining clusters 200 which have corresponding message managers 265 which are not providing interfaces and control for external communication. For these remaining clusters 200, their corresponding message managers 265 transfer data to these other clusters 200 having DDR-2 or PCI-express interfaces for storage in memory or external communication on a PCI-express bus, respectively, either through second communication elements 210 (super-cluster-level) or third communication elements 190 (matrix-level).

The message manager 265 may be implemented in a wide variety of ways, depending upon the selected embodiment. In a first selected embodiment, the message manager 265 is implemented as a finite state machine and implements communication standards, such as those mentioned above. When implemented as a state machine, the message manager 265 may be implemented separately or combined as a part of the SPE 292 (or SME 290). In a second selected embodiment, the message manager 265 is implemented as dedicated computational logic gates, also for the provision of a communication interface, with the SPE 292 (or SME 290) utilized to perform any conditional logic or other state machine functions. An exemplary embodiment of a message manager 265 is illustrated in FIG. 38 and discussed in greater detail below.

In exemplary embodiments, as indicated above, the composite circuit elements 260, 260A will include some form of identification by type or kind of composite circuit element 260, 260A (i.e., type of circuit element 270 within the composite circuit element 260, 260A), to facilitate identification by a state machine element ("SME") 290. Generally, a SPE 292 (or SME 290) will determine (and report to other SMEs 290, as necessary) the types and context availability of the composite circuit elements 260, 260A within its cluster 200, for use in run-time binding. For example, for the illustrated cluster 200, the SPE 292 (or SME 290) may determine that the cluster has one configurable barrel shifter-type element (corresponding to type "A") $270_A$, two configurable triple-ALU-type elements (corresponding to type "B") $270_B$, one configurable Galois multiplier-type element (corresponding to type "C") $270_C$, one configurable bit reordering ("BREO")-type element (corresponding to type "D") 270, and one content addressable memory element (corresponding to type "M") $270_M$. The SPE 292 (or SME 290) may also determine and report at another time that the BREO-type element of its cluster 200 is no longer functioning properly, so that the operations of its BREO-type element may be transferred to a BREO-type element of another cluster 200.

Continuing to refer to FIGS. 5 and 6, the second memory element 255 (or cluster RAM 475) may receive input and provide output (be written to and read from) either directly or indirectly via the full interconnect 275 or distributed full interconnect 295, from a plurality of sources, such as: (1) to and from the first communication elements 250 (for input from other clusters 200, such as input of data, instructions or other control information for use by the SPE 292 (or SME 290) or for queuing data for use by composite circuit elements 260); (2) to and from one or more composite circuit elements 260, 260A (including memory composite circuit element $260_M$) within the same cluster 200; (3) to and from the SPE 292 (or SME 290); or (4) to and from the message manager 265.

FIG. 7 is a block diagram illustrating a third exemplary cluster 200B embodiment in accordance with the teachings of the present invention, as another variation of a cluster 200. In this embodiment, the cluster 200B contains composite circuit elements 260 having communication functionality, such as to provide external communication functionality, e.g., for the communication functionality concentrated within a selected matrix 150 as illustrated in FIG. 3. Also in this embodiment, as an option, the message manager 265 is not utilized for such external communication, which instead is provided within dedicated communication composite circuit elements 260, which may be configurable or nonconfigurable. In this embodiment, each communication composite element 260 is utilized to provide a standard I/O interface for (external) communication to and from the apparatus 100, such as DDR-2 or PCI-e interfaces. In addition, the communication composite elements 260 may have additional input and output bus or media structures to provide such interfaces, and are not confined to communicating outside the cluster 200 through the first communication elements 250. Depending upon the selected embodiment, additional communication composite elements 260 may be utilized for increased resiliency and immunity from catastrophic failure. In all other respects, the clusters 200, 200B are identical, and further differ from cluster 200A in use of a full interconnect 275 rather than a distributed full interconnect 295. As a consequence, any reference to a cluster 200 will be understood to mean and include the third embodiment illustrated as cluster 200B, as a variation or more specific case of a cluster 200, and cluster 200B otherwise also will not be further discussed as a separate embodiment. It should be noted, however, that the first cluster 200 embodiment may also be utilized for the communication functionality concentrated within a selected matrix 150 as illustrated in FIG. 3.

For the cluster embodiments, because of the same matrix, supercluster, cluster and zone addressing, and because of the same element interface and control 280, any other cluster 200 (or composite circuit element 260, 260A) may communicate with the communication composite elements 260 and its cluster 200, or communicate with a cluster 200 having a message manager 265 with an external communication interface, in same manner as any communication with any other composite circuit element 260, 260A or cluster 200. As a result, when a cluster 200 or composite circuit element 260, 260A has a communication external to the apparatus 100, all that is required is for that cluster 200 or composite circuit element 260 to have the address of the corresponding communication composite elements 260 (with the interface corresponding to the selected form of communication) and/or its cluster 200, or the address of a cluster 200 having a message manager 265 with the interface corresponding to the selected form of communication. Such addressing may be provided by various components within the cluster 200, such as the message manager 265, the SPE 292 (or SME 290), or the first communication elements 250, for example. Such external communication is thereby provided through virtual addressing, e.g., via a message manager 265 or cluster 200, or via a communication composite elements 260 or cluster 200, and the composite element 260 does not need any further information concerning the location or type of the external interface. For example, a cluster 200 or composite circuit element 260, 260A does not need any information concerning whether its external communication is with a DDR SDRAM or is via an Ethernet protocol, or where these interfaces may be located on the apparatus 100. Similarly, for internal communication, a composite circuit element 260, 260A also does not need any information concerning whether its communication is within another composite circuit element 260 within the same cluster 200 or a different cluster 200.

FIG. 18 is a block diagram illustrating a fourth exemplary circuit cluster 200C in accordance with the teachings of the present invention. The fourth exemplary circuit cluster 200C differs from the cluster embodiments discussed previously in that its topology has a degree of internal hierarchy, with the fourth exemplary circuit cluster 200C divided into a plurality of zones 201, illustrated as zones 201A, 201B, 201C and 201D, with each zone 201 having four composite circuit elements 260 (as illustrated) which are coupled to a separate interconnect 275, 295 (which may be full or distributed), and with communication between each zone 201 occurring through a plurality of cluster queues 245. The cluster queues 245 are utilized for communication within a cluster 200C, and not merely for "fast track" communication between clusters 200. The full or distributed interconnect 275, 295 is also source-based, as described in greater detail below, with each destination composite circuit element 260 monitoring the interconnect 275, 295 for communication(s) from its corresponding data source. As an equivalent alternative, the full or distributed interconnect 275, 295 may be destination-based, as described herein.

The circuit cluster 200C does not include first communication elements 250. Instead, communication with other clusters 200, superclusters 185, matrices 150, or external communication (such as to a PCI-e bus) (via second channel (or bus structure) 220) is accomplished through the message manager 265, which provides the additional message-based communication functionality of the first communication elements 250. Each of the composite circuit elements 260, illustrated as $CE_0$ through $CE_{14}$, are coupled to the full or distributed interconnect 275, 295 as described previously, with 4 inputs and 2 outputs to and from each composite circuit elements 260. The cluster queues $245_{12}$ through cluster queues $245_{16}$, as illustrated, provide communication between and among the various zones 201 of composite circuit elements 260 within the circuit cluster 200C.

Typically, the cluster queues 245 are implemented as multiple unidirectional ports, using any type of memory as discussed herein, and are implemented to provide several communication paths in both directions between zones 201 (one "hop" to any destination zone 201 within a cluster 200C, with one "hop" occurring per cycle, absent contention from other data sources) or between circuit clusters 200C (one or two cycles or "hops" to an adjacent cluster 200C, and one or more cycles or "hops" to any other destination). In an exemplary embodiment, each cluster queue 245 provides four communication paths, two in each direction. For example, cluster queue $245_{15}$ provides two communication paths from zone 201B (as a data source) to zone 201D (as a data destination), and provides two communication paths from zone 201D (as a data source) to zone 201B (as a data destination). In an exemplary embodiment, each cluster queue 245 also has eight contexts, providing eight virtual connections across each cluster queue 245 in each direction and for each communication path.

Accordingly, for this embodiment, cluster queues 245 and message manager circuit 265 are also considered "communication elements" within the scope of the disclosure.

Figure 19:
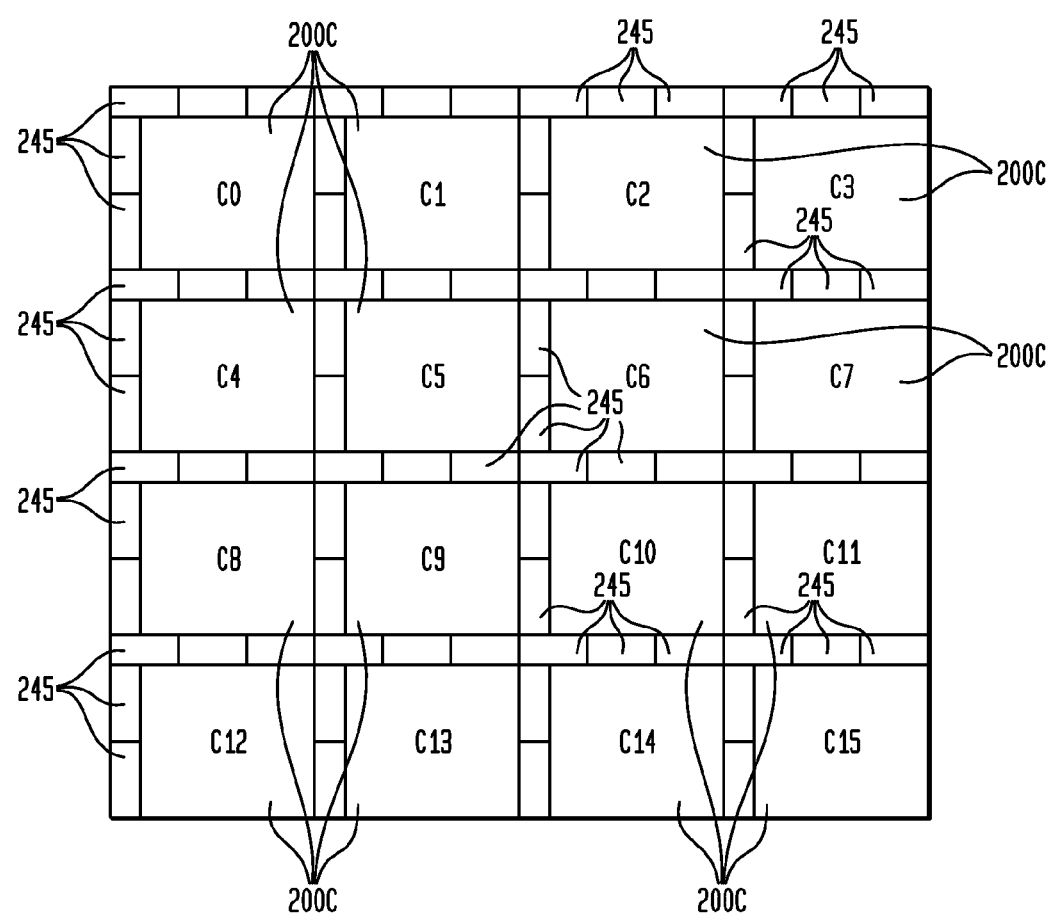
FIG. 19 is a block diagram illustrating an exemplary third apparatus embodiment in accordance with the teachings of the present invention.

FIG. 19 is a block diagram illustrating an exemplary third apparatus embodiment, comprising a supercluster 185C, in accordance with the teachings of the present invention. Using this topology for a circuit cluster 200C, the circuit clusters 200C may be effectively tiled or arrayed with each other, to form a supercluster 185, illustrated as supercluster 185C, having sixteen circuit clusters 200C, illustrated as C0 through C15. Each of the circuit clusters 200C communicates with adjacent circuit clusters 200C through the plurality of cluster queues 245. Such superclusters 185C then do not utilize one or more second communication elements 210, and instead connect to one or more third communication elements 190 through one or more message managers 265 within the supercluster 185C.

Referring again to FIG. 18, for this embodiment, the cluster queues 245 also provide intercluster communication with adjacent clusters 200C. As illustrated, the peripheral cluster queues 245 provide communication between the circuit cluster 200C and its adjacent circuit clusters 200C. For intercluster communication, the cluster queues 245 may be implemented to provide one or two communication paths in each direction, depending on the selected embodiment. For example, in an exemplary embodiment, the peripheral cluster queues 245 provide one communication path in each direction. Using typical geographic coordinates, for example, cluster queue(s) $245_0$ provides communication between circuit cluster 200C and an adjacent "northwest" circuit cluster 200C, cluster queue(s) $245_1$ and $245_2$ provide communication between circuit cluster 200C and an adjacent "north" circuit cluster 200C, cluster queue(s) $245_3$ and $245_4$ provide communication between circuit cluster 200C and an adjacent "west" circuit cluster 200C, and cluster queue(s) $245_5$ provides communication between circuit cluster 200C and an adjacent "southwest" circuit cluster 200C. Similarly, the cluster queue(s) $245_{11}$ (which may be considered part of an adjacent cluster 200C) provide communication between circuit cluster 200C and an adjacent "northeast" circuit cluster 200C, cluster queue(s) $245_{10}$ and $245_9$ (which may be considered part of an adjacent cluster 200C) provide communication between circuit cluster 200C and an adjacent "east" circuit cluster 200C, cluster queue(s) $245_8$ (which may be considered part of an adjacent cluster 200C) provides communication between circuit cluster 200C and an adjacent "southeast" circuit cluster 200C, and cluster queue(s) $245_6$ and $245_7$ (which may be considered part of an adjacent cluster 200C) provide communication between circuit cluster 200C and an adjacent "south" circuit cluster 200C.

In addition, for data routing assignments, such as in the run-time binding described below, rather than routing data or other information through a second communication element 210 to or from a supercluster 185 and/or through a first communication element 250 to or from a circuit cluster 200, routing may occur through a message manager 265 to or from a supercluster 185 or a circuit cluster 200, and by routing to a designated composite circuit element 260 within a supercluster 185C or a circuit cluster 200C through any of the various cluster queues 245, using either the source-based or destination-based communication schemes described herein. This use of cluster queues 245 for intercluster communication has the potential advantage of reduced latency compared to use of the first communication element 250, insofar as multiple words are not required for assembly into a message, and instead may be communicated as they are generated. The supercluster 185C and circuit cluster 200C otherwise function as described herein for any supercluster 185 and circuit cluster 200, respectively. Accordingly, any reference to a supercluster 185 or to a circuit cluster 200 shall be understood to correspondingly mean and include a supercluster 185C (185D) or circuit cluster 200C (200D), respectively.

Additional cluster 200, supercluster 185 and matrix 150 embodiments are discussed below with reference to FIGS. 20-22.

Figure 8:
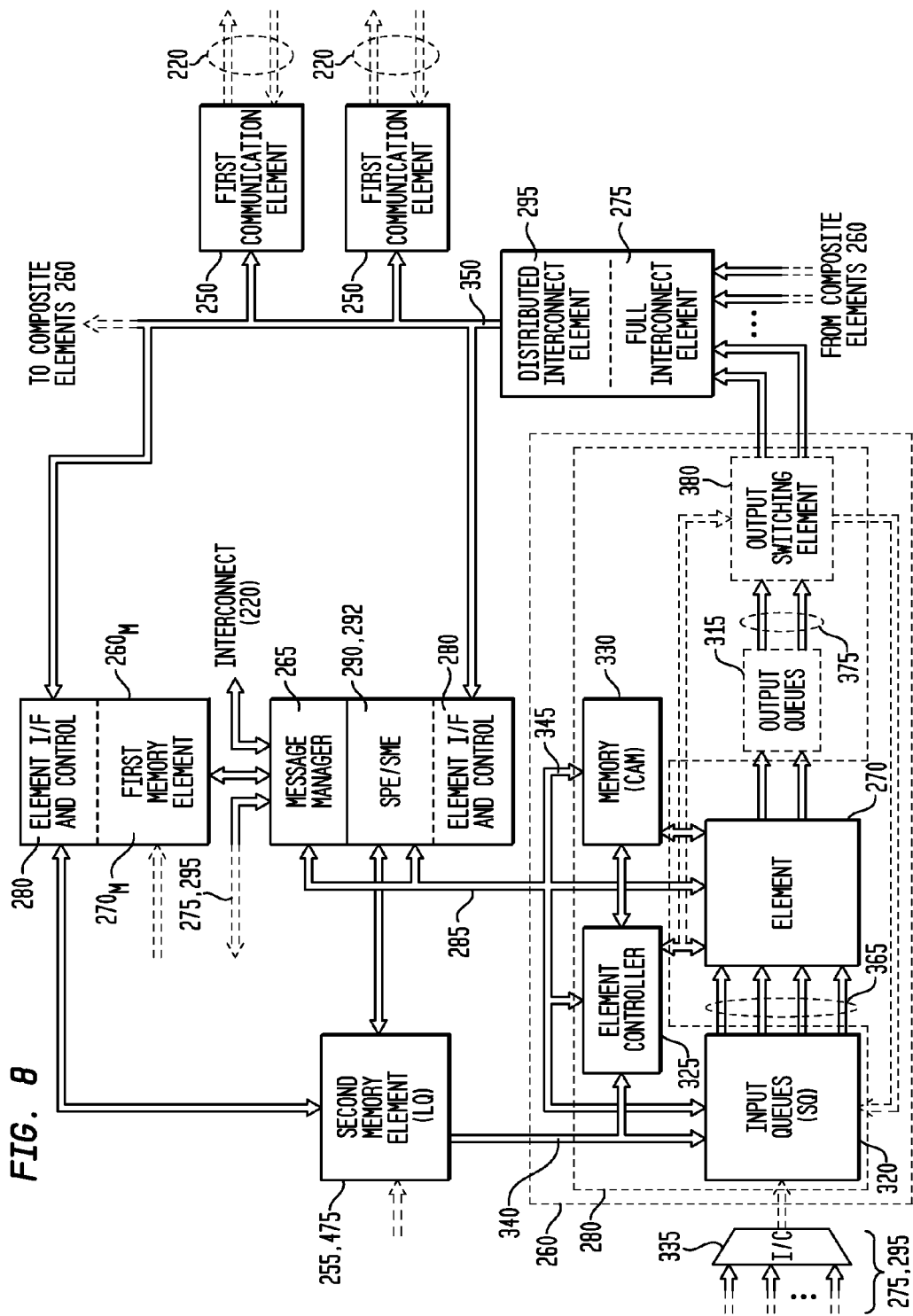
FIG. 8 is a block diagram illustrating in greater detail a first exemplary composite circuit element within an exemplary circuit cluster in accordance with the teachings of the present invention.

FIG. 8 is a block diagram illustrating in greater detail an exemplary composite circuit element 260 within an exemplary cluster 200 in accordance with the teachings of the present invention. As illustrated in FIG. 8, the composite circuit element 260 comprises an element interface and control 280 and a circuit element 270 (also referred to as a computational element 270), which is generally a configurable computational element, but which may also be a nonconfigurable computational element, a configurable or nonconfigurable communication element, a configurable or nonconfigurable finite state machine element, may be a configurable or nonconfigurable memory element, or may be other forms of circuitry selected for any particular application of an apparatus 100. Another variation of a composite circuit element 260, namely, composite circuit element 260A, is illustrated and discussed below with reference to FIG. 25. Accordingly, unless the specification context requires to the contrary (i.e., a specific difference between exemplary embodiments is being noted or described), reference to any composite circuit element 260 should be understood to mean and include composite circuit element 260A and vice-versa.

As an introduction to the operation of a composite circuit element 260, 260A (with control described in greater detail with reference to FIG. 16), each action or function performed by a composite circuit element 260, 260A generally requires that one or more inputs (i.e., data) be present before executing, although in some circumstances, execution may occur with zero inputs. Similarly, each action requires that one or more outputs have room to store a result although in some circumstances, execution may occur with zero outputs being available. Each input and output may be marked as significant (necessary) to the function to be calculated, or may be marked as insignificant (unnecessary), meaning that the input or output is not needed for the given function to be performed, with that configuration data (configuration designating significant inputs and outputs) stored in the configuration and control registers 330, 330A. The action stored in a context may not run until all of its significant inputs have at least one value in each input queue. Similarly, an action may not run until all of its significant outputs have room to store at least one result. When these conditions are met, one or more contexts may execute, depending on contention for internal resources and other conditions (discussed below). The resources needed depend on the element 270 type and the resources needed by each context. The determination of which context can be run is made by the element controller 325 of a composite circuit element 260, 260A on a clock-by-clock basis. If more than one context is ready to run, the element controller 325 will determine which one or ones can run simultaneously and will use one of several, available, scheduling mechanisms, as specified in the element's configurations. As a consequence, the execution of an action or function by a composite circuit element 260, 260A is data-driven.

Each context (or configuration) runs for one clock cycle, as a unit time period in an exemplary embodiment. At the beginning of the cycle, the element controller 325 determines which context will run. The controller 325 then selects that context's configuration from the configuration and control registers 330, 330A, which are the configuration and control storage components that are local to each element. This configuration determines which, if any, input queues 320 need to be read, which function the element will perform during that clock cycle, and which, if any, output queues 315 need to receive the results from executing the context's function. On the next clock cycle, the data that is in the output queue 315 (as a source) can be transmitted over the full interconnect 275, 295 to one or more input queues 320 or to cluster queues 245 that connect adjacent regions.

The act of reading data from the input queues 320 into the element 270 is independent from the writing of data into the input queue 320 from the full interconnect 275, 295. The act of reading and transmitting data from an output queue 315 to one or more destinations is independent of the writing of data into an output queue 315 by an element's context. In one embodiment, the multiplicity of contexts that are part of each input or output queue 320, 315 is built from a common set of circuit elements, only one context of which can be written at a time. With some exceptions (such as for a memory composite circuit element 260M), in exemplary embodiments, only one context of a given input queue 320 or output queue 315 can be read at a time. The read and write contexts on a given input or output queue 320, 315 need not be the same, so that one context of a queue can be read at the same time as another or the same context is being written in that queue. In the exemplary embodiments, all queues operate independently of each other.

Unlike other embodiments of reconfigurable circuitry, the apparatus 100, 140 has two forms of reconfiguration. One, like other forms of programmable logic, consists of downloading a program, consisting of a set of configurations for each of the elements in the program to be performed. This type of reconfiguration happens once, before a program is to be run. The configuration remains active in the programmable logic for as long as the program is to be run.

The second form of reconfiguration is where each element has multiple configurations stored as contexts in the configuration and control registers 330, 330A. The elements 270 are time-shared during the operation of the program, with different contexts executing in different time intervals. In this embodiment, such time-sharing depends on the arrival of data in the input queues for each context of every element. While one context of an element is executing, any other context can be gathering data in its input queues and broadcasting data from its output queues.

In an exemplary embodiment, the element interface and control 280 comprises: (1) an element controller 325; (2) a memory 330 (such as a content addressable memory ("CAM") or random access memory such as SDRAM) which stores contexts and control information (e.g., configuration words); (3) input queues 320 (as a form of memory); and (4) output queues (or registers) 315 (also as a form of memory). In other exemplary embodiments, the element interface and control 280 may include the element controller 325, the memory 330, and either the input queues 320 or the output queues 315, but not both. In additional exemplary embodiments, the element interface and control 280 may include the memory 330, and either the input queues 320 or the output queues 315, but not the element controller 325. In the latter embodiment, once a SPE 292 (or SME 290) has assigned actions and established the data routing, no separate or additional control is utilized within the composite circuit elements 260, with the composite circuit elements 260 allowed to freely and/or continuously execute an assigned context.

As mentioned above, in selected embodiments, the element interface and control 280 may also include an optional output switching element 380 such as one or more switches, transistors, multiplexers or demultiplexers, to provide direct switching capability for output data, such as for internal feedback within the composite circuit element 260, or for providing output data to the SPE 292 (or SME 290), to the message manager 265, or to the first communication elements 250, in addition to providing output data to the full interconnect 275 or distributed full interconnect 295. As mentioned above, the memory 330, input queues 320 and output queues 315 may be implemented as any form of memory, including without limitation any of the memory types mentioned previously, such as CAM or SDRAM.

The input queues 320 provide a plurality of inputs 365 into the configurable circuit element 270, illustrated as an exemplary four inputs each having a width of one 16-bit data word. Alternatively, the width may be wider, such as to include a bit designating a placeholder, for example. The input queues 320 may be independent from each other or may be dependent upon each other, such as using 2 inputs for a combined 32-bit data word. In exemplary embodiments, input queues 320 are provided for each of the inputs into the circuit element 270, with each of the input queues 320 providing a separate queue for each context which may be utilized by the circuit element 270. In addition, the input queues 320 may be implemented as "short queues", having a depth of 1 or 2 data words, although deeper queues and other forms of memory are within the scope of the invention. For an exemplary embodiment, eight contexts are utilized, for each of 4 inputs, with a depth of at least 2 data words. Contexts may also be combined, such as to implement a larger queue, e.g., 16 words, for a selected context.

The input queues 320 may receive data from any of a plurality of input sources, depending upon the switching arrangements, either directly or via the full interconnect 275 or distributed full interconnect 295, such as: (1) from the first communication elements 250 (for input from other clusters 200); (2) from one or more other composite circuit elements 260 (including memory composite element 260$_M$) within the same cluster 200; (3) from the second memory element 255; (4) from the message manager 265; or (5) from the SPE 292 (or SME 290) (e.g., when utilized by the SPE 292 (or SME 290) for calculation of a value or comparison of 2 values, such as to evaluate a condition or an event). As illustrated in FIG. 8, the input queues 320 receive data from either a full interconnect 275 or a distributed full interconnect 295, illustrated as an exemplary input multiplexer 335. For an exemplary embodiment, the input multiplexer 335 is a 16-to-1 multiplexer, allowing the input queues 320 to obtain data from any assigned source by selecting busses of the interconnect 275, 295 for input data. An output from a circuit element 270 also may be fed back to be provided as an input, through the input queues 320, or directly within the circuitry of the element 270, via an output switching element 380 mentioned above, or simply via the full interconnect 275.

In an exemplary embodiment, two output queues (registers or other forms of memory) 315 are provided, each having the corresponding eight contexts, each having a width of one 16-bit data word, and having a selected depth of 1, 2 or more data words. Alternatively, the width may be wider, such as to include a bit designating a placeholder, for example. The output queues 315 also may be independent from each other or may be dependent upon each other, such as using 2 output queues 315 for a combined 32-bit data word. The contexts may also be combined, such as to implement a larger queue, e.g., 8-16 words, for a selected context. In addition to storing output data, the output queues 315 (utilizing an incorporated state machine) may also replicate output data, such as providing the same output data to additional contexts for distribution to additional destinations.

A plurality of outputs 375 are provided from the output queues 315 of the circuit element 270, illustrated as two outputs, also each having a width of one 16-bit data word (or wider, as discussed above, such as for inclusion of a placeholder bit, control information, or other data). The outputs 375 also may be independent from each other or may be dependent upon each other, such as using 2 outputs for a combined 32-bit data word. The outputs 375 are provided to the full interconnect 275 or distributed full interconnect 295 (or the optional output switching element 380), which may independently provide each of the plurality of outputs 375 to any of the following (via corresponding communication structures or bus 350): (1) to the first communication elements 250 (for output to other clusters 200); (2) to one or more (other) composite circuit elements 260 (including memory composite element 260$_M$) within the same cluster 200; (3) to the SPE 292 (or SME 290) (such as when utilized by the SPE 292 (or SME 290) for calculation of a value or comparison of 2 values (e.g., to evaluate a condition or an event)); (4) to the message manager 265; or (5) to an optional second memory element 255, such as a long queue for input into the SPE 292 (or SME 290) or other components. As mentioned above, the optional output switching element 380 and other output switching arrangements are also available and will be apparent to those of skill in the electronic arts, are considered equivalent and are within the scope of the present invention.

In a selected embodiment, the memory 330 is implemented as a CAM, to facilitate searching and identification of stored task identifiers (task IDs) and stored action identifiers (action IDs). In another embodiment, the memory 330 is implemented as RAM, with searching and identification performed utilizing other search methods, such as binary searching. Other types and combinations of memory may be utilized, however, and all are considered equivalent and within the scope of the present invention, whether volatile or non-volatile, including without limitation any type or combination of RAM, FLASH, DRAM, SDRAM, SRAM, MRAM, FeRAM, ROM, EPROM or E$^2$PROM, or any other type of memory, storage medium, or data storage apparatus or circuit, which is known or which becomes known, depending upon the selected embodiment.

The memory 330 is utilized in the exemplary embodiments to store both contexts and control information, utilized to configure the configurable element 270 and direct its operations. Such contexts and control information is stored as a configuration word in the exemplary embodiments, as a plurality of information fields, and is discussed below with reference to FIG. 16. In addition, through the SPE 292 (or SME 290), such configuration words may be altered, deleted, supplanted, added, and so on, and by modifying various bits within the configuration word, the execution of operations by the circuit element 270 may also be controlled. This local storage of contexts and control information provides for extremely fast execution capability, as configurations or instructions do not need to be fetched and read from a remote memory, but are instantly available as contexts for immediate configuration and control of the circuit element 270. As such, the apparatus 100 is not subject to the "von Neumann" bottleneck which limits the execution capabilities of typical processors. Indeed, the various memories 330 function as a large, very highly distributed instruction memory which may be utilized advantageously, such as for distributed processing, distributed digital signal processing, distributed programming, and distributed rebinding of instructions (or actions) in the event of a component failure, for example.

This use and local storage of contexts also allows for significant time multiplexing of operations of composite circuit elements 260, 260A, first communication elements 250, and SPEs 292 (or SMEs 290). For example, while one context of a selected composite circuit element 260 may require input data which has not yet been created by another composite circuit element 260, another context may be able to be executed on the selected composite circuit element 260, rather than the composite circuit element 260 remaining idle. Similarly, the use of a plurality of contexts by a SPE 292 (or SME 290) allows multithreaded operation. For example, a SPE 292 (or SME 290) may commence execution of first code with a particular first data set for a first context, store interim results and a first code pointer, commence execution of second code with a second data set for a second context and provide an output, followed by returning to the first context for continued execution of the first code using the first code pointer and the stored, interim results. This use of time multiplexed contexts further allows interleaving of tasks and usage of resources which otherwise might be idle, allowing tasks to share resources and increasing the overall resource utilization of the IC.

The element controller 325 may be implemented through combinational logic gates and/or as a finite state machine, and is utilized to control how the circuit element 270 is configured and when the circuit element 270 operates, utilizing the configuration word (contexts and control information) stored in memory 330. More specifically, in exemplary embodiments, the circuit element 270 operates based on data flow, such that when it has data at its inputs, when it has an available destination to store or consume the output data to be produced, and when authorized by the element controller 325, the circuit element 270 will commence operations (or fire) and perform its calculations or manipulations on the input data and provide the corresponding output data. The element controller 325 controls this data flow operation, based on a plurality of conditions and priorities (and other information stored as one or more configuration words in memory 330). For example, when more than one context is ready for execution, the element controller 325 may arbitrate which runs first, such as through round-robin, or evaluation of one or more priorities, a scheduled execution of an activity, or when the activity last occurred (e.g., a most recently executed action may have a lower priority in the arbitration, while a least recently executed action may have a higher priority in the arbitration).

The element controller 325 may be implemented with varying levels of sophistication. As mentioned above, in one embodiment, the element controller 325 is not implemented, with the composite circuit elements 260 essentially operating in a continuous mode, subject to other constraints (e.g., control from any of the various SMEs 290). At the other extreme, the element controller 325 may provide multi-threaded operation of the circuit element 270, such as by storing a current state of a partial execution of a first context in the (first) memory 330, executing a second context (via the circuit element 270), and retrieving the current state and resuming execution of the first context by the circuit element 270.

FIG. 20 is a block diagram illustrating a fifth exemplary circuit cluster 200D in accordance with the teachings of the present invention. Circuit cluster 200D is quite similar to circuit cluster 200C, having a zone 201 architecture with cluster queues 245, but differs in several respects. First, each zone 201 (illustrated as zones 201E, 201F, 201G, and 201H) is comprised of a plurality of composite circuit elements 260A, each of which has the functionality and instruction set of several computational elements 270 which may be utilized and which share one element interface and control 280, rather than a composite circuit element 260 having just one computational element 270 functionality with a corresponding element interface and control 280. A representative composite circuit element 260A is discussed below with reference to FIG. 25). Second, within each circuit cluster 200D, there is at least one message manager 265 (also which implements the functionality of a first communication element 250), which is implemented in conjunction with a memory composite circuit element 260M (MEMU), discussed in greater detail below, forming a composite circuit element $260A_1$ referred to as a Memory and Messaging Element ("MME"). The additional composite circuit elements 260A are: an Arithmetic and Control Element ("ACE"), which combines the functionality of a multiplier (MULT), a "super" ALU (SALU), a triple ALU (TALU), and a look-up table ("ELUT"), illustrated as composite circuit element $260A_2$; a Bit Operations and Control Element ("BCE"), which combines the functionality of a multiplier (MULT), a triple ALU (TALU), a bit re-ordering element (BREO) and a look-up table ("ELUT"), illustrated as composite circuit element $260A_3$; a Shift and Arithmetic Element ("SAE"), which combines the functionality of a multiplier (MULT), a triple ALU (TALU), a barrel shifter (BSHF), and a look-up table ("ELUT"), illustrated as composite circuit element $260A_4$; and a Sequential and Memory Element (SPM), which contains the functionality of a Sequential Processor (SP) (instead of a SME 290) and a memory composite circuit element 260M (MEMU), illustrated as composite circuit element $260A_5$. It should also be noted that composite circuit elements 260A and zones 201 having other functionalities may also be implemented and are within the scope of the disclosure.

Figure 21:
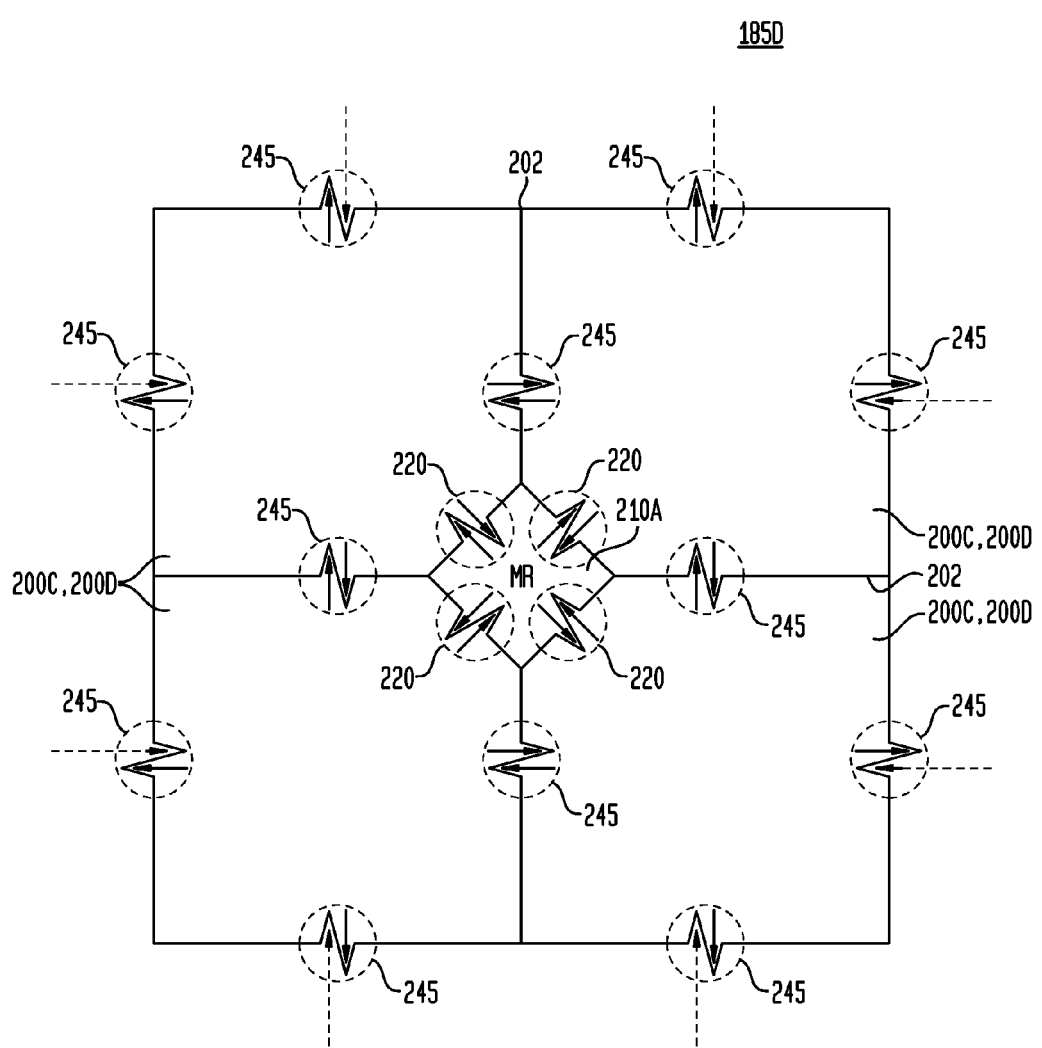
FIG. 21 is a block diagram illustrating tiling of a plurality of circuit clusters to form a supercluster circuit in accordance with the teachings of the present invention.
Figure 22:
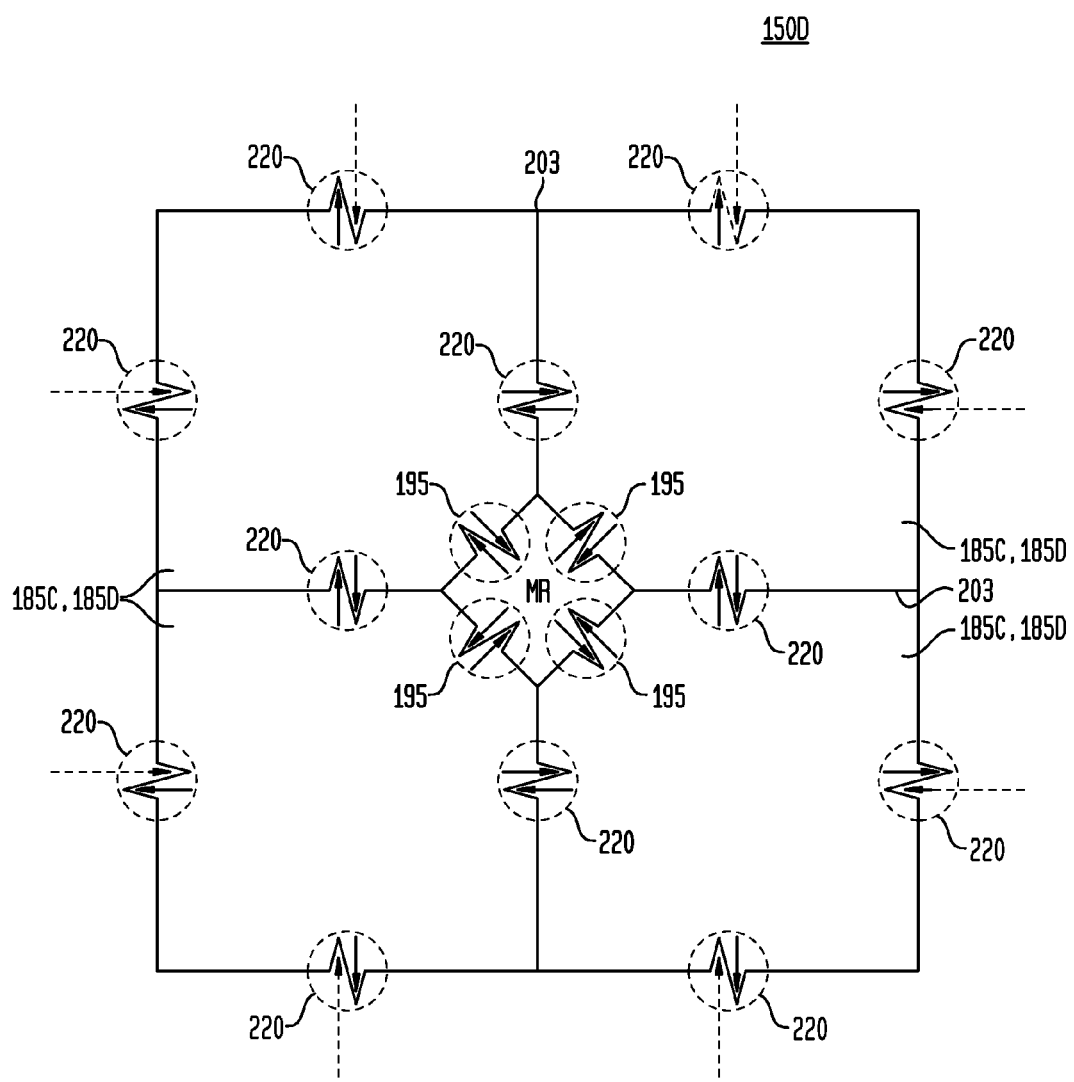
FIG. 22 is a block diagram illustrating tiling of a plurality of supercluster circuits to form a matrix circuit in accordance with the teachings of the present invention.

One of the advantages of the circuit cluster 200C and circuit cluster 200D topologies is that they may be tiled (connected on adjacent sides) to form superclusters 185 (185C and 185D), which in turn may be tiled to form matrices 150, as illustrated in FIGS. 21 and 22. Not separately illustrated, such tiling may continue to form larger and larger circuits, as may be desired or capable of being fabricated. FIG. 21 is a block diagram illustrating tiling of a plurality of circuit clusters 200C, 200D, connected on adjacent sides 202 through the plurality of cluster queues 245 (illustrated using arrows to show connection paths between adjacent circuit clusters 200C, 200D), with one or more message repeater (or waypoint) circuits 210A connected to the message manager 265 of each circuit cluster 200C, 200D and utilized to implement one or more second communication elements 210 (illustrated using arrows to show connection paths within the hierarchical interconnect 155), to form a supercluster circuit 185C, 185D. Cluster queues 245 for communication between diagonally adjacent clusters 200C, 200D have not been illustrated separately in FIG. 21. FIG. 22 is a block diagram illustrating tiling of a plurality of supercluster circuits 185C, 185D, connected on adjacent sides 203 through the plurality of cluster queues 245 (illustrated using arrows to show connection paths between adjacent supercluster circuits 185C, 185D) with one or more matrix-level message repeater (or waypoint) circuits 210A coupled to the supercluster-level message repeater 210A and also utilized to implement one or more third communication elements 190 (also illustrated using arrows to show connection paths within the hierarchical interconnect 155), to form a matrix circuit 150D. Such tiling allows both the flat interconnections (full interconnect 275, 295 and cluster queues 245) and hierarchical interconnections (through message managers 265 and message repeater (or waypoint) circuits 210A) to connect seamlessly, respectively, with both adjacent and non-adjacent circuit clusters 200C, 200D and supercluster circuits 185C, 185D. As previously mentioned, this tiling allows the circuit architecture to be extended to any desired limit, bounded only by the constraints of IC fabrication technology, circuit boards, etc.

Figure 23:
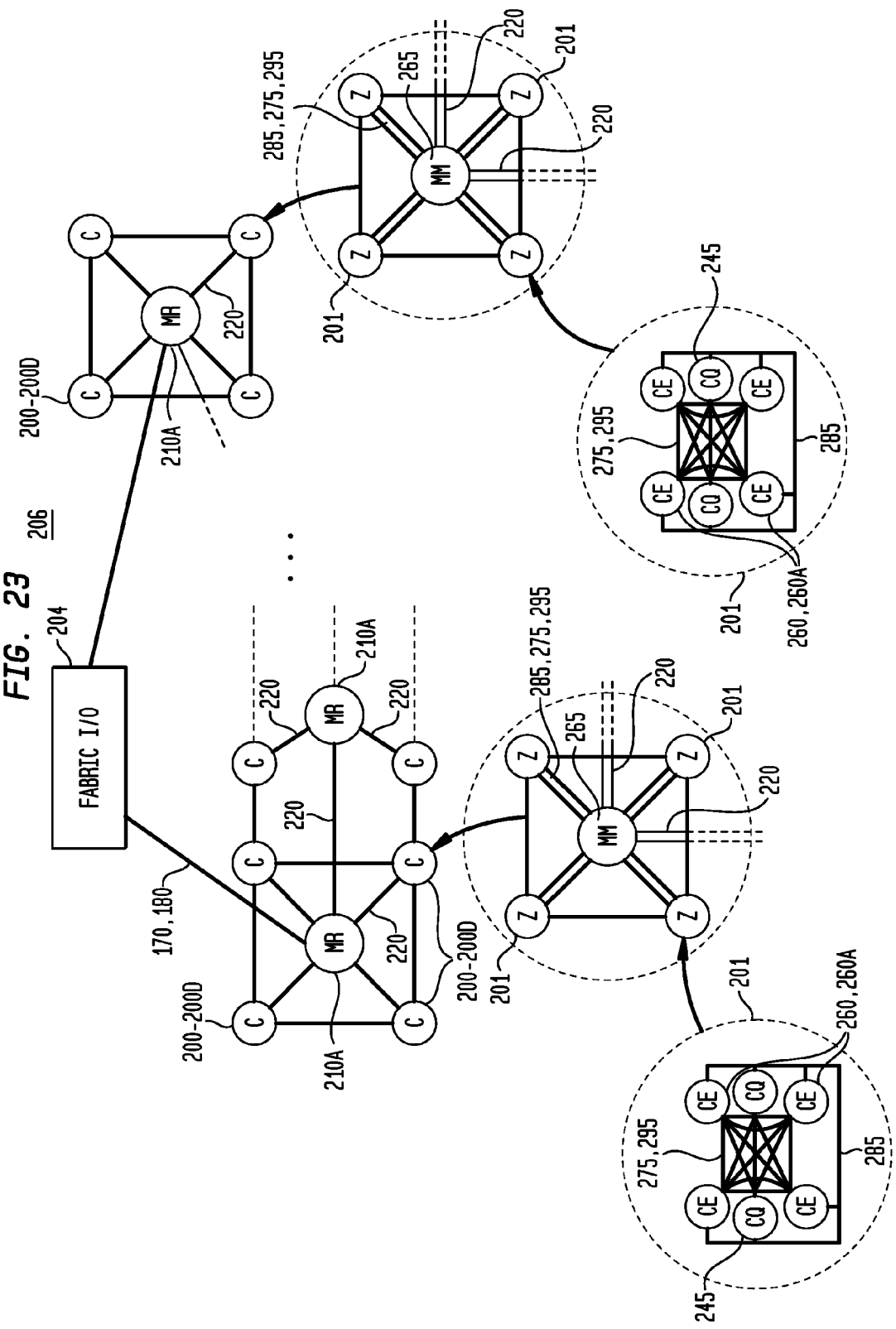
FIG. 23 is a block diagram illustrating successive interconnection levels in accordance with the teachings of the present invention.
Figure 24:
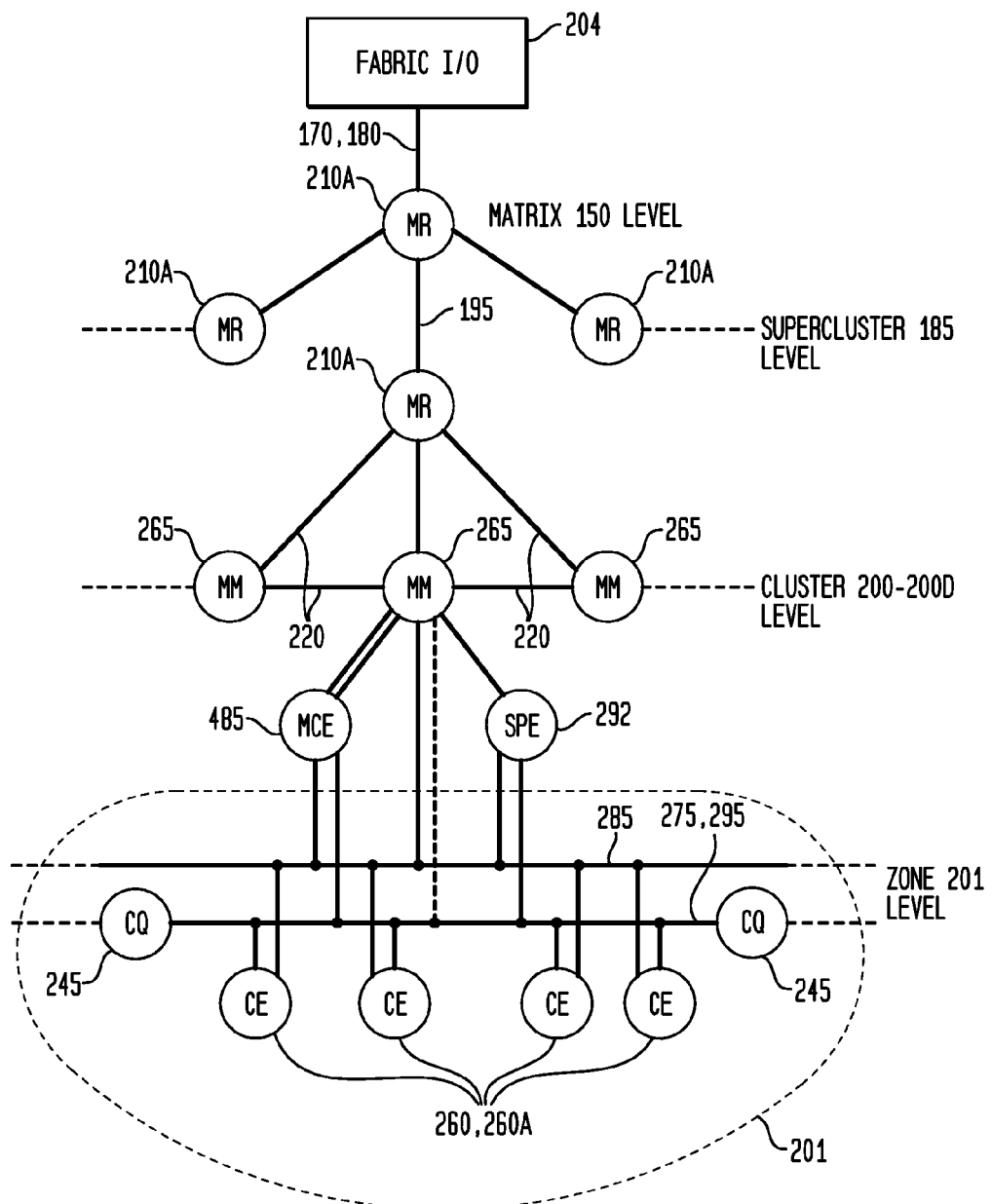
FIG. 24 is a block diagram illustrating successive interconnection levels in accordance with the teachings of the present invention.

FIGS. 23 and 24 are block diagrams illustrating successive interconnection levels, and are useful for illustrating both the hierarchical and the flat interconnection systems in accordance with the teachings of the present invention, useful both for the timing of data transfer, timing closure, and for rapid configuration and/or reconfiguration. As illustrated, successive message repeater (or waypoint) circuits 210A are utilized from the fabric I/O 204 of the apparatus 100, 140 through matrix 150 levels (interconnect 170, 180) through the supercluster 185 level, with interconnect 195 providing both hierarchical and peer-to-peer connections. Multiple ICs (apparatuses 100, 140) may also be connected through fabric I/O 204 to form a larger system 206 connecting multiple ICs. Below the supercluster 185 level, the message channels (interconnect 220) connect to a message manager 265 for information distribution to and from a circuit cluster 200C, 200D. The interconnect 220 is hierarchical and optionally also peer-to-peer between message managers 265 (illustrated as dashed lines). The interconnect 170, 180, 195 and 220, in exemplary embodiments, are message channels using the protocol and having the message bus structure 309 illustrated and discussed with reference to FIG. 4, and transport data, configuration, and control messages (in payload 307).

The message manager 265, in turn, can distribute or assemble the payload 307 to and from multiple sources within a cluster, including the configuration and control bus (CC bus) 285, the memory control element (MEMU) $260_M$, the sequential processing element (SPE) 292, and in selected embodiments, the composite circuit elements 260 over the full interconnect 275, 295. The operation of the message manager 265 is discussed in greater detail below with reference to FIGS. 32 and 38.

Each one of the message word transmissions, to, from or between any of the message repeater (or waypoint) circuits 210A and message managers 265, occurs in one clock cycle, which is the basis for a "unit delay" or "hop". Similarly, any data transmission from an output queue 315 to any input queue 320 or a cluster queue 245 input, or from any cluster queue 245 output to any input queue 320 or cluster queue 245 input, over the full interconnect 275, 295, also occurs in one clock cycle (one unit delay or hop). As discussed below, the execution of an operation by a composite circuit element 260 also occurs in one clock cycle, also one unit delay.

Figure 25:
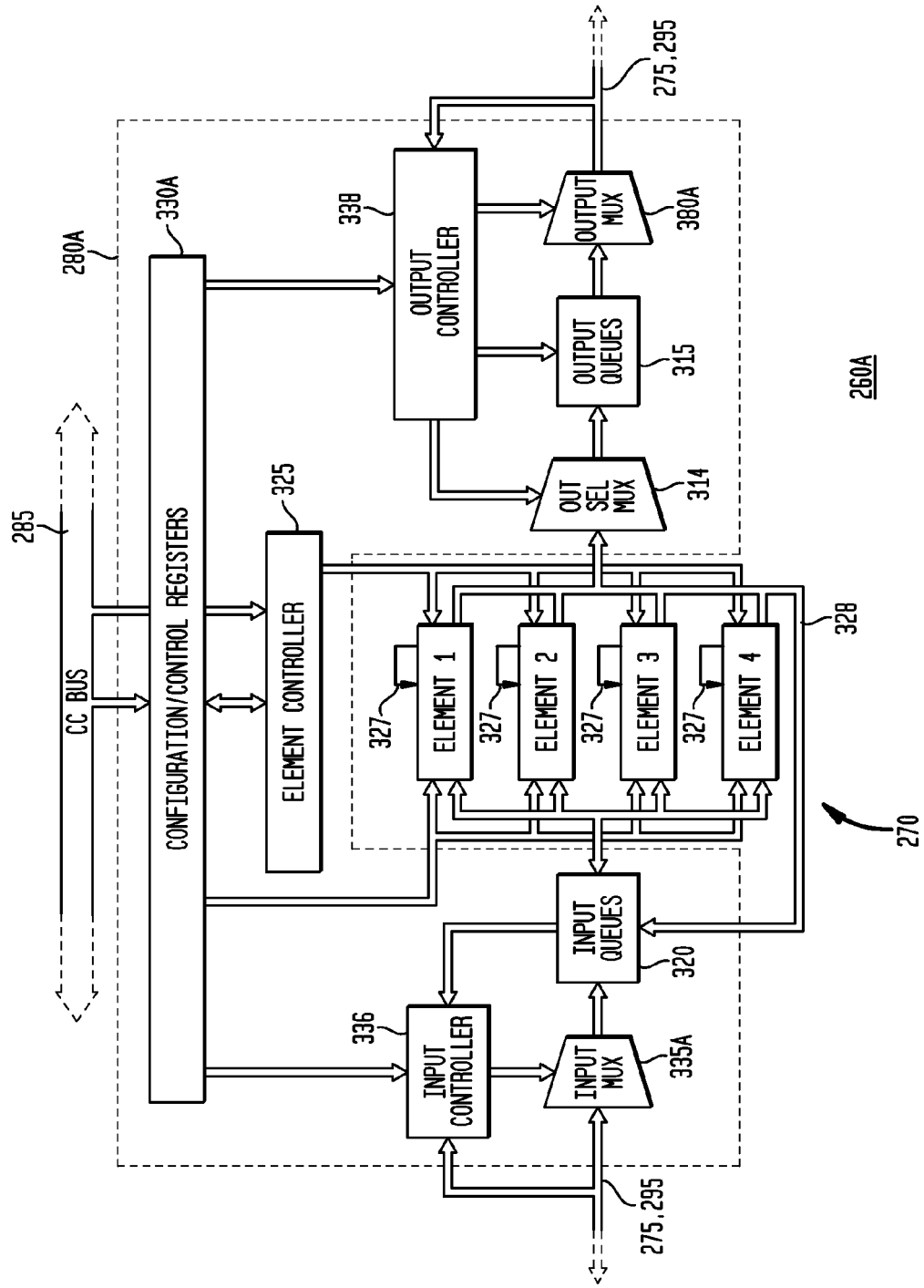
FIG. 25 is a block diagram illustrating in greater detail a second exemplary composite circuit element within an exemplary circuit cluster in accordance with the teachings of the present invention.

FIG. 25 is a block diagram illustrating in greater detail a second exemplary composite circuit element 260A within any of the exemplary circuit clusters 200 in accordance with the teachings of the present invention. The composite circuit element 260A differs from the composite circuit element 260 in several important respects. Unless specifically noted to the contrary, the composite circuit element 260A functions identically to the composite circuit element 260, and reference to one shall be understood to mean and include the other. For example, in exemplary embodiments, both the composite circuit element 260A and the composite circuit element 260 utilize eight contexts, as described above. As mentioned above, each of the composite circuit elements 260A have the functionality and instruction set of several computational elements 270 which may be utilized and which share one element interface and control 280, rather than a composite circuit element 260 having just one computational element 270 functionality with a corresponding element interface and control 280. While illustrated as separate computational elements 270 to illustrate the multiple functionality, it should be noted that the various computational element 270 are likely to share circuitry (hardware) in any actual implementation. The computational elements 270 of the composite circuit element 260A are also illustrated as having direct feedback (327) within the computational element 270 and indirectly (bus 328) into the input queues 320 (without traversing an output queue 315), with the latter referred to a "tight loop", allowing use of the output data on the next clock cycle, rather than incurring a unit time delay by traversing from an output queue 315 to an input queue on the next clock cycle. Unit time delays are discussed in greater detail below.

As indicated above, each of the computational elements 270 is designed or configured to receive input data from the input queues 320, process the data, and output the data to the output queues 315 in one clock cycle, as one unit delay. More specifically, each of the computational elements 270 is designed or configured to receive input data from the input queues 320, process the data, and output the data in a first clock cycle, as one unit delay. The output data is available to the output queues 315 on the rising edge of the next, second clock cycle, during which it enters the output queue 315, is broadcast over the interconnect 275, 295 and is input into an input queue 320 or a cluster queue 245 in the same zone 201 during this second clock cycle, as one unit delay. A composite circuit element 260, 260A in the same zone may then process the received data and have it available at its output queues 315 during a third clock cycle, also as one unit delay. The cluster queue 245, in turn, may output the data for broadcast over the interconnect 275, 295 of the adjacent or diagonally adjacent zone, where it is input into an input queue 320 or a next cluster queue 245 during third clock cycle, also as one unit delay. Accordingly, transmission of data through a cluster queue 245 into an adjacent or diagonally adjacent zone adds one unit delay compared to transmission of data within the same zone.

Also as illustrated in FIG. 25, the configuration and control memory 330 is implemented as configuration and control registers 330A, which are coupled to the configuration and control bus (CC bus) 285, and can be written into by the message manager 265, the sequential processing element (SPE) 292, or optionally by the element controller 325, for establishing a configuration, data routing and other control for each context of the computational elements 270, discussed in greater detail with reference to FIG. 16. For example, for each context, the configuration and control information (or word) stored in configuration and control registers 330A is utilized by the corresponding computational element 270 for its configuration (when it is configurable), for control over its execution of data operations, and by the input controller 336 and output controller 338, for data routing using source-based addressing. In addition, configuration and control is also provided into corresponding registers of a cluster queue 245, as discussed in greater detail below with reference to FIG. 26.

Continuing to refer to FIG. 25, input controller 336 and output controller 338 provide additional control functionality, and may be separate or included within element controller 325, and which work with the input multiplexer (MUX) 335A and output multiplexer (MUX) 380A, respectively, using source based addressing and backpressure, described below with reference to FIG. 26, to control what data enters the input queues 320 and what data exits the output queues 315 for each context. In addition, because multiple outputs may be available from multiple computational elements 270, an output selection multiplexer (OUT SEL MUX) 314 may be utilized to select which output (with valid data corresponding to the executing context) is to provide output data to the output queues 315, with any other outputs of the non-selected computational elements 270 generally unused. This input multiplexer (MUX) 335A and output multiplexer (MUX) 380A effectively perform as a full (or partial) crossbar switch for the full interconnect 275, 295, capable of coupling any output for any context to any input for any context within a zone 201.

More particularly, with the full interconnect bus 279, 295, the input multiplexer (MUX) 335A and output multiplexer (MUX) 380A effectively perform as partial full-crossbar, a full crossbar because every output is connected to every input within a zone 201 for simultaneous reception by every input, and a partial crossbar because it is context-based in some exemplary embodiments, so only one context is transmitted at a time from an output. For example, although two inputs may be listening to different contexts of the same output, only one input will be active, because an output will transmit data for only one of its contexts in any given cycle. Similarly, only one context of an input can receive data in a given cycle, whether it is from the same or different sources. These context-based restrictions allow the partial full-crossbar to be much smaller without sacrificing functionality, as only one context is executing on a given cycle (except in the MEMU $260_M$, in which input queues are processed separately by programming each context to read from a different input queue, so multiple contexts may execute concurrently).

In an exemplary embodiment, four input queues 320 and two output queues 315 are implemented (not separately illustrated), each for eight contexts, each thirty-two bits wide (or 17 to 20 bits in other exemplary embodiments) and two words deep per context, and each is connected to the full interconnect 275, 295. A given context may also be configured to use more of any input queues 320 or output queues 315, such as to "merge" queues to provide greater depth, or to concatenate the width of the queues, such as to join two 16 bit words into a larger, 32 bit word. In an exemplary embodiment, the full interconnect 275, 295 is implemented as a bus (dedicated wires or lines) coupling every output queue 315 and cluster queue 245 output (from an adjacent zone 201) to every input queue 320 (via corresponding output multiplexer (MUX) 380A and input multiplexer (MUX) 335A) and to every cluster queue 245 input (for output to an adjacent zone 201) (and to the other components coupled to the full interconnect 275, 295) within a zone 201, so that each output queue 315 and cluster queue 245 output may transfer data onto the full interconnect 275, 295 without interference from any other output queue 315 or output of a cluster queue 245. On the input side, each input queue 320 (via input multiplexer (MUX) 335A and input controller 336) is connected through full interconnect 275, 295 to each data output within the zone 201 and the output of a cluster queue 245 from an adjacent or diagonal zone 201. While each output queue 315 and cluster queue 245 output may transfer data onto the full interconnect 275, 295, at any given time, only one context of the output queue 315 or cluster queue 245 output is outputting data during any given clock cycle. As indicated above, such a data transfer occurs in one clock cycle, as one unit delay.

The sequential processing element (SPE) 292 also has some unique features. As indicated above, the SPE 292 typically shares an element control and interface 280A with a memory composite circuit element 260M. Using the element control and interface 280A, on a context-by-context basis, either the SPE 292 or memory composite circuit element 260M may be selected for operation. Sharing the same interface, when there is data in significant inputs and room for data in significant outputs, the element control and interface 280A will provide an interrupt to the SPE 292 to obtain and process the incoming data. Unlike other elements 270, however, the SPE 292 may utilize more than one clock cycle to provide output data, and is otherwise not required to be or have a data flow architecture. The SPE 292 may also be utilized for other types of control, such as to start and stop tasks in other composite circuit elements 260, 260A, 260M, through a broadcast message on the configuration and control bus 285. The SPE 292 may also use other composite circuit elements 260, 260A, 260M to evaluate data and otherwise extend its instruction set, such as to evaluate a condition or determine a count, for the SPE 292. In other circumstances, the various composite circuit elements 260, 260A, 260M may utilize the SPE 292, such as to execute lengthy but infrequently used code or instructions, and provide a result back to the composite circuit elements 260, 260A, 260M. In addition, the SPE 292 may have different contexts operating on different data sets, which also allows multi-threaded processing, through the same or different program instructions.

Figure 26:
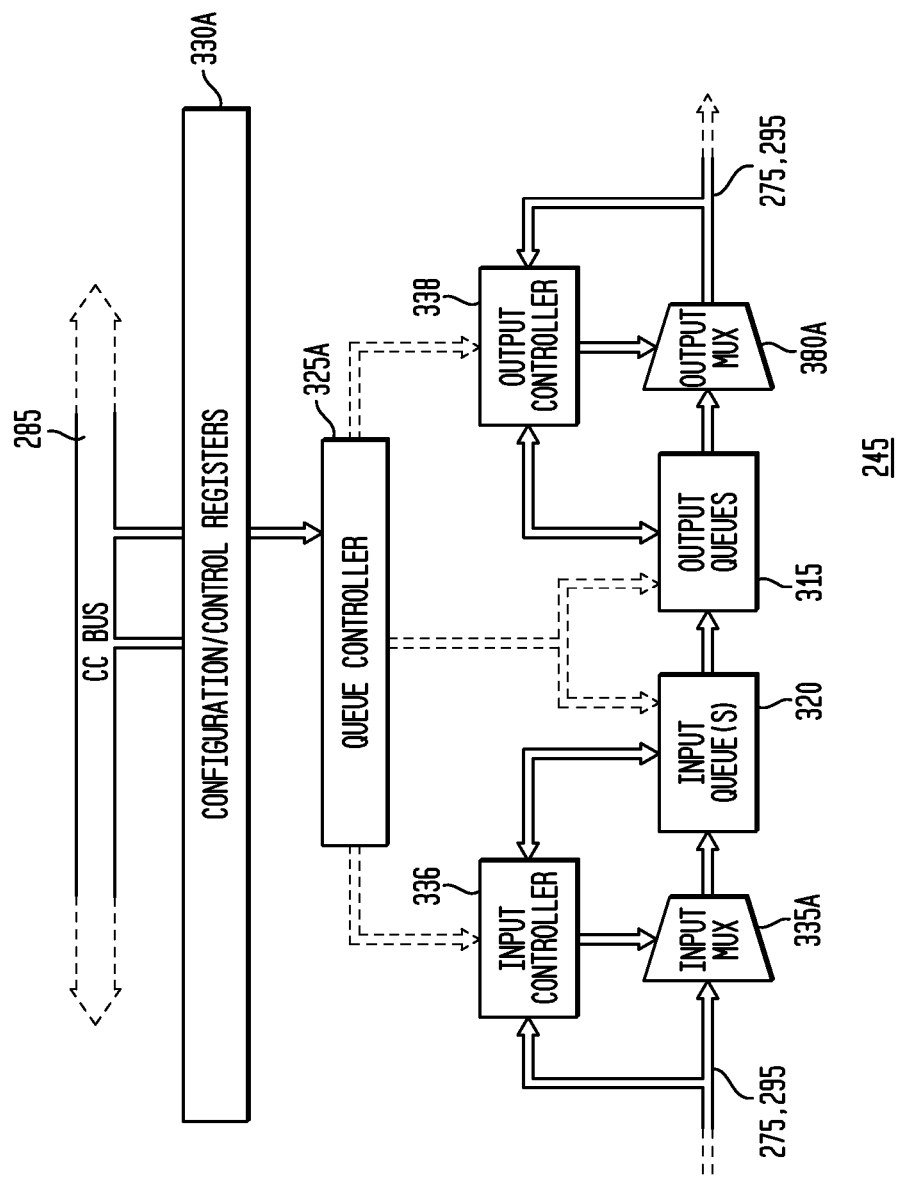
FIG. 26 is a block diagram illustrating an exemplary cluster queue in accordance with the teachings of the present invention.

FIG. 26 is a block diagram illustrating an exemplary cluster queue 245 in accordance with the teachings of the present invention. In exemplary embodiments, a plurality of cluster queues 245 provide for data transfer between adjacent zones 201 and clusters 200C, 200D, with the input of a cluster queue 245 coupled to a full interconnect 275, 295 of a first zone and the output of that cluster queue 245 coupled to a full interconnect 275, 295 of a second zone 201 within the same cluster 200 or an adjacent cluster 200C, 200D or a diagonally coupled zone 201 or cluster 200C, 200D. As illustrated, the exemplary cluster queue 245 is an "empty" composite circuit element 260A, lacking a computational element 270 and its corresponding configuration and control, and otherwise having the same or similar components with the same or similar functionality which control data transfer. The cluster queue 245 is also configurable (using configuration/control register 330A), for source-based addressing with backpressure, and its operation is discussed below with reference to FIG. 27.

Figure 27:
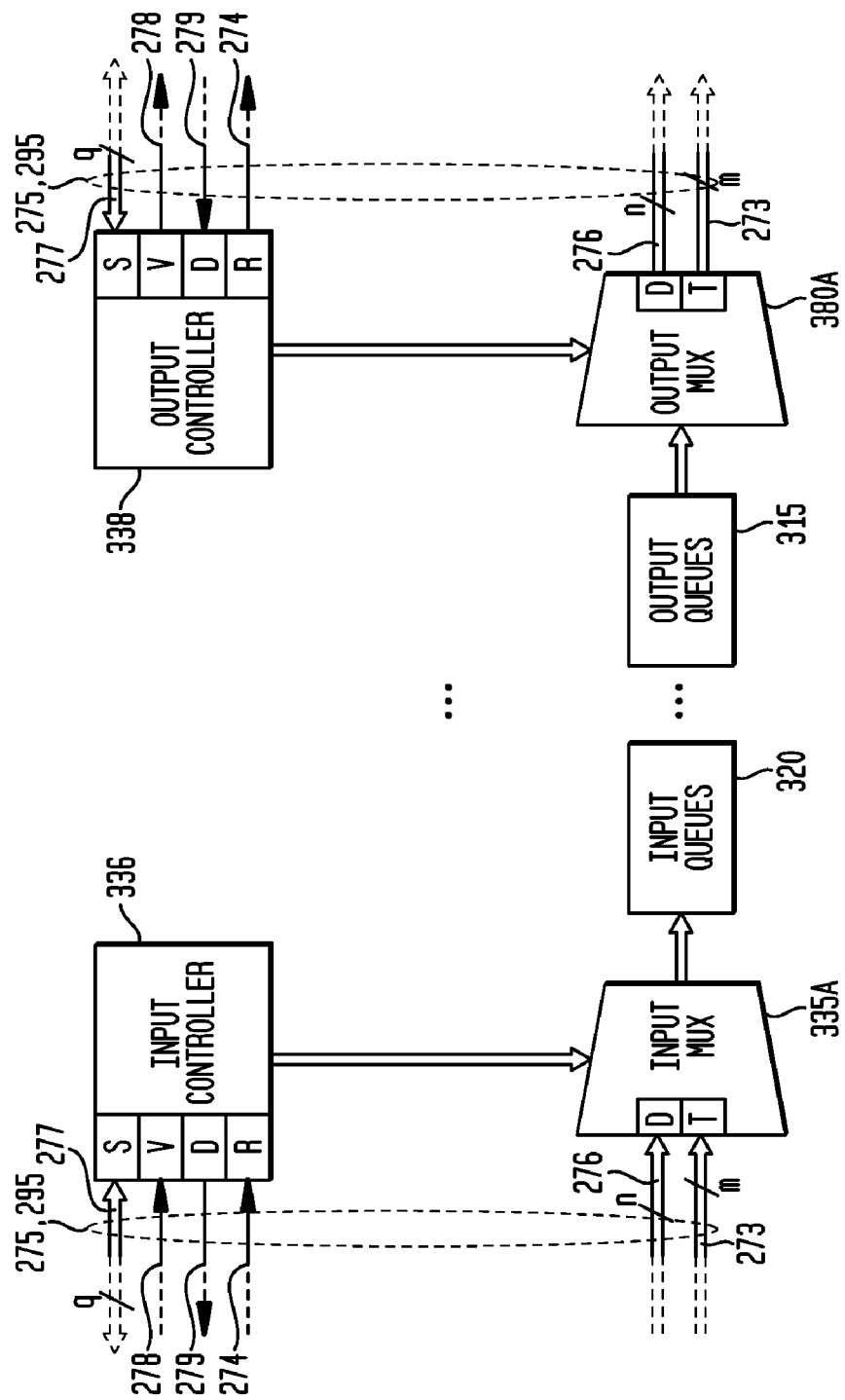
FIG. 27 is a block diagram illustrating in greater detail an exemplary full interconnect bus and protocol within an exemplary circuit zone in accordance with the teachings of the present invention.
Figure 28:
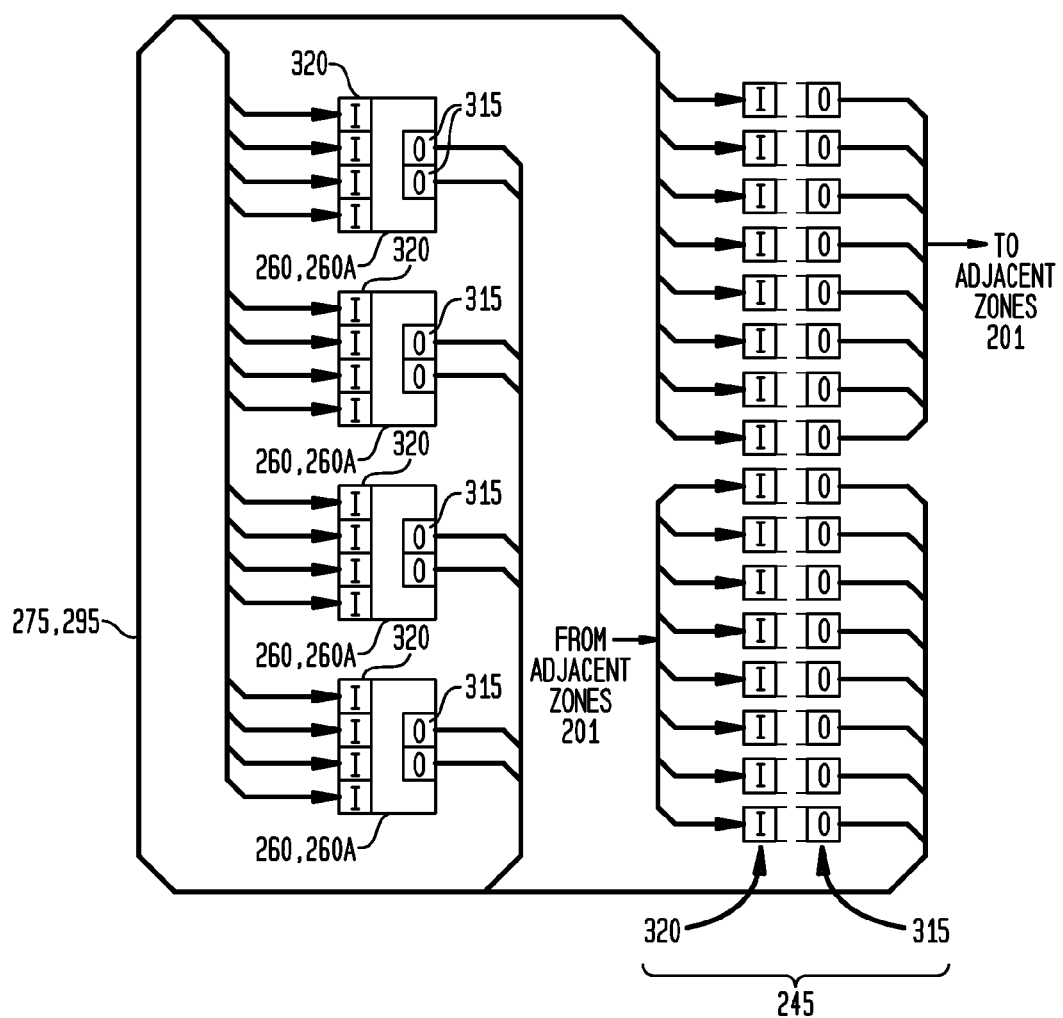
FIG. 28 is a block diagram illustrating in greater detail an exemplary full interconnect bus within an exemplary circuit zone and coupling to adjacent zones through a plurality of cluster queues in accordance with the teachings of the present invention.

As mentioned above, source-based addressing is utilized for all of the composite circuit elements 260A, cluster queues 245, and for any other component transmitting data on the full interconnect 275, 295. FIG. 27 is a block diagram illustrating in greater detail an exemplary full interconnect 275, 295 bus and protocol within an exemplary circuit zone 201 in accordance with the teachings of the present invention, and is useful for describing data input and output to and from both a composite circuit element 260A and a cluster queue 245. FIG. 28 is a block diagram illustrating in greater detail an exemplary full interconnect bus 275, 295 within an exemplary circuit zone 201 in accordance with the teachings of the present invention, and is useful for illustrating the significant extent and the non-hierarchical "flatness" of the interconnections and the between the composite circuit elements 260, 260A and cluster queues 245. FIG. 28 illustrates a zone 201 with four composite circuit elements 260, 260A, each having four input queues 320 and two output queues 315, and sixteen cluster queues 245, each having one input queue 320 and one output queue 315. With regard to the illustrated cluster queues 245, eight cluster queues 245 have input queues 320 originating within the zone for data transfer to an adjacent or diagonally adjacent zone using output queues 315 coupled to adjacent or diagonally adjacent full interconnect 275, 295, and eight cluster queues 245 have input queues 320 coupled to full interconnect 275, 295 originating in adjacent or diagonally adjacent zones for data transfer within the zone using output queues 315 coupled to the zone's full interconnect 275, 295. This results in complete interconnection within the zone of sixteen data sources to each of twenty four data destinations, with all communication within the zone occurring with one unit-delay from a source to a destination.

Referring again to FIG. 27, as illustrated, the full interconnect 275, 295 may be logically divided into several components, the data portion 276 (n bits wide, such as 32 or 64 bits wide) with data control lines 273 (m bits wide, for "tag" bits), and the addressing and additional control portion (lines or wires), illustrated as source address lines 277, valid line 278, deny line 279, and re-try line 274. In an exemplary embodiment, the data control lines 273 are implemented as two lines (m=2), for transmission of tag bits that are used as part of data processing by a selected configurable elements 270, such as for conditional execution. The tag bits meaning depends on the type of element 270. For example, tag bits are used by the memory composite circuit element 260M to indicate the beginning, middle and end of a block of data, or in another embodiment, to indicate just the end of a data block. In other embodiments, tag bits may be utilized by computational elements 270 to start a counter, for example, using a value held in one of the input queues, or utilized as carry bits, also for example.

The number of source address lines 277 "q" will vary depending upon the number of potential sources and their corresponding contexts which are implemented, such that there are sufficient lines to support the number of source addresses which may be needed. In exemplary embodiments, the valid line 278, deny line 279, and re-try line 274 are each one line or wire. As used herein, any producer (e.g., an output queue 320 of a composite circuit element 260A, output queue 320 of a cluster queue 245) of data is a data "source", and any consumer (e.g., an input queue 320 of a composite circuit element 260A or cluster queue 245) is a data "destination". Each data source is associated with a unique address, which identifies not only the specific composite circuit element 260A or cluster queue 245, but also the specific context of the composite circuit element 260A or cluster queue 245 which is or has produced data. When (valid) data is output onto the data lines 276 of the full interconnect 275, 295 (via output multiplexer (MUX) 380A under the control of output controller 338), this unique address is output on the source address lines 277, and a data valid signal is output on line 278, through output controller 338. Essentially, this information is broadcast on all of the full interconnect 275, 295 coupled to that output queue 315, so that any destination may receive it, as discussed below.

At the destination side, with the data, valid and source address broadcast on the full interconnect 275, 295, each input controller 336 is configured (through the configuration and control information stored in configuration and control registers 330A), to respond to or "listen" for a specific source address (source and its context) on the source address lines 277. That specific source address will correspond to some context of that destination which utilizes the data from that source, either for computation (composite circuit element 260A) or for data transfer (cluster queue 245). When that specific source address occurs on the source address lines 277, provided there is room for data in the input queues 320 associated with the corresponding destination context, the input controller 336 allows the input multiplexer (MUX) 335A to input the data into the input queue(s) 320 for that context.

When that specific source address occurs on the source address lines 277 but there is no room for data in the input queues 320 associated with the corresponding destination context, or another context is accepting data into the input queues 320, the input controller 336 does not allow the input multiplexer (MUX) 335A to input the data into the input queue(s) 320 for that context (so that the existing data in the input queues 320 is not overwritten), and instead issues (transmits) a deny signal on line 279. As only one source (output and context) is broadcasting during that interval on its dedicated lines of the full interconnect 275, 295, no additional addressing is needed for the deny signal. When a source address occurs on the source address lines 277 which is not a specific source address to be utilized by the destination, the destination (through input controller 336) ignores the data and also does not allow the input multiplexer (MUX) 335A to input the data into the input queue(s) 320.

Following a data broadcast, when no deny signal has been received on line 279 at the source output controller 338, the output controller 338 may consider all of the output data to have been properly received, and allows the storage to be free for overwriting with new data (i.e., so that there is room in the output queue(s) 315 for more output data). When a deny signal is received on line 279 at the source output controller 338, the output controller 338 does not know which destination did not allow input of the data and does not allow the output data to be overwritten. Instead, the data source context "backs off" and the data source context will re-try the data broadcast (right away if no other contexts have data to output). More specifically, the data is output again onto the data lines 276 of the full interconnect 275, 295 (via output multiplexer (MUX) 380A under the control of output controller 338), with its unique address output on the source address lines 277, and a re-try signal is output on line 274, through output controller 338. Essentially, this information is re-broadcast on all of the full interconnect 275, 295 coupled to that output queue 315, so that any destination may receive it again. The re-try signal will indicate to potential destinations that only destinations which previously issued the deny signal should now accept the data, and that other destinations which previously accepted (and potentially used) the data should ignore the re-broadcast data. When that specific source address occurs on the source address lines 277 with the re-try signal is output on line 274, provided there is now room for data in the input queues 320 associated with the corresponding destination context, the input controller 336 (that previously issued the deny signal) allows the input multiplexer (MUX) 335A to input the data into the input queue(s) 320 for that context. When that specific source address occurs on the source address lines 277 with the re-try signal is output on line 274, but there still is no room for data in the input queues 320 associated with the corresponding destination context, the input controller 336 once again does not allow the input multiplexer (MUX) 335A to input the data into the input queue(s) 320 for that context (so that the existing data in the input queues 320 is not overwritten), and instead issues (transmits) a deny signal again on line 279.

This data transfer from a source output queue 315 and into a destination input queue 320 over the full interconnect 275, 295, and the issuance of any deny signal, occurs within one clock cycle in exemplary embodiments, namely, with one unit delay. This use of the data deny signal, however, may exert "back pressure" on the corresponding data sources (data producers) throughout the apparatus 100, 140, with lack of room in an input queue 320 backing up data in an output queue 315 which prevents an element from executing and using data in its input queues, and so on. In this way, data is not lost, and can continue to be processed, such as following an incoming data burst. The back pressure is alleviated as soon as room is available in the relevant input and/or output queues 320, 315. In addition, although one context in a composite circuit element 260, 260A may not be able to execute, other contexts may be able to execute and be chosen to run by the element controller 325. This also allows for optimal use of system resources—if the data arriving is comparatively slow, it is processed and the system waits for more data, while if the data arrives too fast, back pressure is exerted and data integrity is maintained, with the flow of data being self-regulating. (While in theory this back pressure could have the potential to effectively halt the apparatus 100, 140, and require reset signaling to reset and resume operations with new data (rather than continuing to wait for the re-broadcast data), in practice such as scenario would generally only be the result of an improper implementation by a programmer who did not match the implementation to the application bandwidth or other application data requirements.)

Figure 29:
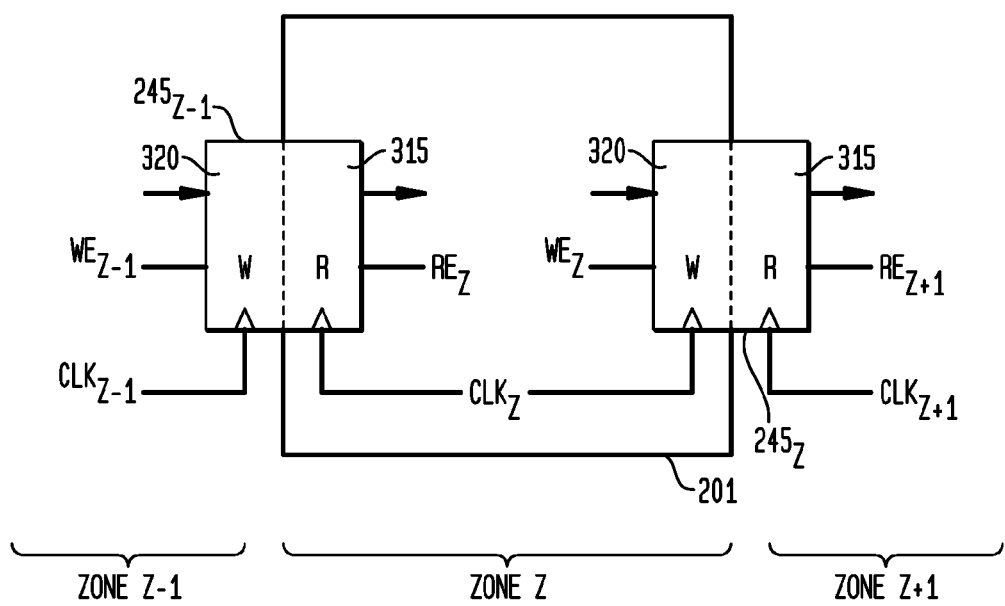
FIG. 29 is a block diagram illustrating first exemplary zone timing isolation between adjacent zones.

FIG. 29 is a block diagram illustrating first exemplary zone timing isolation between adjacent zones, in which two clocks are utilized to read from and write to cluster queues 245. As illustrated, in exemplary embodiments, adjacent or diagonally adjacent zones 201 may be run off the same or different clocks, with corresponding timing isolation between zones achieved through the cluster queues 245, as timing isolation components. As noted herein, a cluster queue 245 spans adjacent or diagonally adjacent zones 201, connecting to corresponding full interconnects 275, 295 in each respective zone 201. The different zones may each be run off of different clocks, illustrated as $CLK_{Z-1}$, $CLK_Z$, and $CLK_{Z+1}$. All in-bound data and out-bound data are conveyed through these isolation components, such that Zone Z, running with clock $CLK_Z$, runs independently of adjacent Zone Z−1, running with clock $CLK_{Z-1}$, and adjacent Zone Z+1, running with clock $CLK_{Z+1}$. As illustrated in FIG. 29, a first cluster queue $245_{Z-1}$ is coupled to a first full interconnect 275, 295 in a first zone 201 (illustrated as zone Z−1) and to a second full interconnect 275, 295 in a second zone 201 (illustrated as zone Z), and a second cluster queue $245_Z$ is coupled to a the second full interconnect 275, 295 in the second zone 201 (illustrated as zone Z) and a third full interconnect 275, 295 in a third zone 201 (illustrated as zone Z+1). As illustrated, for each cluster queue 245, its input queue 320 and its output queue 315 are clocked from different clock sources, e.g., input queue 320 of first cluster queue $245_{Z-1}$ is clocked from $CLK_{Z-1}$ and its output queue 315 is clocked from $CLK_Z$.

In this example, all data sourced by Zone Z−1 is write-controlled by Write Enable $WE_{Z-1}$, but the same data as read by Zone Z is read-controlled by Read Enable $RE_Z$. Similarly, all data sourced by Zone Z is write-controlled by Write Enable $WE_Z$, but the same data as read by Zone Z+1 is read-controlled by Read Enable $RE_{Z+1}$. Accordingly, the input queue 320 of cluster queue $245_{Z-1}$ may receive data on clock $CLK_{Z-1}$, and the output queue 315 of cluster queue $245_{Z-1}$ may transmit data into the adjacent zone Z on clock $CLK_Z$. Similarly, the input queue 320 of cluster queue $245_Z$ may receive data on clock $CLK_Z$, and the output queue 315 of cluster queue $245_Z$ may transmit data into the next adjacent zone Z+1 on clock $CLK_{Z+1}$. In an exemplary embodiment, these timing isolation components (cluster queue 245) are implemented using First-In-First-Out (FIFO) modules, or using Globally-Asynchronous-Locally-Synchronous (GALS) components, and their application in isolating zones in a configurable architecture is new and novel.

Figure 30:
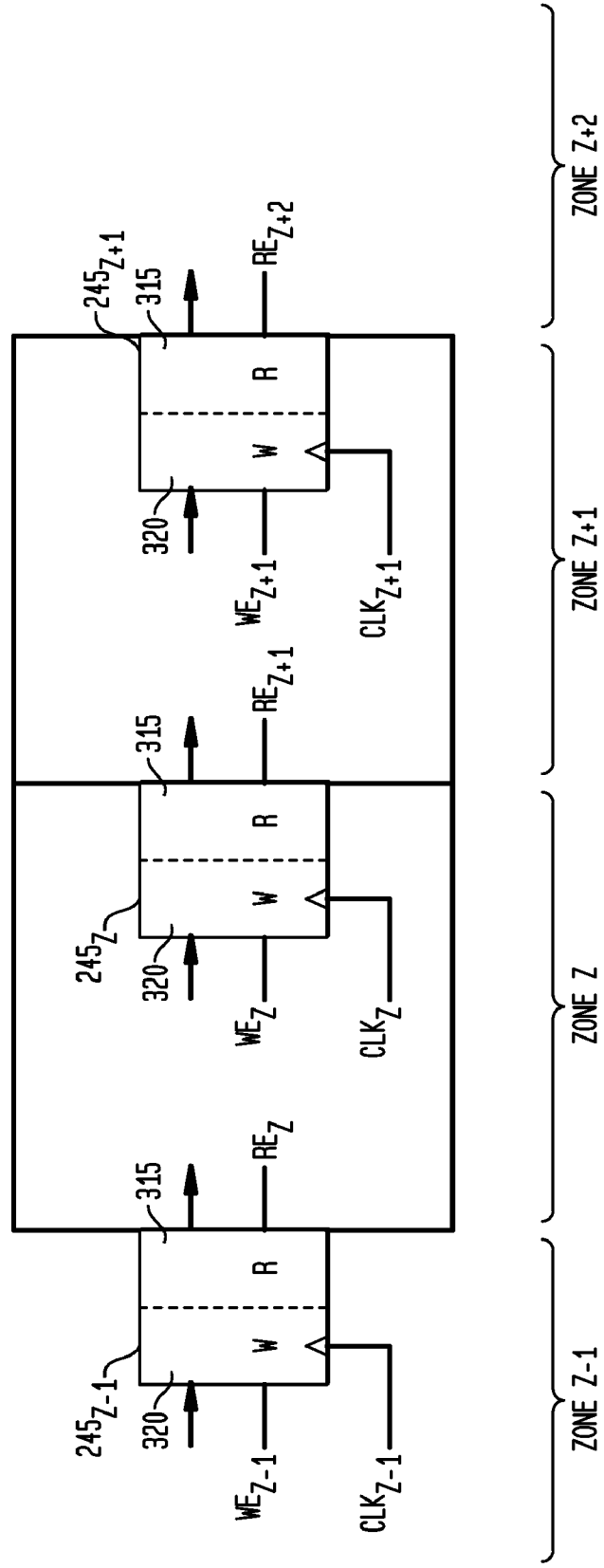
FIG. 30 is a block diagram illustrating second exemplary zone timing isolation between adjacent zones.

FIG. 30 is a block diagram illustrating a second exemplary zone timing isolation between adjacent zones, in which one clock is utilized to read from and write to cluster queues 245 within a zone, and a different clock is utilized to read from and write to cluster queues 245 within an adjacent zone. The different zones also may each be run off of different clocks, illustrated as $CLK_{Z-1}$, $CLK_Z$, and $CLK_{Z+1}$. All in-bound data and out-bound data are conveyed through these isolation components, such that Zone Z, running with clock $CLK_Z$, runs independently of adjacent Zone Z−1, running with clock $CLK_{Z-1}$, and adjacent Zone Z+1, running with clock $CLK_{Z+1}$. As illustrated in FIG. 30, a first cluster queue $245_{Z-1}$ is coupled to a first full interconnect 275, 295 in a first zone 201 (illustrated as zone Z−1) and to a second full interconnect 275, 295 in a second zone 201 (illustrated as zone Z); a second cluster queue $245_Z$ is coupled to a the second full interconnect 275, 295 in the second zone 201 (illustrated as zone Z) and a third full interconnect 275, 295 in a third zone 201 (illustrated as zone Z+1); and a third cluster queue $245_{Z+1}$ is coupled to a the third full interconnect 275, 295 in the third zone 201 (illustrated as zone Z+1) and a fourth full interconnect 275, 295 in a fourth zone 201 (illustrated as zone Z+2). As illustrated, for each cluster queue 245, its input queue 320 and its output queue 315 is clocked from the same clock, e.g., input queue 320 of first cluster queue $245_{Z-1}$ is clocked from $CLK_{Z-1}$ and its output queue 315 is clocked from $CLK_{Z-1}$.

In this example, all data sourced by Zone Z−1 is write-controlled by Write Enable $WE_{Z-1}$, but the same data as read by Zone Z is read-controlled by Read Enable $RE_Z$. Similarly, all data sourced by Zone Z is write-controlled by Write Enable $WE_Z$, but the same data as read by Zone Z+1 is read-controlled by Read Enable $RE_{Z+1}$. In an exemplary embodiment, these timing isolation components (cluster queues 245) are implemented using Data Register File (DF) modules. In such an embodiment, Zone clocks, $Z_i$, are synchronous although not necessarily identical. If not identical, pulse width handling for read and write controls, $REi$ and $WEi$, must accommodate disparate periods of the source clocks. Use of these techniques to isolate zones in a configurable architecture is new novel.

Other clocking schemes may also be utilized, such as each zone 201 and its cluster queues 245 clocked by its own (same) clock, or by all zones 201 and cluster queues 245 clocked by a single clock.

Figure 31:
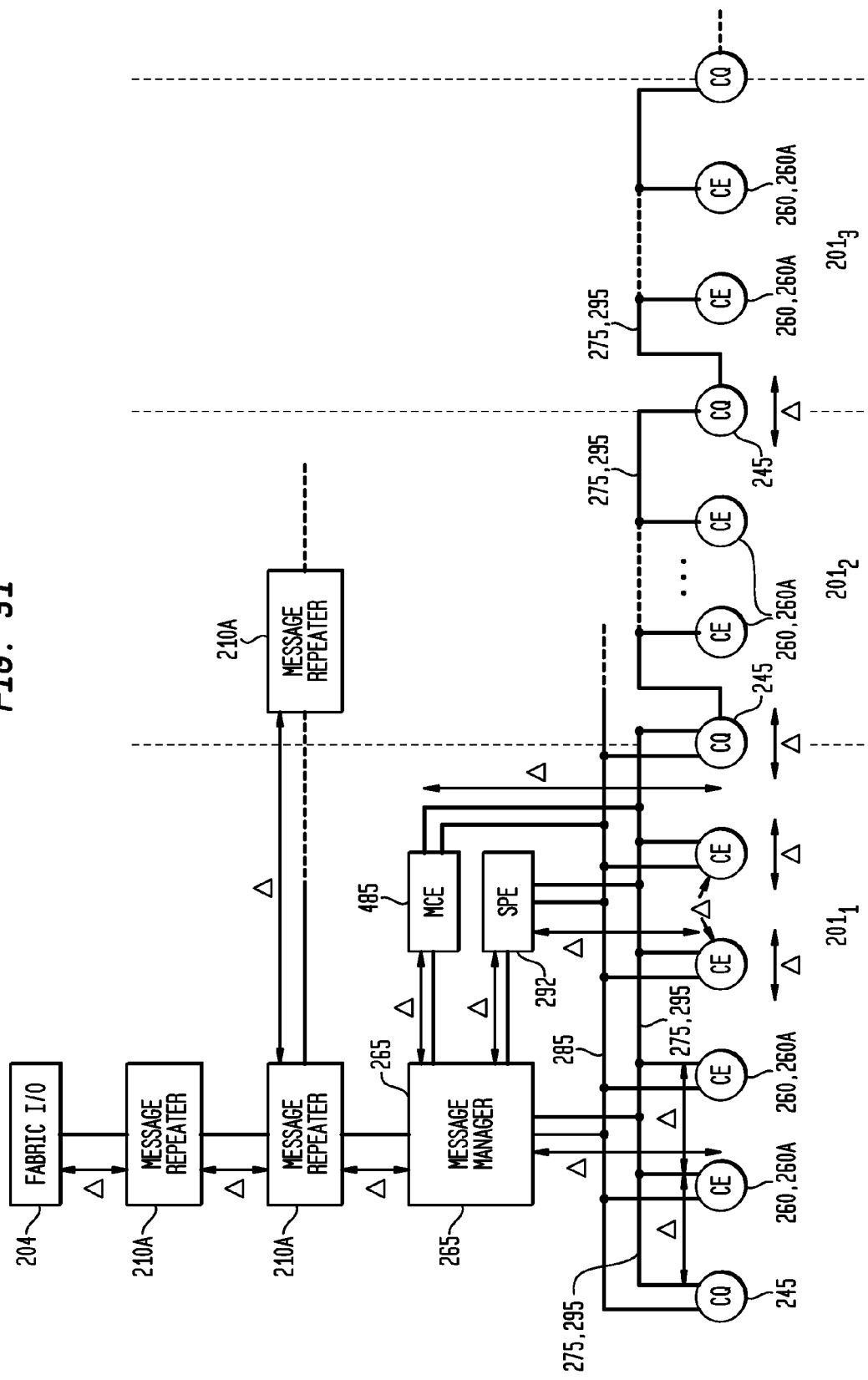
FIG. 31 is a block and timing diagram illustrating exemplary unit delay timing in accordance with the teachings of the present invention.

FIG. 31 is a block and timing diagram illustrating exemplary unit delay timing and timing closure for data transfer, and unit delay timing and timing closure for configuration and/or reconfiguration, in accordance with the teachings of the present invention. Two advantages of the apparatus 100, 140 architecture are the ability to predict timing of data operations and have timing closure without undue computation, and to configure and/or reconfigure readily, allowing such configuration and reconfiguration in the field. As indicated above, each data operation and point-to-point data transfer of data or configuration/control occurs within one time period or "unit delay", illustrated in FIG. 31 as a delta "$\Delta$", typically one clock cycle in exemplary embodiments. As illustrated, any word of a message being transferred between the system (fabric) I/O 204 and a message repeater 210A, between successive message repeaters 210A, between a message repeater 210A and a message manager 265, or between successive message managers 265 (when coupled for peer-to-peer communication), occurs within one unit delay, for data, configuration, and control. Any data transfer of a data word on the full interconnect 275, 295 within a zone (such as the illustrated first zone $201_1$) occurs within one unit delay, such as between the composite circuit elements 260, 260A, between composite circuit elements 260, 260A and a cluster queue 245, and so on. Any data word transfer through a cluster queue 245 between two adjacent or diagonal zones occurs within one unit delay, such as between the illustrated first zone $201_1$ and the illustrated second zone $201_2$. Any data word transfer on the full interconnect 275, 295 within another zone (such as the illustrated second zone $201_2$) occurs within one unit delay, such as between the composite circuit elements 260, 260A, between composite circuit elements 260, 260A and a cluster queue 245, and so on.

Similarly, configuration and control information may also be disseminated or copied rapidly, with any word of configuration and control information distributed by the message manager 265 or the SPE 292 within a cluster 200-200D to or from the element interface and control 280, 280A of a composite circuit element 260, 260A also occurring within one unit delay.

As mentioned above, while configurable devices such as FPGAs are widely used, they are virtually impossible to reconfigure in the field, and even more importantly, while the device is in use in the field. More specifically, when an FPGA is powered up, it is loaded with a stored configuration file for one or more applications that have been previously mapped, placed and routed, with timing closure. While in operation, however, such FPGAs cannot reconfigure with a new mapping, placement and/or routing. One of the many reasons for this is the unpredictability and indeterminacy of operation timing, which can vary widely in such a device depending upon how the task, operation or program is compiled for and mapped to the architecture (how a task's behavioral netlist is mapped to the available components of the FPGA or other configurable logic (mapping)), where on the integrated circuit a task is located (task placement), and how the data path connections for the operation are routed (routing).

More specifically, these traditional configurable logic devices suffer from three largely unpredictable steps in their configuration sequence: (1) map, (2) place, and (3) route. This has the further result of unpredictability of timing, and large timing variances with different mappings, placements and routings.

Mapping is converting the customer behavioral netlist into constructs of the target technology. In this step, the prior art Mapper may invoke target library structures and synthesis optimizations to partition behavioral statements into the function blocks of the target configurable architecture. An optimal Mapper may "rip-up-and-retry" various mappings until the input netlist converts into a structural netlist consuming fewer resources than available in the selected device. This result is then passed to the Placer.

Starting with the mapped structural netlist, the prior art Placer uses various heuristics (such as simulated annealing) to match each netlist instance with particular resources within the selected device architecture. An optimal Placer uses timing-driven placement to determine best placement and continues until its best guess is that all placed items should be capable of actually being routed. This result is then passed to the Router.

The prior art Router, beginning with the placed structural netlist, then uses various algorithms, such as "sort-by-loads-and-begin-routing-with-least-loaded-nets", to see if it can first, route all nets, and second, meet timing. An optimal Router will use timing-driven routing. If timing is not being met, the Router will 'rip-up-and-retry' already routed nets by allocating to them different route resources. For example, an identical task may be placed identically on an FPGAs and CLBs and yet routed differently, resulting in different data path delays, thereby requiring post-route timing analyses.

If after a much longer time (usually hours) the Router still cannot meet timing, it may send the job back to the Placer to obtain a new de novo placement. Similarly, if after many iterations between the prior art Router and the Placer, timing still cannot be met, an optimal map, place and route (MPR) process will send the job back to the prior Mapper to obtain a different allocation of instances-to-resources, beginning the map, place and route process all over from scratch.

When finally all these iterations succeed in a route that meets user timing, a target netlist is finally output. Note that finally timing closure cannot be known until after all these iterations—in the worst case, a triple nested loop. This is one of the major reasons it is impractical to implement partial reconfiguration in the field with the current prior art.

It is well known that the map, place and route determinations for FPGAs and CLBs takes hours upon hours. In addition, performing a second map, place and route determination using the same behavioral netlist may result in a different mapping, placement and routing, with different timing results and a different operating frequency.

In contrast, fixed devices such as ASICs have a known timing, with all architecture placement and routing completed before IC manufacture. Having been designed for a specific purpose, such ASICs are not configurable and cannot be utilized to perform new functionality that was not included in the original design.

It is in light of this map, place and route problem of the prior art that the concept of a "unit delay", "unit time delay" or a "unit time interval", as used throughout this disclosure, should be understood. A unit delay or unit time interval of this disclosure should not be confused with a recurring, specified time interval such as a clock period (or a clocking frequency) for a device. Rather, the intended meaning of unit delay and unit time interval is that of a constant or guaranteed, and known in advance, maximum time interval for any and all data operations and data word transfers, within a zone 201 (or region) of the IC, and between zones (or regions) of the inventive IC, which provides a readily known and easily determined timing closure for a reconfigurable integrated circuit. This constant time interval for all data operations and data transfers within a zone 201 (or other region) is without regard to and is totally independent of how a task may be mapped to (or compiled for) the reconfigurable architecture, the locations of the task placement in the reconfigurable architecture, and the routing or connections for the application data for the task.

As discussed in greater detail herein, this unit time interval is enabled by several inventive architectural features utilized in the apparatus 100, 140. First is the timing isolation provided by the element interface and control, with local data storage in the input queues 320 and output queues 315, such that data is present in an output queue 315 within one unit time interval, regardless of the type or location of a composite circuit element 260, 260A. Second is the full interconnect bus 275, 295 connecting every output queue 315 to every input queue 320 within a zone 201, so that all possible data routing within a zone 201 is available to complete a data transfer and is completely deterministic a priori. Accordingly, the unit interval timing within a zone 201 is completely deterministic and completely independent of both placement and routing. Third, timing is also isolated and deterministic between adjacent and diagonally adjacent zones 201, through the use of cluster queues 245, which also have a known unit delay.

Accordingly, this constant, known time interval, referred to herein as a "unit delay" or "unit time interval", is completely scalable within the inventive architecture, with the simple addition of one unit time interval for any data transfer between adjacent or diagonally adjacent zones 201, and with the simple addition of one to three unit time intervals or delays for any data transfer between clusters 200-200D, depending upon if the data transfer is through one cluster queue 245 (one unit delay), or through two cluster queues 245 to traverse a cluster 200-200D completely (two unit delays), or over the interconnect 220 (from a first message manager 265 in a first cluster 200-200D to a message repeater 210A (one unit delay) to a second message manager 265 in a second cluster 200-200D (one unit delay) to a composite circuit element 260, 260 in the second cluster 200-200D (one unit delay) (three unit delays total)), for example. And unless there is a contention or conflict for resources, this is also true for the loading of additional tasks into the inventive reconfigurable architecture. This inventive constant time interval for completion of any and all data operations and data transfers within a zone enables a readily calculable and known timing closure in advance or a priori from the netlist, which is a huge advancement over the prior art.

Because of the unit-delay characteristic of the inventive architecture, with the full interconnect bus 275, 295 coupling all output queues 315 to all input queues 320 within a zone 201, the route phase is obviated within a zone 201, with only mapping and binding steps required (discussed in greater detail below with reference to FIGS. 11, 12 and 14), and with routing only required for data transfers beginning at the non-adjacent zone 201 and inter-cluster 200-200D levels. But again, any of those possible data transfers also have known unit delays.

The mapping step is similar, converting the input behavioral netlist into target structures, and binding is similar to placing, in that particular locations are selected. But unlike the Placer of prior art which must guess whether one location is more timely than another, all locations in a unit-delay regions (zones 201) are of equal weight. For example, the data operation "A=B·(x+y)" may be mapped to one adder (x+y=z) and one multiplier (B·z), or two multipliers (B·x=w and B·y=q, respectively) and one adder (w+q), and regardless of this mapping to different composite circuit elements 260, 260A, the timing is the same, two unit time intervals. Moreover, all locations in adjacent regions carry known unit-delay penalties, of one to three unit delays for data transfers between zones 201 or clusters 200-200D. This practically reduces the timing analysis to a simple matter of counting unit delays to ascertain if the bandwidth requirements of a given source-destination connection are met.

The other function of the binder, as discussed in greater detail below, is to insert the connection information into the final netlist. For example, once source and destination instance locations are selected, that connection information is written into the netlist to ensure that all destinations "subscribe" to the appropriate sources (as identified by their locations in the hierarchy).

An optimal Binder for the inventive architecture uses bandwidth parameters to determine when source and destination interconnections are within the required number of unit delays. If the Binder cannot meet all bandwidth requirements, it may request a remapping of the structural netlist, such as to place tasks within a selected zone 201 (or adjacent zones 201) or cluster 200-200D.

It should be noted that "timing closure" in the inventive architecture is known after the Binding step. This is a significant advantage over prior art, since prior art must calculate, on average, billions of bit-width timing paths with pico-second granularity to determine timing closure, whereas the invention need only calculate thousands of bus-width timing paths with unit-delay granularity to determine timing closure. This is at least 6 orders of magnitude faster!

Accordingly, as used herein, unit delay or unit time interval means a constant, maximum time interval which is independent of task mapping (or compilation), task placement, and task data routing. In an exemplary embodiment, a unit time delay may be determined by a longest path through the composite circuit elements 260, 260A, which is then the maximum time interval for a data operation (with data transfers generally faster). This maximum time interval is then utilized to set a selected clock frequency, such that in an exemplary embodiment, the period of a clock may equal a unit time interval.

Figure 32:
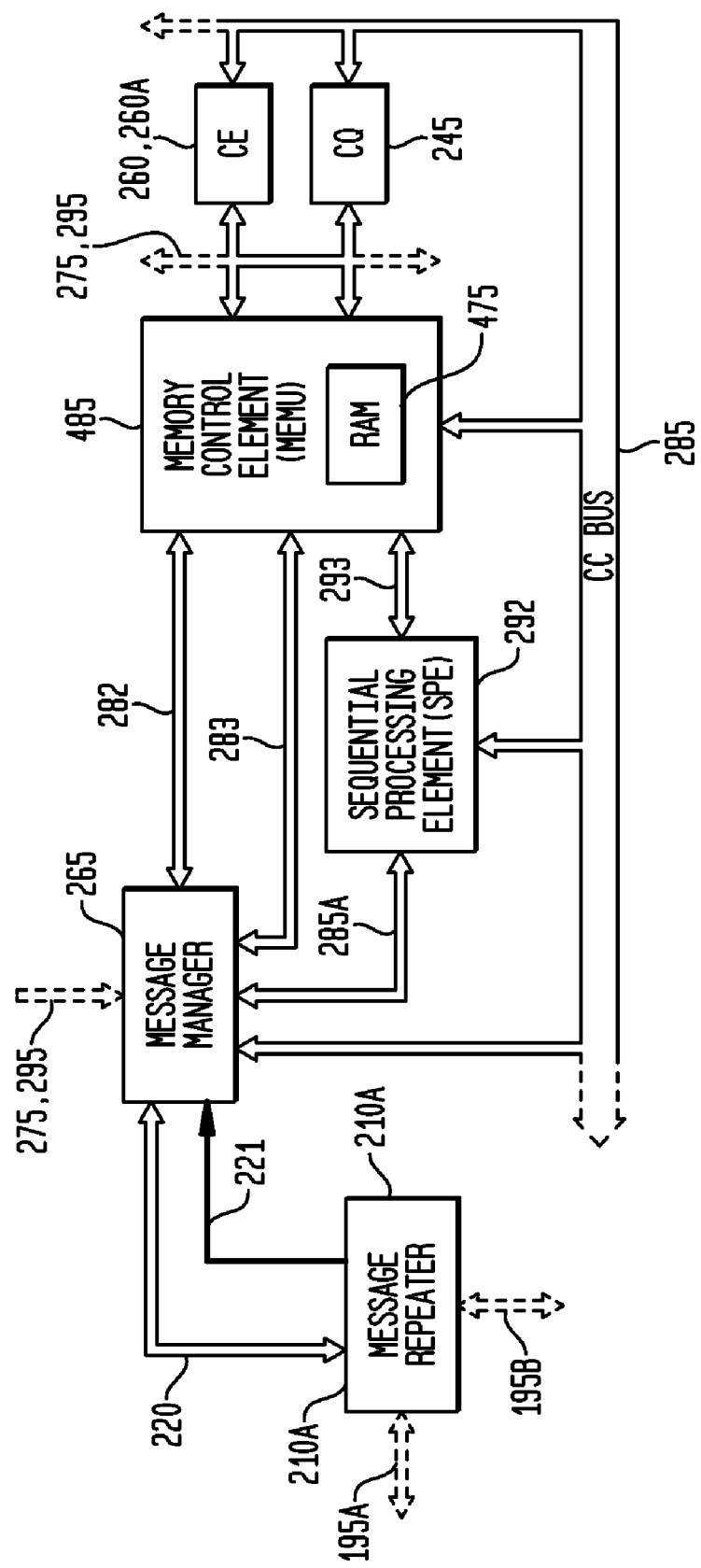
FIG. 32 is a block diagram illustrating in greater detail exemplary interconnections between and among selected circuit components in a circuit cluster in accordance with the teachings of the present invention.

FIG. 32 is a block diagram illustrating in greater detail exemplary interconnections between and among selected circuit components in a circuit cluster in accordance with the teachings of the present invention. As illustrated, in exemplary embodiments, dedicated channels may be utilized, with memory channel 282 and masterless memory (MLM) channel 283 utilized between the message manager 265 and the memory control element (MCE) 485 (which comprises a memory composite circuit element 260M and a cluster memory (RAM) 475), an SPE message channel (SMC) between the message manager 265 and the sequential processor element (SPE) 292, an instruction data bus between the memory composite circuit element 260M and the sequential processor element (SPE) 292, and a configuration and control bus (CC bus) 285 between and among the message manager 265, the sequential processor element (SPE) 292, the memory composite circuit element 260M, and the element interfaces (and control) 280, 280A of the composite circuit elements 260, 260A (illustrated in FIG. 25). In addition, an optional channel 221 may be utilized for additional signaling, such as for reset signaling, interrupt signaling, or any other purpose, for example and without limitation. The structure and protocols of these various channels will be discussed below with reference to FIGS. 33-36. The various other communication channels and protocols of the exemplary embodiments, such as the messaging channels for interconnect 155 and data and addressing channels of the full interconnect 275, 295, have been addressed previously.

Figure 33A:
FIGS. 33A and 33B, is a block diagram illustrating in greater detail an exemplary memory channel and protocol within an exemplary circuit cluster in accordance with the teachings of the present invention.
Figure 33B:
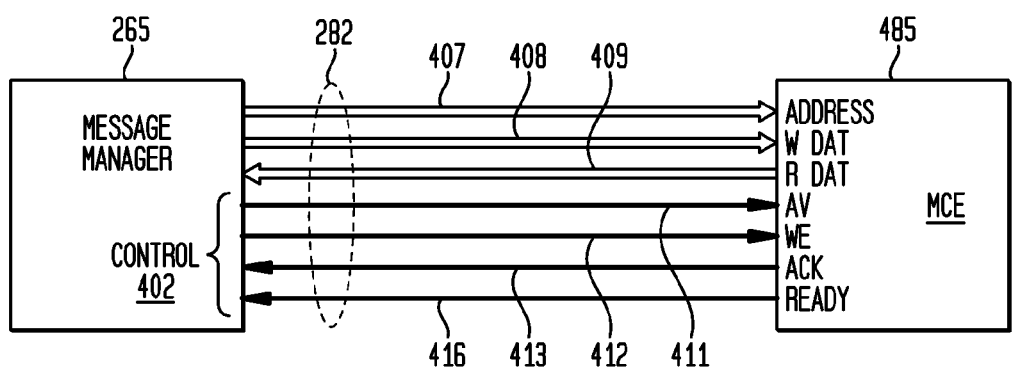

FIG. 33 is a block diagram illustrating in greater detail an exemplary memory channel 282 and protocol within an exemplary circuit cluster 200-200D in accordance with the teachings of the present invention. A memory channel word 401 comprises three fields, a control field 402, an address field 403, and a data payload field 404, with the memory channel 282 comprising lines or wires which correspond to these fields, and can be used for both data write and data copy messages. In an exemplary embodiment, the control field 402 is typically four bits, a first bit indicating that the address is valid (AdrVal signal from the message manager 265 on line 411), a second bit indicating that a memory write is enabled (WE signal from the message manager 265 on the line 412), a third bit providing an acknowledgement (ACK signal from the memory control element (MCE) 485 on line 413), and a fourth bit indicating that the memory control element (MCE) 485 is in a ready state (Ready signal from the memory control element (MCE) 485 on line 416). The message manager 265 uses the address field 403 to indicate an address in cluster memory (RAM) 475 for either a read or write operation (address lines 407), with the payload field containing the data from the message manager 265 to write to cluster memory (RAM) 475 (write data (wdat) lines 408) or containing the data read from cluster memory (RAM) 475 and provided to the message manager 265 (read data (rdat) lines 409). The message manager 265 may convert the memory channel word 401 to a message channel word 310 for further transfer on interconnect 155 (remove control and address fields 402, 403, providing strobe field 301, tags field 302 and an address header field 305, with the read data (rdat 409) payload 404 becoming payload 307 in one or more messages), and vice-versa, when messages are received from the interconnect 155 (removing strobe field 301, tags field 302 and address header field 305, providing control and memory address fields 402 and 403, with the payload data 307 becoming write data in payload 404).

Figure 34A:
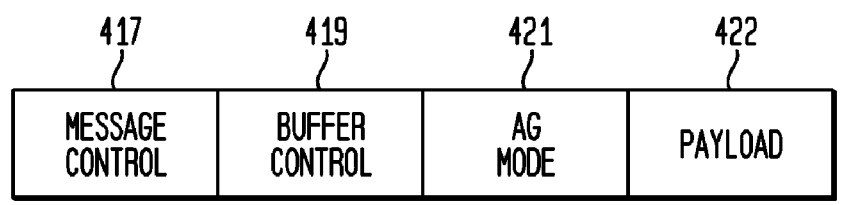
FIGS. 34A and 34B, is a block diagram illustrating in greater detail an exemplary masterless messaging channel and protocol within an exemplary circuit cluster in accordance with the teachings of the present invention.
Figure 34B:
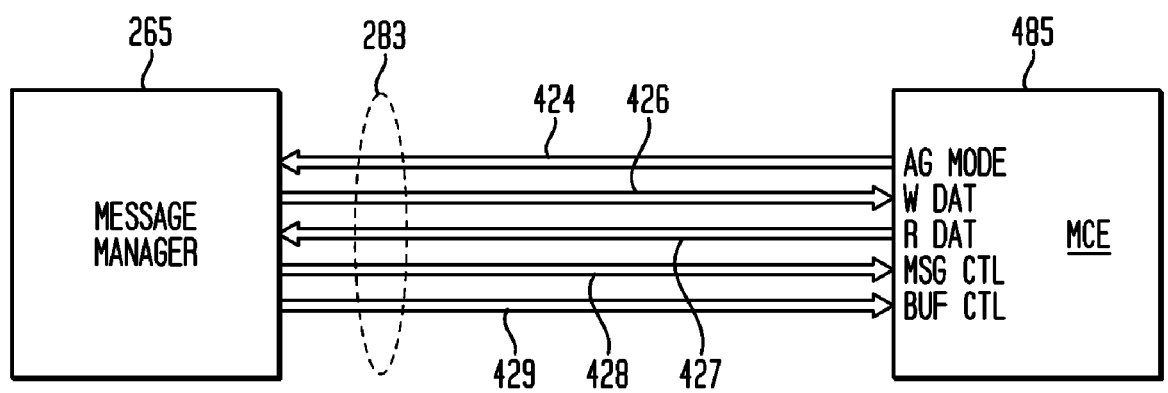
Figure 35A:
FIGS. 35A, 35B, 35C and 35D, is a block diagram illustrating in greater detail an exemplary instruction data bus or channel and protocol within an exemplary circuit cluster in accordance with the teachings of the present invention.
Figure 35B:
Figure 35C:
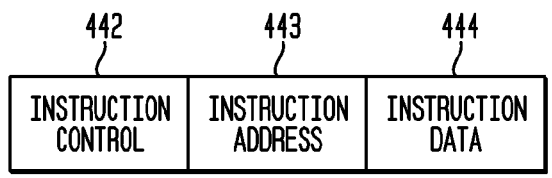
Figure 35D:
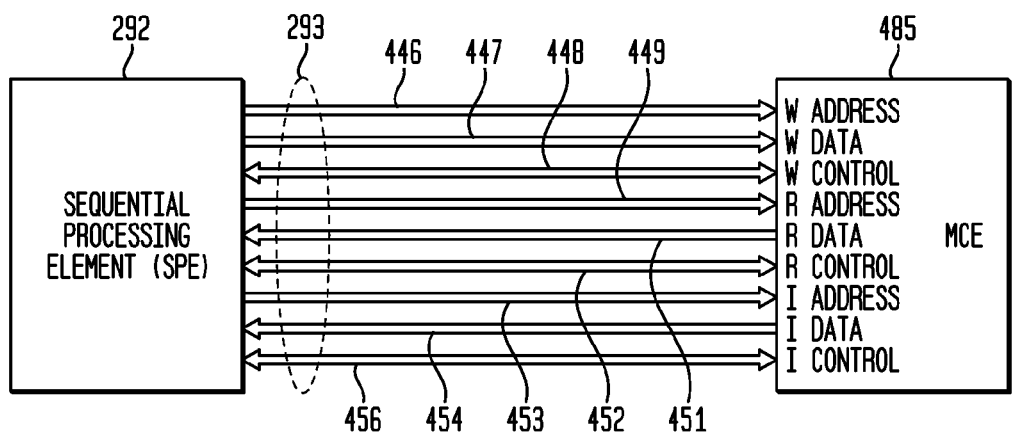

FIG. 34 is a block diagram illustrating in greater detail an exemplary masterless messaging channel and protocol within an exemplary circuit cluster in accordance with the teachings of the present invention. Masterless messaging is discussed in greater detail below, and allows creation of messages without the involvement of the SPE 292. A masterless messaging channel word 423 comprises four fields, a message control field 417, a buffer control field 419, an address generation field 421, and a data payload field 422, with the masterless messaging channel 283 comprising lines or wires which correspond to these fields, and can be used for both data write and data copy messages. In an exemplary embodiment, the message control field 417 is used to designate message size, message status, and a message maximum, from the message manager 265 to the memory control element (MCE) 485 or vice-versa (lines 428), and effectively perform a handshake between the message manager 265 and the memory control element (MCE) 485. The buffer control field 419 is used to control the transport of masterless messages, and includes bits for buffer destination, buffer size, buffer available, buffer status, and buffer ready (lines 429). The address generator mode field 421 is provided by the memory control element (MCE) 485 (lines 424). The payload field containing the data from the message manager 265 to write to cluster memory (RAM) 475 (write data (wdat) lines 426) or containing the data read from cluster memory (RAM) 475 and provided to the message manager 265 (read data (rdat) lines 427). The message manager 265 also may convert the masterless messaging channel word 401 to a message channel word 310 and vice-versa similarly to the process described above.

FIG. 35 is a block diagram illustrating in greater detail an exemplary instruction data bus 293 or channel and protocol within an exemplary circuit cluster in accordance with the teachings of the present invention. Three different kinds of information may be transmitted on the instruction data bus 293, a SPE data read 431, a SPE data write 432, and a SPE instruction fetch 433, each with corresponding lines or wires on the instruction data bus 293. In an exemplary embodiment, the SPE data read 431 comprises three fields, a read control field 434, a read address field 436, and a read data payload field 437. The read control field 434 consists of bits denoting a request or a wait (lines 452). The read address field 436 indicates an address in cluster memory (RAM) 475 for a read operation (address lines 449), with the read data payload field 437 containing the data read from cluster memory (RAM) 475 and provided to the SPE 292 (lines 451). Also in an exemplary embodiment, the SPE data write 432 comprises three fields, a write control field 438, a write address field 439, and a write data payload field 441. The write control field 434 consists of bits denoting a request, wait, byte enable, and priority (lines 448). The write address field 439 indicates an address in cluster memory (RAM) 475 for a write operation (address lines 446), with the write data payload field 441 containing the data to write to cluster memory (RAM) 475 (lines 447). Also in an exemplary embodiment, the SPE instruction fetch 433 comprises three fields, an instruction control field 442, an instruction address field 443, and an instruction data payload field 444. The instruction control field 442 consists of bits denoting a request, wait, and wake (lines 456). The instruction address field 443 indicates an address in cluster memory (RAM) 475 for a read operation (address lines 453), with the instruction data payload field 444 containing the instruction read from cluster memory (RAM) 475 (lines 454).

Figure 36A:
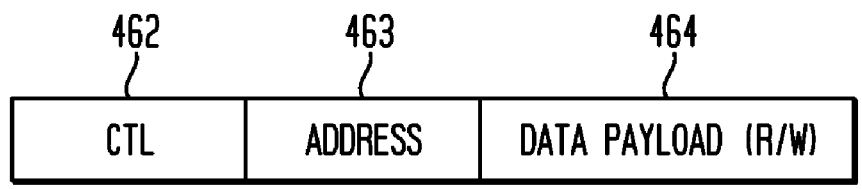
FIGS. 36A and 36B, is a block diagram illustrating in greater detail an exemplary configuration and control bus or channel and protocol within an exemplary circuit cluster in accordance with the teachings of the present invention.
Figure 36B:
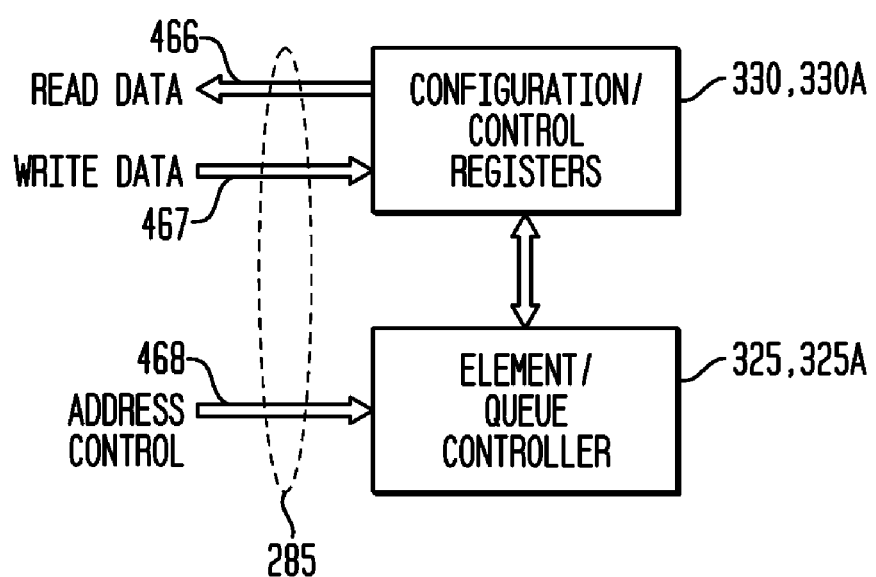

FIG. 36 is a block diagram illustrating in greater detail an exemplary configuration and control bus 285 or channel and protocol within an exemplary circuit cluster in accordance with the teachings of the present invention. In an exemplary embodiment, the configuration word 461 comprises three fields, a control field 462, an address field 463, and a data payload field 464 for read or write data. The control field 462 consists of bits denoting a write enable and either a read or write direction, and the address field 463 indicates a location in the configuration and control register 330A for a read or a write operation (control and address lines 468). The element controller 325 (for a composite circuit element 260A) or a queue controller 325A (for a cluster queue 245) decodes the control and address lines for the corresponding read or write operation in the configuration and control register 330A. The data payload field 464 contains the data read from or written to the configuration and control register 330A (lines 466, 467).

The element controller 325 and configuration and control register 330A contain internal combinational and/or finite state machine logic which can be utilized for several different, significant features enabled with the configuration and control bus 285. First, matching circuitry within the element controller 325 allows the element controller 325 to match task IDs (discussed in greater detail below) with a task ID included within a configuration message broadcast on the configuration and control bus 285, updating the contexts with the matching task ID with the broadcast contents. As a consequence, configuration messages can be broadcast on the configuration and control bus 285 to multiple composite circuit elements 260, 260A, 260M and cluster queues 245, for concurrent or simultaneous updating or configuring of tasks, such as to turn a task on or off at about the same time. The configuration and control bus 285 may also be utilized to read back configuration and status data, using the embedded logic within the element controller 325 and/or configuration and control register 330A. In addition, the element controller 325, configuration and control register 330A and configuration and control bus 285 can utilize different operational modes, discussed in greater detail below, such as control for breakpoints, single-stepping, interrupts and other debugging functions for the reconfigurable IC.

Figure 37:
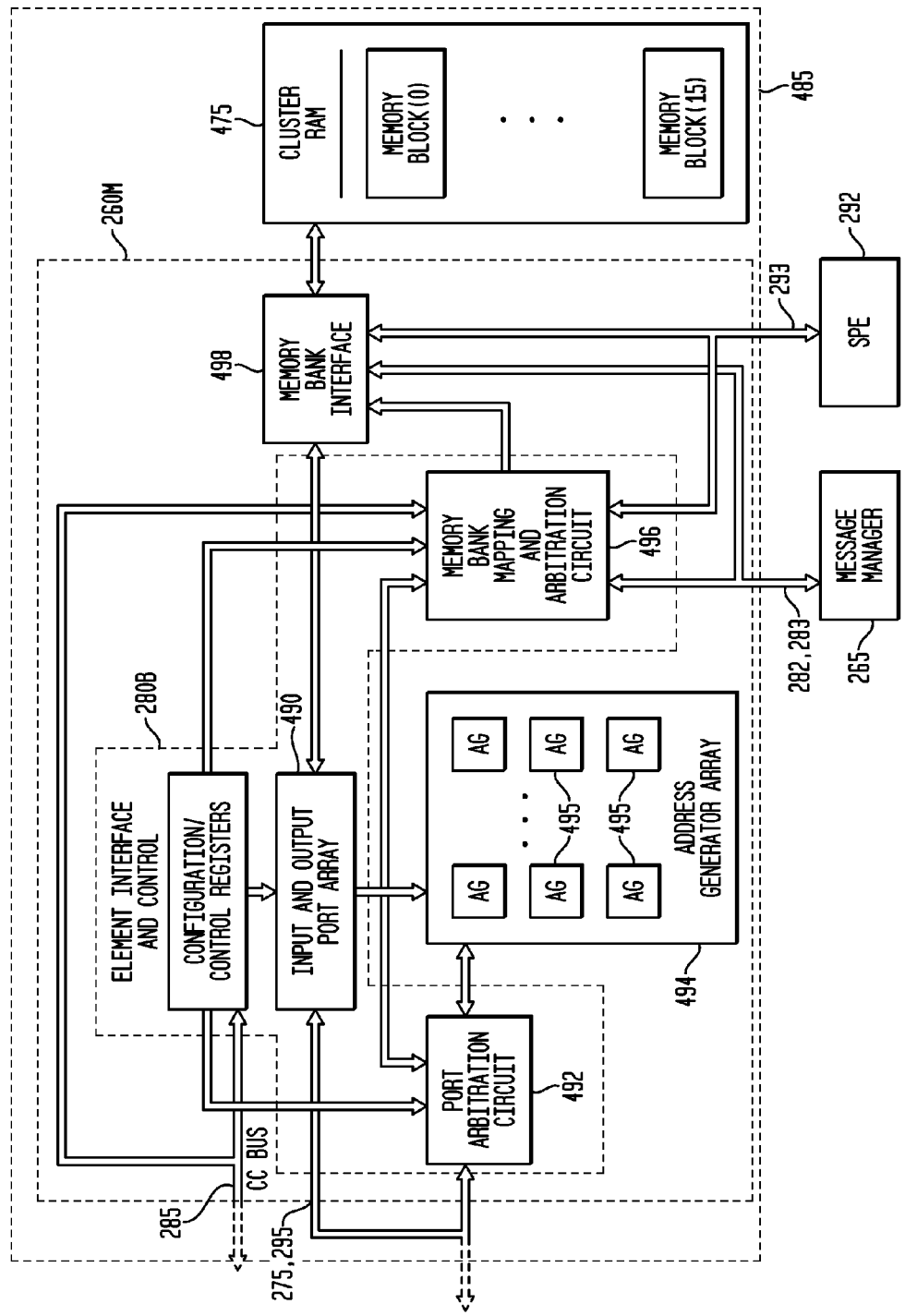
FIG. 37 is a block diagram illustrating in greater detail an exemplary memory composite circuit element within an exemplary circuit cluster in accordance with the teachings of the present invention.

FIG. 37 is a block diagram illustrating in greater detail an exemplary memory composite circuit element 260M with cluster memory (RAM) 475, forming a memory control element (MCE) 485, within an exemplary circuit cluster in accordance with the teachings of the present invention. The memory control element (MCE) 485 comprises a memory composite circuit element 260M coupled to cluster memory (RAM) 475. In addition to the use of the memory control element (MCE) 485 in exemplary clusters 200C and 200D, in the context of other various exemplary clusters, such as the cluster 200B illustrated in FIG. 7, the memory control element (MCE) 485 may be viewed equivalently as a combination of the memory composite circuit element 260M and any of the various other second memory elements (255). As illustrated, the memory composite circuit element 260M is shown slightly differently than other composite circuit elements 260A to illustrate some unique features. For ease of explanation, the internal components of an element interface and control 280A are not separately illustrated, but are generally included within the memory composite circuit element 260M (element controller 325, configuration and control registers 330A, input controller 336, output controller 338, input multiplexer (MUX) 335A, output multiplexer (MUX) 380A, output selection multiplexer (OUT SEL MUX) 314). Stated another way, the element interface and control 280B of the memory composite circuit element 260M includes the components of an element interface and control 280A, along with additional components, such as the input and output port array 490 discussed below, along with additional inputs and outputs on the various bus structures discussed above.

A plurality of input queues 320 and output queues 315 are included within the input and output port array 490. In an exemplary embodiment, eight (rather than four) input queues 320 and eight (rather than two) output queues 315 are utilized in the memory composite circuit element 260M. In an exemplary embodiment, the cluster memory (RAM) 475 is comprised of sixteen independent blocks of synchronous single port memory (RAM) with 16 separate interfaces (provided by memory bank interface 498), each 2K (or 4K in other embodiments). In addition, the memory composite circuit element 260M has sixteen contexts and may execute multiple contexts simultaneously or concurrently, rather than a single context, providing multi-threading. As a consequence, when separate parts of the cluster memory (RAM) 475 are utilized (i.e., no collisions or contentions for significant inputs and outputs), the memory composite circuit element 260M supports up to sixteen simultaneous or concurrent accesses (memory reads and memory writes) to cluster memory (RAM) 475, avoiding the typical processor-memory bottleneck. This also allows the IC area of the cluster memory (RAM) 475 to be smaller compared to implementation of a multiport RAM, although a multiport RAM may also be utilized within the scope of the disclosure. In addition, the memory composite circuit element 260M is autonomous and can read or write a logical block of memory (which may or may not coincide with physical boundaries) without any control from the SPE 292 or other processor.

This conjunction of a distributed and independent memory provided by the cluster memory (RAM) 475 with the full interconnect 275, 295 (with input multiplexer (MUX) 335A and output multiplexer (MUX) 380A) crossbar switching capabilities is highly unique, allowing coupling many different sources to the memory at the same time, a dynamic access with multiple input and output points, and further providing multi-threaded operation. In addition, the memory control element (MCE) 485 also provides a bridging mechanism between the different kinds of information and data transfer utilized in the apparatus 100, 140, bridging the different types of messaging busses and protocols, such as the data flow of the full interconnect 275, 295 and the message switching of the interconnect 220 and message manager 265.

In an exemplary embodiment, there are two memory composite circuit elements 260M per cluster 200C, 200D, which share the cluster memory (RAM) 475 and which share an address generator array 494 of programmable address generators 495. In an exemplary embodiment, sixteen programmable address generators 495 are utilized. Each address generator 495 is flexible and may be used for one dimensional block reads and writes, single-word access, and FIFO reads and writes. A pair of address generators 495 may be used for two dimensional block reads and writes, providing inner and outer loop counting. In addition, the address generators 495 may process streams of data without intervention of the message manager 265 or SPE 292 to manage initiation, termination, or inner loop operations.

The memory composite circuit element 260M is also considerably more sophisticated, multi-threaded and configurable or programmable than a DMA controller. The memory composite circuit element 260M allows memory accesses to be defined for the data structure, rather than vice-versa, such as 1D, 2D, 3D, row and column skipping and striping, wrap around, partitioning, and hard limits, in addition to random access, also allowing memory storage when the block size is not fixed and known in advance. The cluster memory (RAM) 475 may be used for storage of application data; messaging data; control; configuration; local instruction and data storage for sequential execution instruction set processing within the apparatus 100, 140, such as for a SPE 292; sources, sinks and intermediate buffers for messaging circuitry. The memory composite circuit element 260M also supports local and remote address generation, memory access arbitration, and memory bounding functions. Memory addresses may be generated externally and modified within the memory composite circuit element 260M in a number of ways, including but not limited to address masking, modulo two addition, and address shifting. Address generation circuitry may additionally be remotely controlled and used by configuration and control bus circuitry The memory control element (MCE) 485 may be used to support any or all of the following functionality in a reconfigurable IC such as apparatus 100, 140: (1) simultaneous access to multiple memory banks; (2) shared memory access; (3) memory access ordering; (4) memory region protection; (5) memory address generation; (6) memory address modification; (7) system bus address generation; (8) memory access limiting based on data-set size and type; (9) memory access reuse based on data-set size and type; (10) trigger controlled memory access; and (11) dynamic addressing parameter access via datapath ports (full interconnect 275, 295).

Referring to FIG. 37, the memory composite circuit element 260M receives and transfers data to and from multiple different sources using the busses and protocols discussed above, as multiple and different classes of memory ports (with arbitration discussed below), including to and from the message manager 265, the SPE 292, the full interconnect 275, 295, the CC bus 285, and the cluster memory (RAM) 475. In addition to an element interface and control 280B and the input and output port array 490 with the various connections mentioned above, the memory composite circuit element 260M comprises a port arbitration circuit 492, the address generator array 494, a memory bank mapping and arbitration circuit 496, and a memory bank interface 498.

The message manager 265 port or bus 282 consists of a 17-bit address bus, an address valid indicator, an address source indicator, a write indicator, and a 16-bit data bus as inputs to the memory composite circuit element 260M. When the address source and valid indicators are set, an address generator 495 is selected by the value of the address bus bits and that address generator 495 is used to generate the address to cluster memory (RAM) 475 ("adgen" mode), and the associated data count output of the memory composite circuit element 260M is monitored by the message manager 265 logic. When an address valid indicator is set without the assertion of the address source indicator, the message manager 265 address bus (407) provides the address to cluster memory (RAM) 475. When a write indicator is asserted with address valid, data is routed to the appropriate memory bank from the 16-bit data bus input based on the address. If a write indicator is not asserted with the address valid, data is routed from cluster memory (RAM) 475 to the 16-bit message manager 265 output data bus 409 coupled to the memory composite circuit element 260M.

The SPE 292 port type consists of three separate interfaces to the memory control element (MCE) 485 described above, an instruction read interface, a data read interface, and a data write interface. Each interface consists of an address bus, a data bus, and memory request input along with a memory wait output. Address and request inputs from the SPE 292 are used by the bank mapping and arbitration module 496 to determine whether to assert a memory wait to the SPE 292 and access the proper memory bank based on the address.

The full interconnect 275, 295 port type is under execution context control and consists of interfaces to the cluster 200C, 200D via the memory composite circuit element 260M input 320 and output queues 315. Seventeen bit addresses are generated internally via the address generator array 494 by association with one of the sixteen contexts of the memory composite circuit element 260M. Address and port collision determine whether an input or output queue is written to or read from the cluster memory (RAM) 475. Resource allocation of full interconnect 275, 295 ports and address generators 495 is specified via the execution context definition.

The memory bank interface 498 provides an array of sixteen separate interfaces to the blocks of cluster memory (RAM) 475. Each RAM block interface consists of a clock input, a 12-bit address input, 16-bit data input, a 2-bit write enable input, a 1-bit chip enable input, and a 16-bit data output port. Memory striping provides full-rate simultaneous read and write access to the memory core, by alternating reads with writes to different memory blocks. Address pattern generation logic provides access to separate physical memory banks on each cycle. By accessing separate stripes of memory, read and write interfaces are able to simultaneously access a data buffer stored in cluster memory (RAM) 475.

The memory bank mapping and arbitration circuit 496 and memory bank interface 498 are couplable to all the defined port types and provide the direct interface and arbitration to cluster memory (RAM) 475. The SPE 292 interface only connects to this portion of the memory composite circuit element 260M for cluster memory (RAM) 475 access management. The message manager 265 ports are also coupled to the memory bank mapping and arbitration circuit 496 and memory bank interface 498, but additionally receive status information directly from the address generator array 494 to support addressing via the address generator array 494.

Memory bank arbitration identifies and resolves simultaneous accesses to the physical memory banks comprising the cluster memory (RAM) 475. All address sources (message manager 265, SPE 292, full interconnect 275, 295) are gated by their validity indicator and compared for each access cycle. When two or more address sources are targeting the same physical memory bank, an arbitration circuit (492, 496) determines which address source is allowed access and asserts a wait indicator to the source which was not selected. In an exemplary embodiment, a fixed-priority arbitration scheme is implemented, with highest priority provided to the message manager 265 interface, followed by the full interconnect 275, 295 interface, SPE 292 instruction interface, and lastly the SPE 292 data interfaces. For the full interconnect 275, 295 interface, the port arbitration circuit 492 implements a second priority arbitration to handle collisions between multiple execution contexts, with the lowest numbered address generator 495 being used allocated the highest priority access to cluster memory (RAM) 475 in the event of contention. The same inputs used by the port arbitration circuit 492 to determine a collision are also used to determine the multiplexer controls (in memory bank interface 498) that map a memory composite circuit element 260M port to the physical cluster memory (RAM) 475 bank controls.

In an exemplary embodiment, the port arbitration circuit 492 and memory bank mapping and arbitration circuit 496 perform many of the execution control functions of an element controller 325, 325A, which therefore is not required as a separate component in many implementations. Port arbitration of port arbitration circuit 492 is a function of the context-based full interconnect 275, 295 port type based on the context configuration instructions. Each full interconnect 275, 295 context is defined by a set of control registers written and read via the CC bus 285 port that define the context execution parameters, memory operation type, input queue parameters, and output queue parameters. The context execution parameters, among other things, define the execution order and priority of the context defining it as either a lead or not a lead context in an execution chain and the next context to execute in the chain (described in greater detail below with reference to FIG. 16). The memory operation type register defines the access direction (read or write), underlying data structure, and an address generator 495 in the array 494. Input and output queue parameters define on a queue-by-queue basis the queue type, depth, significance to the context, and source/destination ID (for input/output queues.)

The port arbitration circuit 492 determines context execution based on all of the above configuration parameters as well as the state of the address generator array 494 and memory bank mapping and arbitration circuit 496. When a wait state is asserted due to either an address generator 495 in the array 494 or a collision detected by the memory bank mapping and arbitration circuit 496, the associated execution context is not executed for that cycle and input queue 320 data is not consumed. In the absence of a wait, input port arbitration is a function of queue contention, queue state, and execution chain requirements. Contexts are ready to run based on queue state and the execution chain. When there is data in the significant input queue 320 contexts, and there is room in the associated output queue 315 contexts, the queue state component of the ready-to-run function is met. Depending on the memory operation type, input queue meaning differs. Some modes require address or data information to be supplied via an input queue. For all modes, input queues which are not interpreted as either address or data to the cluster memory (RAM) 475 act as trigger inputs. Trigger inputs are specified as significant to the arbitration logic, and all trigger inputs as well as any information inputs queues must be non-empty for the context to execute. For output queues 315, the queue state is updated when an acknowledge from the full interconnect 275, 295 destination is received or, alternatively, a deny is not received. When deny is received or an acknowledge is not received, data is held in the output queue 320. When all execution chain requirements are met (the context leads or is the next in an execution chain) this portion of the ready-to-run function is met. Full interconnect 275, 295 input and output queue contention is checked for all ready-to-run contexts and in the absence of contention all contexts that are ready have their memory access executed. When port contention does occur, a round robin arbitration scheme determines which of the conflicting contexts is executed.

Address generation for the full interconnect 275, 295 (and under certain conditions the message manager 265) port type is accomplished via the address generator array 494. In exemplary embodiment, the address generation array 494 consists of eight coupled pairs of address generators for a total of 16 address generators which, as mentioned above, may be shared or not shared by memory composite circuit elements 260M. Each address generator 495 is capable of independent or paired operation with operational parameters defined by the associated execution context's memory operation type register. Every address generator 495 contains a set of CC bus 285 memory mapped registers further defining the memory access parameters for that address generator 495.

The address generator 495 specific registers define memory regions within the physical cluster memory (RAM) 475 by specifying minimum and maximum address for the region, the current address to memory, the stride to calculate the next address in memory, an access count, and a maximum number of accesses to perform. Each address generator 495 further comprises of a set of two's complement adders, comparison logic, and an access counter. Independent of the operational mode of the context's address generator 495, the minimum and maximum address registers define the boundaries of addresses that may be generated by the address generator 495. Addresses greater than maximum for positive strides, or less than minimum for negative strides, are wrapped back into the valid address range effectively by a modulo function.

In an exemplary embodiment, the address generators 495 support 1-D data block addressing for read or write using a single address generator 495 and one context; 2-D data block addressing for read or write using an address generator 495 pair and one context; externally generated addressing from a full interconnect 275, 295 input queue using an address generator 495 and one context; and FIFO addressing for read and write using a single address generator 495 and two contexts.

Each address generator 495 provides state information for use by the port arbitration circuit 492 and available to the context output queues 320: 1-D and 2-D address generators 495 report when a data block is completed (access count=max access); externally generated addressing has no blocking state to the port arbitration circuit 492; and FIFO addressing provides FULL, EMPTY and watermark conditions. Based on the associated context's memory operation type, cluster memory (RAM) 475 block done conditions result in: (1) the context not being executable until cleared via the CC bus 285; (2) further data accesses restart the address generator 495 at the minimum or initialized address setting; or (3) addressing continues starting at the last calculated address.

Done status is optionally output from the memory composite circuit element 260M for full interconnect 275, 295 ports based upon the memory access type and address generation parameters. In 1-D block mode, Done signals the last word of a data block of the configured size, while in 2-D blocks, Done may be generated on either the last word of a row/column or the last word of the entire 2-D data block. Status indicators are provided on the full interconnect 275, 295 output ports to indicate memory access state and are available for use by control and processing logic within the apparatus 100, 140. Additionally, optional or additional control lines of the full interconnect 275, 295 input ports may force the memory context to a Done state.

Restart capabilities of the address generation logic are specified on a context-by-context basis. The supported restart modes implemented in exemplary embodiment provide three different restart conditions for address generation; no restart, restart at minimum, restart at next. No restart mode will disable address generation upon the first completion of the data block, with the block size defined as part of the address generation operating parameters. The Done status of a no restart mode block may be cleared via a configuration memory space access to the address generator parameters. Restart at minimum will automatically restart address generation for a context at the end of a data block and set the next memory address in the generation scheme to the minimum address value defined in the address generator parameters. Restart at next mode contexts will automatically restart the address generation pattern using the last calculated address as the start of a new data block.

The FIFO (first in, first out) mode of the memory composite circuit element 260M is particularly unique and innovative. One context of the memory composite circuit element 260M is programmed for a FIFO read operation, and another context is programmed for a FIFO write operation. Both operations may use the same address generator 495.

For FIFO mode, the memory composite circuit element 260M uses the following parameters and addresses: (1) a base_address: the starting location/minimum address for the FIFO contents in RAM, and there may be multiple base addresses, such as an even base address and an odd base address; (2) max_depth: the maximum number of words in the FIFO; (3) a read_pointer: contains the physical RAM address of the next location in the FIFO to be read; (4) read_offset: the offset from the minimum address in the FIFO to the next location to be read, such that read_pointer=base_address+read_offset×item_size (e.g., item_size=2 bytes); (5) write_pointer: contains the physical RAM address of the next location in the FIFO to be written; (6) write_offset: the offset from the minimum address in the FIFO of the next location to be written, such that write_pointer=base_address+write_offset×item_size; (7) cur_depth: the number of valid words currently in the FIFO, such that when the write_pointer>read_pointer, the cur_depth=write_offset−read_offset; and (8) a watermark: a monitor for when the current depth of the FIFO reaches a high or low level (number of valid words). The address generator 495 contains two base addresses, a write pointer, an internal write offset, a read offset, and the logic needed to detect the watermark conditions. The Write Pointer, Write Offset and the Read Offset wrap when the FIFO's max_depth is met or exceeded. When an offset wraps, it is re-initialized. When two different base addresses are used, one for even offsets and another for odd offsets, the memory composite circuit element 260M can perform simultaneous read and write operations in a FIFO mode. For example, a read operation may occur using a read pointer set to a memory address having an odd number, while a concurrent write operation may occur using a write pointer set to a memory address having an even number.

In addition, the memory composite circuit element 260M may utilize different kinds of control signaling. For example, tags may be utilized for block writes of variable length, such that a tag control bit indicates the last word to be written, which in turn may trigger other downstream processing in the data flow.

As may be apparent from the discussion above, the memory composite circuit element 260M provides some highly new and novel functionality, including without limitation: a shared memory structure and controller (memory composite circuit element 260M) within a context-switched reconfigurable array; providing multiple port types appropriate to different components within the reconfigurable array (apparatus 100, 140); providing a bridge circuit between disparate parts of the array (apparatus 100, 140) such as configuration logic, application logic, data transfer logic, and system busses; acting as a destination or source of data between processing tiles of the reconfigurable apparatus 100, 140; providing access arbitration logic between the multiple port types and address arbitration between multiple instances of a specific port type; supporting a sequential context firing order on an execution context basis; supporting parallel memory access on an execution context basis; providing simultaneous access to memory across and within port types; address generators to generate addresses to the memory core; programmable logic supporting user defined memory boundaries that act as limits on the range of generated addresses; modification of address sources from within the reconfigurable array (apparatus 100, 140), including but not limited to, bounding; programmable and reconfigurable address generators 495; logic and user defined configuration data describing data block types which specify modifications to the generated address pattern; methods of restarting the address pattern based upon the data block type and context configuration; address generators 495 being used as the address source for message transfer logic within the reconfigurable array; and support for control only trigger inputs gating accesses to the memory core.

Several other features of the memory composite circuit element 260M are also new and novel, including the capability to program the address generators 495 to read or write data in virtually any order, such as ascending, descending, striping, 2-D, FIFO mode, wrapping and non-wrapping patterns. In addition, the address generators 495 may also be preprogrammed to read and write data into the cluster memory (RAM) 475 as a data stream in the reconfigurable fabric, and also to utilize any user-specified or fixed location in the cluster memory (RAM) 475.

Figure 38:
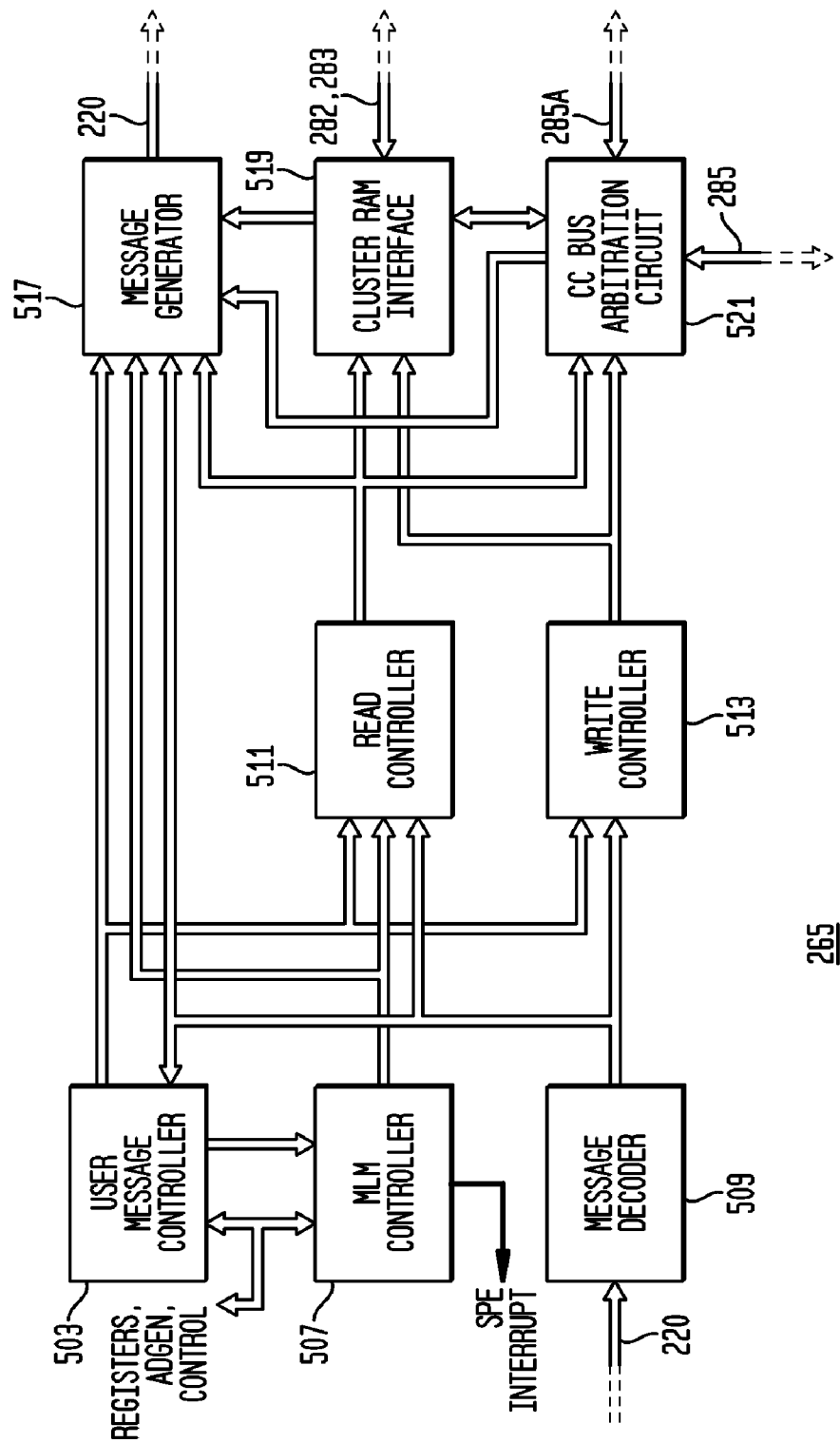
FIG. 38 is a block diagram illustrating in greater detail an exemplary message manager circuit in accordance with the teachings of the present invention.

FIG. 38 is a block diagram illustrating in greater detail an exemplary message manager circuit 265 in accordance with the teachings of the present invention. A message manager 265 provides communication functionality described above and, in addition, can also function as a source and mechanism for on-chip configuration and re-configuration, without outside intervention.

The exemplary embodiments provide circuit elements, in the form of a message manager 265, implementing communication circuitry which is able to deliver configuration data and initialization data to cause a reconfigurable IC (apparatus 100, 140) to perform useful functions. As such communication circuitry, the message manager 265 may additionally provide control data, deliver or receive application data and/or provide instruction data for a processor such as sequential processing element (SPE) 292 or state machine element 290. The message manager 265 may be used to read back data (configuration, control, instruction or application) stored in the reconfigurable IC (apparatus 100, 140).

The message or data packets which are received or generated by the message manager 265 may be directed by an absolute address to a final destination or by an absolute address to an intermediate destination and a "logical" address which causes local address generation circuitry to compute the final destination for the received data.

The message manager 265 may be used to support any or all of the following functionality in a reconfigurable IC (apparatus 100, 140): configuration of some or all of the device (apparatus 100, 140); movement of configuration and reconfiguration data on and off the IC; movement of application data on and off the IC; movement of application/IC state data (possibly for debug or binding purposes) on and off the IC; system level control (master) of data movement; local on IC instruction processor to non-local on IC instruction processor; movement of configuration and reconfiguration from point-to-point internal to the IC; movement of application data from point-to-point internal to the IC; movement of application, and/or IC state data (possibly for debug or binding purposes) from point-to-point internal to the IC; movement of configuration and reconfiguration data point-to-point internal to the IC; management of communication between sequential processing elements (SPE) 292; data movement between clusters 200.

In exemplary embodiments, a message manager 265 generally does the following:

(1) A message manager 265 receives messages from and sends messages to the supercluster way-point, which allows messages to come into and leave a cluster 200. Once a message gets to a message repeater, it is routed to (or closer to) its destination cluster or off-chip.

(2) A message manager 265 provides masterless data movement, which sends messages to and receives messages from the memory composite circuit element 260M, allowing data-flow programs to transfer logical blocks of memory without involving the sequential processing element (SPE) 292. When data is moved across the apparatus 100, 140 using masterless messaging (MLM), generally a message manager 265 may be communicating with another message manager 265, but that is not required.

(3) Reads from and writes to the cluster memory (RAM) 475, as one of the mechanisms for transferring data to or from cluster memory (RAM) 475. These transfers can happen before, during, or after data-flow programs have run. As a message manager 265 has the primary responsibility for data movement on and off the device (apparatus 100, 140), in exemplary embodiments, the message manager 265 automatically responds to Data Copy and Data Write messages. As a data movement master, the message manager 265 monitors the status of its data buffers, it will not send data unless it knows a receive buffer is empty, ready to receive the data, and it will not read data unless it knows a transmit buffer is full, ready to transmit the data. The message manager 265 supports single and double buffers without the need for polling buffer status. The automatic sending of "buffer status" messages to the destination greatly reduces the amount of traffic. The "buffer status" messages are Data Write messages which are sent when a buffer becomes available. Acknowledge messages are often used to confirm the availability of data buffers in the destination.

(4) Reads from and writes to cluster configurations via the CC bus 285. This is the primary mechanism for configuring the composite circuit elements 260, 260A, 260M and interconnect (155 and full interconnect 275, 295) within a cluster 200-200D. The configuration data can also be read or copied to another cluster. The broadcast feature of the CC bus 285 allows an entire task to be suspended, run, or freed within a single clock cycle.

(5) Provides controls and monitoring, and may control or be controlled by the local sequential processing element (SPE) 292. The sequential processing element (SPE) 292 can be programmed to respond to the completion of tasks by the message manager 265. These interrupts allow the sequential processing element (SPE) 292 to perform other tasks while the message manager 265 is reading or writing its messages. The message manager 265 can start and stop the sequential processing element (SPE) 292. When used as a master, the message manager 265 is tightly coupled with the SPE 292. A program running in the SPE 292 can cause messages to be sent via the message manager 265 to write and copy data buffers to and from any location in the apparatus 100, 140. The SPE 292 can be programmed to keep track of available buffers and the arrival of data throughout the system so that it can allow old data to be overwritten when it is no longer needed. The message manager 265 uses polling messages (Data Copy message type) and Acknowledge messages to keep the SPE 292 informed of the system status. Interrupts are generally used to make the SPE 292 aware of the arrival of status information.

(6) Support "logical" destinations which are mapped to a physical address. This provides flexible connections to the SPE 292 and memory composite circuit element 260M contexts in block and FIFO modes. SPE 292 to SPE 292 communication is generally accomplished using "logical" destinations and interrupts, e.g., SPE 292 A can send a message to SPE 292 B without having a specific buffer for the message, and SPE 292 B will have set up a buffer (including a maximum length) for messages to be stored. When a message arrives in that buffer, an interrupt is sent to SPE 292 B which will then interpret the message and take appropriate action.

The message manager 265 processes messages from three different origins: (1) Incoming messages from the message repeater (210) or through the full interconnect 275, 295, and into the cluster's message manager 265; (2) Outgoing acknowledgments that are produced by a message manager 265 when it has finished processing a message; and (3) Outgoing messages from the cluster 200-200D, through the full interconnect 275, 295 or through the message repeater (210) to some destination, on or off chip. These messages may originate in the memory composite circuit element 260M or the SPE 292.

In exemplary embodiments, generally there are about three types of messages processed by the message manager 265:

(1) A Data Write, a message whose payload will be written to some part of the Cluster's address space. A Data Write message generally consists of the destination address and the data to be written there, which may be application data, configuration data, or other data types. Data Write messages, for example, may be user task writes, writes to cluster memory (RAM) 475, or writes over the configuration and control bus 285, such as for writing to the SPE 292 and modifying SPE 292 executable code, or writes to configure any composite circuit element 260, 260A, 260M within a cluster 200. In this embodiment, also for example, the message manager circuit 265 may write to the SPE 292, to provide SPE 292 control.

(2) A Data Copy, a message that causes the message manager 265 to read some portion of its address space and produce a Data Write message that is directed at some (possibly) other cluster. A Data Copy message generally consists of a source address, destination address, and a size of data to be copied.

(3) Forward to External Way-Point, this message type is a compact wrapper for a message with a specific off-chip destination. The wrapper indicates which of the on-chip, top-level, way-points will direct the rest of the message to a specific off-chip bus. The Data Write and Data Copy message types may send an acknowledgment message (a form of Data Write message) when the operation has finished. Outgoing messages also may be assembled in the cluster memory (RAM) 475 by the SPE 292 and are then transmitted by the message manager circuit 265, such as by setting a pointer to the start of the message and specifying the message size. The message assembly may be applicable to outgoing messages which do not require acknowledgment or extended to those which do require acknowledgment. The format and protocol for these messages has been described above with reference to FIG. 4.

Referring to FIG. 38, an exemplary message manager 265 comprises a user message controller 503, a masterless messaging ("MLM") controller 507, a message decoder 509 and a message generator 517 (both coupled to the interconnect 220), a read controller 511, a write controller 513, a cluster memory (RAM) 475 interface 519 (coupled to the cluster memory (RAM) 475 via busses 282, 283), and a CC bus arbitration circuit 521 (coupled to the configuration and control (CC) bus 285). Not separately illustrated in FIG. 38, the message manager 265 may have its own address generators in any of the various controllers or message generator 517. In an exemplary embodiment, the message manager circuit 265 may also be implemented as dedicated logic gates, or as a finite state machine (or as a state machine) in conjunction with various combinational logic gates, or as any type of processor, for example and without limitation.

An incoming Data Write message will have been routed to the message manager 265 over interconnect 220, which is coupled to the message decoder 509. The message decoder 509 determines the message type and the destination for the payload. The write controller 513 then provides appropriate addressing, such as providing an address in the cluster memory (RAM) 475 and passing the address and payload to the cluster memory interface 519, or providing a configuration address (for a composite circuit element 260, 260A, 260M, cluster queue 245, or SPE 292) and passing the address and payload to the CC bus arbitration circuit 521 for transmission on the CC bus 285 to its destination composite circuit element 260, 260A, 260M, cluster queue 245, or SPE 292. If an acknowledgment is required, message generator 517 prepares a Data Write message and transmits it over the interconnect 220. In addition, a Data Write message with configuration information may be provided to different locations in a memory map, configuration locations, or initialization locations. Data Write messages also do not have to have or be provided with sequential memory addresses, and there may be non-contiguous locations for configurations. For example, one message may be utilized to write an array of contexts within a composite circuit element 260, 260A, 260M or cluster queue 245.

An incoming Data Copy message also will have been routed to the message manager 265 over interconnect 220, which is coupled to the message decoder 509. The message decoder 509 determines the message type and whether an acknowledgment is needed. The read controller 511 then provides appropriate addressing, such as providing an address in the cluster memory (RAM) 475 and passing the address to the cluster memory interface 519 to read the requested information, or providing a configuration address and passing the address to the to the CC bus arbitration circuit 521 for transmission on the CC bus 285 to its destination composite circuit element 260, 260A, 260M, cluster queue 245, or SPE 292 to obtain the requested information. Using the read or retrieved payload and destination address (provided in the Data Copy message), the message generator 517 prepares a Data Write message and transmits it over the interconnect 220, to the requester or a third party. For example, this Data Copy message may be used to transfer a configuration from cluster X to cluster Y automatically, such as for resilience when part of a cluster may be broken, or to move a task out of an over-used cluster to a less crowded cluster, for example and without limitation. An acknowledgment message may be utilized to indicate to the host that a configuration has been accepted, and may be generated automatically by the message generator 517.

User messages may be sent to the message manager 265 with a specific local address for storage of the payload. User messages also may be sent to the message manager 265 without a specific address, allowing the destination user message controller 503 to determine where the message payload should go. For example, such a payload may then be stored in a default address in the cluster memory (RAM) 475, and the SPE 292 is notified that such a message was received. The SPE 292 may have been programmed or configured that user messages are stored in that location, and may retrieve and process the message accordingly. This may be useful, for example, for distributing a configuration to one or more places, when the source of the message does not need to know where or which parts of the cluster have been configured.

Messages may also be generated by a cluster 200-200D, either by the SPE 292 or using masterless messaging. The SPE 292 can build a message in the cluster memory (RAM) 475, e.g., having configuration, control, or application data, and trigger the sending of the message by the message manager 265 (through the message generator 517, such as a Data Write or Data Copy message). This allows a message to be sourced from the message manager 265 by the SPE 292 and not by some other host. Hugely important, this allows configuration and reconfiguration to be initiated and controlled internally by a processor (SPE 292) within the device (apparatus 100, 140), so configurations do not have to be downloaded into the device from some external source.

Messages may also be generated by a cluster 200-200D using masterless messaging which does not require any involvement of the SPE 292, and which may have the added benefit of transferring blocks of data to potentially alleviate any back pressure in the full interconnect 275, 295 data path. For example, interim results of data processing may need further processing in another cluster, and the interim data (such as from a composite circuit element 260, 260A) can be transferred through a cluster queue 245 to another cluster, or may be transferred to the memory composite circuit element 260M for storage in the cluster memory (RAM) 475 and to trigger masterless messaging using the masterless messaging controller 507. The incoming data for the masterless message is stored in cluster memory (RAM) 475 by the memory composite circuit element 260M, such as by using a specific address generator 495, which increments a corresponding pointer as the data comes in and is stored. When either the specific address generator 495 indicates that a buffer or memory block is full, or when a buffer available bit (on bus 429) has been set by the destination, the masterless messaging controller 507 will direct or perform the message addressing and assemble the message having a payload of the stored data (through message generator 517) and have it transmitted on the interconnect 220 (also by the message generator 517). Such masterless messaging may be utilized with FIFO, single buffer block and double buffer block modes of the memory composite circuit element 260M.

For example, single buffer block masterless messaging (MLM) may be done using a source address generator 495 in block mode, and by the source message manager 265 sending a type of Data Write Message to a destination address generator 495 in a block mode, e.g., a MEMU AdGen Data Write (or Copy). The basic operation of single block buffering is that data is collected from the full interconnect 275, 295 data path by an address generator 495. This address generator 495 fills a block in cluster memory (RAM) 475 (and reaches a done state) and the message manager 265, using a different address generator 495, transfers the data out of the cluster memory (RAM) 475 and creates messages with this data as a payload to another cluster 200-200D. The message manager 265 then restarts the collection address generator 495 to collect more data. Two address generators 495 are generally used at both the source and destination. At the source, a data collection address generator 495 is used to collect the data in the data path and store it in the cluster memory (RAM) 475, and its block done control bit is used to trigger the message manager 265. (For a double block mode, the message manager 265 will reset the collecting address generator 495, to begin collecting data again). The second address generator 495, the source transfer address generator 495, is used to read the data from cluster memory (RAM) 475 when sending the data buffer messages. The source message manager 265 should determine that there is an empty buffer at the destination and an available buffer at the source. This is done by having the status of the source and destination block done bits available to the source message manager 265. The collection address generator 495 should be assigned to a transfer address generator 495 of the memory composite circuit element 260M. The transfer address generator 495 should be assigned to one of the MLM buffers in the cluster, if any are specified for the MLM process. The registers associated with the selected MLM buffer determine the size and destination of the message which transfers the data. At the destination cluster, the transferred data can be stored in the destination cluster memory (RAM) 475, then read out and sent along the full interconnect 275, 295 data path for use by composite circuit elements 260, 260A or cluster queues 245 in that destination cluster.

The message manager 265 also provides a broadcast mode, such as for an incoming message that may specify multiple destinations, e.g., to set up input queues 320 with the same configuration, or to turn on or off a specific task across multiple composite circuit elements 260, 260A or cluster queues 245 at the same time.

Exemplary configurable, computational elements 270 are illustrated in FIGS. 9 and 10. FIG. 9 is a block diagram of an exemplary multiplier-type configurable element $270_F$, and FIG. 10 is a block diagram of an exemplary triple-ALU-type configurable element $270_G$. As illustrated, each has four 16-bit inputs 365 and two 16-bit outputs 375, and depending upon the context, each is capable of utilizing all inputs 365 and outputs 375. The configuration corresponding to a selected context is provided for mode selection of corresponding multiplexers, demultiplexers, and other switching elements to implement the selected configuration.

As illustrated in FIG. 9, the exemplary multiplier-type configurable element $270_F$ is configurable for several operating modes, such as for 32-bit multiplication, 16-bit multiplication, accumulation, and mixtures of 16- and 32-bit arithmetic. As a brief, high-level explanation, the multiplier-type configurable element $270_F$ may be configured using the 4 multiplexers 383, 384, 385, 386, using the 32-bit output select 387, and using other configuration bits input into the adder/subtracter 382 and the multiplier 381. The 32-bit output select 387 specifies whether the low 32 bits of the adder/subtracter 382 is output or which portion which portion of the 64-bit accumulation register 388 is output. The multiplexer 385 (A Select) specifies the A-input into the adder/subtracter 382, as zero, $I_1$, $I_2$, or the accumulation register 388; the multiplexer 386 (B Select) specifies the alignment of the B-input into the adder/subtracter 382, as one of four 16-bit portions of a 64-bit output from the multiplier 381; and configuration bits into the adder/subtracter 382 further specify whether the A-input is signed or unsigned and whether the B-input is added or subtracted. The multiplexer 383 (P Select) specifies the P-input into the multiplier 381, as $I_3$ or $I_2$, and whether signed or unsigned. The multiplexer 384 (Q Select) specifies the Q-input into the multiplier 381, as $I_1$ or $I_0$, and whether signed or unsigned. In addition, the multiplier-type configurable element $270_F$ also illustrates output feedback within the element 270, from the 64-bit accumulation register 388 to multiplexer 385.

As illustrated in FIG. 10, the exemplary triple-ALU-type configurable element $270_G$ is configurable for a wide variety of functions in including multiplication, addition and subtraction (in signed arithmetic), masking, arithmetic averaging, and rounding, for example. In addition, the exemplary triple-ALU-type configurable element $270_G$ may output a constant, pass one value (copying A or B to its output), perform logical functions (NOT, AND, OR, XOR), and may perform conditional or unconditional data flow. As illustrated in FIG. 10, depending upon the configuration bits, each of the shifters 393, 394, and 395 shift their corresponding inputs left (positive) or right (negative) by the designated amounts. The ABS blocks 389, 399 either compute the absolute value of the input or pass the input, also depending on the configuration bits. The status multiplexer 396 generates a status word using flag bits from each of the ALUs 390, 391 and 392, which may be provided to the SPE 292 (or SME 290), in which one flag bit designates a carry or comparison, a second flag bit indicates the result is the most significant bit, a third flag bit indicates the result is a negative one (−1), and a fourth flag bit indicates the result is zero. The condition-swap multiplexers 397 and 398 are utilized to provide conditional execution on inputs $I_3$, $I_2$, and based on the result, passing $I_0$ and/or $I_1$ to outputs 375, and further providing for swapping of inputs before being copied to outputs 375.

As mentioned above, in addition to these types of configurable elements 270, other anticipated configurable elements 270 include bit re-ordering elements ("BREOs"), single ALU elements, "super" ALU elements (32-bit ALU), barrel shifter elements, look-up table elements, memory elements, programmable controller elements, communication elements, etc.

B. Program Compilation for the Apparatus

Figure 11:
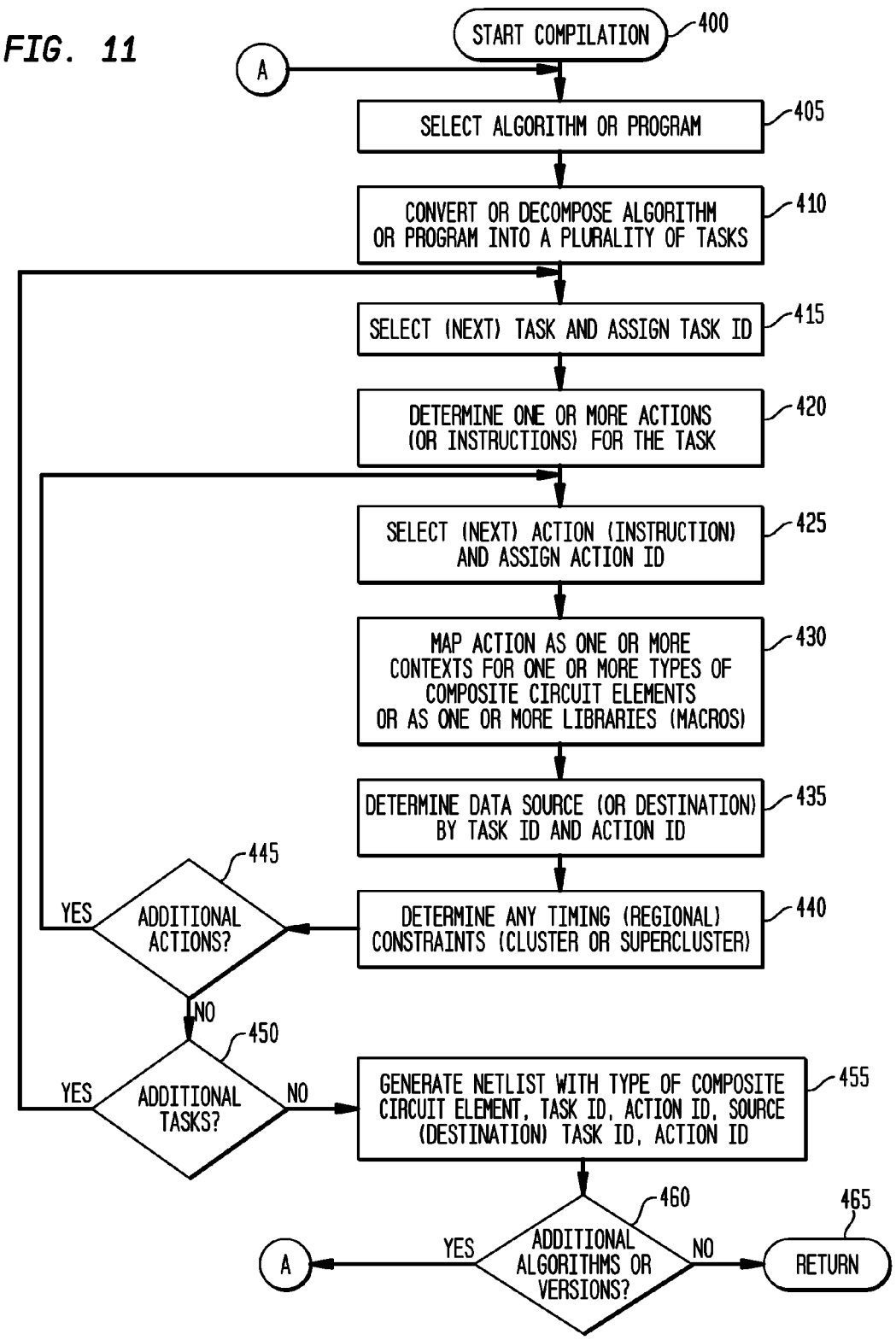
FIG. 11 is a flow diagram illustrating at a high level an exemplary compilation process in accordance with the teachings of the present invention.

FIG. 11 is a flow diagram illustrating at an exemplary compilation process in accordance with the teachings of the present invention. It should be understood that the following discussion is very high level for purposes of explaining the present invention. The compilation process may be performed using any computer system or network, workstation, processing device, one or more microprocessors, electronic design automation ("EDA") tools, electronic system-level ("ESL") tools, etc.

Referring to FIG. 11, the method begins, start step 400, with selection of an algorithm for compiling, step 405. Such an algorithm may be expressed in a wide variety of ways, from a mathematical description to a source code or object code listing for a microprocessor, for example. The algorithm is converted or decomposed into a plurality of "tasks", step 410, which are high level descriptions of a function or process, such as performing an inverse Fast Fourier Transformation (IFFT). A task is then selected from the plurality of tasks and is assigned a task identifier ("task ID"), step 415, which is typically a sufficiently unique identifier to differentiate the task from the other instances of tasks of the same algorithm or from tasks of other algorithms which will also be running concurrently on the apparatus 100.

The selected task is then converted or decomposed into one or more actions to be performed by a composite circuit element 260, 260A (including computational, state machine, and/or communication composite elements 260, 290, 250) to execute the task, step 420. As mentioned above, an "action" is the type of function or activity to be performed by a composite circuit element 260, 260A, such as multiplication, bit manipulation, and instruction processing, for example, and may be considered equivalent to an instruction which would be executed by a processor or a function performed by an ASIC or FPGA to achieve the same result. For example, an IFFT task may be decomposed into a plurality of "butterfly" steps such as multiplication, addition and accumulation steps, each or all of which would constitute an action (or instruction), such as "multiply 'a' times 'b' (a×b)", and which would correspond to one of the operational configurations of one of the composite circuit elements 260. Accordingly, as used herein, the terms "action", "function" or "activity" are used equivalently and interchangeably to mean any such circuit processes. (As a result, such actions (or instructions), once assigned and bound, will be on the IC in the form of a configuration of one or more of the elements 270). Of the one or more actions (or instructions), an actions (or instructions) is selected and assigned an action identifier ("action ID"), step 425, which is a sufficiently unique identifier to differentiate the action (or instruction) from other actions (or instructions) for the selected task. The task ID and action ID are utilized in the run-time binding process, discussed below with reference to FIG. 14.

Each action (or instruction) is then mapped or assigned as one or more contexts of one or more composite circuit elements 260, 260A by type of composite circuit element(s) to be utilized, step 430, and not to any specific composite circuit elements 260, 260A or specific addresses within the architecture, to create a "symbolic", generic or non-specific compilation which is not tied to particular hardware components. For example, a multiplication and addition action (or instruction) may be mapped as a single context to an ALU-type composite element 260 (a composite element 260 having an ALU-type circuit element 270), and not to a specific ALU-type composite element 260 within a specific cluster 200. More complicated actions (or instructions) may be mapped to multiple contexts of multiple types of composite circuit elements 260. Later, as part of the binding process, one or more specific composite circuit elements 260, 260A of the selected type will be assigned to perform the action (or, equivalently, execute the instruction), as one or more of its (or their) available contexts. This distinction is important, as it allows the action (or instruction) to be assigned initially to one or more composite circuit elements 260, 260A and then potentially reassigned to other composite circuit elements 260, 260A, as may be needed, during operation of the apparatus 100. In addition, as indicated, in exemplary embodiments, this separate binding process may assign the action (or instruction) as one or more contexts which are available for the selected types of composite circuit elements 260, 260A, with other contexts potentially remaining available for assignment of other actions (or instructions).

As part of this process, corresponding "linkage" for each action (or instruction) is also determined, also at this generic, symbolic or non-specific level, step 435, namely, as generic or symbolic "pointers": for each action, information is generated and retained concerning either sources for input data or destinations for data output, or both. For example, action number "512" of task "418" will, in addition to being mapped to an ALU-type composite element 260, 260A, have associated information that it will receive its input from action number "414" of task "229", or that it will provide its output to action number "811" of task "319" (or both). Only one such set of either input linkage or output linkage is required, provided the set of information is generated consistently for all actions (or instructions), as linking an input to its data source automatically is linking the output of the data source to this input (destination) which will utilize the data, and vice-versa. In selected embodiments, it may be useful to have both sets of I/O linkage information. This relationship or "linkage" between input and output, through generic or symbolic pointers, is also useful as part of the task and action (or instruction) binding process discussed below. This input or output linkage determination of step 435 may be performed in the compilation process in a wide variety of orders and following any of various steps. For example, this determination may be performed following either step 440 or 445, such as when all actions (or instructions) for a task have been determined and mapped to the types of composite circuit elements 260, or when all actions (or instructions) and tasks have been determined and mapped to the types of composite circuit elements 260, 260A.

The compilation process also determines any timing constraints in the program or algorithm which would correspondingly require a degree of proximity or locality of execution by the various composite circuit elements 260, 260A, and provides corresponding regional constraints for the affected tasks and/or actions (or instructions), step 440. For example, for various timing requirements, some processes may need to be executed within a single cluster 200 or zone 201 or within a group of clusters 200 within the same supercluster 185, to avoid any delays which may be incurred from routing data messages or packets on the interconnect 155 to and from other clusters 200 or other superclusters 185. In these circumstances, a regional requirement is provided in the compiled output (the "symbolic netlist" discussed below), such as by a "region" command or instruction designation, for example, to provide that the actions (or instructions) which follow must be performed within a single cluster 200 or within a single supercluster 185, followed by an "end region" indication for the actions (or instructions) confined to the single cluster 200 or single supercluster 185. Depending upon the selected embodiment, such regional constraints may also be extended to zones 201 within a circuit cluster 200, such as a circuit cluster 200C.

Following step 440, the method determines whether there are additional actions (or instructions) to be assigned an identifier and mapped to types of composite circuit elements 260, step 445, and if so, the method returns to step 425 and iterates, to select the next action (or instruction) and proceed through steps 425, 430 (potentially 435) and 440. When all actions (or instructions) for the task have been assigned an identifier and mapped to types of composite circuit elements 260, 260A (and possibly input or output linked) in step 440, the method proceeds to step 450, and determines whether additional tasks are to be compiled. When additional tasks are to be compiled in step 450, the method returns to step 415 and iterates, selecting the next task, assigning a task ID, and so on.

When all tasks have been processed in step 450, such that the selected algorithm has been converted into a plurality of tasks and actions (or instructions), which have then been symbolically (generically or non-specifically) mapped to types of composite circuit elements 260 and symbolically linked by either data input sources or data output destinations (or both) (e.g., using symbolic pointers), the method generates a composite circuit element and routing "symbolic netlist" or symbolic compilation, step 455. This symbolic netlist, listing or compilation comprises a plurality of symbolic netlist elements, with each such symbolic netlist element corresponding to and containing information for execution of each action of each task of the algorithm or program. More particularly, each symbolic netlist element contains information concerning: (1) the task ID; (2) the action ID; (3) one or more types of composite circuit elements 260 and the number of contexts needed for each type of composite circuit element 260 for execution of the action (or instruction) of the corresponding task ID and action ID; (4) input or output (or both) linkage information; and (5) any regional (i.e., proximity) constraints for the corresponding tasks or actions (or instructions). In addition, the compilation method is applicable to any of the various circuit and interconnect topologies described herein, including to the supercluster 185C and circuit cluster 200C topologies.

As an alternative to mapping to one or more types of composite circuit elements 260, 260A in step 430 and linking instructions in step 435, actions (or instructions) may also be mapped to "macro-definitions" or "libraries". Such "macro-definitions" or "libraries" are essentially pre-compiled tasks or actions, which have already been mapped to types of composite circuit elements 260, 260A and which have been correspondingly linked (with regional constraints, if any), with a corresponding symbolic netlist. For example, an IFFT may be mapped to an IFFT library, which contains all of the composite element-type and composite element-linkage information to carry out an IFFT using the apparatus 100. Such library creation may occur at any of various levels, such as mapping various algorithms of H.264 for streaming media, for example.

Moreover, there may be multiple sets of such mappings and linkages for any selected action or task, which may be optimized for different goals, each of which may result in a different symbolic netlist. For example, as mentioned above, a task to be performed by a triple-ALU-type composite element 260, 260A may instead be mapped to three single ALU-type composite elements 260, 260A. While this could potentially decrease bandwidth or speed of performance, it may allow performance by the apparatus 100 when other, higher priority algorithms are utilizing all available contexts of all available triple-ALU-type composite elements 260, 260A. Similarly, a task to be performed by an ALU-type composite element 260, 260A may instead be mapped to a plurality of addition- and multiplication-type composite elements 260, 260A, creating yet another mapping and linking variation.

As a result of these mapping and linking variations which are available, any selected algorithm may have multiple symbolic netlists generated, each optimized or selected for a different goal, such as speed of performance, power minimization, ability to run with diminished resources, safety, redundancy, conflict resolution, and so on. For example, referring to FIG. 1, in the event a significant portion of the IC is damaged, such that the optimal algorithm for ABS no longer has sufficient IC resources to run, another (sub-optimal) version of the ABS functionality may be loaded and bound in the IC, enabling an important function to continue to operate and avoid potentially harmful consequences under circumstances in which another IC, such as a standard microprocessor, would fail completely.

Following symbolic netlist generation in step 450, the compilation method determines whether additional algorithms are to be compiled or, as discussed above, additional versions or alternatives for a selected algorithm are to be compiled, step 455, and if so, the method returns to step 405 and iterates. When no further algorithms or versions of algorithms are to be compiled in step 455, the method may end, return step 460.

C. Task Loading and Task Management

The exemplary embodiments include a wide variety of means to start and stop a distributed, multi-tasking, data-driven architecture. For real programs, this is, of course very important. On a multi-tasking machine, it is important that starting and stopping a single task not interfere with any other task that is running or being loaded into the architecture. Starting a data-flow task consists of two separate steps. The first is to load the task into the apparatus 100, 140. The second step is to set the task to the "run" state. Sections D and E below are focused on run-time binding, configuration and reconfiguration while the apparatus 100, 140 may be running. In this section, task loading and binding is described for loading and binding in advance of run-time.

In exemplary embodiments, there are several ways for loading tasks. One mechanism is to load the configuration information for a task via the message manager 265, such as through messages downloaded from the fabric I/O from outside the IC or from another cluster, which the message manager 265 may then store in cluster memory (RAM) 475, or process and transfer the configuration information over the CC bus 285 into the configuration and control registers 330, 330A of the composite circuit elements 260, 260A. Another method is for the message manager 265 to retrieve configuration information from cluster memory (RAM) 475, or process and/or transfer the configuration information over the CC bus 285 into the configuration and control registers 330, 330A of the composite circuit elements 260, 260A. A third method is to have a cluster's SPE 292 write the configuration into the configuration addresses within the cluster 200-200D, discussed below in Sections D and E. A fourth method is to store some or all of the configuration information in non-volatile storage in each composite circuit element 260, 260A, which may then be loaded into the configuration and control registers 330, 330A as necessary or desirable. Such configuration information is transferred over the CC bus 285 as a series of packets, illustrated in FIG. 36.

When the message manager 265 is used to load a task, the task's configuration information is typically stored as a sequence of blocks, sorted by configuration address, in the cluster memory (RAM) 475. Each block contains a number of header words that describe the block. Each block contains, at least, the starting address for where the payload for the block will be stored in the device. The payload for the block contains the contents for consecutive locations in the configuration address space for the programmable composite circuit elements 260, 260A. When the configuration information for composite circuit element 260, 260A contains several equal-sized blocks at parallel addresses, then a two-dimensional addressing block can be used to reduce the number of headers required to configure those programmable elements. If n parallel blocks are being programmed, instead of sending n blocks of configuration information, only one two-dimensional block need be sent, thus reducing the size of the required headers by a factor of n.

For example and without limitation, a message manager 265 can receive configuration information from off-chip, from another apparatus 100, 140, or from a processor, such as the SPE 292. A message manager 265 can also receive configuration information from any other cluster 200-200D. Thus other clusters 200-200D can forward or originate configuration information for any task, part of a task, or memory that is configured or used within an apparatus 100, 140.

A SPE 292 can directly configure any of the composite circuit elements 260, 260A in that cluster 200-200D. The SPE 292 does this by accessing the desired configuration addresses that are part of the address space of the SPE 292. This allows the SPE 292 to copy a data-flow task into the desired configuration addresses. The SP can also modify a task's configuration information before storing the configuration information in the composite circuit elements 260, 260A. This is useful for relocating a task from the original location to another location, such as when the original location has become unavailable, for whatever reason.

A SPE 292 also can configure any configurable composite circuit elements 260, 260A in any other cluster on its own device or on any other connected device, whether on the same circuit board, rack of boards, computer, array of computers, or network-connected devices. This mode of configuration is performed when the SPE 292 composes a message containing configuration information and then uses the cluster's message manager 265 to transmit the message to the destination or to an intermediate destination that can forward the message to, or on the way to, its final destination.

A third way for loading a task is to have some or all of the configuration memory (configuration and control registers 330, 330A) that is local to each programmable composite circuit element 260, 260A be non-volatile memory. When all of the local configuration memory is non-volatile, then the configuration is always available, even after power has been lost and restored to the device. Context-switching can still proceed as for a device that contains only static memory resources. When some of the local configuration memory is non-volatile, then dedicated tasks can always be resident, leaving some contexts free for dynamically-loaded tasks.

As mentioned above, a program is decomposed into tasks, with configuration information for every context of all programmable composite circuit elements 260, 260A that are part of that task. A task may use all, some, or none of the contexts of each individual elements 270 on the device. Generally, contexts that are not used by a first task may be used by other tasks, unless the co-resident tasks would compromise the first task's bandwidth requirements. As mentioned above, every context contains a task identifier (task ID) indicating to which task that context belongs. Every context contains a mechanism that specifies the "run state" for that context, described in greater detail below. A context may be in one of the following states: "free", "suspended", "run", or "single-step". In the "free" state, the context has not been assigned to any task, so its input queues 320 are not active and the context may not be run. In the "suspended" state, where the context has been allocated to a task, in an exemplary embodiment, each input queue 320 is actively listening to the data source to which it is subscribed, but the context will not run until its state has been changed to run, while in other embodiments, the input queues 320 are not active. The "run" state specifies that each input queue 320 is actively listening to its data source and that the context may be run when the run pre-conditions have been met. In the "single-step" state, the inputs queues 320 are active and the context may be run once and then remain inactive until the SPE 292, element controller 325, or message manager 265 re-enables execution. Other valid context run-states are possible and are discussed in greater detail below with reference to FIG. 16.

When a task's configuration information is loaded into a device, constituent context information for that task may be programmed to be in the "suspended" state. In this state, for some embodiments, the input queues 320 of the composite circuit element 260, 260A may be listening to their respective data sources. This means that the input queues 320 will collect tokens that are meant for them, and if an input queue 320 fills, it will issue back pressure (deny) to the data source, which will then re-try the transmission. In this way, no data tokens are lost.

Either the message manager 265 or SPE 292 may change the run state for a single context or for all the contexts in a task. The change of run state happens in one clock period, such as through broadcast of a message on the CC bus 285. When a single context of a programmable element is switched to the run state, it will be eligible for execution if its other run conditions have been met. If all the contexts assigned to a task are switched to the run state simultaneously, then all contexts whose other conditions are met will be candidates for execution on the next clock cycle.

The run-state for each context or for all the contexts in a task may be set to any of the valid run state values. In the next clock period, that context, or all the contexts of the specified task, will be in that run state.

Another way for starting a task is data-driven. After one or more contexts in a task have been set to the run state, they will not run until the other requisite conditions are met. These conditions include having all the requisite tokens (input data) in the appropriate input queues 320, and room for data in significant output queues 315. A task may be set up to deliver those input tokens when desired conditions are detected by that task or by the SPE 292. Inputs to the context may or may not, depending on the configuration, be used in a calculation. When such inputs exist, the data values that are not part of the calculation are considered to be "triggers" for a calculation. That is, when the "unused" inputs are "significant" for a calculation to proceed, even if the data value for that token is not part of the calculation, the context must wait for a token on the significant, unused, input. Thus, a task may be triggered by such significant, unused inputs. When an input queue 320 is shared across multiple contexts, the data in that queue is available to all those contexts without preference for any of those contexts. The execution of one of those contexts may be predicated upon receiving a trigger input on that context and on no other, as determined by the logic of the task. The logic of the task would then trigger the desired context, which would consume a token from the shared queue and make it unavailable to the other, undesired, contexts.

Several of the for starting a task are describe above. The determination of when to start a task is made by the programmer, and may be started immediately after the task has been loaded. A task may also be started by the SPE 292.

A task is halted, and thus its contexts freed, when the task's contexts are set to the "free" state. Every context that was part of that task will then be available for use by other tasks. The means for determining when a task is to be halted/freed is left up to the programmer. The means for detecting a terminating condition is thus programmable. The logic of a task may determine when the task is done. The condition may be expressed as either a status interrupt or a programmable composite circuit element 260, 260A encountering a desired value or condition. This status value can be set up as an interrupt to the SPE 292. The SP, upon receiving the status interrupt, can set the run-state for the task to the halted/free state.

Alternatively, the SPE 292 can be programmed to wait for the arrival of a token on any of its input queues or for a specific value or sequence of values. Upon receipt of the desired value(s), the SPE 292 can set the run-state for the task to the halt/free/suspend state.

A task is suspended, and thus none of its contexts will run, when the task's contexts are set to the "suspend" state. In some exemplary embodiments, the input queues 320 that were part of that task will still listen to their data sources, and issue back pressure when full, thus preventing data loss. As with the setting the halt or free states, the SPE 292 can be used to suspend a task upon receiving a status or data interrupt.

The programmable composite circuit elements 260, 260A have been designed so that a portion of a task may be loaded or changed while other tasks or other parts of that task remain running. The portion of the task that is to be changed should be suspended, and optionally all data sources that transmit to the suspended contexts, depending upon whether data re-routing is to occur. A specialized instruction in the SPE 292 can locate the configuration addresses of such sources. Once the data sources are suspended and any existing tokens allowed to flow through the previously-configured programmable composite circuit elements 260, 260A, the desired portion of the task is then suspended or freed, as necessary, either on a context-by-context basis or by designating the collection of desired contexts as a task (hereafter referred to as a "sub-task") in its own right and with its own task identifier. A new sub-task can then be loaded, or may have been pre-loaded, or the newly-freed contexts can be re-configured to perform the new operations. Then each of its input queues 315 are set to subscribe to the desired data sources that may have been individually suspended above. Any destinations that were subscribing to the old sub-task must, if the new sub-task's output ports are in a different location from where they were in the old sub-task, be reconfigured to listen to the new sub-tasks newly-located output ports. The new sub-task is now configured to take the place of the old sub-task, so the original data sources can be set to the run state. The sub-task can be set to the run state after its data destinations are subscribing to it and after the sub-task is listening to its data sources.

D. Operating System

Figure 12:
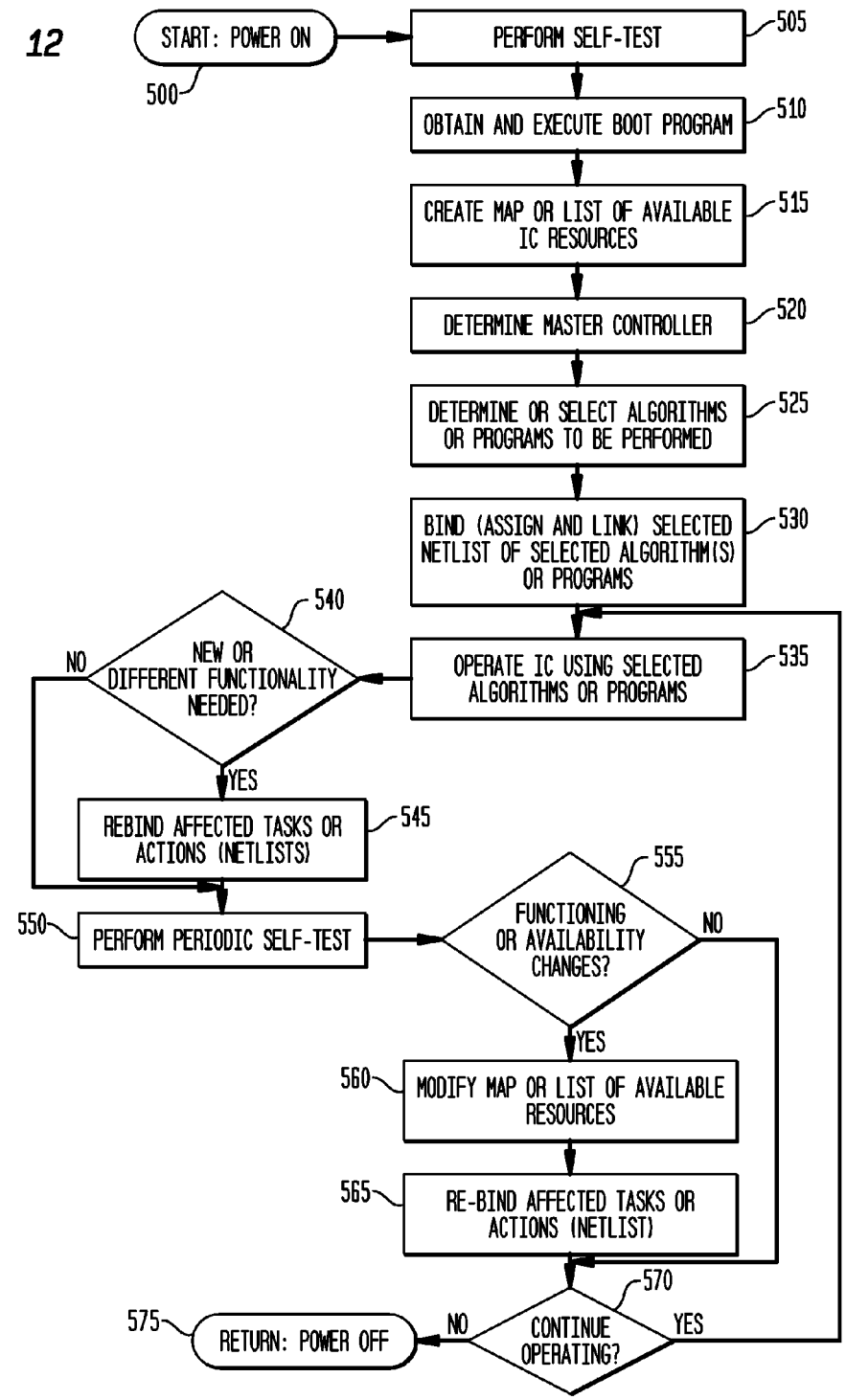
FIG. 12 is a flow diagram illustrating at a high level an exemplary operating system or process in accordance with the teachings of the present invention.

FIG. 12 is a flow diagram illustrating at a high level an exemplary operating system or process in accordance with the teachings of the present invention. It should be understood that the following discussion is very high level for purposes of explaining the present invention. In addition to being performed by the various SPEs 292 (or SMEs 290), alternatively, this operating system functionality could be performed by one or more additional controllers 175.

The process begins, starting with step 500, with the apparatus 100 being powered on, such as part of an SOC or within another system, such as a vehicle, a computer, a complex system, a mobile telephone, a personal digital assistant, an MP3 player, and so on. A self-test is performed, step 505, typically by each of the SPEs 292 (or SMEs 290), which may test themselves and, in exemplary embodiments, the various composite circuit elements 260, 260A, first communication elements 250, full interconnect(s) 275 or distributed full interconnects 295, other SPEs 292 (or SMEs 290), and other logic, communication or memory elements within their corresponding clusters 200 or other clusters 200 (e.g., for those clusters 200 implemented without corresponding SPEs 292 (or SMEs 290)). There are a wide variety of methods to determine whether these various components are operating properly. In an exemplary embodiment, the operational determination is performed by a composite circuit element (with composite circuit element utilized in its inclusive sense, including of all of the various composite circuit elements 260, 260A, first communication elements 250, full interconnect(s) 275 or distributed full interconnects 295, other SPEs 292 (or SMEs 290), and other logic, communication or memory elements within their corresponding clusters 200 or other clusters 200), and is at least one of the following types of determinations: a periodic diagnostic performed by at least one composite circuit element of the plurality of composite circuit elements; a background diagnostic performed as a selected context of at least one composite circuit element of the plurality of composite circuit elements; or a comparison test performed by a plurality of composite circuit elements of the same circuit element type. For example, each of the various types of composite circuit elements, including the types of elements 270, may each perform a diagnostic self-test, followed by comparing their corresponding results. If the results of a first composite circuit elements does not match the expected result, such as by comparison of the results of other composite circuit elements 260, 260A of the same type, the first composite circuit element is deemed defective or not properly operational, and is not included within the map or list of available resources (step 515, below).

One or more of the SPEs 292 (or SMEs 290) (or controllers 175) will then obtain and execute a boot program, step 510, such as a program designed and stored for the apparatus 100 in an associated memory (e.g., flash or other EEPROM memory) or other data storage device, such as a hard disk drive, an optical drive, etc., which may be part of the same IC or associated system.

Two significant functions are performed as part of the boot process of the operating system in steps 515 and 520. One or more of the SPEs 292 (or SMEs 290) creates a map or list of available apparatus 100 resources, such as a list within a cluster 200 or supercluster 185 of which composite circuit elements 260, 260A, first communication elements 250, and other components are functioning properly, step 515 (e.g., similar to creating a bad or good sector map for a memory or disk drive). Step 515 may be performed, for example, by each SPE 292 (or SME 290) for its corresponding cluster 200, or by one or more SPEs 292 (or SMEs 290) (pre-designated or as determined in the boot program) for an entire supercluster 185 or matrix 150. In an exemplary embodiment, step 515 is performed by combinational logic elements, as illustrated in and as discussed below with reference to FIG. 13, which may be located or distributed within a composite circuit element 260, 260A, a cluster 200, and throughout the matrix hierarchy. In addition, in step 520, a master controller is determined, which may be one selected SPE 292 (or SME 290) or a plurality of SPEs 292 or SMEs 290 operating as a master controller, or may be one or more additional controllers 175 or other, off-chip controllers, processors, or state machines. In an exemplary embodiment, a master controller is determined as a SPE 292 (or SME 290) having the lowest address (at the time).

The operating system, through one or more SPEs 292 (or SMEs 290) (or controllers 175), potentially with user input, then determines or selects which programs, algorithms or functions are to be performed, step 525, such as selecting the ABS, traction control, video and navigational programs previously discussed. Next, in step 530, the operating system binds the symbolic netlist(s) of the selected programs to the available resources (determined in step 515), by assigning a task and action(s) (or instruction(s)) to a selected composite circuit element 260, 260A (as one or more contexts), by linking the inputs of the selected composite circuit element 260, 260A to the other corresponding composite circuit elements 260, 260A which are its data sources, to provide its input data (which also correspondingly links these data source outputs to the inputs of the selected composite circuit element 260, 260A as data destinations), and/or by linking the outputs of the selected composite circuit element 260, 260A (as data sources) to the other corresponding composite circuit elements 260, 260A which are its data destinations, to utilize the data produced by the selected composite circuit elements 260, 260A (which also correspondingly links the inputs of these data destinations to the outputs of the selected composite circuit element 260, 260A (as a data source)).

Once all tasks and actions (or instructions) are bound (assigned and linked), the apparatus 100 commences execution or running of the corresponding programs or operations, step 535, such as operating the ABS and fraction control systems, playing a video for passengers, and providing a real-time navigational display for the driver. The binding (assigning and linking) process is discussed in detail below with reference to FIG. 14. The control of the program (or operational) execution process in each composite circuit element 260, 260A is discussed in greater detail below with reference to FIG. 16.

The operating system may also determine that new or different functionality is needed, step 540, such as when a user or operator selects an additional program, or circumstances require a change in functionality, such as through a sensor detecting a particular condition. For example, in a vehicle environment, a sensor may detect a change in driving or road conditions, and adjust various programs accordingly. When new or different functionality is needed in step 540, the method rebinds (re-assigns and re-links) the affected tasks and actions (or instructions), step 545, and the apparatus 100 continues to operate with these various changes. The tasks and actions (or instructions) may be moved to new locations, or existing or new tasks and actions (or instructions) may be loaded, assigned and bound. The operating system may also bind or re-bind an entire program or functionality de novo. This re-binding step 545 may also include unbinding, that is, completely removing an assigned functionality, such as by deleting its corresponding contexts from memory. Such unbinding may occur, for example, when the apparatus 100 is already at capacity, and room must be created for the new or different functionality. Such unbinding was illustrated in FIG. 1, when video functioning was removed as the apparatus 100 increasingly lost capacity through IC damage.

The apparatus 100, through one or more SPEs 292 (or SMEs 290) (or controllers 175) performing the operating system (or as part of a built-in self test ("BIST")), periodically performs a limited or full self-test, step 550, to detect any changes in availability of resources, step 555. For example, the self-test may reveal that a BREO-type circuit element 270 is no longer functioning properly, and therefore should no longer be available for use within the apparatus 100. When such damage or loss of functionality occurs in step 555, the operating system (through the SPEs 292 (or SMEs 290) or controllers 175) correspondingly modifies the map or list of available resources, step 560, rebinds the affected tasks and actions (or instructions) using the modified list or map, step 565, and the apparatus 100 continues to operate with these various changes.

When no such damage or loss of functionality has occurred in step 555, or following step 565, the method proceeds to step 570. In step 570, the apparatus 100 may continue operating, returning to step 535. In the event that operations are to cease in step 570, such as by the user selecting to turn off the device having the apparatus 100, the apparatus 100 may shut down or power off, return step 575.

Not separately illustrated in FIG. 12, in another exemplary embodiment, the plurality of composite circuit elements 260, 260A may be implemented or adapted to store periodically a then current state, such as a "snapshot" of its current operations. Subsequently, in response to a detected fault, the composite circuit elements 260, 260A are adapted to retrieve the stored state and recommence operation using the stored state.

E. Symbolic Netlist Assignment and Run-Time Binding

With this background in mind, the run-time binding process may now be explained. As indicated above, the inventive architecture in conjunction with the run-time binding of a symbolic netlist (or other program compilation) enable the self-healing and resiliency of the apparatus 100. More particularly, when any of the composite circuit elements 260, 260A, SPEs 292 (or SMEs 290), first communication elements 250, full interconnect(s) 275 or distributed full interconnect(s) 295, other cluster 200 components, or routing or other communications elements (190, 210), either do not perform properly initially (as determined in step 515 during testing portions of the boot process) or during later operation (as determined during self-test or as determined by other components, steps 550, 555), they are not placed on or are removed from the map or list of available resources, respectively. If not performing properly initially, the affected component is never assigned any functionality in step 530. If the affected component was originally functioning and is no longer (step 555), it is removed from the list or map of available resources, and its assigned functionality is moved or loaded to another available component and re-routed, separately or as part of the rebinding of the corresponding tasks or instructions of step 565. If it has been determined that the data has been corrupted, the controlling task is notified so that the appropriate action can be taken. This binding process is explained in detail below.

In addition to run-time binding, it should also be noted that the entire binding process may take place off-chip, in advance of run time. The various tasks may be allocated to the available hardware, and all routing and interconnection determinations made, by the user or by suitably designed software, for example and without limitation. The resulting data may then be loaded into the apparatus 100, 140, using the message based interconnect 220, for example, with the configuration and control words routed to their appropriate destinations throughout the apparatus 100, 140.

It should be noted that with the hierarchical interconnect 155 of the exemplary embodiments, which handles data, configuration and control, the loading and routing of the configuration and control words may occur quite rapidly and in parallel as the interconnect 155 fans out to lower levels and into each cluster 200-200D, with very few "hops" involved from the fabric I/O to the message manager 265 and then on to the configuration and control registers 330, 330 of the composite circuit elements 260, 260A, 260A and cluster queues 245 over the CC bus 285. This rapid and parallel configuration routing over a message-based interconnect is in sharp contrast to the comparatively slow serial routing or row and column routing of other configurable devices, such as FPGAs.

1. Resource Availability

Figure 13:
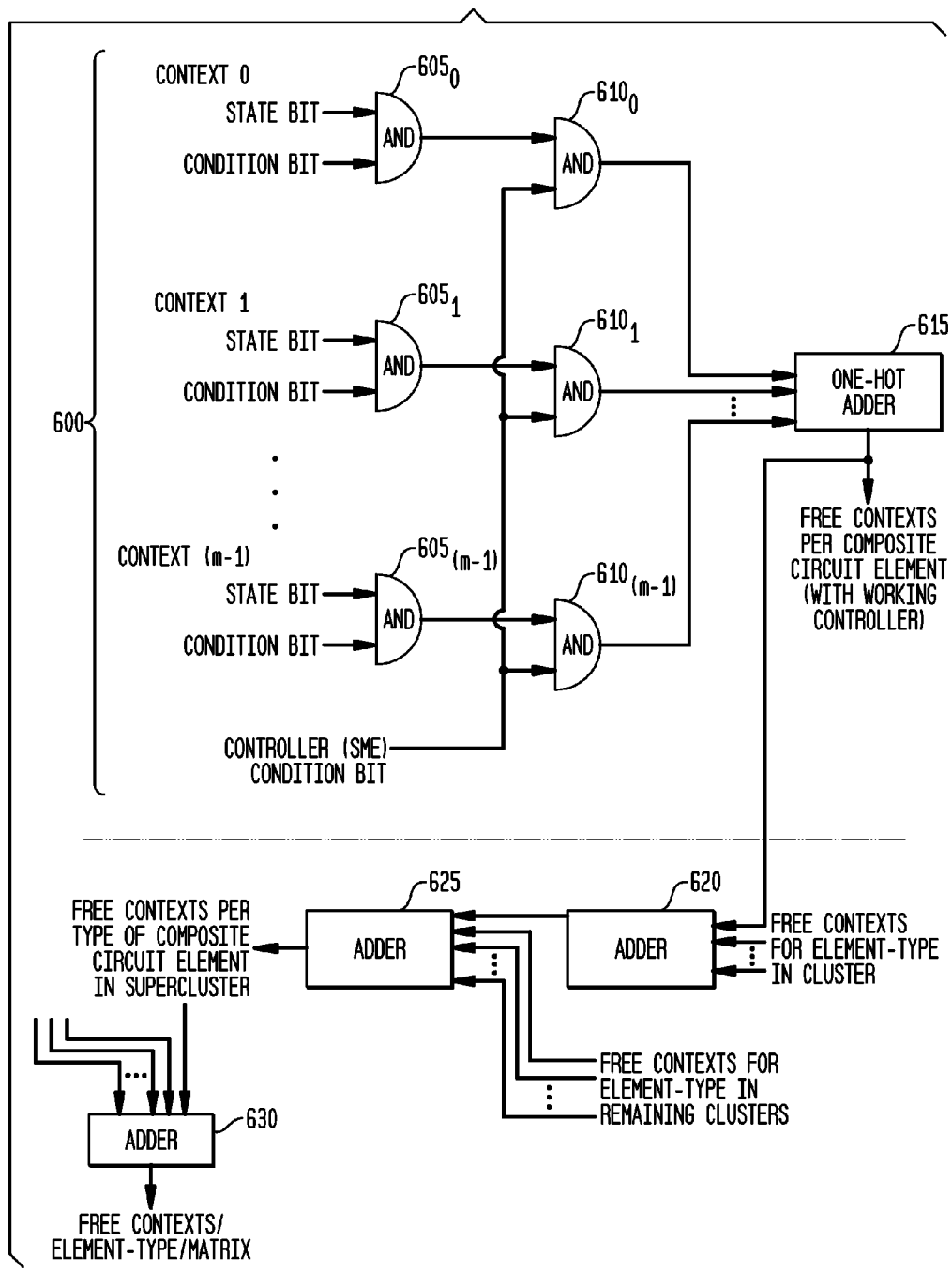
FIG. 13 is a block diagram illustrating exemplary combinational logic circuitry for context availability determination within an exemplary apparatus in accordance with the teachings of the present invention.

FIG. 13 is a block diagram illustrating exemplary combinational logic circuitry 600 for context availability determination within an exemplary apparatus 100 in accordance with the teachings of the present invention. Such circuitry 600 may be included within each composite circuit element 260, 260A, such as within a circuit element 270, an element controller 325, within a SPE 292 (or SME 290), or as separate combinational logic (not separately illustrated in FIG. 8). As mentioned above, the number of available contexts for each type of composite circuit element 260, 260A is determined for use in binding (or re-binding) a program or algorithm for performance within the apparatus 100. Such determination may be made by one or more SPEs 292 (or SMEs 290), controllers (or other processors) 175, or as illustrated in FIG. 13, dedicated combinational logic circuitry 600.

Referring to FIG. 13, as part of the information stored in the memory 330 within each composite circuit element 260, 260A is a state bit and a first condition bit, for each context. The state bit indicates whether the context has been assigned or allocated to an action (or instruction) or not, and is therefore free or available to be assigned (logic high or one), or is not free and available to be assigned (logic low or zero). Alternatively, the state may be determined by examining the memory 330 to determine whether the action ID and task ID fields are zero or non-zero for the selected context, indicating available (no assigned or allocated action ID and task ID) or unavailable (already assigned or allocated action ID and task ID), and then inverted to be utilized as the state bit in FIG. 13. The first condition bit indicates whether the composite circuit element 260, 260A is operational (logic high or one) or non-operational (logic low or zero), as determined from the various exemplary self-test processes discussed above. For each context (of "m" contexts), a first AND operation is performed on the corresponding state bit and first condition bit, via AND gates 605 (illustrated as the plurality of AND gates $605_0$, $605_1$, through $605_{(m-1)}$, such that the result of the AND operation indicates that the context is both available and that the composite circuit element 260, 260A is working properly (logic high or one), or that either the context is not available or that the composite circuit element 260, 260A is not working properly (logic low or zero).

A second, controller (SPE 292 (or SME 290)) condition bit is utilized to indicate whether the SPE 292 (or SME 290) (within the cluster 200) is operational (logic high or one) or non-operational (logic low or zero), also as determined from the various exemplary self-test processes discussed above, and may be stored in any of the various memories within the composite circuit element 260, 260A or cluster 200. A second AND operation is performed using this first AND result (state and first condition bit) and the second, controller condition bit (via the plurality of AND gates $610_0$, $610_1$, through $610_{(m-1)}$), such that the result of the second AND operation indicates that the context is both available and that both the composite circuit element 260, 260A and SPE 292 (or SME 290) are working properly (logic high or one), or that the context is not available, that the composite circuit element 260, 260A is not working properly, or that the SPE 292 (or SME 290) is not working properly (logic low or zero). The first and second AND operations also may be performed as a single, combined AND operation having at least three inputs (state bit, first condition bit, and second condition bit). The results of the second AND operation for each context may be added, such as by using a "one-hot" adder 615 (or a SPE 292 (or SME 290) or other controller), providing the number of free contexts per composite circuit element 260, 260A (with a working SPE 292 (or SME 290)).

As illustrated, this process may continue up the matrix hierarchy, with the number of free contexts per composite circuit element 260, 260A added together for each type of composite circuit element 260, 260A within a cluster 200, then added together for each type of composite circuit element 260, 260A within a supercluster 185, then added together for each type of composite circuit element 260, 260A within a matrix 150, and then added together for each type of composite circuit element 260, 260A within the apparatus 100. These additional ADD operations may be performed using dedicated ADDERs (e.g., 620, 625, 630) or by using composite circuit elements 260, 260A configured for ADD operations and under the control of their corresponding SPEs 292 (or SMEs 290). As a result, availability counts for each type of composite circuit element 260, 260A may be determined and maintained at each level, namely, at a cluster 200 level, a supercluster 185 level, a matrix 150 level, and an apparatus level.

Such counts at these various levels are particularly useful for determining whether a supercluster 185 or cluster 200 has availability to satisfy a regional constraint, such as when a number of operations must be performed with timing constraints using certain types of composite circuit elements 260, 260A within a cluster 200 or supercluster 185. In addition, using such combinational logic circuitry, composite circuit element 260, 260A availability is determined and maintained rapidly, concurrently and in parallel for all clusters 200, with delays only from several AND and ADD operations (e.g., two AND delays and four ADD delays total for an entire matrix 150).

As an alternative for availability determination, the SPE 292 (or SME 290) may be utilized to poll or examine the various registers of all of the memories 330 of the corresponding composite circuit elements 260, 260A within the cluster 200, and add up the results by type of composite circuit element 260, 260A for each cluster, with one or more selected SPEs 292 (or SMEs 290) then adding up results for each supercluster 185 and matrix 150. Such availability determination may be top-down in the matrix hierarchy, such as initiated by a master controller (which may be a designated SPE 292 (or SME 290) or a controller 175), or bottom-up in the matrix hierarchy, such as illustrated in FIG. 13 or as provided by each of the SPEs 292 (or SMEs 290) within each cluster 200. It will be apparent to those of skill in the electronic arts that there are innumerable ways of providing this availability determination, using combinational, conditional or control logic, all of which are considered equivalent and within the scope of the present invention.

2. Symbolic Netlist Assignment

Figure 14A:
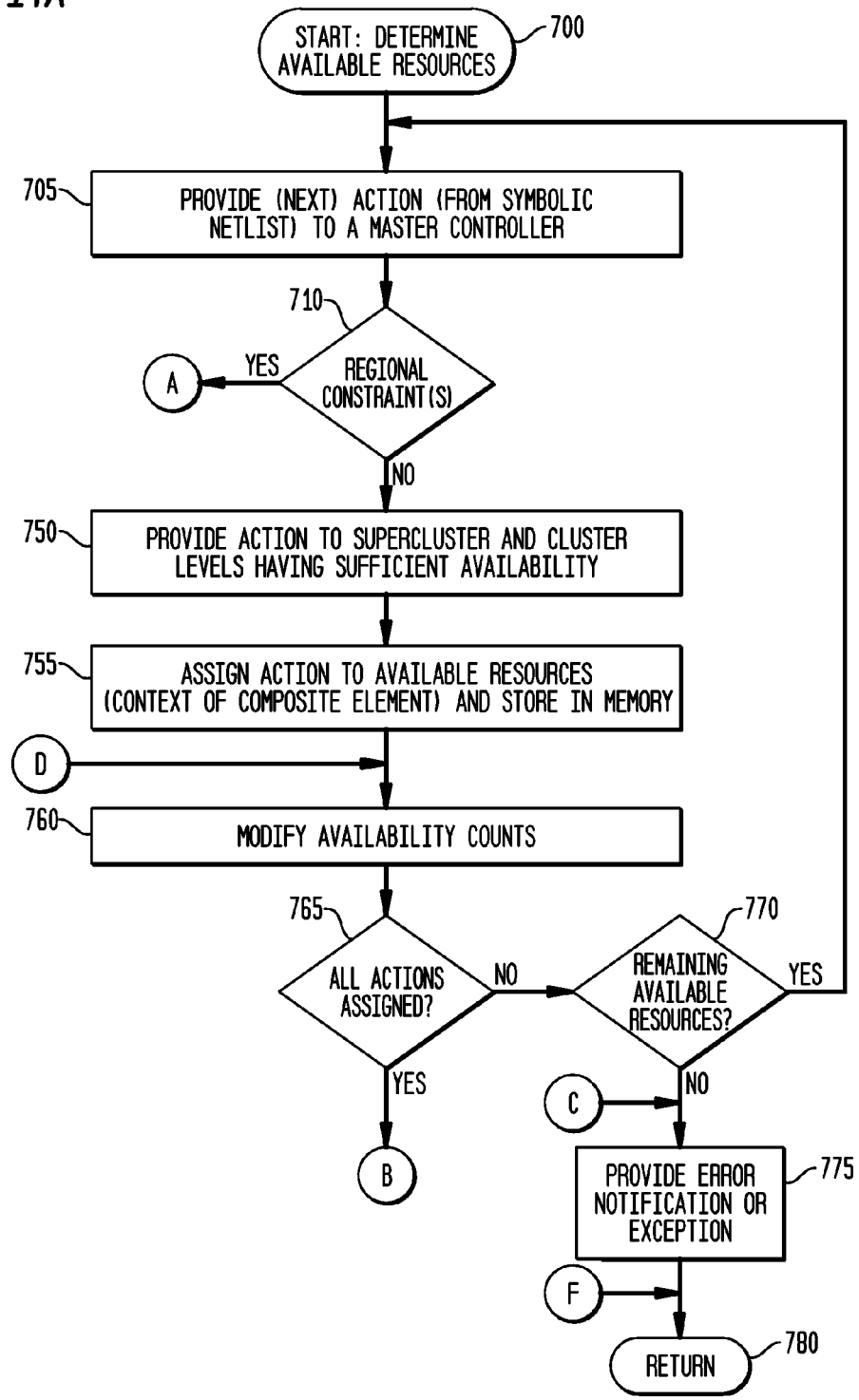
Figure 14B:
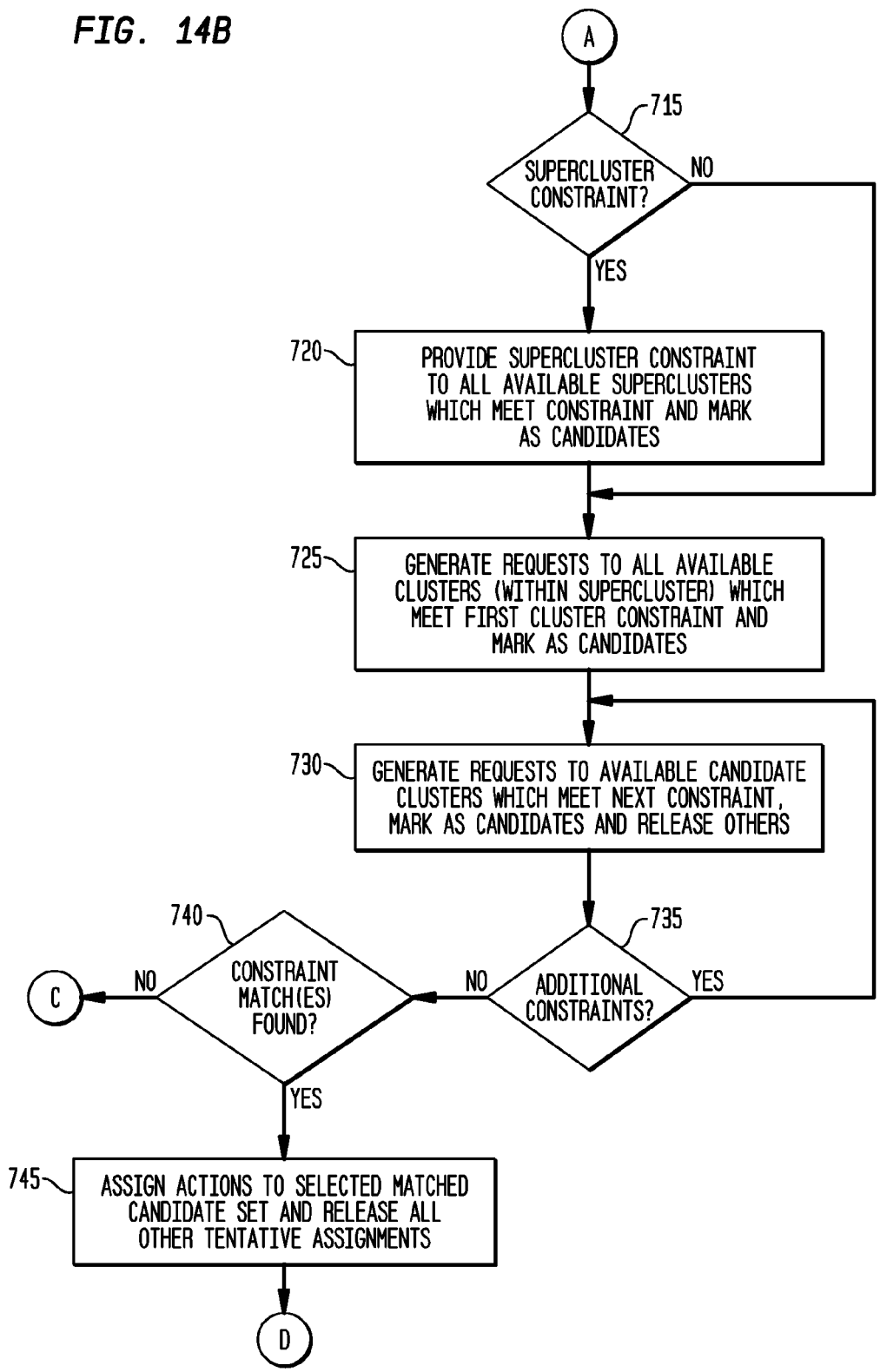
Figure 14D:
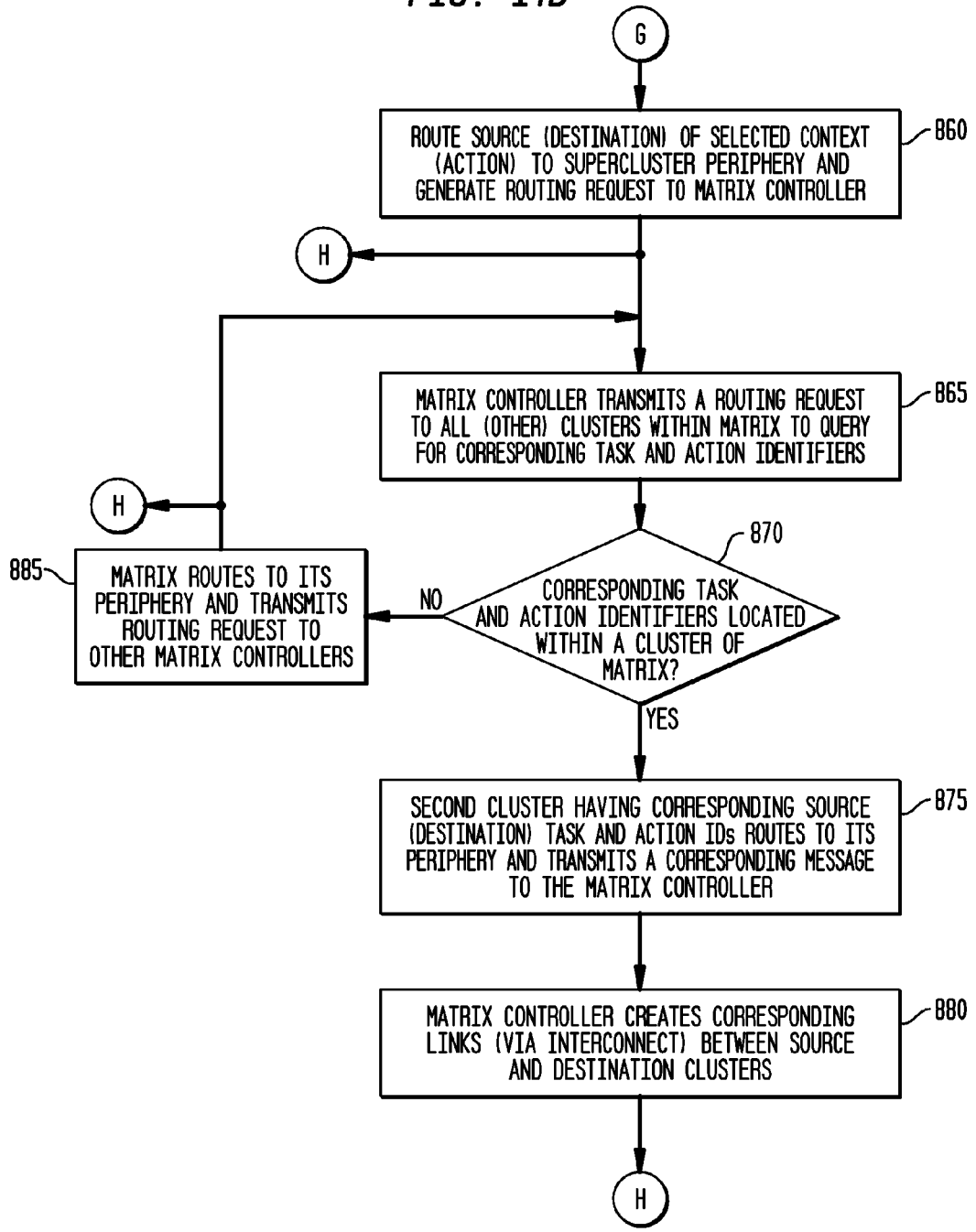

FIG. 14, divided into FIGS. 14A, 14B, 14C and 14D, is a flow diagram illustrating an exemplary algorithm or symbolic netlist run-time binding process in accordance with the teachings of the present invention, and further illustrates significant functionality associated with the SPEs 292 (or SMEs 290) distributed throughout the apparatus 100. Alternatively, this functionality could be performed by one or more additional controllers 175, such as a controller 175 designated as a master controller for the apparatus 100. In addition to the binding process illustrated, those of skill in the art will recognize that numerous variations of the methodology are available, and are considered equivalent and within the scope of the present invention. At least one such variation is also discussed below.

As mentioned above, the apparatus 100 performs a run-time binding operation of an algorithm provided as a symbolic netlist, which may be considered similar to a place and route operation for programmable resources with programmable routing. In this case, the programmable resources themselves have been placed on the IC, and the binding process then assigns an action (or instruction) (as part of a task) to one or more contexts of one or more available resources, and provides the corresponding routing or linkage of inputs and outputs. In contrast with prior art place and route methodologies, which may take hours or days to run, the methodology of the invention operates quite rapidly, on the scale of microseconds or milliseconds to seconds.

Referring to FIG. 14A (FIG. 14A), the method begins, start step 700, with the determination and/or maintenance of the availability counts for each type of composite circuit element 260, 260A, preferably at the cluster, supercluster, and matrix levels, as discussed above. The first (or next) action (i.e., function or instruction), as symbolic netlist elements, are provided to a master controller, step 705, which may be one or more designated SPEs 292 (or SMEs 290) or one or more controllers 175, for example. The designated SPE 292 (or SME 290) or controller 175 then determines whether the action (function or instruction) includes a regional or proximity constraint, step 710, and if so, proceeds to step 715. When the action (or instruction) does not include a regional constraint in step 710, the action (or instruction) is provided to a supercluster and a cluster level having sufficient availability of resources for the instruction, step 750, such as a sufficient number of available contexts for the one or more types of composite circuit elements 260, 260A provided in the symbolic netlist.

The SME(s) 290 of the available cluster(s) 200 assign(s) the action (or instruction) to one or more available composite circuit elements 260, 260A in the cluster(s) 200, step 755, by storing the corresponding information (configuration, the task ID, the action ID, and the source (or destination) task ID and action ID) in the corresponding memory 330 of each such composite circuit element 260, 260A, or stored in a memory composite circuit element 260, 260A, the second memory element 255, or other memory accessible to the SPE 292 (or SME 290) and the composite circuit element 260, 260A. The amount and location of the stored information may vary among selected embodiments. In an exemplary embodiment, the action (or instruction) is stored locally in the memory 330 (or otherwise within the cluster 200) as a configuration, task ID, action ID, with corresponding linkage information (either data source for inputs or data destination for outputs, also by task ID and action ID). Following the assignment, the availability count is modified, step 760, such as automatically modified as described above for FIG. 13, or by decrementing a count maintained in a register when, for example, the various counts are maintained by a designated SPE 292 (or SME 290) or controller 175.

The method then determines whether all actions (or instructions) have been assigned, step 765. When there are actions (or instructions) remaining to be assigned, the method then determines whether there are available resources remaining, step 770. When there are available resources remaining in step 770, the method returns to step 705 and iterates, selecting and assigning the next action (or instruction). When there are no more actions (or instructions) remaining for assignment, the method proceeds to step 800 to commence with routing (i.e., linking) all of the assigned actions (or instructions).

When there are actions (or instructions) remaining to be assigned in step 765, but there are no more available resources in step 770, indicating that the selected algorithm may not be able to operate on the apparatus 100 as currently configured (or available), an error or exception message is generated, step 775, and the method may end, return step 780, as the symbolic netlist of the selected program cannot be currently assigned. In that event, there are many potential courses of action. For example, the designated SPE 292 (or SME 290) or controller 175 may delete lower priority programs or operations which are consuming or utilizing resources, to make room for the selected program or operations and allow the selected program to execute on the apparatus 100. In other instances, the designated SPE 292 (or SME 290) or controller 175 may select another version of the program which may be able to be assigned without removing such other programs. In other instances, it may indicate that a larger apparatus 100 with more resources is needed for the selected application.

When the selected action (or instruction) includes a regional constraint in step 710, the method proceeds to step 715, as illustrated in FIG. 14B. Such a regional constraint may take the form of, for example:

```
region 3 supercluster
    region 1 cluster actions I1, I2
        I1
        I2
    end region
    region 2 cluster actions I3, I4
        I3
        I4
    end region
end region
``` in which a supercluster regional (proximity) constraint incorporates two cluster-level regional constraints, each of which has included actions (or instructions) subject to the constraint ("constrained actions"). As mentioned above, zone 201 constraints may also be utilized. As illustrated in this example, actions (or instructions) I1 and I2 (as symbolic netlist elements) must be assigned within the same cluster 200, and actions (or instructions) I3 and I4 (as symbolic netlist elements) must be assigned within the same cluster 200 (as Region 2, which may be the same or a different cluster than the Region 1 cluster of I1 and I2). Both clusters 200, however, must be in the same supercluster, as incorporated within the supercluster constraint (region 3).

In step 715, the designated SPE 292 (or SME 290) or controller 175 determines whether the constraint is a supercluster constraint, which would require the set of constrained actions to be assigned within the same supercluster 185. When the regional constraint is for a supercluster in step 715, the designated SPE 292 (or SME 290) or controller 175 provides the supercluster constraint to all available superclusters 185 which meet the availability requirements of the constraint, and temporarily designates or marks those one or more superclusters as candidates, step 720. Following step 720, or when the constraint is not a supercluster constraint in step 715, the constrained actions are provided to all available clusters 200 which meet the first cluster constraint (within one or more superclusters, if required by the previous constraint), such as the various clusters which meet the Region 1 constraint of the example, and those clusters 200 are temporarily designated as candidates, step 725. The next set of cluster-level constrained actions, if any, are provided to all available clusters 200 which meet the next cluster constraint (within one or more superclusters, if required by the previous constraint), such as the various clusters which meet the Region 2 constraint of the example, and those clusters 200 are also temporarily designated as candidates, step 730. In addition, those superclusters or clusters which had previously been candidates, but now do not contain sufficient available clusters to meet these additional constraints, may now be released and no longer designated as candidates for the regional constraints. While not separately illustrated, the same methodology may also be employed for any zone 201 constraints. When there are additional constraints to be processed, step 735, the method returns to step 730, and continues the temporary designation process.

When no further constraints need to be processed in step 735, the method determines whether one or more matches (supercluster and/or cluster levels) have been found, step 740. When one or more matches have been found in step 740, the designated SPE 292 (or SME 290) or controller 175 selects at least one such match, assigns the constrained actions (or instructions) to the selected candidate set, releases all the other tentative assignments, and proceeds to step 760, to modify the availability counts and continue the assignment process, as discussed above. When no match has been found in step 740, indicating that the selected algorithm may not be able to operate on the apparatus 100 as currently configured (or available), the method returns to step 775 and generates an error or exception message, and the method may end, return step 780, as the symbolic netlist of the selected program with the constraints cannot be currently assigned. As mentioned above, in that event, there are many potential courses of action. For example, the designated SPE 292 (or SME 290) or controller 175 may delete lower priority programs or operations or may utilize another version of the program which may be assigned more readily.

3. Run-Time Binding

When all actions (or instructions) have been assigned in step 765, the actions (or instructions) may be connected or routed, to establish all of the data communication paths which will be utilized during operation of the apparatus 100 to execute the selected program or algorithm. As indicated above, each action (or instruction) has input or output information stored symbolically with the configuration for the selected context of a selected composite circuit element 260, 260A. More specifically, the input or output information is stored effectively as pointers, with one task ID and action ID pointing to another task ID and action ID as either its data source (for input data) or data destination (to provide output data). Such information is stored symbolically or generically, because until the action (or instruction) has been assigned, the actual address for the data source or data destination is unknown. Provided that either data source information is utilized consistently, or data destination information is utilized consistently, only one such set of information is needed, although both can be utilized to potentially increase resiliency. In accordance with the exemplary embodiments, such data source or data destination information is utilized to connect the data inputs (for the input queues 320) of a composite circuit element 260, 260A, for each context, with the data outputs 375 (via output queues 315) of a context of another composite circuit element 260, 260A (or the same composite circuit element 260, 260A, for a feedback configuration). This creates either direct data connections (circuit-switched within a cluster 200) or message or packet-routed (hybrid message or packet-routed and circuit switched between clusters) data connections for data flow and, in either case, data is provided without requiring intermediate or separate steps of data storage in a register and data fetching from a register. Depending on the selected embodiment, such as for a supercluster 185C and circuit cluster 200C, the data connections may all be circuit-switched, through the cluster queues 245 and corresponding full or distributed interconnect 275, 295.

Following step 765, the routing process begins, step 800, as illustrated in FIG. 14C. In the exemplary embodiment illustrated in FIG. 14C, the process is "bottom-up", beginning at the cluster 200 level (or zone 201 and cluster 200C levels) and proceeding to higher levels (supercluster and matrix levels) as needed. Not separately illustrated, the process may also be initiated from a "top-down" perspective, such as by the designated SPE 292 (or SME 290) or controller 175 transmitting a request to the SPEs 292 (or SMEs 290) of the clusters 200 to initiate the routing process of step 800.

Referring to FIG. 14C, step 800, one or more SPEs 292 (or SMEs 290) of the corresponding clusters 200 begin the routing process by selecting an action (or instruction) of a first context of a composite circuit element 260, 260A, and determining the source (or destination) task and action identifiers stored as part of the selected action (or instruction). In exemplary embodiments, this process may be performed by each SPE 292 (or SME 290) of each cluster 200 as a parallel process, resulting in a very highly efficient binding routing process. In other exemplary embodiments, if not every cluster 200 has a SPE 292 (or SME 290), then another SPE 292 (or SME 290) within the supercluster 185 may be utilized.

As indicated above, these source (or destination) task and action IDs, in selected embodiments, are stored in the memory 330 of the element interface and control 280 of the composite circuit element 260, 260A. In alternative embodiments, the source (or destination) task and action identifiers may be stored in other memory elements, such as a memory-type composite circuit element $260_M$, second memory element 255, or other memory elements which may be included within a cluster 200. To facilitate routing, the memory 330 (or other memory element) may be implemented as a content addressable memory ("CAM"), as mentioned above, or as any other type of memory. Consequently, in step 805, for routing at a first level of hierarchy, a SPE 292 (or SME 290) may examine all of the memories (330, 255, $260_M$, etc.) within its cluster 200 by these source (or destination) task and action identifiers of the first context (the composite circuit element 260, 260A context to be routed) to find the corresponding action (or instruction) of another, second context which matches these source (or destination) task and action identifiers. When other forms of memory are utilized instead of a CAM, e.g., SDRAM, then the SPE 292 (or SME 290) may perform a search of the memory (330, 255, $260_M$, or other memory storing the task ID and action ID), such as a binary search, to find the corresponding action (or instruction) of another, second context which matches these source (or destination) task and action identifiers.

When the matching action (or instruction) (having the corresponding task and action identifiers) of a second context of a composite circuit element 260, 260A has been found within a memory (330, 255, $260_M$, etc.), in step 810, the SPE 292 (or SME 290) then knows to route the selected, first context to this second context having the matching or corresponding action (or instruction). As a consequence, in step 815, when source task and action identifiers are stored, the SPE 292 (or SME 290) routes the input(s) of the first context (as a data destination) to the corresponding output of the second context (as a data source), and when destination task and action identifiers are stored, the SPE 292 (or SME 290) routes the output(s) of the first context (as a data source) to the corresponding input(s) of the second context (as a data destination). Within the cluster 200 or zone 201, the SPE 292 (or SME 290) establishes these internal cluster connections via the full interconnect 275 or distributed full interconnect 295. Following step 815, when there are additional actions (or instructions) to be routed in step 820, the method continues iteratively, returning to step 800, with a SPE 292 (or SME 290) or other controller selecting the next action (or instruction) to be routed.

When the matching action (or instruction) (having the corresponding task and action identifiers) of a second context of a composite circuit element 260, 260A has not been found within a memory (330, 255, $260_M$, etc.) of its cluster 200, in step 810, the SPE 292 (or SME 290) then knows that the corresponding data source or destination is not within its cluster 200 (referred to as a first cluster 200). As a consequence, in step 825, the SPE 292 (or SME 290) both: (1) routes the selected, first context to the periphery of the first cluster 200 (to one of the first communication elements 250 for data transmission via interconnect 155, through the full interconnect 275, distributed full interconnect 295, or the message manager 265, or otherwise directly to the first communication element 250); and (2) generates a routing request (query) to the supercluster-level controller (which may be a designated SPE 292 (or SME 290) or controller 175 having this assigned duty) to find a second context in another cluster 200 of its supercluster 185 which may have the matching or corresponding action (or instruction). From the perspective of the SPE 292 (or SME 290) of the first cluster 200, its routing of the first context is complete, and it may proceed with routing of other contexts (actions (or instructions)), if any, returning to step 820, with the supercluster controller (designated SPE 292 (or SME 290) or controller 175) then proceeding to step 830.

Having received a routing request (designating the second context), in step 830, the supercluster controller transmits a request or query to all (other) clusters 200 within its supercluster 185, for those SPEs 292 (or SMEs 290) to determine whether the corresponding action (or instruction) is located in one of their memories ($330, 255, 260_M$, etc.), for routing at a second level of hierarchy. When one of these other clusters 200, as a second cluster 200, has the matching or corresponding action (or instruction) (i.e., has the source (or destination) task and action identifiers of the first context) as a second context of one of its composite circuit elements 260, 260A, step 835, this second cluster 200 then knows that this second context is the source or destination for data which is to be routed to or from another, first cluster 200. As a consequence, in step 840, the second SPE 292 (or SME 290) of the second cluster 200 routes this second context to the periphery of the second cluster 200 (to one of the first communication elements 250 for data transmission via interconnect 155, through the full interconnect 275, distributed full interconnect 295, the message manager 265, or otherwise directly to the first communication element 250), and transmits a corresponding message to the supercluster controller (designated SPE 292 (or SME 290) or controller 175), indicating or providing information that it has the second context having the matching or corresponding action (or instruction). The supercluster controller, in turn, creates a corresponding linkage between the first cluster 200 and the second cluster 200, for the corresponding contexts, step 845, such as by storing corresponding routing information in a second communication element 210, and the cluster-to-cluster routing is complete. From the perspective of the SPE 292 (or SME 290) of the second cluster 200, its routing is also complete, and it may proceed with routing of its other contexts (actions (or instructions)), if any, also returning to step 820.

While not separately illustrated, in another variation, such as for supercluster 185C, one or more of the SPEs 292 (or SMEs 290) within the supercluster 185C may perform all such routing within a cluster 200C or within the entire supercluster 185C, all through the various cluster queues 245. Referring to FIG. 18, a SPE 292 (or SME 290) may provide: (1) corresponding routing within a selected zone 201B, such as directly from $CE_4$ to $CE_5$, for example, via the full or distributed interconnect 275, 295; (2) corresponding routing within a selected circuit cluster 200C, such as directly from $CE_4$ to $CE_{12}$ via the full or distributed interconnects 275, 295 and cluster queue $245_{15}$; (3) corresponding routing to a selected adjacent circuit cluster 200C, such as directly from $CE_4$ to another composite circuit element 260, 260A of another cluster 200C within the supercluster 185C via the full or distributed interconnects 275, 295, any intervening (zone to zone) cluster queues 245, and then through a peripheral cluster queue 245, such as $245_{10}$; (4) corresponding routing to a selected, non-adjacent circuit cluster 200C within the supercluster 185C, such as directly from $CE_4$ to another composite circuit element 260, 260A of another cluster 200C via the full or distributed interconnects 275, 295, any intervening (zone to zone) cluster queues 245, and typically a plurality of peripheral cluster queues 245; and (5) corresponding routing to a circuit cluster 200C which is not within the supercluster 185C, via a message manager 265.

For example, when routed through any of the cluster queues 245, any selected cluster queue 245 (with a corresponding selected context) is a data destination for a selected context of data producing composite circuit element 260, 260A, and is in turn a data source for either a selected context of a data consuming composite circuit element 260, 260A or another selected context of a cluster queue 245 (such as for data routing through a plurality of cluster queues 245, such as for data routing between clusters 200C, for example, using either source- or destination-based communication, as described herein).

In step 835, when none of these other clusters 200 within the selected, first supercluster 185 has the matching or corresponding action (or instruction) (with the source (or destination) task and action identifiers of the first context) in a second context of one of its composite circuit elements 260, 260A, the supercluster controller then knows that the corresponding data source or destination is not within its supercluster 185 (referred to as a first supercluster 185). As a consequence, in step 860 (illustrated in FIG. 14D), the first supercluster controller both: (1) routes the first context to the periphery of the first supercluster 185 (i.e., to one of the second communication elements 210 or to one of the message managers 265); and (2) generates a routing request to the matrix-level controller (which also may be a designated SPE 292 (or SME 290) or controller 175 having this assigned duty) to find a second context in another supercluster 185 of its matrix 150 which may have the matching or corresponding action (or instruction), for routing at a third level of hierarchy. From the perspective of the designated SPE 292 (or SME 290) or controller 175 of the first supercluster 185, its routing is complete, and the method returns to step 820, to continue the routing process for other actions, as may be needed, and also proceeds to step 865.

Having received a routing request (designating the second context), in step 865, the matrix controller transmits a request or query to all (other) clusters 200 within its matrix 150, for those SPEs 292 (or SMEs 290) to determine whether the corresponding action (or instruction) is located in one of their memories ($330, 255, 260_M$, etc.), for routing at this third level of hierarchy. This routing request may be transmitted directly to SPEs 292 (or SMEs 290) of the clusters 200, or may be transmitted via supercluster controllers. When one of these other clusters 200, as a second cluster 200, has the matching or corresponding action (or instruction) (i.e., has the source (or destination) task and action identifiers of the first context) as a second context of one of its composite circuit elements 260, 260A, step 870, this second cluster 200 then knows that this second context is the source or destination for data which is to be routed to or from another, first cluster 200. As a consequence, in step 875, the second SPE 292 (or SME 290) of the second cluster 200 routes this second context to the periphery of the second cluster 200 (to one of the first communication elements 250 for data transmission via interconnect 155, through the full interconnect 275, distributed full interconnect 295, the message manager 265, or otherwise directly to the first communication element 250), and transmits a corresponding message to the matrix controller (designated SPE 292 (or SME 290) or controller 175), indicating or providing information that it has the second context having the matching or corresponding action (or instruction). The matrix controller, in turn, creates a corresponding linkage between the first cluster 200 and the second cluster 200, for the corresponding contexts, step 880, such as by storing corresponding routing information in a third communication element 190 and a second communication element 210, and the supercluster-to-supercluster routing is complete. From the perspective of the SPE 292 (or SME 290) of the second cluster 200, its routing is also complete, and it may proceed with routing of its other contexts (actions (or instructions)), if any, also returning to step 820.

In step 870, when none of these other clusters 200 within the selected, first matrix 150 has the matching or corresponding action (or instruction) (with the source (or destination) task and action identifiers of the first context) in a second context of one of its composite circuit elements 260, 260A, the matrix controller then knows that the corresponding data source or destination is not within the first matrix 150. As a consequence, in step 885, the first matrix 150 both: (1) routes the first context to the periphery of the first matrix 150 (i.e., to one of the third communication elements 190); and (2) generates a routing request to the other matrix-level controllers (which also may be a designated SPE 292 (or SME 290) or controller 175 having this assigned duty) to find a second context in another matrix 150 of the device 100 which may have the matching or corresponding action (or instruction), for routing at a fourth level of hierarchy. From the perspective of the designated SPE 292 (or SME 290) or controller 175 of the first matrix 150, its routing is complete, and the method returns both to step 820, to continue the routing process for other actions, as may be needed, and the method iteratively repeats steps 865-880, as needed, at the apparatus 100 level.

As all actions (or instructions) had been assigned previously, the matching or corresponding action (or instruction) is in a second context of a composite circuit element 260, 260A in a cluster 200 of a supercluster 185 of one of the matrices 150, and the method searches up to the matrix or apparatus level, as needed, with those corresponding matrix- or apparatus-level controllers (designated SPE 292 (or SME 290) or controller 175) routing to their corresponding peripheries (e.g., third communication elements 190 and any intervening second communication elements 210) using interconnect 155 and transmitting queries to their corresponding lower-level superclusters 185 and clusters 200.

As a result, all actions (or instructions) become routed, connecting all data sources or data destinations with their corresponding data destinations or data sources, respectively, either within the same cluster 200 (step 815), or between clusters 200 (steps 825, 840, and 845) which are within the same supercluster 185, or within the same matrix 150 (steps 875 and 880), or just within the apparatus 100. When all actions (or instructions) have been routed in step 820, the designated SPE 292 (or SME 290) or controller 175 sets or enables the run status for the particular task ID, step 850. When there are additional tasks of a program or algorithm which have actions remaining to be routed, step 855, the method continues, returning to step 800, and when there are no further tasks having actions to be routed, the method may end, return step 780. It should also be noted that step 850, which sets or enables the run status for the particular task, may also be performed following step 855, when all of tasks have been routed.

The run status, as discussed below, is a field utilized in the configuration word for a context (stored in memory 330) and utilized by the element controller 325 to determine whether the circuit element 270 should execute a selected context (i.e., perform the corresponding action). In this case, it indicates that the task has been fully configured, with all actions (or instructions) assigned and routed, such that it may be ready to execute, provided that other conditions are also met, as discussed below. The run status may also be utilized to start or stop selected tasks, or to purge a selected task, such as to load a new task in its place.

In addition, it will be apparent to those of skill in the electronic arts that a number of variations of the methodology of FIG. 14 may be implemented equivalently and are within the scope of the present invention. For example, in the event that the actions (or instructions) are not stored locally in a memory 330, or in a memory composite element $260_M$, or in second memory element 255, but are stored centrally in a separate memory, a top-down approach may be utilized. Continuing with the example, a top-level controller such as a matrix-level controller (designated SPE 292 (or SME 290) or controller 175) may initiate the routing process, examining the stored and linked actions (or instructions), determining the routing within and between the various clusters, and passing the various configurations (as contexts) to the affected composite circuit elements 260, 260A. As another variation, the top-level controller such as a matrix-level controller (designated SPE 292 (or SME 290) or controller 175) may simply transmit the corresponding actions (or instructions) to the clusters 200, which then initiate the routing process as described above with reference to FIGS. 14C and 14D.

Also, while one or more controllers 175 may be utilized to implement the assignment and routing processes, it is also apparent that the use of a designated SPE 292 (or SME 290) is a more robust and resilient solution. In these circumstances, any of the plurality of SPEs 292 (or SMEs 290) (of the corresponding plurality of clusters 200) may perform the various roles of supercluster 185 controller, matrix 150 controller, or apparatus 100 controller. In the event of harm or damage to a given SPE 292 (or SME 290), innumerable other SPEs 292 (or SMEs 290) are available to assume any of these roles.

Significantly, the time involved for this assignment and routing process is linear with respect to the number of actions (or instructions) "k", and proceeds quite rapidly, as it is performed concurrently in a massively parallel process within each cluster 200. For example, depending upon the number of cluster-, supercluster- and matrix-levels "n" involved, the worst case amount of time per context (or instruction) is typically 3n+1 or 4n+1 clock or computation cycles, for messages to be transmitted and routing to be completed to the corresponding peripheries of each level. This is in sharp contrast with prior art routing methodologies in which the routing time, at a minimum, is a function of $k^2$ and, if optimized, is non-deterministic and has an unpredictable routing time.

Another advantage of this assignment and binding process of the present invention is the ability to assign and route tasks and actions (or instructions) to a plurality of heterogeneous clusters 200. More particularly, clusters 200 are not required to be the same, and may be quite different, with different mixes of types of composite circuit elements 260, 260A, without impacting the ability to program the resulting device. For example, any cluster 200 with many multiplier-type composite circuit elements 260, 260A will simply have more availability for assignment of multiplication operations, such that those types of actions (or instructions) will automatically gravitate to those types of clusters 200. In addition, the assignment and binding time would be the same for both homogeneous or heterogeneous clusters 200.

As discussed above with reference to FIG. 1, in the event of damage to or failure of one or more components within a cluster 200, such as a composite circuit element 260, 260A or SPE 292 (or SME 290), the cluster 200 or the individual component may be designated or marked as unavailable. Under these circumstances, any tasks and/or actions (or instructions) assigned to an affected composite circuit element 260, 260A should be placed with one or more other composite circuit elements 260, 260A, and this may be performed in a wide variety of ways.

Figure 15:
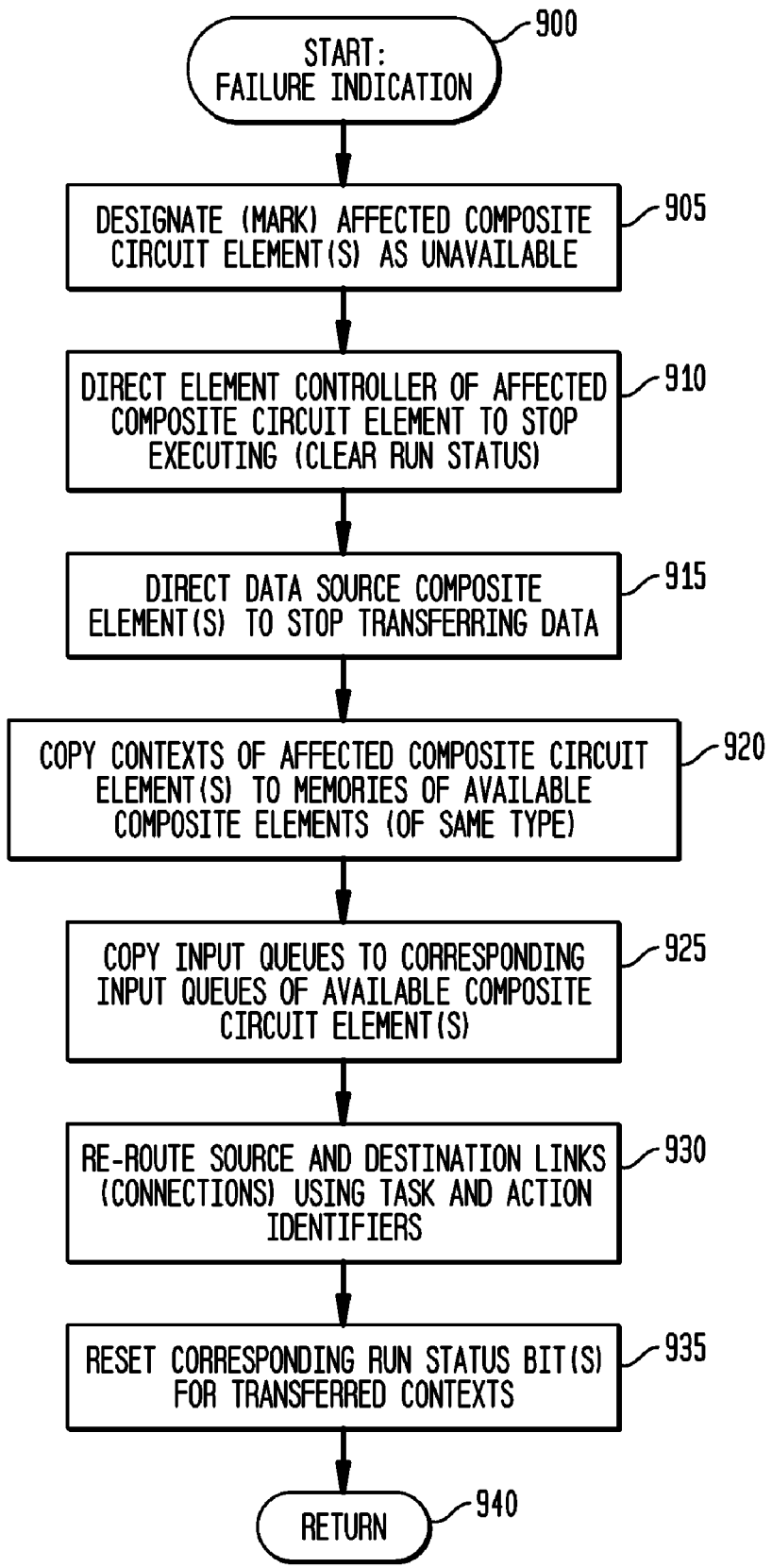
FIG. 15 is a flow diagram illustrating a first exemplary re-assignment and re-binding process in accordance with the teachings of the present invention.

FIG. 15 is a flow diagram illustrating a first exemplary re-assignment and re-binding process in accordance with the teachings of the present invention. In this first approach, starting with step 900, such as due to a failure indication during self-testing, one or more SPEs 292 (or SMEs 290) (from within the same cluster 200 if unaffected by the damage or failure, or from another cluster 200) marks or designates the affected composite circuit element 260, 260A as unavailable, step 905, and directs the element controller 325 of the affected composite circuit element 260, 260A to stop executing all contexts, step 910, typically utilizing the run status bit. The SPE 292 (or SME 290) would also transmit a message to the linked data source composite circuit elements 260, 260A, to direct those composite circuit element(s) 260, 260A to stop producing data and transferring it to the affected composite circuit element 260, 260A, step 915. The SPE 292 (or SME 290) then determines which (if any) other composite circuit elements 260, 260A are available to take over the affected functionality (i.e., the functionality which had been performed by the affected and now unavailable composite circuit element 260, 260A), and copies the contexts stored in the memory 330 of the affected composite circuit element 260, 260A to one or more memories 330 of the available composite circuit element(s) 260, 260A of the same type which have available contexts, step 920. In an exemplary embodiment, the SPE 292 (or SME 290) may store and maintain a transformation table, which indicates which composite circuit elements 260, 260A have availability and have the requisite type of circuit element 270 for such a transfer of functionality. The SPE 292 (or SME 290) may also copy the contents of the associated input queues 320 to the input queues 320 of the available composite circuit elements 260, 260A, step 925; alternatively, for certain types of real-time data, the input data may be discarded or, equivalently, allowed to remain in the associated input queues, with operations resuming at the available composite circuit element(s) 260, 260A using newly produced data.

The SPE 292 (or SME 290) then re-routes the connections to and from the available composite circuit elements 260, 260A, step 930, such as by doing source (or destination) task and action identifier searches as discussed above and, in addition, if both source and destination task and action identifier information is not stored, performing a search for the affected actions (or instructions) in other memories 330 of other composite circuit elements 260, 260A, to determine the corresponding data destinations (or sources) to complete the routing. Other routing steps as discussed above also may be utilized as needed (e.g., for routing between clusters 200). In step 935, the SPE 292 (or SME 290) then resets the corresponding run status bits of the transferred contexts, to re-enable the execution of the affected actions (or instructions) by the available composite circuit element(s) 260, 260A, and the re-assignment and re-binding process may end, return step 940.

In a second approach, the task may be re-assigned and re-bound (e.g., as illustrated in FIGS. 12-14) and, given the affected components are no longer available, no actions (or instructions) will be assigned to them. This approach also has the advantage of preserving any locality constraints, as such constraints will be included within the task actions (or instructions). In addition, as the duration of the assignment and binding process is linear with respect to the number of actions (or instructions), this re-assignment and re-binding process proceeds rapidly, with minimal disruption, particularly when the number of affected actions (or instructions) is comparatively small. As part of this process, one of the designated SPEs 292 (or SMEs 290) may also direct the element controller 325 of the affected composite circuit element 260, 260A to stop executing all contexts, transmit a message to the linked data source composite circuit element(s) 260, 260A to direct the source composite circuit element(s) 260, 260A to stop producing data and transferring it to the affected composite circuit element 260, 260A, copy the contents of the associated input queues 320 to the newly assigned, available composite circuit elements 260, 260A, and reset the run status bits for the transferred contexts of the available composite circuit elements 260, 260A.

As a consequence, a program or algorithm that has been compiled as a symbolic netlist for the apparatus 100 has been assigned and routed within the apparatus 100, creating all of the composite circuit element 260, 260A configurations (stored as contexts) and data path connections (via full interconnect 275, distributed full interconnect 295, or interconnect 155). While the apparatus 100 has been designed to enable such assignment and routing in real time, it is not required to be performed in real-time and may be performed in advance, with all such assignment and routing within the scope of the present invention. With this background, the operation of and control of execution within the apparatus 100 may now be explained.

F. Apparatus Operation and Control of Execution

Figure 16A:
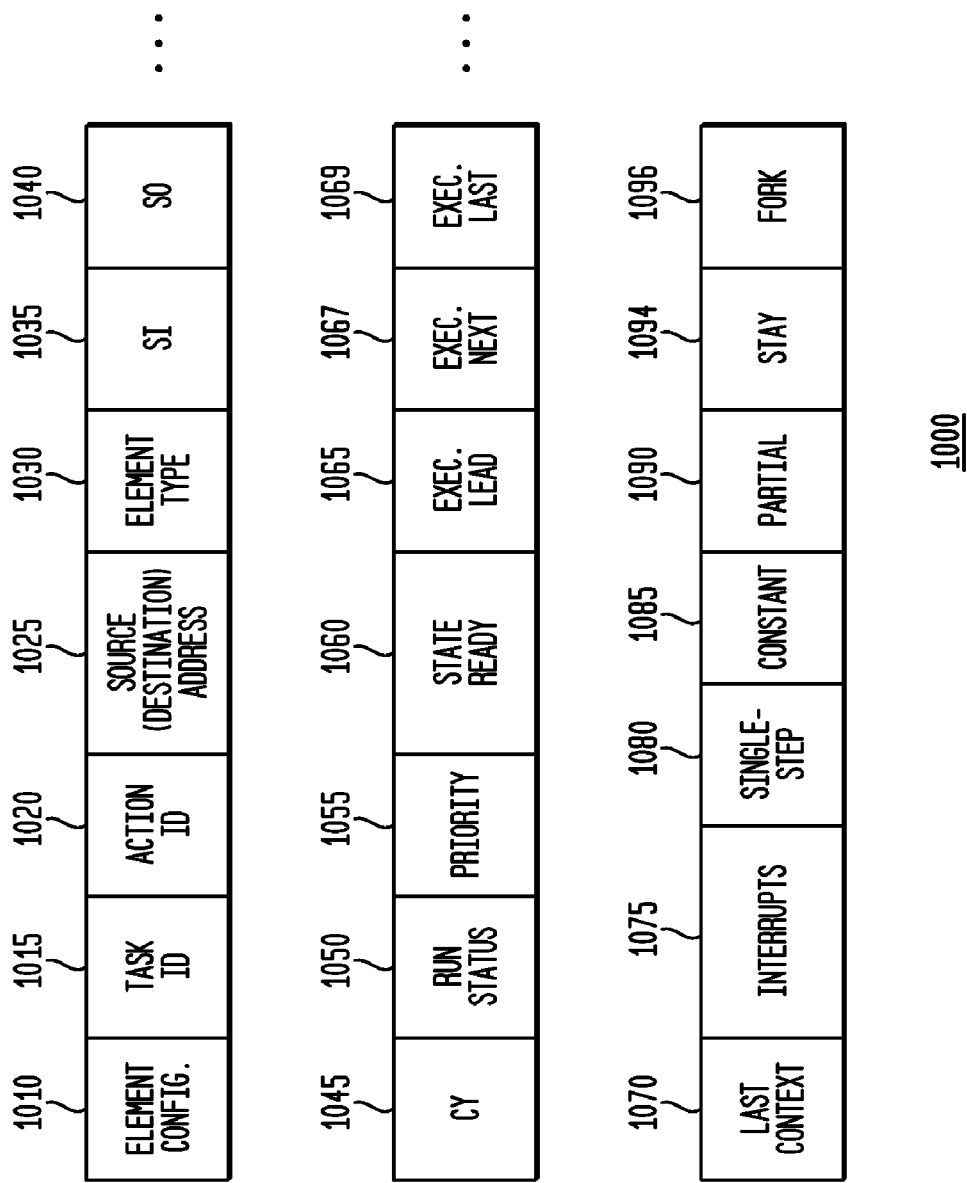

FIG. 16, divided into FIGS. 16A, 16B, and 16C, is a diagram illustrating exemplary configuration and control words 1000, 1135, and 1002, in accordance with the teachings of the present invention. As illustrated in FIG. 16A, the exemplary configuration word 1000 is comprised of a plurality of data fields, and comprises at least two or more of the following data fields, in any order: an element configuration field 1010; a task ID field 1015; an action ID field 1020; a source (and/or destination) address field 1025 (designating a source (or destination) composite circuit element 260, 260A, a port, and context); an element type field 1030; a significant inputs ("SI") field 1035; a significant outputs ("SO") field 1040; an optional cycles ("CY") field 1045; a run status field 1050; an optional priority field 1055; an optional state ready field 1060; optional execution lead, next and last fields 1065, 1067, 1069; an optional last context field 1070; an optional interrupts field 1075; an optional single-step field 1080; an optional constant mode field 1085, an optional partial (or conditional) execution field 1090, optional output queue lead, next and last fields 1091, 1092, 1093, an optional stay in context field 1094, and an optional "fork" field 1096. A corresponding configuration and control word 1000 it utilized for each context of the composite circuit element 260, 260A. As mentioned above, the memory composite circuit element 260M has somewhat different control, so multiple contexts may execute simultaneously, rather than sequentially. It will be apparent to those of skill in the electronic arts that additional or fewer fields may be utilized, depending upon the applications and objectives of the selected apparatus 100 and any incorporated system, and all such variations are within the scope of the present invention.

A plurality of configuration words, one for each context, are utilized by the element controller 325 to control the configuration and execution of a configurable element 270, and utilized by the input controller 336 and output controller 338 to control the configuration and operation of the input queues 320 and output queues 315, respectively. Each configuration word is indexed by the context number. The one or more configuration bits which control how the configurable element 270 is to be configured or how data is to be interpreted is or are stored in element configuration field 1010. Similarly, the assigned and routed (bound) actions (or instructions) are stored as the corresponding task ID, in field 1015, and the action ID in field 1020.

The plurality of configuration and control words are stored in one or more configuration and control registers 330, 330A, and also may be stored in any of the various memories (e.g., cluster RAM 475), such as for use in configuration and reconfiguration of other composite circuit elements 260, 260A, and may be moved throughout the IC and on and off the IC. In an exemplary embodiment, configuration and control words for a context are stored with contiguous addresses in the configuration and control registers 330, 330A, with offsets between configuration addresses of consecutive contexts (utilized for other configuration information).

The data output and/or data input locations, as bound destination (and/or source) addresses, are stored in field 1025. Alternatively, the data input and/or data output pointers (as source/destination task IDs and action IDs) may be stored, depending upon the methodology implemented for potential re-routing. For example, when an entire task is re-assigned and re-bound de novo, new routing information will be generated, rather than utilizing the previously stored source and destination information. The remaining control fields are utilized to control whether and when a given context is executed (for a corresponding action to be performed by the circuit element 270), how interrupts are serviced by the SPE 292 (or SME 290), and how output data is provided to one or more destination addresses.

The element type field 1030 is utilized to designate which type of element 270 is being used for the context, selecting one of the elements 270 when more than one type of element 270 is included within a composite circuit element 260A.

Figure 17:
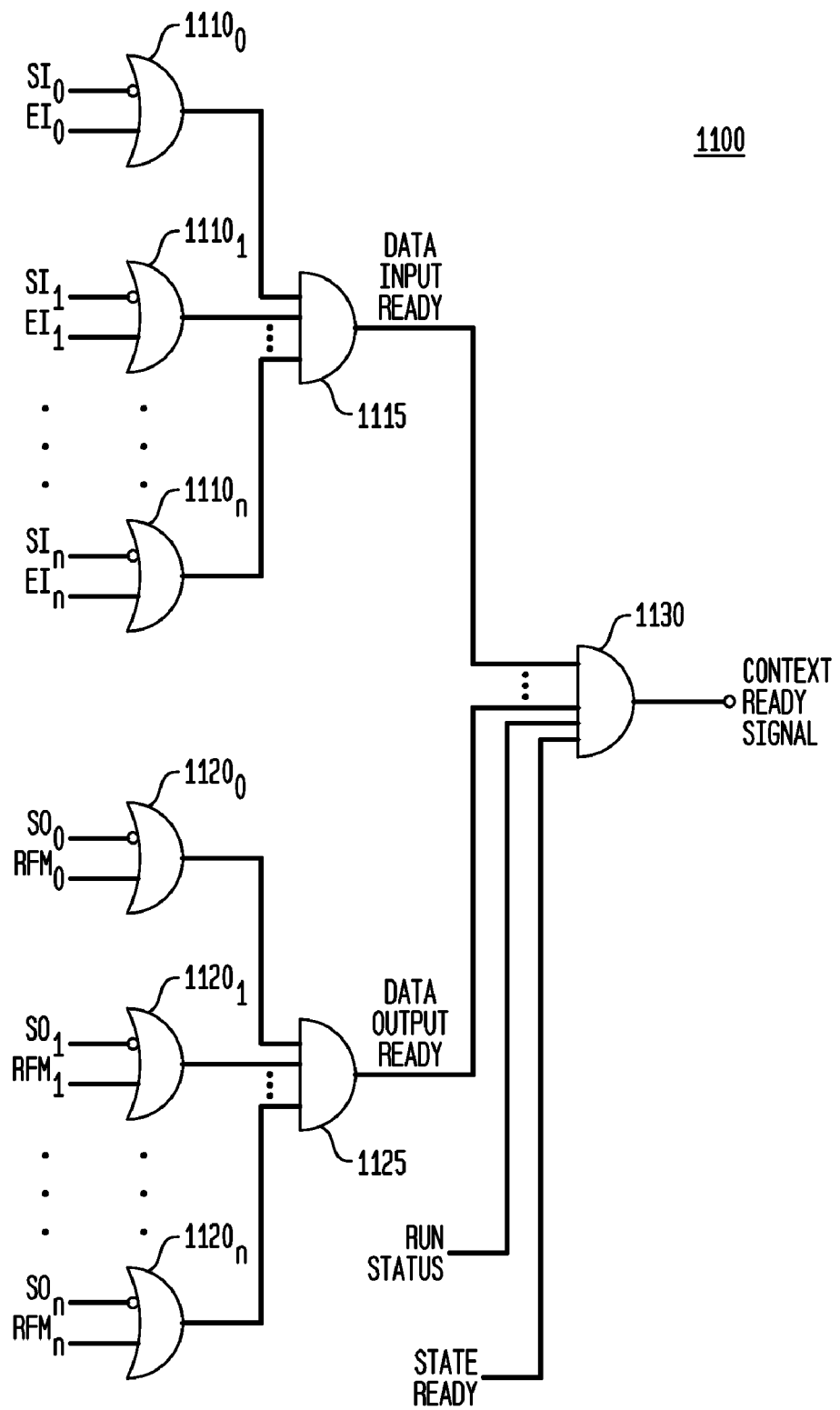
FIG. 17 is a block diagram illustrating exemplary combinational logic circuitry for context readiness determination within an exemplary apparatus in accordance with the teachings of the present invention.

The element controller 325, in exemplary embodiments, comprises combinational logic gates or elements, such as AND, OR and INVERTER gates, which provide a result (a given context executes or does not execute), based upon the values of the bits stored in the various fields (e.g., 1035, 1040, 1050, 1060) of the exemplary configuration and control word 1000. FIG. 17 is a block diagram illustrating exemplary combinational logic circuitry 1100 for context readiness determination within an exemplary apparatus in accordance with the teachings of the present invention.

As mentioned above, in a data flow environment, a context (task) may execute when it has sufficient input data and a sufficiently free or available destination for the resulting output data. As there are multiple inputs and corresponding multiple input queues 320 into the configurable element 270, the significant input (SI) bits (1035) designate which of those inputs are to be utilized in the selected context. In addition, the input queues 320 are adapted to provide a first signal, referred to as "enough input" ("EI"), indicating that there is sufficient data in the corresponding input queues 320. For example, in the element controller 325, each of the SI bits are inverted, and each of the inverted SI bits and its corresponding EI signal are ORed (OR gates $1110_0$ through $1110_n$), with all of their corresponding OR results (four results for four inputs) then ANDed together (AND gate 1115), to provide a "data input ready" signal, such that the AND result (data input ready) indicates that there is sufficient data available at the inputs which will be utilized by the selected context. More specifically, the data input ready signal is provided when (1) there is enough input data at the significant inputs, and (2) any other remaining input is not significant.

Similarly, as there are multiple output queues 315 and outputs 375 from the configurable element 270, the significant output (SO) bits (1040) designate which of those outputs and corresponding queues are to be utilized in the selected context. In addition, a second signal referred to as a "room for more" ("RFM") signal is provided to indicate that the corresponding destination(s) have sufficient space available for output data, either from the output queues 315 or from the input queues 320 of the data destination, or potentially from an output register tracking output data consumption. Also for example, in the element controller 325, the SO bits are inverted, and each of the inverted SO bits and its corresponding RFM signal are ORed (OR gates $1120_0$ through $1120_n$), with all of their corresponding OR results (two results for two outputs) then ANDed together (AND gate 1125), to provide a "data output ready" signal, such that the AND result (data output ready) indicates that there is sufficient memory space available for data output by the selected context, namely, space available in the corresponding output queues 315 (or destination input queues 320 (or other memory)). More specifically, the data output ready signal is provided when (1) there is room for output data at the significant outputs, and (2) any other remaining output is not significant.

These two results, the data input ready and data output ready then may be ANDed together (AND gate 1130), to provide an overall data "ready" status for a selected context. For example, the ready status is equal to a logic one when both the data input(s) and data output(s) are ready, and is zero otherwise. Alternatively, as illustrated in FIG. 17, the data input ready and data output ready results may be ANDed with other fields (state ready and run status, discussed below), to provide an overall indication that the context is ready for execution (a "context ready" signal).

The run status stored in field 1050 indicates whether the context has been enabled for execution, and may be set following data input-output routing in the binding process, or set (or reset) at other times by the message manager 265 or SPE 292 (or SME 290), for example. For example, the task (of which the selected context is a part) may still be in the process of being configured and routed for other configurable elements 270, and should not be enabled until such routing is complete. Accordingly, a task may be started by setting or enabling the context run status in field 1050. In other circumstances, one of the message managers 265 or SPEs 292 (or SMEs 290) may have halted a task, for possible resumption at another time, or may be in the process of deleting tasks, and may do so by clearing of disabling the context run status in field 1050. As a consequence, the element controller 325 will execute a context only when enabled, as indicated by the run status in field 1050.

As indicated above, the run status (also referred to as run state) may be implemented as a multi-bit field in various exemplary embodiments, to indicate at least several different statuses or states, in any combination, such as run, halt, suspend, single-step, single-step with interrupt, and free, for any selected context, for example and without limitation. Also as mentioned above, these different states entail different allowed capabilities of the composite circuit element 260, 260A, 260M for the selected context. Also as indicated above, the run status may be determined by a message manager 265, a SPE 292 (or SME 290), or by an incoming message on the message channel (220). It should also be noted that starting (enabling) and stopping (disabling) a task may be accomplished through a broadcast message over the CC bus 285 (from the message manager 265 or SPE 292), by matching the task ID, as previously mentioned.

In various exemplary embodiments, the run status may be implemented to indicate any number of different statuses or states, in any combination, such as run, halt, suspend, single-step, single-step with interrupt, and free, for any selected context for example and without limitation. As indicated above, halt indicates that the input queues 320 are not listening to any sources, cannot issue back pressure, and the context does not execute; suspend indicates that the input queues 320 are listening to specified sources, are receiving data and can issue back pressure, but the context does not execute; run indicates that the input queues 320 are listening to specified sources, are receiving data, can issue back pressure, and the context does execute; single-step indicates that the input queues 320 are listening to specified sources, are receiving data and can issue back pressure, but the context executes only once and does not execute again until re-enabled; single-step with interrupt indicates that the input queues 320 are listening to specified sources, are receiving data and can issue back pressure, but the context executes only once, issues an interrupt to the SPE 292, and does not execute again until re-enabled; and free indicates that the registers can be reset when the apparatus 100, 140 starts, and would need a new configuration to execute an operation. It should be noted that the free and halt statuses are different: for a halt status, the configuration (and control) word 1000 remains in place, and the status can be re-enabled (such as to run or single-step), while for a free status, the configuration and control registers 330, 330A would need to be repopulated with a configuration (and control) word 1000 for the selected context.

The SPE 292 (or SME 290) may also utilize one or more state ready bits (stored in optional field 1060) to control context execution based on various conditions or other events. For example, when a condition has been met, such as an initialization, a selected context may need to be run next, and is designated with the state ready bits. All of these bits (run status, state ready, data output ready signal, data input ready signal) may be ANDed (AND gate 1130), and the result may also be stored within the run status field 1050 or another field accessible by the element controller 325. As a consequence, the conjunction of the state ready bits, the data input ready, data output ready and run status indicators, provide an indication to cause the element controller 325 to allow execution of the selected context. Alternatively, operations may be controlled through use of the run status (of field 1050), without the state ready bits, allowing the SPE 292 (or SME 290) to simply designate whether the context is or is not enabled for execution.

In another exemplary embodiment, whether an element 270 may execute a given context may be determined by other combinations of enablement, data readiness, conditions and execution ordering. In an exemplary embodiment, an element 270 may execute a selected context when input data has arrived in the significant input queues 320 (data input ready signal), the significant output queues 315 have room to accept output data (data output ready signal), the run status is enabled (set to run), and execution chain signals from the corresponding execution chain bits (in fields 1065, 1067, 1069). Execution chaining is discussed in greater detail below and, in this case, the execution of a context by an element 270 will also depend on whether the context is part of an execution chain and if so, where the context is in the chain sequence (lead, next, last).

The optional cycles field 1045 is utilized to designate the number of clock cycles required to execute the corresponding action. This field is utilized to avoid another, second context being executed while computations of a first context are still in progress.

The optional single-step field 1080 is utilized to provide for a context to execute just once, such as for results to be examined by the SPE 292 (or SME 290). Various testing contexts are often run in a single-step mode, with the SPE 292 (or SME 290) setting or clearing a single-step bit (e.g., for a test to be run at selected times, and to not be always available to run).

In a selected embodiment, the optional context field 1070 may be utilized as part of arbitration among potential execution of a plurality of contexts. When a context has been executed, the last context bit is set (and the last context bits of the other contexts are reset to zero). In the event of competing contexts which are ready for execution, the last context bit is utilized to determine if one of the contexts just executed, and if so, allows the other context to execute, to avoid one context from completely dominating execution in the configurable element 270. In addition, in the event of competing contexts which did not just execute, one or more optional priority bits (stored in field 1055) may be utilized to arbitrate and allow the higher priority context to execute first.

In an exemplary embodiment, an optional partial (and/or conditional) execution indicator (stored in field 1090) is utilized to allow execution when not all significant inputs have data present or, in some instances, execution may begin without any inputs being designated as significant or, in other instances, some inputs may be examined to determine if other inputs will be utilized. In another exemplary embodiment, the partial or conditional execution may be indicated or implicit within the configuration bits themselves, as part of or implicit within the op code or instruction utilized in or forming the configuration (or configuration bits), without use of a separate partial or conditional execution indicator in optional field 1090. Generally, the element controller 325 chooses a context to execute based on the arrival of data at the significant inputs and the availability of room in the significant output queues. While this method works for most types of operations, there are some operations where this may be an impediment to providing useful results and another form of control is utilized, using the partial execution indicator or the configuration bits.

An exemplary situation in which a partial execution indicator is helpful is the case where the operation copies one of two or more inputs to an output and does not use the otherwise significant inputs that were not chosen in a particular execution cycle. This is useful for a merge operation that selects data from one of its input streams and leaves the other streams alone until such time as another input stream will be processed. Only one datum from each of the processed streams is consumed. The data in the unprocessed streams remains intact. If all initially significant inputs were required to be present at all times, the operation could dead-lock (halt until reset because its prerequisites cannot be met) under some circumstances. One such circumstance is when a first input data stream should be processed and its corresponding input queue 320 has data, but a second (initially) significant input queue 320 does not have data because it has already been completely processed, in which case no more data will be arriving at that second input queue 320, and so cannot act as a trigger for the current operation (i.e., the second input queue is conditionally significant—initially significant, and later insignificant). Another case is where the second data stream has not yet been created, and may or may not be created until the first data stream has finished being processed. In this latter case, an artificial circular dependency is created, where the first data stream cannot be processed because the second data stream has not yet been created and the second data stream cannot be created until the first data stream has finished being processed.

To accommodate these important processing requirements of having inputs that may be present, but are not always required to be present or may not be present altogether initially, the conditions precedent for execution are modified for certain operations, so that the element controller 325 may allow an element 270 to execute in the absence of one or more otherwise significant inputs or to execute initially without regard to the status of inputs. This may be accomplished in any of several ways. First, when such an operation is programmed in a context of the configuration and control registers 330, 330A, the element controller 325 recognizes the partial (or conditional) execution indicator (stored in field 1090), allowing a "partial execution" of this class of instructions/context, so that execution may proceed without the presence of all significant inputs.

As a second alternative, one or more inputs or outputs that may actually be used for the operation are nonetheless marked as insignificant, meaning that those inputs or outputs are not required for the element controller 325 to decide to run the operation. In this second alternative, however, the onus falls on the operation to decide whether any insignificant input actually needs to be present. If the needed insignificant input were present, then the operation could proceed and run to completion. If the needed insignificant input were not present, then the operation would be aborted and could be a candidate for execution at some future time.

As a third alternative, the indication of a conditional or partial execution is implicit in the element configuration. For example, some multiply operations require input data on four input queues 320, but not all at the same time. Implicit in the multiplication instruction, during a first cycle, the element 270 may begin execution without any inputs being considered significant, and examine several inputs for data, such as $I_0$ and $I_2$. If data is not present at these inputs, the execution will abort but, concomitantly, the element 270 will designate these two inputs as significant (e.g., will set a corresponding flag or set a bit in the optional field 1090), such that the operation will trigger when data arrives at these inputs in a subsequent cycle. When data is present at these inputs, the element 270 will execute, as a partial operation, storing the interim results in an accumulator within the element 270, and in the next (second) cycle, determine if data is present at all four inputs, and if so, will execute (and if not, may abort and proceed with calculations for another context, using the previously stored interim results in a subsequent cycle, to resume the calculations where it left off). In a third cycle, the element will examine other inputs for data, such as $I_1$ and $I_3$, and if so, will execute, with the previously significant inputs of $I_0$ and $I_1$ no longer being significant for this execution cycle. Accordingly, in this instance, selected inputs are conditionally and temporally significant, and while a context may initially commence an execution without being triggered by a data arrival, it cannot complete the execution without the input data at these significant inputs, such that a lack of input data at a conditionally or temporally significant data input can be utilized to halt any further execution of the context.

In addition, some data operations are conditional, and may use the partial (or conditional) execution indicator (stored in field 1090), or may allow the element 270 to determine the inputs it needs during execution. This may occur in evaluation of a "case statement", for example, when the result of the case will cause selection of a branch to execute with selected inputs, without waiting for other inputs which may never arrive. This may also occur for a "for loop", in which the body of the loop is controlled with variables, which in the first pass may require waiting for data to arrive in significant input queues 320, and for subsequent passes, will depend upon variables fed back to determine significant input queues 320 or output queues 315, if any. For example, an element 270 may actually only need data on selected input queues 320 when some condition is true or false, such as the result of a comparison. The element 270 may utilize data from first and second input queues 320, and if that operation returns a result which is "true", the element 270 will utilize data from a third input queue 320, and if "false", the element 270 will utilize data from a fourth input queue 320. As another example, the element 270 may utilize data from first and second input queues 320, and if that operation returns a result which is "true", the element 270 will utilize data from a third input queue 320, and if "false", the element 270 will abort the operation, and will not consume input data or provide output data. As another example, the element 270 may execute an operation, and if that operation returns a result which is "true", the output controller 338 will output data from a first output queue 315, and if "false", the output controller 338 will output data from a second output queue 315. As yet another example, the element 270 may execute an operation, and if that operation returns a result which is "true", the element controller 325 will output data into a first output queue 315, and if "false", the element controller 325 will output data into a second output queue 315 and ignore any existing data in a first output queue 315 that could otherwise exert back pressure.

Other composite circuit elements 260, 260A may also use partial or conditional execution. For example, a composite circuit element 260, 260A may read from a first input queue 320 until it is empty (thereby becoming a condition), and then read from a second input queue 320 in a subsequent operation, without needing to inject new data into the first input queue 320 in order to be able to read from the second input queue 320. As another example, a composite circuit element 260, 260A may run an operation, and if that operation returns a result which is "true", the element 270 will utilize data from a first input queue 320, and will wait for that data to arrive, temporarily setting that input queue 320 into a significant status, and will not consume input data or provide output data in the interim; after the data has arrived and the operation has continued, the status of the input queue 320 can be reset to insignificant.

The order of execution of element contexts depends on the arrival of data in input queues 320 for each element context, and the availability of empty slots in the output queues 315. This order is, essentially, non-deterministic. The order of broadcasting data from each of the output contexts is, essentially, non-deterministic. For the majority of cases, this is fine. There are some cases where the order that data is output from the different contexts is important. To handle these cases, contexts can be set up in a "chain". In one embodiment, each chain has a "lead" context, a "next" context, and a "last" context (link or node). The lead is the first context in the chain, the last is the last context in the chain. A chain with only one context is both a lead and a last. A wide variety of implementations are possible and within the scope of the disclosure. In addition, such chaining or ordering of context executions may also override arbitration when additional contexts may also be ready for execution. In general, such chaining or ordering may be established as part of the configuration established in defining specific tasks and loading the tasks into the apparatus 100, 140.

In an exemplary embodiment, the optional execution context lead indicator (stored in field 1065), execution context next indicator (stored in field 1067), and optional execution context last indicator (stored in field 1069) (also collectively referred to as "execution chain" indicators), are utilized to determine the first (lead) execution context and the next and last execution contexts to execute, and is particularly useful for controlling the sequence in which contexts are executed, i.e., sequencing or chaining together a sequence of operations. In this embodiment, the element controller 325 can commence execution of the "execution chain lead" context (the first context of the chain, also as designated within field 1065), when the other conditions discussed above have been met. More particularly, in an exemplary embodiment, when execution is to begin, the element controller 325 looks for execution contexts that are ready to run, namely their "run" bit says that they are eligible to be run, that all their significant inputs are ready, and their significant outputs have room for results. The contexts that are ready and are "leads" are eligible to be chosen to be executed.

Thereafter, the element controller 325 will examine the execution context next field 1067 (or last field 1069) to see if the current context is the last in the chain or points to another context in the chain, and will execute the next context in the sequence, as designated in the field 1067, also when the other conditions (e.g., EI, RFM, etc.) have been met, and otherwise will wait (idle) for this next context to become available, such as when data arrives. If the next execution context is the same as the current context (without the utilization of field 1069 and may require comparison logic), or if otherwise the current context has been designated in field 1069 as the last context of the chain (allowing examination of the stored value without the need for a comparison), then execution of the sequence has been completed. If the execution context was the last in the chain, then the list of eligible leads is examined for new chain candidates. These chain indicator fields 1065, 1067 and 1069 may also include a designation as to whether the data input(s) will be consumed.

In a selected embodiment, an optional "interrupts" field 1075 may also be provided. This field may designate, as part of the configuration word 1000, the setting, masking, and detecting of interrupts, including when a context executes. These interrupts are serviced by the SPE 292 (or SME 290).

Also in a selected embodiment, an optional constant mode field 1085 may be utilized, to designate that one or more of the input data words in one or more input queues 320 is a constant or are constants. For such a constant, it is generally maintained (until changed), so the constant is not consumed during data operations. In an exemplary embodiment, selected bits of the constant mode field 1085 are also utilized to indicate the next data read location (e.g., which data word in a two word input queue 320), such as for toggling or switching between two or more constant values, and this may be extended to any or all of the input queues 320. This can also be done as part of a tight loop, with output data fed back into the input queues 320, and may also be applied to output queues 315.

In another exemplary embodiment, a composite circuit element 260, 260A may need to continue to execute in a selected context until a particular data stream is processed or a loop is completed. For this mode, an optional "stay in context" field 1094 may be utilized. The composite circuit element 260, 260A will continue to execute the selected context (provided there is incoming data in the significant inputs and room for data in significant outputs) until the data stream includes a "tag" control bit indicating the end of a data block, at which point the next context will re-initialize the loop or input queue(s) 320.

In another exemplary embodiment, when destination-based (rather than source-based) data transmission is utilized, the optional "fork" field 1096 is utilized for output replication, when the same output is to be provided (or replicated) to multiple destinations. Additional contexts are utilized to store these additional destinations. In this embodiment, the element controller 325 can commence execution of the "fork lead" context (the first context of the fork, also as designated within field 1030), when the other conditions discussed above have been met. Thereafter, when the one or more bits of the fork field 1096 indicate another context, the current output will be provided (copied sequentially) as the output for that context, avoiding a need to re-execute a context based on the same data to provide the same output, just to a different location. Other contexts which are not part of the "fork" sequence are not executed during this sequential output replication. If the next context is the same as the current context, then execution of the forking (output duplication) has been completed. When no fork is indicated in field 1030, the element controller 325 simply determines what other contexts may be ready for execution, and proceeds accordingly.

Referring to FIG. 16B, a configuration (and control) word 1135 is illustrated for an input queue 320. Such a configuration (and control) word 1135 is typically provided to the composite circuit element 260, 260A over the CC bus 285, and may be considered part of the configuration word 1000 for a selected context (with its task ID and action ID fields). The configuration (and control) word 1135 is shown separately in FIG. 16B for ease of explanation. As illustrated in FIG. 16B, the exemplary configuration word 1135 is comprised of a plurality of data fields, and comprises at least two or more of the following data fields, in any order: a source field 1139; a significant inputs ("SI") field 1141; an optional constant mode field 1143; an optional status field 1145; an optional maximum length field 1147; an optional length field 1149; and a reset field 1151. A corresponding input queue configuration and control word 1135 it utilized for each context of the input queue 320. As mentioned above, the memory composite circuit element 260M has somewhat different control, so multiple contexts may execute simultaneously, rather than sequentially. It will be apparent to those of skill in the electronic arts that additional or fewer fields may be utilized, depending upon the applications and objectives of the selected apparatus 100, 140 and any incorporated system, and all such variations are within the scope of the present invention.

The source field 1139 designates a source that the input queue 320 is to listen to over the full interconnect 275, 295, indicating a composite circuit element 260, 260A, 260M or cluster queue 245, the context of the composite circuit element 260, 260A, 260M or cluster queue 245, and a port).

The significant inputs ("SI") field 1141 is utilized to indicate whether the input queue 320 is a significant input for the context (as for conditional modes, an input queue 320 may still be utilized for data while being considered insignificant, as discussed above). The optional constant mode field 1143 is utilized to indicate whether the input queue has a constant length or not, such that the same data or sequence of data is re-read (the data is not consumed and stays in place for successive operations until it is rewritten). The optional status field 1145 is utilized to indicate the condition of the input queue 320, such as whether it is broken or otherwise out of service. The optional maximum length field 1147 is utilized to force a maximum length of the input queue 320 to be a length of two (default length), so that the input queue 320 cannot be merged for use by other contexts. The optional length field 1149 indicates whether the input queue 320 has been merged, with specification of the precise merger specified in a master register (not separately illustrated) utilized for additional control for all of the input queues 320 of the particular composite circuit element 260, 260A or cluster queue 245. The reset field 1151 may be utilized to allow the input queues 320 to be overwritten and effectively purged, such as for a reset by the SPE 292.

Such a master register, in an exemplary embodiment, would indicate the merger of the input queue memory allocated to the eight available contexts, so that a selected context may have a larger (or smaller) portion of the input queue 320 resources. Such a master register is also utilized for storing read and write pointers, an indicator of whether the input queue 320 is full or not, and a mask for performance of selected operations.

Referring to FIG. 16C, a configuration (and control) word 1160 is illustrated for an output queue 315. Such a configuration (and control) word 1160 is typically provided to the composite circuit element 260, 260A over the CC bus 285, and may be considered part of the configuration word 1000 for a selected context (with its task ID and action ID fields). The configuration (and control) word 1160 is shown separately in FIG. 16C for ease of explanation. As illustrated in FIG. 16C, the exemplary configuration word 1160 is comprised of a plurality of data fields, and comprises at least two or more of the following data fields, in any order: an optional source field 1162; a significant outputs ("SO") field 1164; an optional output mapping field 1166; an optional output queue chain lead field 1168; an optional output queue chain next field 1172; an optional output queue chain last field 1174; and a reset field 1176. A corresponding output queue configuration and control word 1160 it utilized for each context of the output queue 315. As mentioned above, the memory composite circuit element 260M has somewhat different control, so multiple contexts may execute simultaneously, rather than sequentially. It will be apparent to those of skill in the electronic arts that additional or fewer fields may be utilized, depending upon the applications and objectives of the selected apparatus 100, 140 and any incorporated system, and all such variations are within the scope of the present invention.

The optional source field 1162 designates the composite circuit element 260, 260A, 260M or cluster queue 245, the context of the composite circuit element 260, 260A, 260M or cluster queue 245, and an output port. This optional field may be utilized by the output controller 338 to provide this information over the full interconnect 275, 295, designating itself as a source to which a destination may attend.

The significant outputs ("SO") field 1164 is utilized to indicate whether the output queue 315 is a significant output for the context (as for conditional modes, an output queue 320 may still be utilized for data while being considered insignificant, as discussed above). The optional output queue mapping field 1166 is used to indicate whether the output of the context will be mapped to a different output queue context. The reset field 1176 may be utilized to allow the output queues 315 to be overwritten, resetting the pointers and effectively purging the output queue 315, so that any data in the output queue 315 is not utilized, such as for a reset by the SPE 292 or for loading a new configuration.

In some embodiments, the order of broadcasting data from an output queue 315 depends on which output queues 315 have data, whether the output queue 315 is in the middle of an acknowledgment handshake with its destinations, and whether back-pressure has slowed the broadcast of data. The order of broadcasting data from each of the output contexts is, essentially, non-deterministic. For the majority of cases, this is fine. There is a comparatively small number of cases where the order that data is output from the different output queues 315 is important. To handle these cases, output queue 315 contexts can be set up in a "chain" as well. In one embodiment, each output queue 315 chain also has a "lead" context, a "next" context, and a "last" context. The lead is the first output queue 315 context in the chain, the last is the last output queue 315 context in the chain. An output queue 315 chain with only one context is both a lead and a last. A wide variety of implementations are possible and within the scope of the disclosure.

In an exemplary embodiment, the optional output queue lead indicator (stored in field 1168), output queue next indicator (stored in field 1172), and optional output queue last indicator (stored in field 1174) (also collectively referred to as "output queue chain" indicators), are utilized to determine the first (lead) context and the next and last contexts to execute, and is particularly useful for controlling the sequence of data broadcasting from output queues 315, i.e., sequencing or chaining together a sequence of output data. In this embodiment, when output queue 315 broadcast begins, the output controller 338 looks for output queue contexts that have data. The output queue 315 contexts that have data and are "leads" are eligible to be chosen to be broadcast (the first output queue 315 of the chain, also as designated within field 1091). If the output queue 315 receives a deny signal, the lead context of the output queue 315 will continue to broadcast data, until no deny signal is received.

Thereafter, the output controller 338 will examine the output queue next field 1172 (or last field 1174) to see if the current output queue context is the last in the chain or points to another output queue context in the chain, and will allow broadcast from the next output queue context in the sequence, as designated in the field 1172, also when the other conditions (e.g., data is present in the output queue 315, etc.) have been met, and otherwise will wait (idle) for this next output queue context to become available, such as when data arrives. If the next output queue context is the same as the current output queue context (without the utilization of field 1174 and may require comparison logic), or if otherwise the current output queue context has been designated in field 1174 as the last output queue context of the chain (allowing examination of the stored value without the need for a comparison), then the data broadcast of the sequence has been completed. If the output queue 315 receives a deny signal, the next/last context of the output queue 315 will continue to broadcast data, until no deny signal is received. If the output queue context was the last in the chain, then the list of eligible leads is examined for new output queue chain candidates. These output queue chain indicator fields 1168, 1172 and 1174 may also include a designation as to whether the data output(s) will be consumed.

As a consequence, as discussed above, each of the element controller 325, input controller 336, and output controller 338 may be implemented using a plurality of combinational logic gates, which evaluate the various fields of the corresponding configuration and control words 1000, 1135, 1160 (and other control signals) for each context. When the various fields and other signal indicate that a context is both ready and should be run, the element controller 325, input controller 336 or output controller 338 may load a configuration of the context if needed, and the corresponding task or action (or instruction) is executed.

In summary, the present invention provides resilient and adaptive integrated circuitry with self-healing capabilities. Numerous advantages of the exemplary embodiments are readily apparent. The IC architecture of the present invention is resilient, providing adaptation for manufacturing defects, flaws which may arise during usage of the IC, and adaptability for new features, services, algorithms, and other events. This IC architecture is self-healing, because in the event a portion of the IC is damaged or otherwise becomes unusable, another portion of the IC is effectively "recruited" or reassigned to take over and perform the functions of the damaged portion. The present invention allows a single component to be switched out, and does not have the fixed wiring of the prior art. In addition, as the functions are reassigned, new control and data pathways are also created, so that the transferred operations continue to perform seamlessly with other IC operations. Such adaptive resilience and self-healing may occur in real-time or near real-time, depending upon the selected embodiment. Such resiliency provides for a graceful degradation of performance in the event of damage to the IC, rather than a catastrophic failure, and is especially significant in health and safety applications.

It is to be understood that this application discloses a system, apparatus, software and method for resilient and adaptive integrated circuitry with self-healing capabilities. Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

A "processor" as used herein may be any type of controller or processor, and may be embodied as one or more processors 175, adapted to perform the functionality discussed herein. The processor may be in a separate system, or may be integrated as part of the die of the systems 100, 140, etc., and may be any type of processor or controller, such as a commercially available processor or microprocessor, e.g., ARM or MicroBlaze, or may be implemented using one or more SPEs 292 (or SMEs 290). As the term processor is used herein, a processor may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components. As a consequence, as used herein, the term processor should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or $E^2$PROM. A processor (such as processor 1215), with its associated memory, may be adapted or configured (via programming, FPGA interconnection, or hard-wiring) to perform the methodologies of the invention. For example, the methodology may be programmed and stored, in a processor/controller 175 with its associated memory (and/or other memory) and other equivalent components, as a set of program instructions or other code (or equivalent configuration or other program) for subsequent execution when the processor is operative (i.e., powered on and functioning). Equivalently, when the processor 1215 may implemented in whole or part as FPGAs, custom ICs and/or ASICs, the FPGAs, custom ICs or ASICs also may be designed, configured and/or hard-wired to implement the methodology of the invention. For example, the processor may be implemented as an arrangement of processors, controllers, microprocessors, DSPs and/or ASICs, collectively referred to as a "controller" or "processor", which are respectively programmed, designed, adapted or configured to implement the methodology of the invention, in conjunction with a memory.

"Memory", as used herein, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. In addition, such computer readable media includes any form of communication media which embodies computer readable instructions, data structures, program modules or other data in a data signal or modulated signal, such as an electromagnetic or optical carrier wave or other transport mechanism, including any information delivery media, which may encode data or other information in a signal, wired or wirelessly, including electromagnetic, optical, acoustic, RF or infrared signals, and so on. The memory may be adapted to store various look up tables, parameters, coefficients, other information and data, programs or instructions (of the software of the present invention), and other types of tables such as database tables.

As indicated above, the processor/controller 175 is programmed, using software and data structures of the invention, for example, to perform the compilation methodology of the present invention. As a consequence, the system and method of the present invention may be embodied as software which provides such programming or other instructions, such as a set of instructions and/or metadata embodied within a computer readable medium. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 1215, for example).

The software, metadata, or other source code of the present invention and any resulting bit file (object code, database, or look up table) may be embodied within any tangible storage medium, such as any of the computer or other machine-readable data storage media, as computer-readable instructions, data structures, program modules or other data, such as discussed above with respect to the memory 1220, e.g., a floppy disk, a CDROM, a CD-RW, a DVD, a magnetic hard drive, an optical drive, or any other type of data storage apparatus or medium, as mentioned above.

Any I/O interfaces may be implemented as known or may become known in the art, and may include impedance matching capability, voltage translation for a low voltage processor to interface with a higher voltage control bus, and various switching mechanisms (e.g., transistors) to turn various lines or connectors on or off in response to signaling from the processor. In addition, the I/O interface may also be adapted to receive and/or transmit signals externally to the system, such as through hard-wiring, IR or RF signaling, for example, to receive information such as algorithms for compiling, for example. The I/O interface may provide connection to any type of bus or network structure or medium, using any selected architecture. By way of example and not limitation, such architectures include Industry Standard Architecture (ISA) bus, Enhanced ISA (EISA) bus, Micro Channel Architecture (MCA) bus, Peripheral Component Interconnect (PCI) bus, SAN bus, or any other communication or signaling medium, such as Ethernet, ISDN, T1, satellite, wireless, and so on. The I/O interface may be implemented as known or may become known in the art, to provide data communication between the processor and the network, using any applicable standard (e.g., one of the various PCI, USB or Ethernet standards, for example and without limitation).

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A reconfigurable integrated circuit capable of on-chip configuration and reconfiguration, the integrated circuit comprising:
   a plurality of configurable composite circuit elements, each composite circuit element comprising:
      a configurable circuit; and
      an element interface and control circuit, the element interface and control circuit comprising an element controller and at least one configuration and control register, the at least one configuration and control register to store one or more configuration and control words;
   a configuration and control bus coupled to the plurality of configurable composite circuit elements, the configuration and control bus comprising a plurality of address and control lines and a plurality of data lines;
   a memory;
   a sequential processor coupled to the configuration and control bus and to the memory, the sequential processor to write a first configuration to the at least one configuration and control register of an addressed first configurable composite circuit element to configure or reconfigure the configurable circuit.

2. The integrated circuit of claim 1, wherein the sequential processor further is to write a data source address to the at least one configuration and control register for the addressed first configurable composite circuit element to provide input data routing.

3. The integrated circuit of claim 2, wherein the sequential processor further is to write a data source address of the addressed first configurable composite circuit element to one or more configuration and control registers of other configurable composite circuit elements to provide output data routing for the addressed first configurable composite circuit element.

4. The integrated circuit of claim 2, wherein the sequential processor further is to read the first configuration and the data source address from the memory and transfer the first configuration and the data source address to the addressed first configurable composite circuit element over the configuration and control bus.

5. The integrated circuit of claim 2, wherein the sequential processor generates the first configuration.

6. The integrated circuit of claim 2, wherein the sequential processor generates the data source address.

7. The integrated circuit of claim 1, further comprising:
a message-based interconnect bus to transfer a plurality of messages, each message comprising control information and a data payload; and
a message manager circuit coupled to the message-based interconnect bus, to the configuration and control bus, and to the memory, the message manager circuit to receive and interpret the plurality of messages.

8. The integrated circuit of claim 7, wherein when the data payload is a second configuration, the message manager circuit further is to write the second configuration to at least one configuration and control register of an addressed second configurable composite circuit element to configure or reconfigure the configurable circuit element of the addressed second configurable composite circuit element.

9. The integrated circuit of claim 8, wherein the message manager circuit further is to write a second data source address to the at least one configuration and control register of the addressed second configurable composite circuit element to provide input data routing for the addressed second configurable composite circuit element.

10. The integrated circuit of claim 7, wherein when the data payload is a configuration, the message manager circuit further is to write the configuration to the memory.

11. The integrated circuit of claim 7, wherein when the data payload is application data, the message manager circuit further is to write the application data to the memory or transfer the application data to a configurable composite circuit element or to the sequential processor.

12. The integrated circuit of claim 7, wherein the message manager circuit further is to transmit a message to or receive a message from an absolute address.

13. The integrated circuit of claim 7, wherein the message manager circuit further is to transmit a message to or receive a message from an application-specified address.

14. The integrated circuit of claim 7, wherein the message manager circuit further is to transmit a message to or receive a message from a data path-specified address.

15. The integrated circuit of claim 7, wherein the message manager circuit further is to transmit a message to or receive a message independently of the sequential processor or a host processor.

16. The integrated circuit of claim 7, wherein the message manager circuit further is to generate and transmit an acknowledgment message automatically upon reception of a message.

17. The integrated circuit of claim 7, wherein the message manager circuit further is to read a configuration from one or more configuration and control registers of an addressed third composite circuit element.

18. The integrated circuit of claim 7, wherein the message-based interconnect bus is further coupled to an integrated circuit input and output to receive and transmit a plurality of messages from and to the integrated circuit.

19. The integrated circuit of claim 7, wherein the message manager circuit further is to broadcast configuration data over the configuration and control bus to the plurality of composite circuit elements.

20. The integrated circuit of claim 1, wherein the sequential processor further is to read a configuration from one or more configuration and control registers of an addressed third composite circuit element.

21. The integrated circuit of claim 1, wherein each configurable composite circuit element has a plurality of contexts, and wherein the sequential processor further is to write a configuration and control data to the at least one configuration and control register for a first context of the addressed first configurable composite circuit element, the control data comprising a task identifier of a plurality of tasks.

22. The integrated circuit of claim 21, wherein the sequential processor further is to concurrently enable a plurality of contexts of a plurality of configurable composite circuit elements by broadcasting second control information over the configuration and control bus, the second control information having the task identifier and an enable run status.

23. The integrated circuit of claim 21, wherein the sequential processor further is to suspend a task by broadcasting second control information over the configuration and control bus, the second control information having the task identifier and a halt run status.

24. The integrated circuit of claim 21, wherein the sequential processor further is to move a task by broadcasting second control information over the configuration and control bus, the second control information having the task identifier and a halt run status; the sequential processor further to write a second configuration, a data source address, a data source context and the task identifier to a one or more configuration and control registers for a second context of an addressed second configurable composite circuit element to configure or reconfigure the configurable circuit and provide input data routing for the second context of the addressed configurable composite circuit element; and the sequential processor further is to write a data source address and a data source context of the second context of the addressed second configurable composite circuit element to one or more configuration and control registers of other configurable composite circuit elements to provide output data routing for the second context of the addressed second configurable composite circuit element.

25. The integrated circuit of claim 1, wherein an initial configuration and data routing is transferred from an external source into the integrated circuit and is stored in the memory, and wherein the sequential processor subsequently is to write a second configuration to at least one configuration and control register for the addressed first configurable composite circuit element to reconfigure the configurable circuit without involvement of the external source.

26. The integrated circuit of claim 1, wherein an initial configuration and data routing is transferred from an external source into the integrated circuit and is stored in the memory, and wherein the sequential processor subsequently is to write a second configuration to at least one configuration and control register for the addressed first configurable composite circuit element to reconfigure the configurable circuit without involvement of a non-volatile memory storing configurations.

27. An integrated circuit capable of on-chip configuration and reconfiguration without external involvement, the integrated circuit comprising:
a plurality of configurable composite circuit elements, each composite circuit element having a plurality of contexts and comprising:
a configurable circuit; and
an element interface and control circuit, the element interface and control circuit comprising an element controller and one or more configuration and control registers, the one or more configuration and control registers to store a configuration and control word for each context of the plurality of contexts;
a configuration and control bus coupled to the plurality of configurable composite circuit elements, the configuration and control bus comprising a plurality of address and control lines and a plurality of data lines;
a memory;
a sequential processor coupled to the configuration and control bus and to the memory, the sequential processor to write a first configuration to the one or more configuration and control registers for a first context of an addressed first configurable composite circuit element to configure or reconfigure the configurable circuit for the first context of the addressed first configurable composite circuit element.

28. The integrated circuit of claim 27, wherein the sequential processor further is to write a data source address and a data source context to the one or more configuration and control registers for the first context of the addressed first configurable composite circuit element to provide input data routing for the first context of the addressed first configurable composite circuit element.

29. The integrated circuit of claim 28, wherein the sequential processor further is to write a data source address and a data source context of the first context of the addressed first configurable composite circuit element to one or more configuration and control registers of other configurable composite circuit elements to provide output data routing for the first context of the addressed first configurable composite circuit element.

30. The integrated circuit of claim 28, wherein the sequential processor further is to read the first configuration, the data source address and the data source context from the memory and transfer the first configuration, the data source address and the data source context to the addressed first configurable composite circuit element over the configuration and control bus.

31. The integrated circuit of claim 27, further comprising:
a message-based interconnect bus to transfer a plurality of messages, each message comprising control information and a data payload; and
a message manager circuit coupled to the message-based interconnect bus, to the configuration and control bus, and to the memory, the message manager circuit to receive and interpret the plurality of messages.

32. The integrated circuit of claim 31, wherein when the data payload is a second configuration, the message manager circuit further is to write the second configuration to one or more configuration and control registers for a second context of an addressed second configurable composite circuit element to configure or reconfigure the configurable circuit element for the second context of the addressed second configurable composite circuit element.

33. The integrated circuit of claim 32, wherein the message manager circuit further is to write a second data source address and a second data source context to the one or more configuration and control registers for the second context of the addressed second configurable composite circuit element to provide input data routing for the second context of the addressed second configurable composite circuit element.

34. The integrated circuit of claim 31, wherein when the data payload is a configuration, the message manager circuit further is to write the configuration to the memory.

35. The integrated circuit of claim 31, wherein the message manager circuit further is to broadcast configuration data over the configuration and control bus to the plurality of composite circuit elements.

36. The integrated circuit of claim 27, wherein the sequential processor further is to write control data to the one or more configuration and control registers for the first context of the addressed first configurable composite circuit element, the control data comprising a task identifier of a plurality of tasks.

37. The integrated circuit of claim 36, wherein the sequential processor further is to concurrently enable a plurality of contexts of a plurality of configurable composite circuit elements by broadcasting second control information over the configuration and control bus, the second control information having the task identifier and an enable run status.

38. The integrated circuit of claim 36, wherein the sequential processor further is to suspend a task by broadcasting second control information over the configuration and control bus, the second control information having the task identifier and a halt run status.

39. The integrated circuit of claim 36, wherein the sequential processor further is to move a task by broadcasting second control information over the configuration and control bus, the second control information having the task identifier and a halt run status, the sequential processor further to write a second configuration, a data source address, a data source context and the task identifier to one or more configuration and control registers for a second context of an addressed second configurable composite circuit element to configure or reconfigure the configurable circuit and provide input data routing for the second context of the addressed configurable composite circuit element, and the sequential processor further is to write a data source address and a data source context of the second context of the addressed second configurable composite circuit element to one or more configuration and control registers of other configurable composite circuit elements to provide output data routing for the second context of the addressed second configurable composite circuit element.

40. An integrated circuit capable of on-chip configuration and reconfiguration, the integrated circuit comprising:
a plurality of configurable composite circuit elements, each composite circuit element having a plurality of contexts and comprising:
a configurable circuit; and
an element interface and control circuit, the element interface and control circuit comprising an element controller and one or more configuration and control registers, the one or more configuration and control registers to store a configuration and control word for each context of the plurality of contexts;
a configuration and control bus coupled to the plurality of configurable composite circuit elements, the configuration and control bus comprising a plurality of address and control lines and a plurality of data lines;

a memory;

a message manager circuit coupled to the configuration and control bus and to the memory, the message manager circuit to write a first configuration, a data source address and a data source context to the one or more configuration and control registers for a first context of an addressed first configurable composite circuit element to configure or reconfigure the configurable circuit for the first context of the addressed first configurable composite circuit element and to provide input data routing for the first context of the addressed first configurable composite circuit element.

41. The integrated circuit of claim 40, wherein the message manager circuit further is to write a data source address and a data source context of the first context of the addressed first configurable composite circuit element to one or more configuration and control registers of other configurable composite circuit elements to provide output data routing for the first context of the addressed first configurable composite circuit element.

42. The integrated circuit of claim 41, wherein the sequential processor further is to read the first configuration, the data source address and the data source context from the memory and transfer the first configuration, the data source address and the data source context to the addressed first configurable composite circuit element over the configuration and control bus.

43. The integrated circuit of claim 40, further comprising:
a message-based interconnect bus coupled to the message manager circuit for transfer a plurality of messages, each message comprising control information and a data payload;
wherein when the data payload is a second configuration, the message manager circuit further is to write the second configuration to one or more configuration and control registers for a second context of an addressed second configurable composite circuit element to configure or reconfigure the configurable circuit for the second context of the addressed second configurable composite circuit element.

44. The integrated circuit of claim 43, wherein the message manager circuit further is to write a second data source address and a second data source context to the one or more configuration and control registers for the second context of the addressed second configurable composite circuit element to provide input data routing for the second context of the addressed second configurable composite circuit element.

45. The integrated circuit of claim 43, wherein when the data payload is a configuration, the message manager circuit further is to write the configuration to the memory.

46. The integrated circuit of claim 40, wherein the message manager circuit further is to broadcast configuration data over the configuration and control bus to the plurality of composite circuit elements.

47. The integrated circuit of claim 40, wherein the message manager circuit further is to write control data to the one or more configuration and control registers for the first context of the addressed first configurable composite circuit element, the control data comprising a task identifier of a plurality of tasks.

48. The integrated circuit of claim 47, wherein the message manager circuit further is to concurrently enable a plurality of contexts of a plurality of configurable composite circuit elements by broadcasting second control information over the configuration and control bus, the second control information having the task identifier and an enable run status.

49. The integrated circuit of claim 48, wherein the sequential processor further is to suspend a task by broadcasting second control information over the configuration and control bus, the second control information having the task identifier and a halt run status.

50. An integrated circuit capable of on-chip configuration and reconfiguration, the integrated circuit comprising:
a plurality of configurable composite circuit elements, each composite circuit element having a plurality of contexts and comprising:
a configurable circuit; and
an element interface and control circuit, the element interface and control circuit comprising an element controller and one or more configuration and control registers, the one or more configuration and control registers to store a configuration and control word for each context of the plurality of contexts;
a configuration and control bus coupled to the plurality of configurable composite circuit elements, the configuration and control bus comprising a plurality of address and control lines and a plurality of data lines;
a memory;
a sequential processor coupled to the configuration and control bus and to the memory, the sequential processor to write a first configuration to the one or more configuration and control registers for a first context of an addressed first configurable composite circuit element to configure or reconfigure the configurable circuit for the first context of the addressed first configurable composite circuit element; and
a message manager circuit coupled to the configuration and control bus and to the memory, the message manager circuit to write a second configuration to the one or more configuration and control registers for a second context of an addressed second configurable composite circuit element to configure or reconfigure the configurable circuit for the second context of the addressed second configurable composite circuit element.

* * * * *